US009291898B2

(12) United States Patent
Yokokawa et al.

(10) Patent No.: US 9,291,898 B2
(45) Date of Patent: Mar. 22, 2016

(54) ACTINIC RAY-SENSITIVE OR RADIATION-SENSITIVE RESIN COMPOSITION, RESIST FILM USING THE SAME, PATTERN FORMING METHOD, MANUFACTURING METHOD OF ELECTRONIC DEVICE, ELECTRONIC DEVICE AND RESIN

(71) Applicant: FUJIFILM Corporation, Minato-ku, Tokyo (JP)

(72) Inventors: Natsumi Yokokawa, Shizuoka (JP); Shuji Hirano, Shizuoka (JP); Hiroo Takizawa, Shizuoka (JP); Wataru Nihashi, Shizuoka (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 14/605,415

(22) Filed: Jan. 26, 2015

(65) Prior Publication Data

US 2015/0132688 A1 May 14, 2015

Related U.S. Application Data

(63) Continuation of application No. PCT/JP2013/070828, filed on Jul. 25, 2013.

(30) Foreign Application Priority Data

Jul. 27, 2012 (JP) ................................ 2012-167818
Mar. 15, 2013 (JP) ................................ 2013-054399

(51) Int. Cl.
*G03F 7/004* (2006.01)
*G03F 7/038* (2006.01)

(Continued)

(52) U.S. Cl.
CPC .............. *G03F 7/0388* (2013.01); *C08F 12/24* (2013.01); *C08F 20/28* (2013.01); *C08F 220/12* (2013.01);

(Continued)

(58) Field of Classification Search
CPC ......... G03F 7/038; G03F 7/0388; G03F 7/30; C08F 2220/12; C08F 2220/18; C08F 2220/20; C08F 2220/26; C08F 12/24; C08F 2220/285; C08F 220/12; C08F 220/18; C08F 220/20; C08F 220/26; H01L 21/0271; H01L 21/0273; H01L 21/0274
USPC ................ 430/270.1, 322, 325, 329; 526/320
See application file for complete search history.

(56) References Cited

U.S. PATENT DOCUMENTS 5,071,731 A 12/1991 Chen et al.
5,077,174 A 12/1991 Bauer et al.

(Continued)

FOREIGN PATENT DOCUMENTS

JP 57-8541 A 1/1982
JP 58-118641 A 7/1983

(Continued)

OTHER PUBLICATIONS

Search Report dated Sep. 3, 2013 issued in International Application No. PCT/JP2013/070828 (PCT/ISA/210).

(Continued)

*Primary Examiner* — Amanda C Walke
(74) *Attorney, Agent, or Firm* — Sughrue Mion, PLLC

(57) ABSTRACT

There is provided an actinic ray-sensitive or radiation-sensitive resin composition comprising (P) a resin having (a) a repeating unit represented by the specific formula; a resist film formed using the actinic ray-sensitive or radiation-sensitive resin composition; a pattern forming method comprising (i) a step of forming a film by using the actinic ray-sensitive or radiation-sensitive resin composition, (ii) a step of exposing the film, and (iii) a step of developing the exposed film by using a developer to form a pattern; a method for manufacturing an electronic device, comprising the pattern forming method; and an electronic device manufactured by the manufacturing method of an electronic device.

19 Claims, 3 Drawing Sheets

(51) Int. Cl.

| | |
|---|---|
| ***C08F 220/12*** | (2006.01) |
| ***C08F 220/18*** | (2006.01) |
| ***C08F 220/20*** | (2006.01) |
| ***C08F 220/26*** | (2006.01) |
| ***C08F 12/24*** | (2006.01) |
| ***H01L 21/027*** | (2006.01) |
| ***C08F 20/28*** | (2006.01) |
| ***G03F 7/00*** | (2006.01) |
| ***G03F 7/039*** | (2006.01) |
| ***G03F 7/30*** | (2006.01) |
| *C08F 220/28* | (2006.01) |

(52) U.S. Cl.

CPC ............. *C08F 220/18* (2013.01); *C08F 220/20* (2013.01); *C08F 220/26* (2013.01); *G03F 7/0002* (2013.01); *G03F 7/0045* (2013.01); *G03F 7/038* (2013.01); *G03F 7/0392* (2013.01); *G03F 7/0397* (2013.01); *G03F 7/30* (2013.01); *H01L 21/0274* (2013.01); *C08F 2220/285* (2013.01)

(56) References Cited

U.S. PATENT DOCUMENTS

| | | | | |
|---|---|---|---|---|
| 6,090,526 | A | 7/2000 | Kumar | |
| 8,795,948 | B2 * | 8/2014 | Dazai et al. | 430/270.1 |
| 8,802,352 | B2 * | 8/2014 | Ichikawa et al. | 430/270.1 |
| 8,841,060 | B2 * | 9/2014 | Kataoka et al. | 430/270.1 |
| 8,883,396 | B2 * | 11/2014 | Yahagi et al. | 430/270.1 |
| 9,017,924 | B2 * | 4/2015 | Takaki et al. | 430/270.1 |
| 2010/0055608 | A1 * | 3/2010 | Ohashi et al. | 430/270.1 |
| 2010/0136485 | A1 * | 6/2010 | Hasegawa et al. | 430/296 |
| 2011/0236826 | A1 * | 9/2011 | Hatakeyama et al. | 430/270.1 |
| 2011/0236831 | A1 * | 9/2011 | Hasegawa et al. | 430/285.1 |
| 2012/0208124 | A1 * | 8/2012 | Iwashita et al. | 430/270.1 |
| 2012/0328987 | A1 * | 12/2012 | Hatakeyama et al. | 430/285.1 |
| 2013/0022911 | A1 * | 1/2013 | Utsumi et al. | 430/270.1 |
| 2013/0084523 | A1 * | 4/2013 | Nakamura et al. | 430/270.1 |
| 2013/0189619 | A1 * | 7/2013 | Komuro et al. | 430/270.1 |
| 2013/0260312 | A1 * | 10/2013 | Suzuki et al. | 430/270.1 |
| 2014/0186769 | A1 * | 7/2014 | Kaiho et al. | 430/285.1 |

FOREIGN PATENT DOCUMENTS

| | | | |
|---|---|---|---|
| JP | 4-358154 | A | 12/1992 |
| JP | 5-506106 | A | 9/1993 |
| JP | 8-101507 | A | 4/1996 |
| JP | 2000-29215 | A | 1/2000 |
| JP | 2000-171977 | A | 6/2000 |
| JP | 2010-256419 | A | 11/2010 |

OTHER PUBLICATIONS

Written Opinion dated Sep. 3, 2013 issued in International Application No. PCT/JP2013/070828 (PCT/ISA/237).

Office Action dated Dec. 1, 2015 issued by the Japanese Patent Office in counterpart Japanese Patent Application No. 2013-054399.

* cited by examiner

ACTINIC RAY-SENSITIVE OR RADIATION-SENSITIVE RESIN COMPOSITION, RESIST FILM USING THE SAME, PATTERN FORMING METHOD, MANUFACTURING METHOD OF ELECTRONIC DEVICE, ELECTRONIC DEVICE AND RESIN

CROSS REFERENCE TO RELATED APPLICATION

This is a continuation of International Application No. PCT/JP2013/070828 filed on Jul. 25, 2013, and claims priority from Japanese Patent Application No. 2012-167818 filed on Jul. 27, 2012, and Japanese Patent Application No. 2013-054399 filed on Mar. 15, 2013 the entire disclosures of which are incorporated therein by reference.

TECHNICAL FIELD

The present invention relates to an actinic ray-sensitive or radiation-sensitive resin composition, an actinic ray-sensitive or radiation-sensitive film using the same, a pattern forming method, a manufacturing method of an electronic device, an electronic device, and a resin. More specifically, the present invention relates to an actinic ray-sensitive or radiation-sensitive resin composition suitably used in the ultramicrolithography process applicable to, for example, a process for producing VLSI or a high-capacity microchip, a process for fabricating a nanoimprint mold, and a process for producing a high-density information recording medium, as well as in other photofabrication processes, a resist film using the same, a pattern forming method, a manufacturing method of an electronic device, an electronic device, and a resin.

BACKGROUND ART

In the process for producing a semiconductor device such as IC and LSI, microfabrication by lithography using a photoresist composition has been conventionally performed. Recently, with the increase in integration of an integrated circuit, formation of an ultrafine pattern in the sub-micron or quarter-micron region is required. To cope with this requirement, the exposure wavelength also tends to become shorter, for example, from g line to i line or further to KrF excimer laser light. At present, other than the excimer laser light, development of lithography using an electron beam, an X-ray or EUV light is also proceeding.

Among others, electron beam lithography is positioned as a next-generation or next-next-generation pattern formation technology and a high-sensitivity and high-resolution positive resist is being demanded. In particular, for shortening the wafer processing time, it is a very important task to increase the sensitivity, but in the positive resist for electron beam, when high sensitivity is pursued, this causes a problem that the resolution is likely to lower.

In this way, high sensitivity is in a trade-off relationship with high resolution and further with good pattern profile, and it is very important how to satisfy all of these properties at the same time.

Also, in the lithography using an X-ray, EUV light or the like as well, it is an important task to satisfy all of high sensitivity, high resolution and good pattern profile at the same time.

In order to solve these problems, for example, in JP-A-2010-256419 (the term "JP-A" as used herein means an "unexamined published Japanese patent application"), JP-A-

2000-29215 and JP-A-8-101507, a positive resist composition using a resin having an acetal-type protective group is disclosed, and it is stated that according to such a composition, the resolution, sensitivity and the like are improved.

In the positive image forming method, an isolated line or dot pattern can be successfully formed with this composition, but in the case of forming an isolated space or fine hole pattern, the pattern profile is liable to deteriorate.

In addition, a pattern forming method using an organic solvent-containing developer (organic developer) is also being developed recently. This method is supposed to enable stable formation of a high-definition fine pattern.

However, for forming a fine pattern with a narrow space width by using an organic solvent-containing developer, it is presently demanded to further improve the performance in terms of resolution, sensitivity and resolution in isolated space pattern formation.

SUMMARY OF INVENTION

An object of the present invention is to provide an actinic ray-sensitive or radiation-sensitive resin composition ensuring that a fine pattern with a narrow space width (for example, a space width of the order of several tens of nm) can be formed at high resolution and high sensitivity and particularly in the formation of a fine pattern with a narrow space width, an isolated space pattern difficult to form by alkali development can be formed at high resolution by organic solvent development, a resist film using the same, a pattern forming method, a manufacturing method of an electronic device, an electronic device, and a resin.

That is, the present invention is as follows.

[1] An actinic ray-sensitive or radiation-sensitive resin composition comprising:

(P) a resin having (a) a repeating unit represented by the following formula (1):

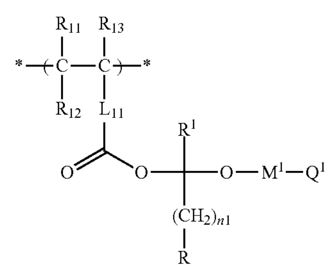

(1)

wherein each of $R_{11}$, $R_{12}$ and $R_{13}$ independently represents a hydrogen atom, an alkyl group, a cycloalkyl group, a halogen atom, a cyano group or an alkoxycarbonyl group, $R_{12}$ may combine with $L_{11}$ to form a ring, and in this case, $R_{12}$ represents a single bond or an alkylene group;

$R^1$ represents a hydrogen atom or an alkyl group;

$L_{11}$ represents a single bond or a divalent linking group, and in the case of forming a ring with $R_{12}$, $L_{11}$ represents a trivalent linking group;

R represents an alkyl group, a cycloalkyl group, an aryl group, an aralkyl group, an alkoxy group, an acyl group or a heterocyclic group;

n1 represents an integer of 1 or more;

$M^1$ represents a single bond or a divalent linking group;

$Q^1$ represents an alkyl group, a cycloalkyl group, an aryl group or a heterocyclic group;

when $M^1$ is a divalent linking group, $Q^1$ may combine with $M^1$ through a single bond or another linking group to form a ring; and the case where R combines with $Q^1$ or $M^1$ to form a ring is excluded.

[2] The actinic ray-sensitive or radiation-sensitive resin composition as described in [1], wherein $R^1$ is a hydrogen atom.

[3] The actinic ray-sensitive or radiation-sensitive resin composition as described in [1] or [2], wherein $L_{11}$ is a single bond, a group represented by —COO-$L_1$- or a group represented by -$L_2$-O—$CH_2$— (wherein $L_1$ represents an alkylene group having a carbon number of 1 to 9, which may contain a heteroatom or a carbonyl bond, and $L_2$ represents an arylene group having a carbon number of 1 to 10).

[4] The actinic ray-sensitive or radiation-sensitive resin composition as described in [3], wherein $L_{11}$ is a single bond.

[5] The actinic ray-sensitive or radiation-sensitive resin composition as described in any one of [1] to [4], wherein R in formula (1) is a group represented by —C($R^{21}$)($R^{22}$)($R^{23}$) (wherein each of $R^{21}$ to $R^{23}$ independently represents a hydrogen atom, an alkyl group, a cycloalkyl group, an aryl group, an aralkyl group or a heterocyclic group, and each of at least two members of $R^{21}$ to $R^{23}$ independently represents an alkyl group, a cycloalkyl group, an aryl group, an aralkyl group or a heterocyclic group, and at least two members of $R^{21}$ to $R^{23}$ may combine with each other to form a ring, with the provided excluding the case where at least one of $R^{21}$ to $R^{23}$ combines with $M^1$ or $Q^1$ to form a ring).

[6] The actinic ray-sensitive or radiation-sensitive resin composition as described in any one of [1] to [4], wherein n1 in formula (1) is 1.

[7] The actinic ray-sensitive or radiation-sensitive resin composition as described in [5] or [6], wherein in formula (1), each of $R^{21}$ to $R^{23}$ is independently an alkyl group.

[8] The actinic ray-sensitive or radiation-sensitive resin composition as described in any one of [1] to [7], wherein the resin (P) is a resin further containing a repeating unit represented by the following formula (5) or (6):

(5)

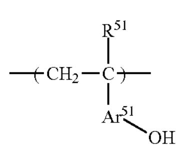

(6)

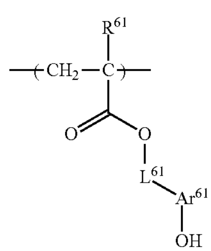

wherein each of $R^{51}$ and $R^{61}$ independently represents a hydrogen atom or a methyl group, each of $Ar^{51}$ and $Ar^{61}$ independently represents an arylene group, and $L^{61}$ represents a single bond or an alkylene group.

[9] The actinic ray-sensitive or radiation-sensitive resin composition as described in any one of [1] to [8], wherein the resin (P) is a resin further containing a repeating unit represented by the following formula (4):

(4)

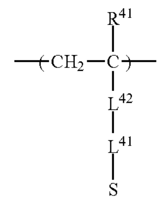

wherein $R^{41}$ represents a hydrogen atom or a methyl group, $L^{41}$ represents a single bond or a divalent linking group, $L^{42}$ represents a divalent linking group, and S represents a structural moiety capable of decomposing upon irradiation with an actinic ray or radiation to generate an acid on the side chain.

[10] A resist film formed using the actinic ray-sensitive or radiation-sensitive resin composition described in any one of [1] to [9].

[11] A pattern forming method comprising (i) a step of forming a film by using the actinic ray-sensitive or radiation-sensitive resin composition described in any one of [1] to [9], (ii) a step of exposing the film, and (iii) a step of developing the exposed film by using a developer to form a pattern.

[12] A method for manufacturing an electronic device, comprising the pattern forming method described in [11].

[13] An electronic device manufactured by the manufacturing method of an electronic device described in [12].

[14] A resin comprising a repeating unit having a phenolic hydroxyl group represented by the following formula and a repeating unit represented by the following formula (1-2):

(1-2)

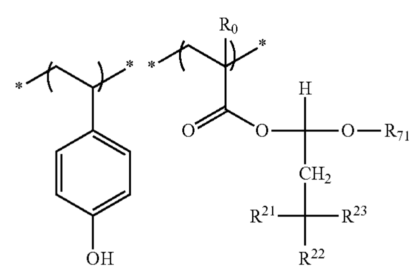

wherein in formula (1-2), $R_0$ represents a hydrogen atom or a methyl group;

each of $R^{21}$ to $R^{23}$ independently represents a hydrogen atom, an alkyl group, a cycloalkyl group, an aryl group, an aralkyl group or a heterocyclic group, and each of at least two members of $R^{21}$ to $R^{23}$ independently represents an alkyl group, a cycloalkyl group, an aryl group, an aralkyl group or a heterocyclic group;

at least two of $R^{21}$ to $R^{23}$ may combine with each other to form a ring, with the proviso excluding the case where at least one of $R^{21}$ to $R^{23}$ combines with $R_{71}$ to form a ring; and $R_{71}$ represents an unsubstituted alkyl group, a cycloalkyl group-substituted alkyl group, a cycloalkyl group, an aralkyl group, an aryloxyalkyl group or a heterocyclic group.

The present invention preferably further includes the following configurations.

[15] The actinic ray-sensitive or radiation-sensitive resin composition as described in any one of [1] to [9] above, further containing a compound capable of generating an acid upon irradiation with an actinic ray or radiation.

[16] The actinic ray-sensitive or radiation-sensitive resin composition as described in any one of [1] to [9] and [15] above, further containing a basic compound.

[17] The actinic ray-sensitive or radiation-sensitive resin composition as described in any one of [1] to [9], [15] and [16] above, further containing a solvent.

[18] The actinic ray-sensitive or radiation-sensitive resin composition as described in any one of [1] to [9] and [15] to [17] above, further containing a surfactant.

According to the present invention, an actinic ray-sensitive or radiation-sensitive resin composition ensuring that a fine pattern with a narrow space width (for example, a space width of the order of several tens of nm) can be formed at high resolution and high sensitivity and particularly in the formation of a fine pattern with a narrow space width, a pattern difficult to form by alkali development (for example, an isolated space pattern) can be formed at high resolution by organic solvent development, a resist film using the same, a pattern forming method, a manufacturing method of an electronic device, an electronic device, and a resin can be provided.

DESCRIPTION OF EMBODIMENTS

Figure 1:
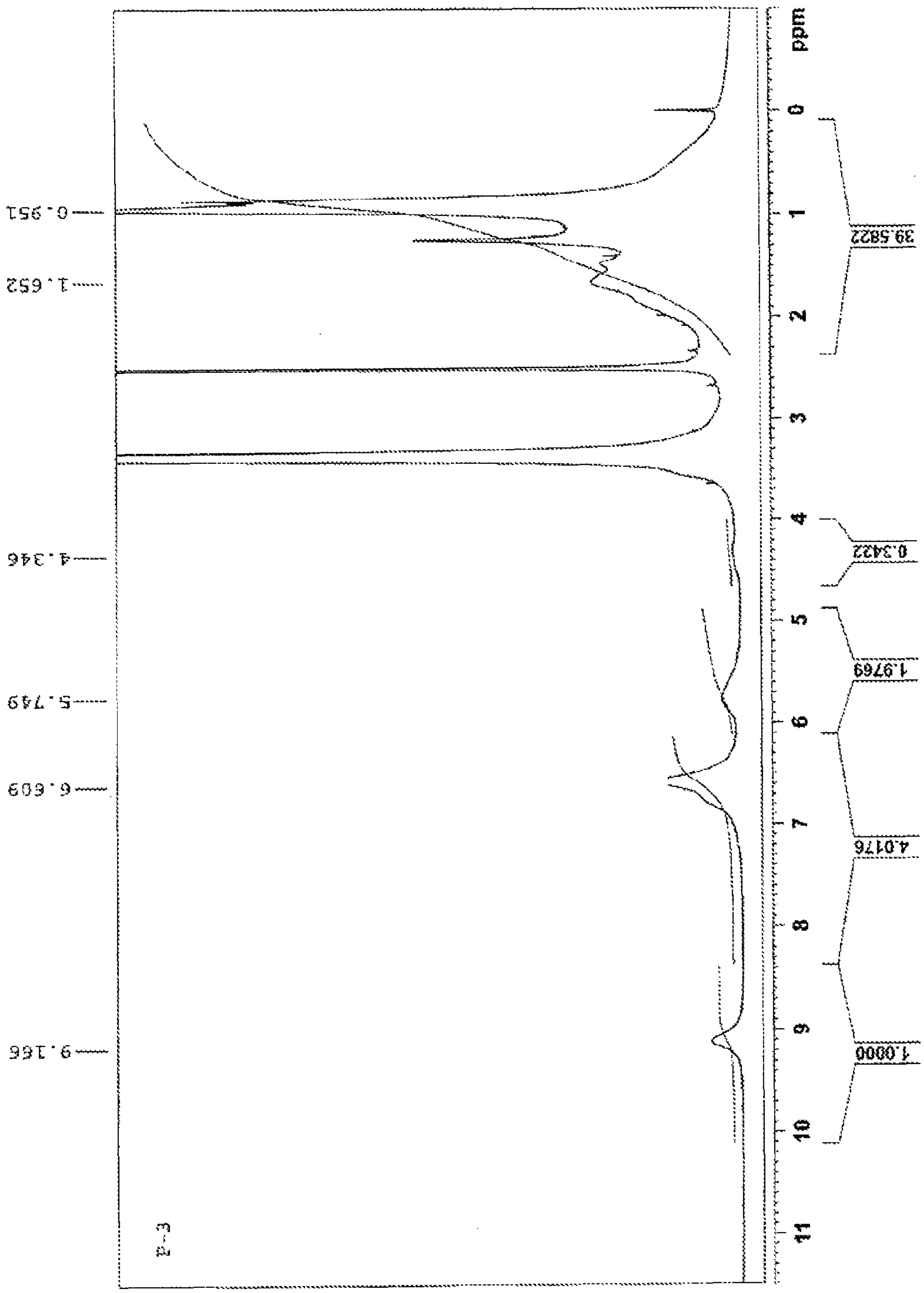
FIG. 1 is a graph showing the $^1$H-NMR spectrum of Resin (P-3).

The mode for carrying out the present invention is described below.

In the description of the present invention, when a group (atomic group) is denoted without specifying whether substituted or unsubstituted, the group encompasses both a group having no substituent and a group having a substituent. For example, "an alkyl group" without explicit depiction of whether substituted or unsubstituted encompasses not only an alkyl group having no substituent (unsubstituted alkyl group) but also an alkyl group having a substituent (substituted alkyl group).

The term "actinic ray" or "radiation" as used in the description of the present invention means, for example, a bright line spectrum of mercury lamp, a far ultraviolet ray typified by excimer laser, an extreme-ultraviolet (EUV) ray, an X-ray, or an electron beam (EB). Also, in the present invention, the "light" means an actinic ray or radiation.

In addition, unless otherwise indicated, the "exposure" as used in the present invention encompasses not only exposure to a mercury lamp, a far ultraviolet ray typified by excimer laser, an X-ray, EUV light or the like but also lithography with a particle beam such as electron beam and ion beam.

The actinic ray-sensitive or radiation-sensitive resin composition of the present invention contains (P) a resin having (a) a repeating unit represented by the following formula (1):

(1)

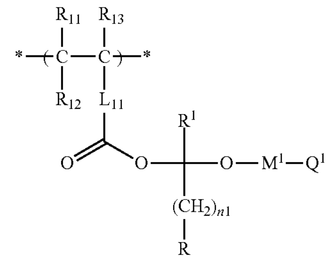

In formula (1), each of $R_{11}$, $R_{12}$ and $R_{13}$ independently represents a hydrogen atom, an alkyl group, a cycloalkyl group, a halogen atom, a cyano group or an alkoxycarbonyl group. $R_{12}$ may combine with $L_{11}$ to form a ring, and in this case, $R_{12}$ represents a single bond or an alkylene group.

$R^1$ represents a hydrogen atom or an alkyl group.

$L_{11}$ represents a single bond or a divalent linking group, and in the case of forming a ring with $R_{12}$, $L_{11}$ represents a trivalent linking group.

R represents an alkyl group, a cycloalkyl group, an aryl group, an aralkyl group, an alkoxy group, an acyl group or a heterocyclic group.

n1 represents an integer of 1 or more.

$M^1$ represents a single bond or a divalent linking group.

$Q^1$ represents an alkyl group, a cycloalkyl group, an aryl group or a hetrocyclic group.

When $M^1$ is a divalent linking group, $Q^1$ may combine with $M^1$ through a single bond or another linking group to form a ring.

The case where R combines with $Q^1$ or $M^1$ to form a ring is excluded.

The resin (P) is a resin having a structure where in the repeating unit (a) represented by formula (1), a carboxyl group as a polar group is protected by acetalization or ketalization with a leaving group capable of decomposing and leaving by an action of an acid.

In the case of performing negative development using an organic solvent-containing developer, the resin (P) is a resin capable of increasing in the polarity by the action of an acid to decrease the solubility for the organic solvent-containing developer, and in the case of performing positive development using an alkali developer, the resin (P) is a resin capable of increasing in the polarity by the action of an acid to increase the solubility for the alkali developer. Incidentally, in the case of performing positive development using an alkali developer, the carboxyl group as a polar group functions as an alkali-soluble group.

The actinic ray-sensitive or radiation-sensitive resin composition according to the present invention may be used for negative development (development where the exposed area remains as a pattern and the unexposed area is removed) or may be used for positive development (development where the exposed area is removed and the unexposed area remains as a pattern). That is, the actinic ray-sensitive or radiation-sensitive resin composition according to the present invention may be an actinic ray-sensitive or radiation-sensitive resin composition for organic solvent development, which is used for development using an organic solvent-containing developer, or may be an actinic ray-sensitive or radiation-sensitive resin composition for alkali development, which is used for development using an alkali developer. Here, the term "for organic solvent development" means usage where the composition is subjected to at least a step of performing development by using an organic solvent-containing developer, and the term "for alkali development" means usage where the composition is subjected to at least a step of performing development by using an alkali developer.

The actinic ray-sensitive or radiation-sensitive resin composition of the present invention is typically a resist composition and is preferably a negative resist composition (that is, a resist composition for organic solvent development), because high effects can be obtained in particular. Also, the composition according to the present invention is typically a chemical amplification resist composition.

The actinic ray-sensitive or radiation-sensitive resin composition of the present invention ensures that a fine pattern with a narrow space width (for example, a space width of the order of several tens of nm) can be formed at high resolution and high sensitivity and particularly in the formation of a fine pattern with a narrow space width, a pattern difficult to form by alkali development (for example, an isolated space pattern) can be formed at high resolution by organic solvent development. The reason therefor is not clearly known but is presumed as follows.

In the present invention, n1 in the group represented by —$(CH_2)_{n1}$— in formula (1) is an integer of 1 or more and the glass transition temperature (Tg) is thereby greatly increased, as a result, the resolution is considered to be enhanced. In addition, the carbon atom that reacts with an acid generated from an acid generator in the exposed area (that is, the carbon atom connected to $R^1$) readily achieves contact with the acid because at least one non-bulky methylene group intervenes between the carbon atom and R, and thanks to a hyperconjugation effect of a carbocation intermediate generated upon acid decomposition reaction, the stability is enhanced, so that the reaction by the acid can efficiently proceed, as a result, the sensitivity is considered to be enhanced.

Also, particularly in resolving a fine pattern, it is difficult to sufficiently enhance the resolution only by acid diffusion prevention based on the structure design of an acid generator, but by virtue of R being a specific group, Tg of the resin (P) is greatly increased and this is considered to bring about an enhancement of the resolution.

Furthermore, the repeating unit (a) represented by formula (1) decomposes by the action of an acid generated from an acid generator and generates a carboxylic acid to achieve a large dissolution contrast as compared with an acid-decomposable resin of a type generating a phenolic hydroxyl group or an alcoholic hydroxyl group and this is considered to bring about an effect that particularly in the formation of a fine pattern with a narrow space width, a pattern difficult to form by alkali development (for example, an isolated space pattern) can be formed at high resolution by organic solvent development.

[1] Resin (P)

In the present invention, the resin (P) has (a) a repeating unit represented by formula (1):

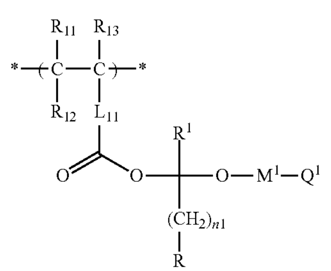

(1)

In formula (1), each of $R_{11}$, $R_{12}$ and $R_{13}$ independently represents a hydrogen atom, an alkyl group, a cycloalkyl group, a halogen atom, a cyano group or an alkoxycarbonyl group. $R_{12}$ may combine with $L_{11}$ to form a ring, and in this case, $R_{12}$ represents a single bond or an alkylene group.

$R^1$ represents a hydrogen atom or an alkyl group.

$L_{11}$ represents a single bond or a divalent linking group, and in the case of forming a ring with $R_{12}$, $L_{11}$ represents a trivalent linking group.

R represents an alkyl group, a cycloalkyl group, an aryl group, an aralkyl group, an alkoxy group, an acyl group or a heterocyclic group.

n1 represents an integer of 1 or more.

$M^1$ represents a single bond or a divalent linking group.

$Q^1$ represents an alkyl group, a cycloalkyl group, an aryl group or a heterocyclic group.

When $M^1$ is a divalent linking group, $Q^1$ may combine with $M^1$ through a single bond or another linking group to form a ring.

The case where R combines with $Q^1$ or $M^1$ to form a ring is excluded.

The alkyl group of $R_{11}$ to $R_{13}$ in formula (1) is preferably an alkyl group having a carbon number of 20 or less, such as methyl group, ethyl group, propyl group, isopropyl group, n-butyl group, sec-butyl group, hexyl group, 2-ethylhexyl group, octyl group and dodecyl group, which may have a substituent, more preferably an alkyl group having a carbon number of 8 or less, still more preferably an alkyl group having a carbon number of 3 or less.

As the alkyl group contained in the alkoxycarbonyl group, the same as the alkyl group in $R_{11}$ to $R_{13}$ is preferred.

The cycloalkyl group may be either monocyclic or polycyclic and is preferably a monocyclic cycloalkyl group having a carbon number of 3 to 8, such as cyclopropyl group, cyclopentyl group and cyclohexyl group, which may have a substituent.

The halogen atom includes fluorine atom, chlorine atom, bromine atom and iodine atom, with fluorine atom being preferred.

Preferred examples of the substituent on the groups above include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The carbon number of the substituent is preferably 8 or less.

In the case where $R_{12}$ is an alkylene group and forms a ring with $L_{11}$, the alkylene group is preferably an alkylene group having a carbon number of 1 to 8, such as methylene group, ethylene group, propylene group, butylene group, hexylene group and octylene group, more preferably an alkylene group having a carbon number of 1 to 4, still more preferably an alkylene group having a carbon number of 1 or 2. The ring formed by combining $R_{12}$ and $L_{11}$ is preferably a 5- or 6-membered ring.

In formula (1), each of $R_{11}$ and $R_{13}$ is preferably a hydrogen atom, an alkyl group or a halogen atom, more preferably a hydrogen atom, a methyl group, an ethyl group, a trifluoromethyl group (—$CF_3$), a hydroxymethyl group (—$CH_2$—OH), a chloromethyl group (—$CH_2$—Cl) or a fluorine atom (—F). $R_{12}$ is preferably a hydrogen atom, an alkyl group, a halogen atom or an alkylene group (forms a ring with $L_{11}$), more preferably a hydrogen atom, a methyl group, an ethyl group, a trifluoromethyl group (—$CF_3$), a hydroxymethyl group (—$CH_2$—OH), a chloromethyl group (—$CH_2$—Cl), a fluorine atom (—F), a methylene group (forms a ring with $L_{11}$) or an ethylene group (forms a ring with $L_{11}$).

In formula (1), the alkyl group of $R^1$ is preferably an alkyl group having a carbon number of 1 to 10, more preferably an alkyl group having a carbon number of 1 to 5, still more preferably an alkyl group having a carbon number of 1 to 3, yet still more preferably an alkyl group having a carbon number of 1 or 2 (that is, a methyl group or an ethyl group). Specific examples of the alkyl group of $R^1$ include a methyl group, an ethyl group, an n-propyl group, an isopropyl group, an n-butyl group, an isobutyl group, a sec-butyl group, and a tert-butyl group.

$R^1$ is preferably a hydrogen atom or an alkyl group having a carbon number of 1 to 5, more preferably a hydrogen atom or an alkyl group having a carbon number of 1 to 3, still more preferably a hydrogen atom, a methyl group or an ethyl group, yet still more preferably a hydrogen atom.

Examples of the divalent linking group represented by $L_{11}$ include an alkylene group, a divalent aromatic ring group, a cycloalkylene group, —COO-$L_1$-, —O-$L_1$-, and a group formed by combining two or more of these groups. Here, $L_1$ represents an alkylene group, a cycloalkylene group, a divalent aromatic ring group, or a group formed by combining an alkylene group and a divalent aromatic ring group.

The divalent aromatic ring group is preferably a 1,4-phenylene group, a 1,3-phenylene group, a 1,2-phenylene group or a 1,4-naphthylene group, more preferably a 1,4-phenylene group.

$L_{11}$ is preferably a single bond, a group represented by —COO-$L_1$-, or a group represented by -$L_2$-O—$CH_2$—, more preferably a single bond. Here, $L_2$ represents a divalent aromatic ring group.

In the cycloalkylene group of $L_{11}$ and $L_1$, the carbon constituting the ring (the carbon contributing to ring formation) may be a carbonyl carbon or may be replaced by a heteroatom such as oxygen atom, and also, an ester bond may be contained to form a lactone ring.

$L_1$ is preferably an alkylene group having a carbon number of 1 to 9, which may contain a heteroatom or a carbonyl bond, more preferably a methylene group, an ethylene group or a propylene group.

$L_2$ is preferably an arylene group having a carbon number of 1 to 10, more preferably a 1,4-phenylene group, a 1,3-phenylene group or a 1,2-phenylene group, still more preferably a 1,4-phenylene group or a 1,3-phenylene group.

In the case where $L_{11}$ combines with $R_{12}$ to form a ring, preferred examples of the trivalent linking group represented by $L_{11}$ include groups formed by removing one arbitrary hydrogen atom from specific examples above of the divalent linking group represented by $L_{11}$.

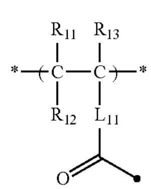

Specific examples of the partial structure (main chain moiety structure) represented by formula (1-1) in the repeating unit represented by formula (1) are illustrated below, but the present invention is not limited thereto.

In formulae, "*" indicates a bond connected to the oxygen atom of the acetal structure in formula (1).

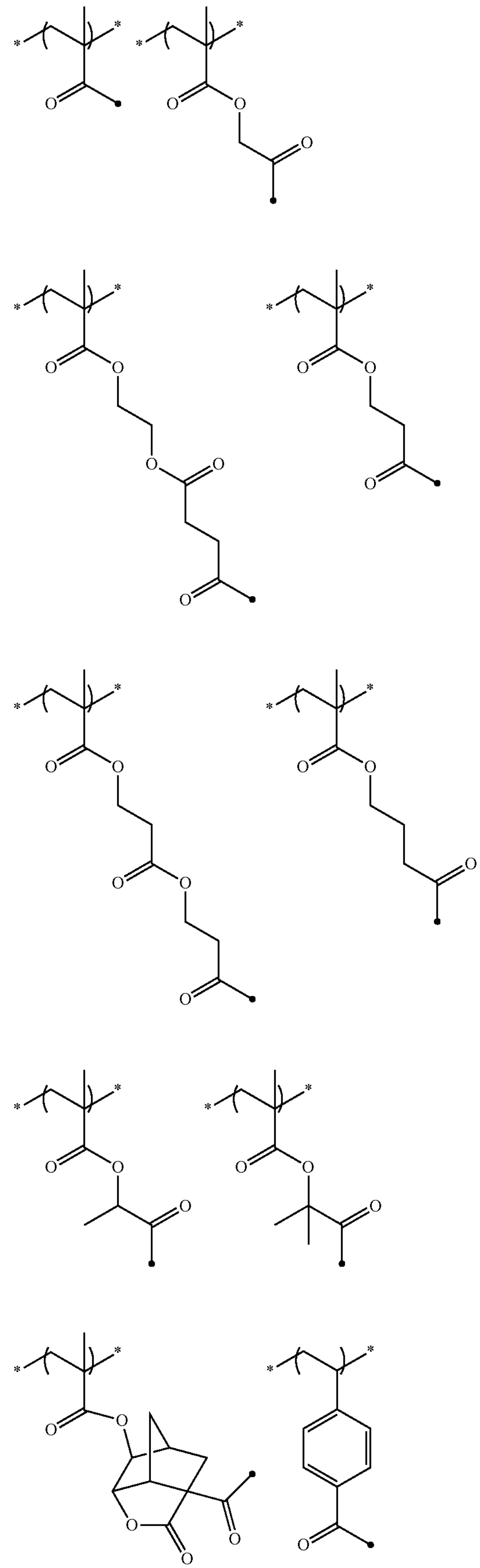

-continued
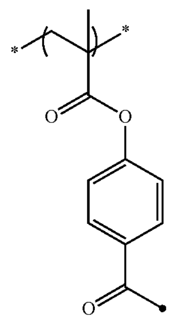
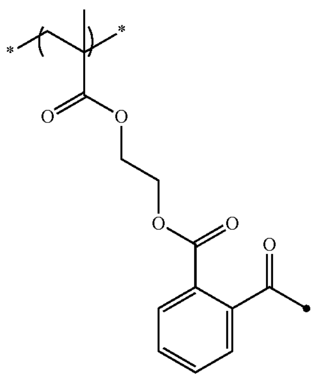
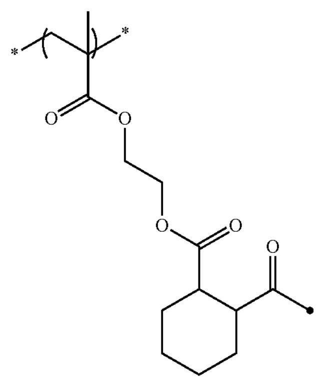
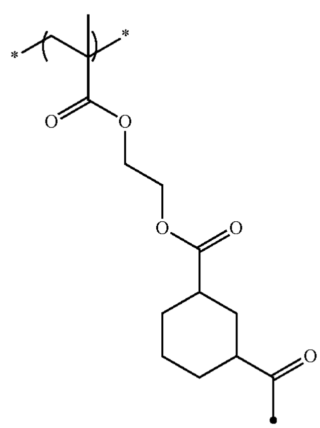
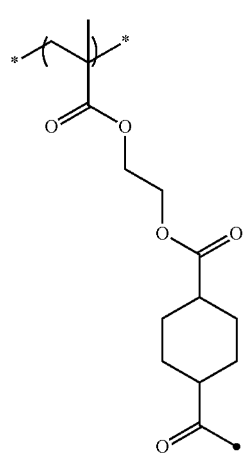
-continued
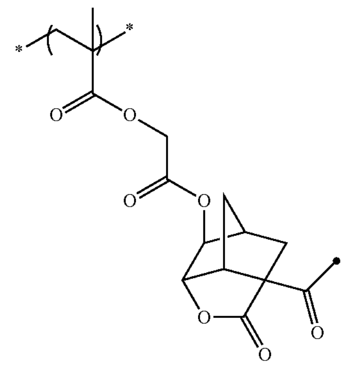
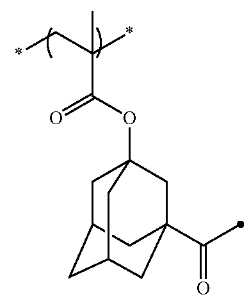
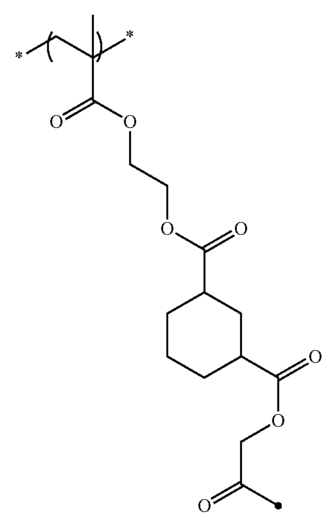
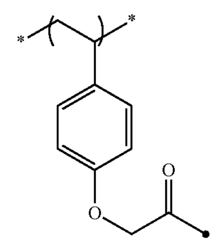
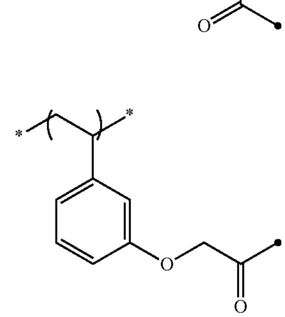
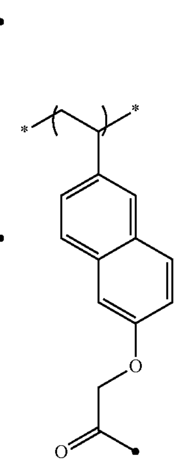

-continued

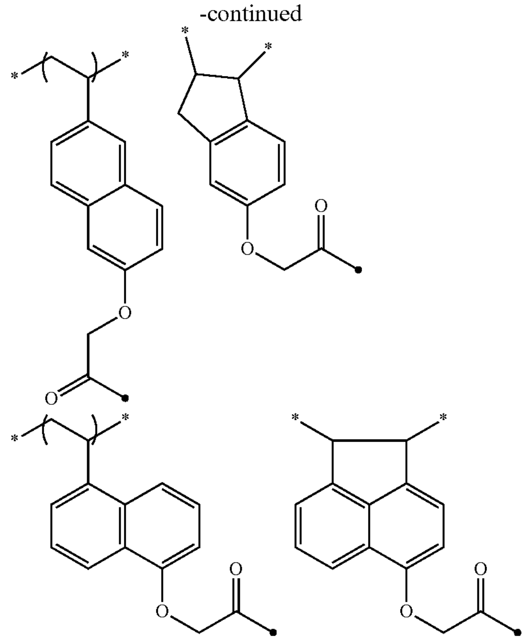

n1 preferably represents an integer of 1 to 5, more preferably an integer of 1 to 3, still more preferably 1 or 2, yet still more preferably 1. Thanks to this configuration, the resolution can be more enhanced.

R represents an alkyl group, a cycloalkyl group, an aryl group, an aralkyl group, an alkoxy group, an acyl group or a heterocyclic group.

The alkyl group of R is preferably an alkyl group having a carbon number of 1 to 15, more preferably an alkyl group having a carbon number of 1 to 10, still more preferably an alkyl group having a carbon number of 1 to 6. Specific examples of the alkyl group of R include a methyl group, an ethyl group, a propyl group, an isopropyl group, an n-butyl group, a sec-butyl group, a tert-butyl group, a neopentyl group, a hexyl group, a 2-ethylhexyl group, an octyl group, and a dodecyl group. The alkyl group of R is preferably a methyl group, an ethyl group, a propyl group, an isopropyl group or a tert-butyl group.

The cycloalkyl group of R may be monocyclic or polycyclic and is preferably a cycloalkyl group having a carbon number of 3 to 15, more preferably a cycloalkyl group having a carbon number of 3 to 10, still more preferably a cycloalkyl group having a carbon number of 3 to 6. Specific examples of the cycloalkyl group of R include a cyclopropyl group, a cyclobutyl group, a cyclopentyl group, a cyclohexyl group, a cycloheptyl group, a cyclooctyl group, a decahydronaphthyl group, a cyclodecyl group, a 1-adamantyl group, a 2-adamantyl group, a 1-norbornyl group, and a 2-norbornyl group. The cycloalkyl group of R is preferably a cyclopropyl group, a cyclopentyl group or a cyclohexyl group.

The aryl group of R is preferably an aryl group having a carbon number of 6 to 15, more preferably an aryl group having a carbon number of 6 to 12, and encompasses a structure where a plurality of aromatic rings are connected to each other through a single bond (such as biphenyl group and terphenyl group). Specific examples of the aryl group of R include a phenyl group, a naphthyl group, an anthranyl group, a biphenyl group, and a terphenyl group. The aryl group of R is preferably a phenyl group, a naphthyl group or a biphenyl group.

The aralkyl group of R is preferably an aralkyl group having a carbon number of 6 to 20, more preferably an aralkyl group having a carbon number of 7 to 12. Specific examples of the aralkyl group of R include a benzyl group, a phenethyl group, a naphthylmethyl group, and a naphthylethyl group.

Examples of the alkyl group moiety of the alkoxy group for R include those recited above for the alkyl group of R. This alkoxy group is preferably a methoxy group, an ethoxy group, an n-propoxy group or an n-butoxy group.

The acyl group of R includes, for example, a linear or branched acyl group having a carbon number of 2 to 12, such as acetyl group, propionyl group, n-butanoyl group, i-butanoyl group, n-heptanoyl group, 2-methylbutanoyl group, 1-methylbutanoyl group and tert-heptanoyl group.

The heterocyclic group of R is preferably a heterocyclic group having a carbon number of 6 to 20, more preferably a heterocyclic group having a carbon number of 6 to 12. Specific examples of the heterocyclic group of R include a pyridyl group, a pyrazyl group, a tetrahydrofuranyl group, a tetrahydropyranyl group, a tetrahydrothiophene group, a piperidyl group, a piperazyl group, a furanyl group, a pyranyl group, and a chromanyl group.

The alkyl group of $R^1$ and the alkyl group, cycloalkyl group, aryl group, aralkyl group, alkoxy group, acyl group and heterocyclic group of R may further have a substituent.

Examples of the substituent which the alkyl group of $R^1$ and R may further have include a cycloalkyl group, an aryl group, an amino group, an amido group, a ureido group, a urethane group, a hydroxy group, a carboxy group, a halogen atom, an alkoxy group, an aralkyloxy group, a thioether group, an acyl group, an acyloxy group, an alkoxycarbonyl group, a cyano group, and a nitro group.

Examples of the substituent which the cycloalkyl group of R may further have include an alkyl group and the groups described above as specific examples of the substituent which the alkyl group may further have.

Incidentally, each of the carbon number of the alkyl group and the carbon number of the substituent which the cycloalkyl group may further have is preferably from 1 to 8.

Examples of the substituent which the aryl group, aralkyl group and heterocyclic group of R may further have include a nitro group, a halogen atom such as fluorine atom, a carboxyl group, a hydroxyl group, an amino group, a cyano group, an alkyl group (preferably having a carbon number of 1 to 15), an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), and an alkoxycarbonyloxy group (preferably having a carbon number of 2 to 7).

R is described in more detail.

In formula (1), R is more preferably a group represented by $—C(R^{21})(R^{22})(R^{23})$.

In this formula, each of $R^{21}$ to $R^{23}$ independently represents a hydrogen atom, an alkyl group, a cycloalkyl group, an aryl group, an aralkyl group or a heterocyclic group, and each of at least two members of $R^{21}$ to $R^{23}$ independently represents an alkyl group, a cycloalkyl group, an aryl group, an aralkyl group or a heterocyclic group.

At least two members of $R^{21}$ to $R^{23}$ may combine with each other to form a ring. However, the case where at least one of $R^{21}$ to $R^{23}$ combines with $M^1$ or $Q^1$ to form a ring is excluded.

When R in formula (1) is a group represented by $—C(R^{21})(R^{22})(R^{23})$, the bulkiness is increased and the glass transition temperature (Tg) of the resin (P) becomes higher. As a result, in the formation of a fine line pattern, disconnection of a line is less likely to occur, and the resolution can be more enhanced.

Specific examples and preferred examples of the alkyl group of $R^{21}$ to $R^{23}$ are the same as specific examples and preferred examples of the alkyl group described above for R.

As described above, each of at least two members of $R^{21}$ to $R^{23}$ independently represents an alkyl group, a cycloalkyl group, an aryl group, an aralkyl group or a heterocyclic group, and it is preferred that all of $R^{21}$ to $R^{23}$ represent an alkyl group, a cycloalkyl group, an aryl group, an aralkyl group or a heterocyclic group.

Specific examples and preferred examples of the cycloalkyl group of $R^{21}$ to $R^{23}$ are the same as specific examples and preferred examples of the cycloalkyl group described above for R.

Specific examples and preferred examples of the aryl group of $R^{21}$ to $R^{23}$ are the same as specific examples and preferred examples of the aryl group described above for R.

Specific examples and preferred examples of the aralkyl group of $R^{21}$ to $R^{23}$ are the same as specific examples and preferred examples of the aralkyl group described above for R.

Specific examples and preferred examples of the heterocyclic group of $R^{21}$ to $R^{23}$ are the same as specific examples and preferred examples of the heterocyclic group described above for R.

The alkyl group, cycloalkyl group, aryl group, aralkyl group and heterocyclic group of $R^{21}$ to $R^{23}$ may further have a substituent.

Specific examples of the substituent which the alkyl group of $R^{21}$ to $R^{23}$ may further have are the same as specific examples of the substituent which the alkyl group of R may further have.

Specific examples of the substituent which the cycloalkyl group of $R^{21}$ to $R^{23}$ may further have include an alkyl group and the groups described above as specific examples of the substituent which the alkyl group may further have.

Each of the carbon number of the alkyl group and the carbon number of the substituent which the cycloalkyl group may further have is preferably from 1 to 8.

Specific examples and preferred examples of the substituent which the aryl group, aralkyl group and heterocyclic group of $R^{21}$ to RU may further have are the same as specific examples and preferred examples of the substituent which the aryl group, aralkyl group and heterocyclic group of R may further have.

At least two of $R^{21}$ to $R^{23}$ may form a ring together.

In the case where at least two of $R^{21}$ to $R^{23}$ combine with each other to form a ring, examples of the ring formed include a cyclopentane ring, a cyclohexane ring, an adamantane ring, a norbornene ring, and a norbornane ring. These rings may have a substituent, and examples of the substituent which the ring may have include an alkyl group and the groups described above as specific examples of the substituent which the alkyl group may further have.

In the case where all of $R^{21}$ to $R^{23}$ combine with each other to form a ring, examples of the ring formed include an adamantane ring, a norbornane ring, a norbornene ring, a bicyclo[2,2,2]octane ring, and a bicyclo[3,1,1]heptane ring. Among these, an adamantane ring is preferred. These rings may have a substituent, and examples of the substituent which the ring may have include an alkyl group and the groups described above as specific examples of the substituent which the alkyl group may further have.

From the standpoint that the compound (P) can have a high glass transition temperature and the resolution can be enhanced, it is preferred that each of $R^{21}$ to $R^{23}$ is independently an alkyl group.

The carbon number of the group represented by —$C(R^{21})(R^{22})(R^{23})$ in formula (1) is preferably 15 or less. By satisfying this condition, the resist film obtained can have sufficient affinity for the developer and the exposed area can be more unfailingly removed by the developer (that is, adequate developability can be obtained).

Specific examples of R (preferably the group represented by —$C(R^{21})(R^{22})(R^{23})$) are illustrated below, but the present invention is not limited thereto. In specific examples, * indicates a bond connected to the group represented by —$(CH_2)_{n1}$— in formula (1).

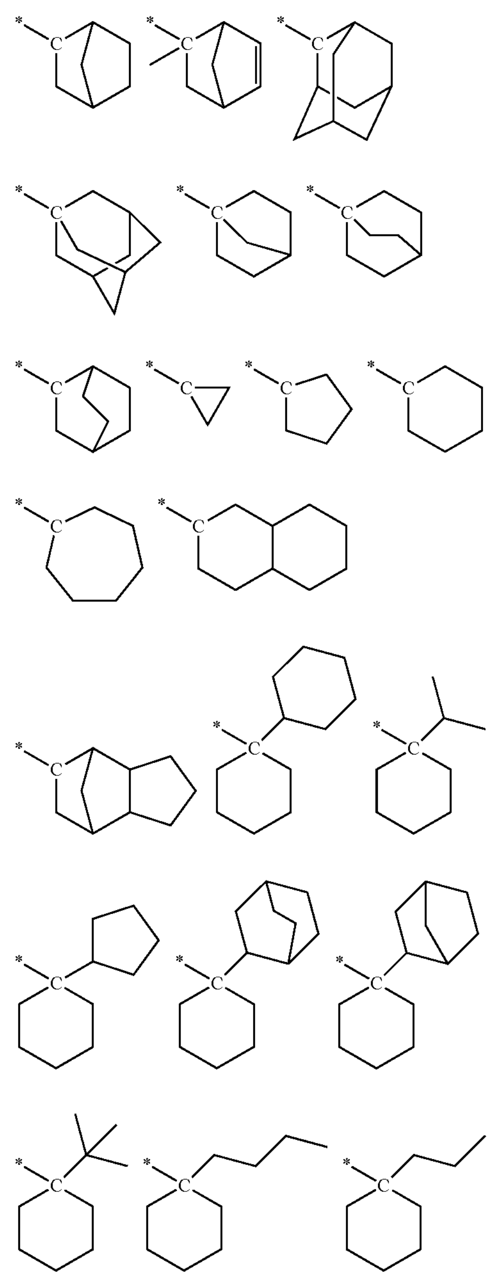

-continued

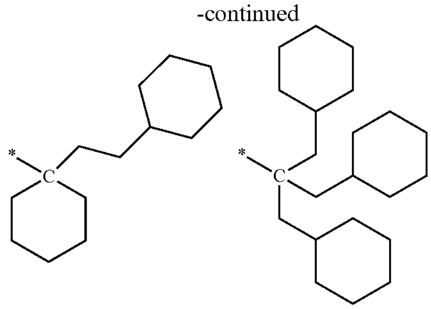

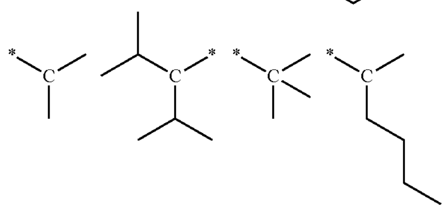

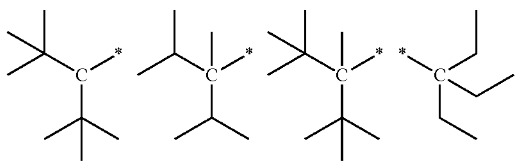

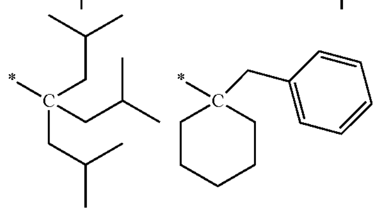

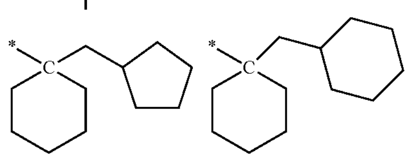

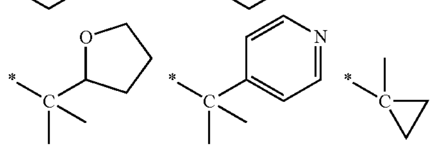

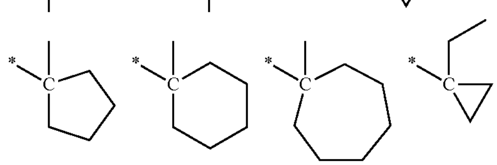

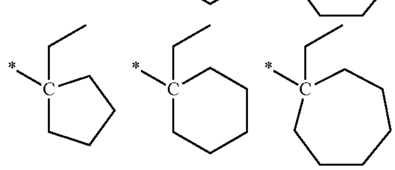

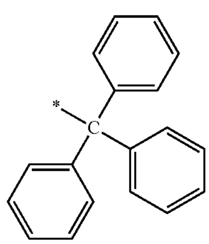

The divalent linking group of $M^1$ is, for example, an alkylene group (preferably an alkylene group having a carbon number of 1 to 8, such as methylene group, ethylene group, propylene group, butylene group, hexylene group or octylene group), a cycloalkylene group (preferably a cycloalkylene group having a carbon number of 3 to 15, such as cyclopentylene group or cyclohexylene group), —S—, —O—, —CO—, —CS—, $—SO_2—$, $—N(R_0)—$, or a combination of two or more thereof, and a linking group having a total carbon number of 20 or less is preferred. Here, $R_0$ is a hydrogen atom or an alkyl group (for example, an alkyl group having a carbon number of 1 to 8, and specific examples thereof include a methyl group, an ethyl group, a propyl group, an n-butyl group, a sec-butyl group, a hexyl group, and an octyl group).

$M^1$ is preferably a single bond, an alkylene group or a divalent linking group formed by a combination of an alkylene group and at least one of —O—, —CO—, —CS— and $—N(R_0)—$, more preferably a single bond, an alkylene group or a divalent linking group formed by a combination of an alkylene group and —O—. Here, $R_0$ has the same meaning as $R_0$ above.

$M^1$ may further have a substituent, and examples of the substituent which $M^1$ may further have are the same as those of the substituent which the alkyl group of $R^{21}$ above may have.

Specific examples and preferred examples of the alkyl group of $Q^1$ are the same, for example, as those described for the alkyl group of $R^{21}$ above.

The cycloalkyl group of $Q^1$ may be monocyclic or polycyclic. The carbon number of the cycloalkyl group is preferably from 3 to 10. Examples of the cycloalkyl group include a cyclopropyl group, a cyclobutyl group, a cyclopentyl group, a cyclohexyl group, a cycloheptyl group, a cyclooctyl group, a 1-adamantyl group, a 2-adamantyl group, a 1-norbornyl group, a 2-norbornyl group, a bornyl group, an isobornyl group, a 4-tetracyclo[6.2.1.1$^{3,6}$.0$^{2,7}$]dodecyl group, a 8-tricyclo[5.2.1.0$^{2,6}$]decyl group, and a 2-bicyclo[2.2.1]heptyl group. Among these, a cyclopentyl group, a cyclohexyl group, a 2-adamantyl group, a 8-tricyclo[5.2.1.0$^{2,6}$]decyl group and a 2-bicyclo[2.2.1]heptyl group are preferred.

Specific examples and preferred examples of the aryl group of $Q^1$ are the same, for example, as those described for the aryl group of $R^{21}$ above.

Specific examples and preferred examples of the heterocyclic group of $Q^1$ are the same, for example, as those described for the heterocyclic group of $R^{21}$ above.

The alkyl group, cycloalkyl group, aryl group and heterocyclic group of $Q^1$ may have a substituent, and examples of the substituent include an alkyl group, a cycloalkyl group, a cyano group, a halogen atom, a hydroxyl group, an alkoxy group, a carboxyl group, and an alkoxycarbonyl group.

The group represented by $-M^1-Q^1$ is preferably an unsubstituted alkyl group, a cycloalkyl group-substituted alkyl group, a cycloalkyl group, an aralkyl group, an aryloxyalkyl group or a heterocyclic group. Specific examples and preferred examples of the unsubstituted alkyl group as the group represented by $-M^1-Q^1$, the "cycloalkyl group" and the cycloalkyl group in the "cycloalkyl group-substituted alkyl group" as the group represented by $-M^1-Q^1$, and the aryl group in the "aralkyl group (arylalkyl group)" and "aryloxyalkyl group" as the group represented by $-M^1-Q^1$ are the same as those described for the alkyl group, the cycloalkyl group and the aryl group of $Q^1$, respectively.

Specific examples and preferred examples of the alkyl moiety in the "cycloalkyl group-substituted alkyl group", "aralkyl group (arylalkyl group)" and "aryloxyalkyl group" as the group represented by $-M^1-Q^1$ are the same as those described for the alkylene group of $M^1$.

Specific examples and preferred examples of the heterocyclic group as the group represented by -$M^1$-$Q^1$ are the same as those described for the heterocyclic group of $Q^1$.

Specific examples of the group represented by -$M^1$-$Q^1$ include a methyl group, an ethyl group, an isopropyl group, a cyclopentyl group, a cyclohexyl group, a cyclohexylethyl group, a 2-adamantyl group, a 8-tricyclo[5.2.1.0$^{2,6}$]decyl group, a 2-bicyclo[2.2.1]heptyl group, a benzyl group, a 2-phenethyl group, and a 2-phenoxyethylene group.

Also, as described above, when $M^1$ is a divalent linking group, $Q^1$ may combine with $M^1$ through a single bond or another linking group to form a ring. The another linking group includes an alkylene group (preferably an alkylene group having a carbon number of 1 to 3), and the ring formed is preferably a 5- or 6-membered ring.

Specific examples of the group represented by -$M^1$-$Q^1$ are illustrated below, but the present invention is not limited thereto. In specific examples, * indicates a bond connected to the oxygen atom in formula (1), Me stands for a methyl group, Et stands for an ethyl group, and Pr stands for an n-propyl group.

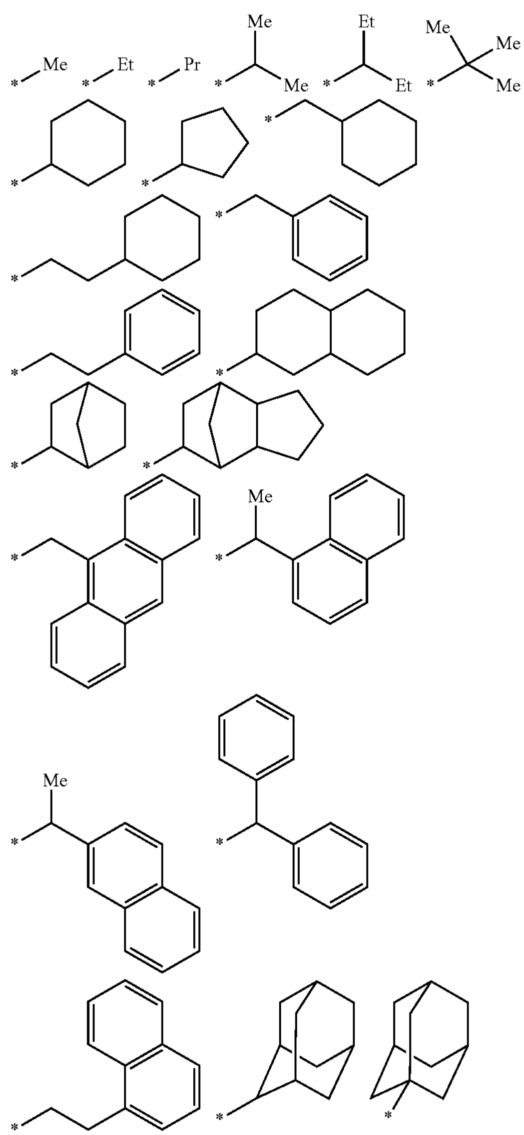

-continued

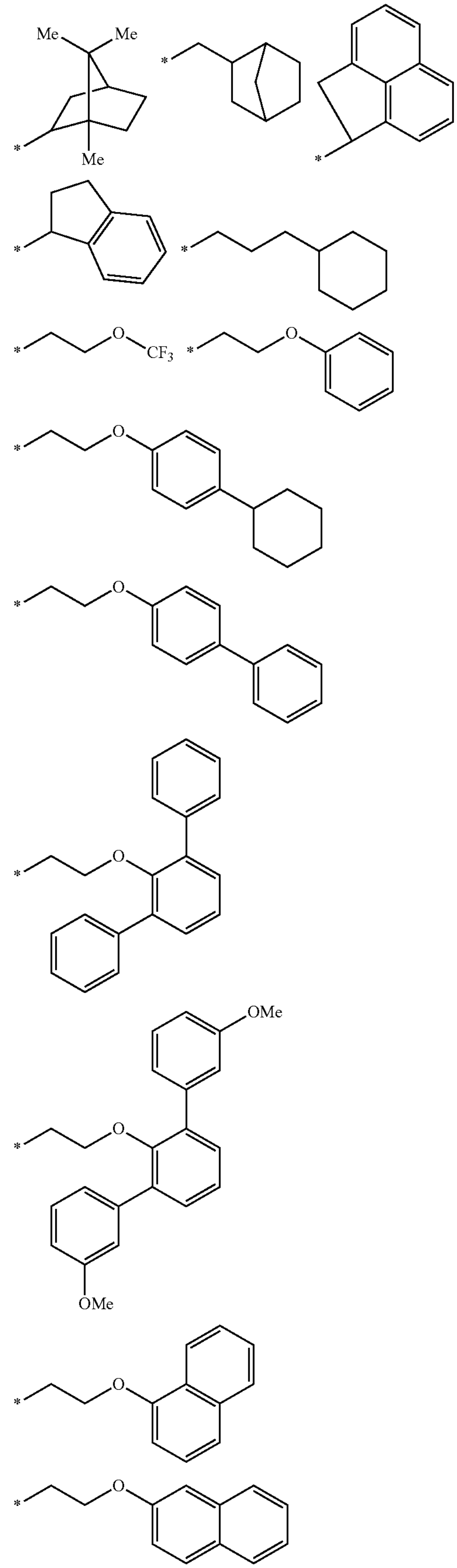

-continued

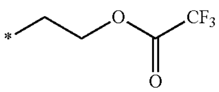
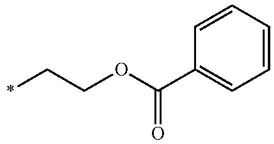
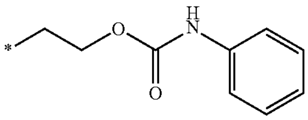
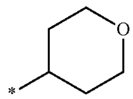
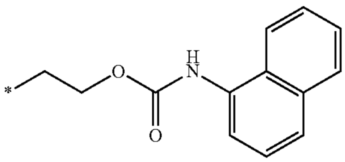
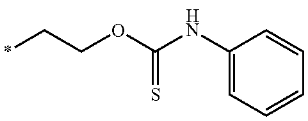
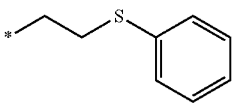
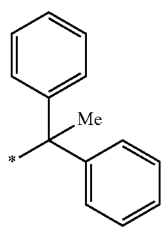
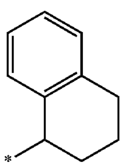
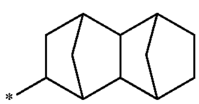
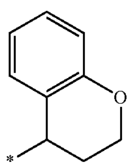
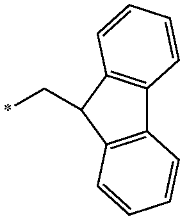
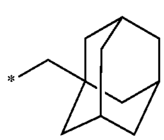
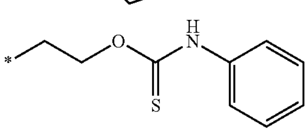
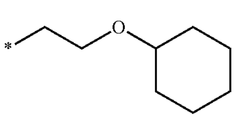
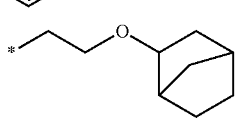
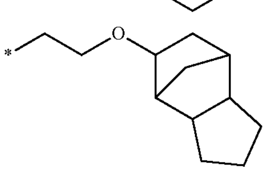
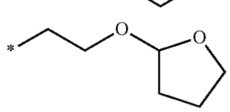
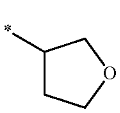
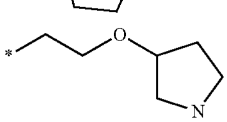
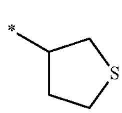

-continued

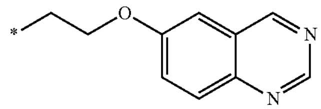
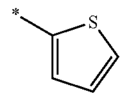
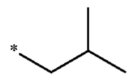

From the standpoint of sufficiently achieving sensitivity enhancement, as described above, the case where R combines with $M^1$ or $Q^1$ to form a ring is excluded. For example, repeating units having structures shown below are not encompassed by the repeating unit represented by formula (1). The reason therefor is because in the structures shown below, an alkyl group extending from the carbon atom sandwiched between two oxygen atoms is fixed as a ring structure and is thereby reduced in the function as a leaving group (enhanced in the stability) and in turn, the sensitivity decreases.

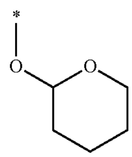
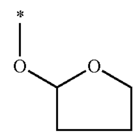
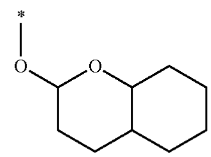
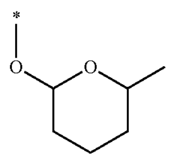
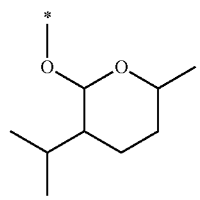

Specific examples of the portion except for the main chain moiety structure represented by formula (1-1), that is, the portion of an acetal structure-containing leaving group, in the repeating unit represented by formula (1) are illustrated blow, but the present invention is not limited thereto. In specific examples, * indicates a bond connected to the oxygen atom of an ester bond connected to $L_{11}$ in formula (1).

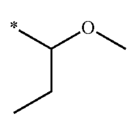
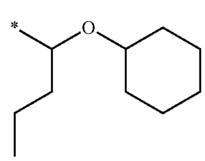
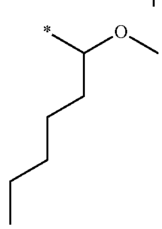
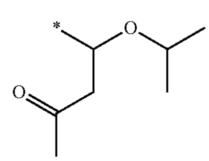
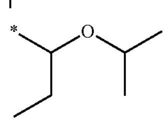
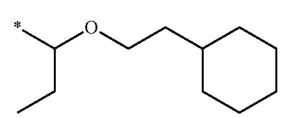

-continued
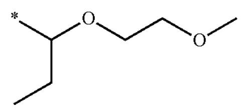
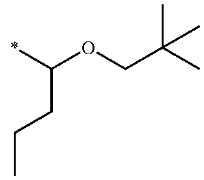
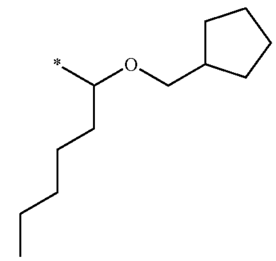
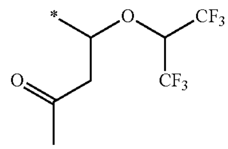
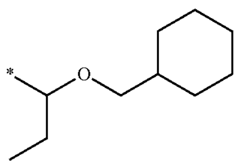
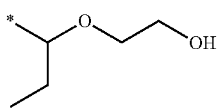
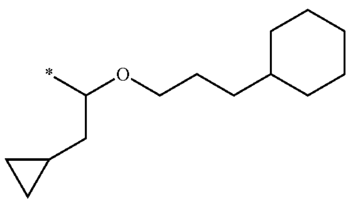
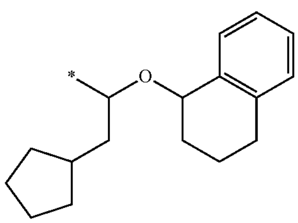
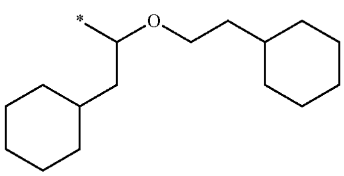
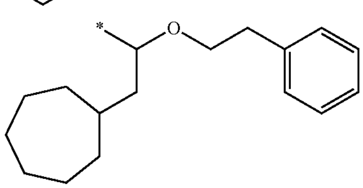
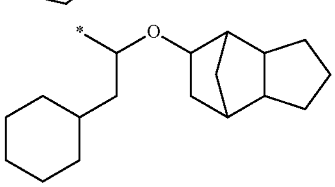
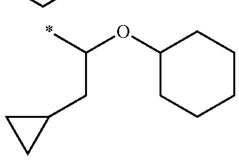
-continued
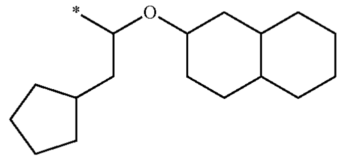
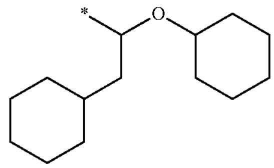
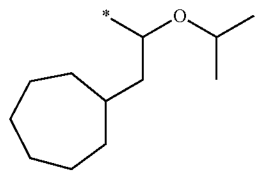
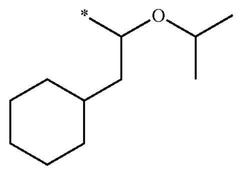
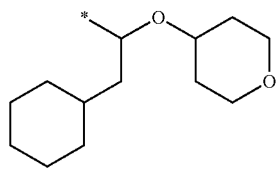
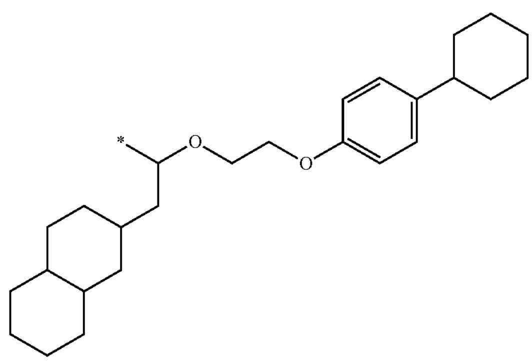
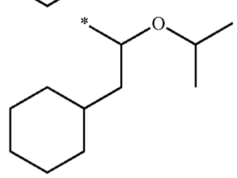
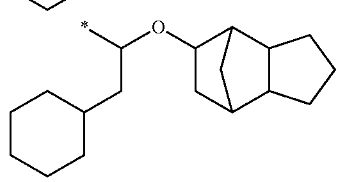
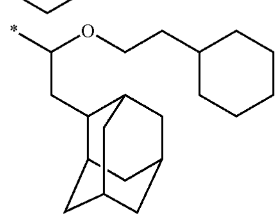
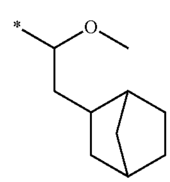

-continued
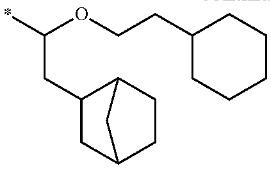
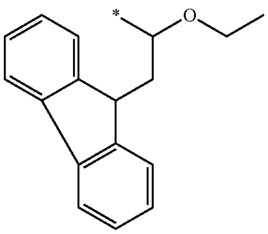
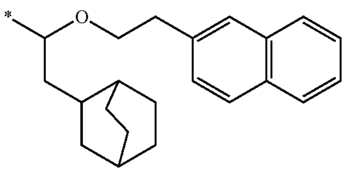
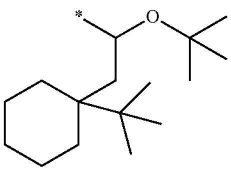
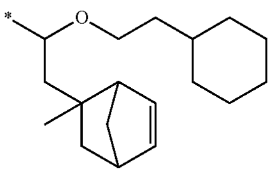
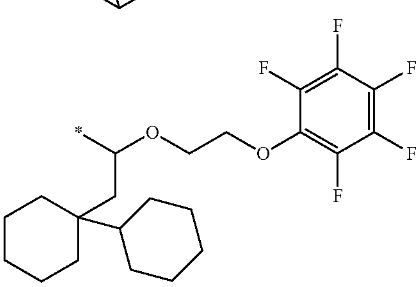
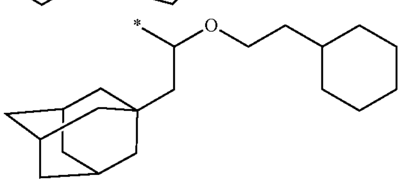
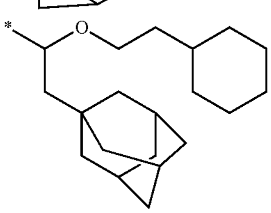
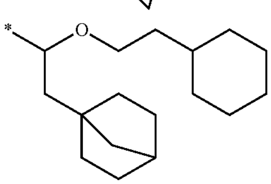
-continued
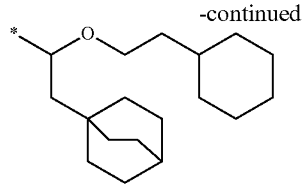
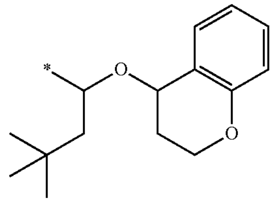
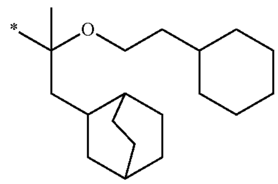
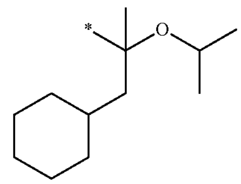
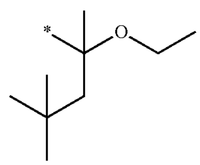
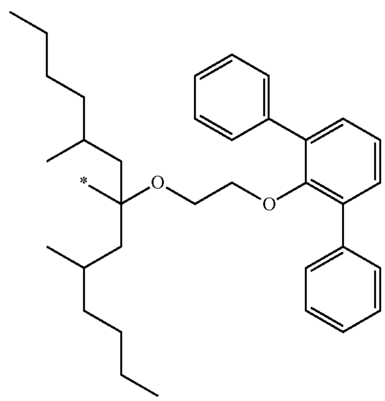
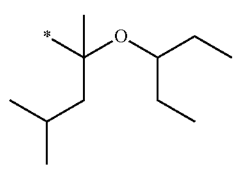
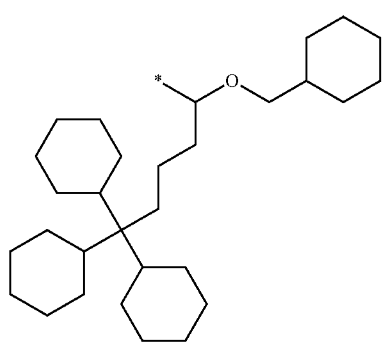

-continued
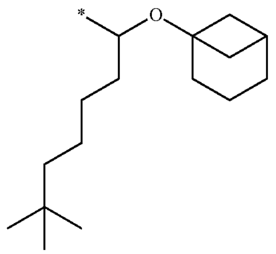
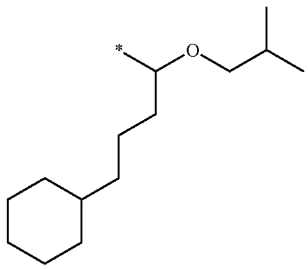
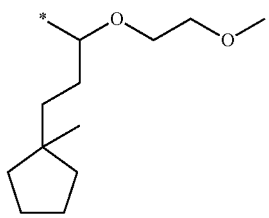
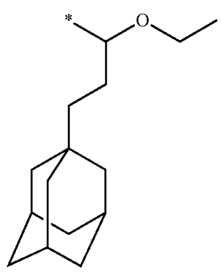
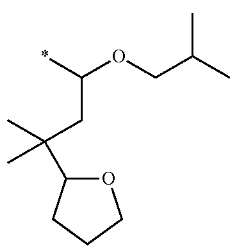
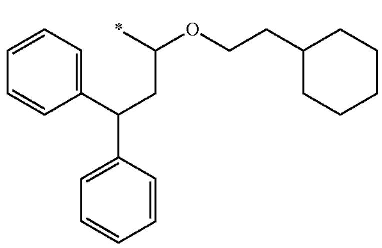
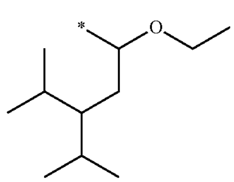
-continued
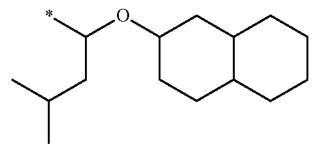
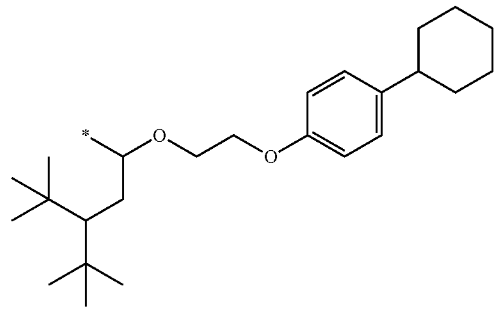
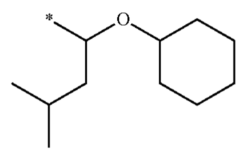
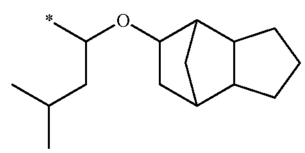
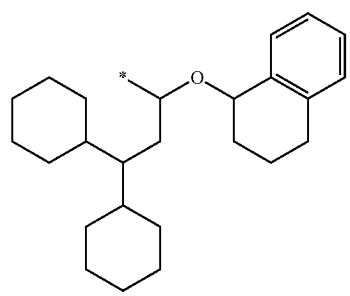
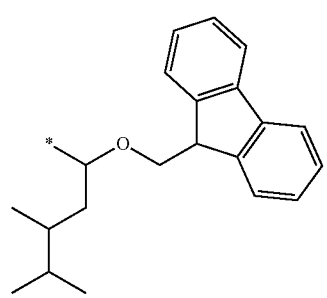
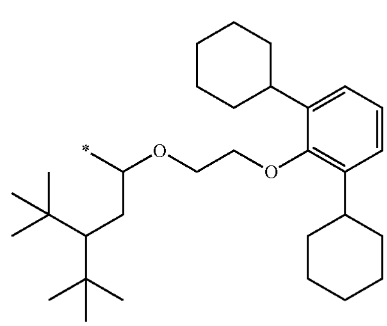

-continued
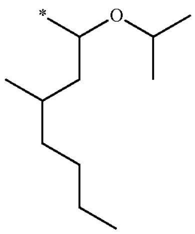
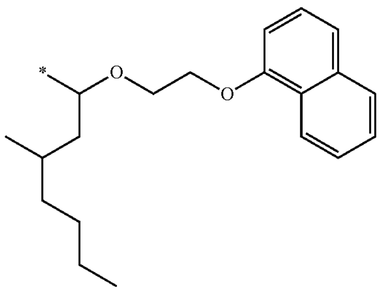
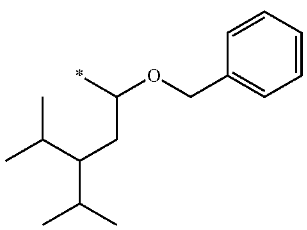
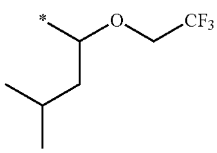
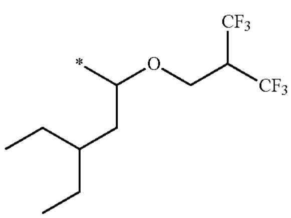
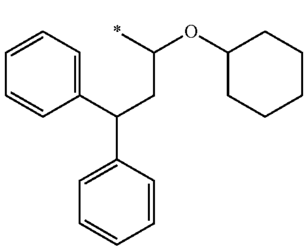
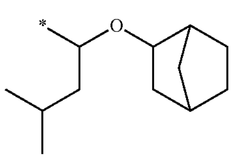
-continued
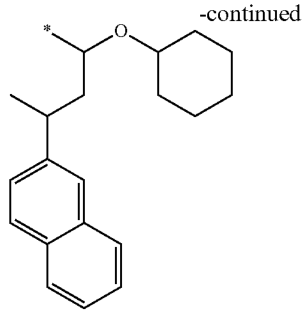
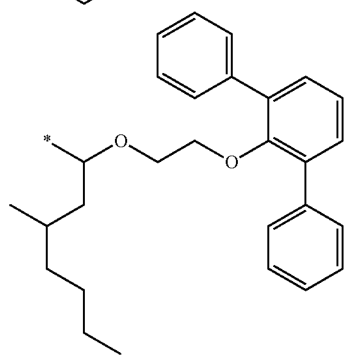
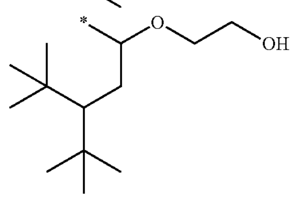
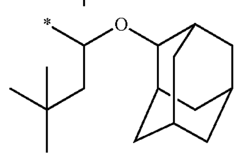
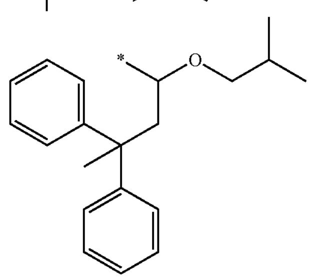
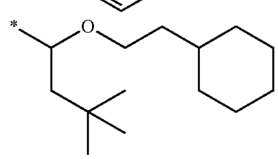
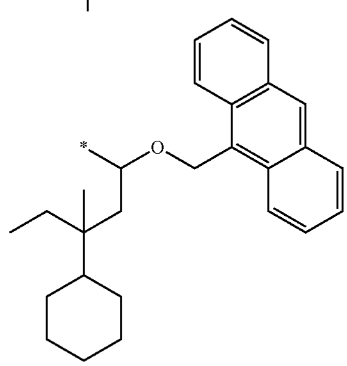

-continued
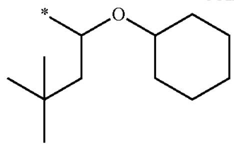
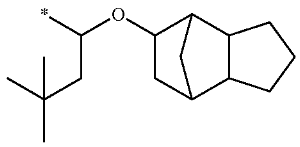
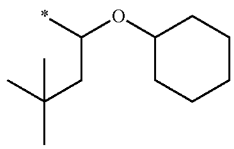
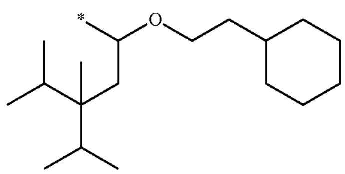
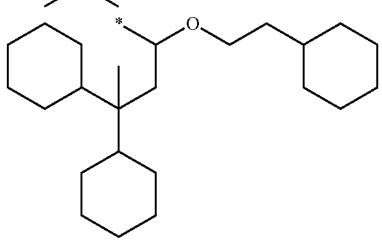
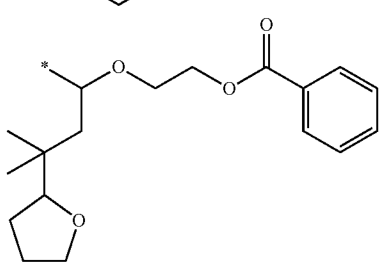
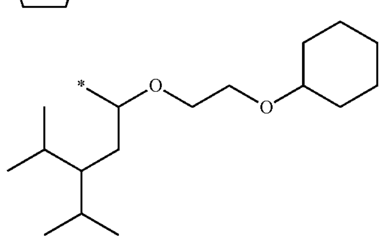
Specific examples of the repeating unit (a) represented by formula (1) are illustrated below, but the present invention is not limited thereto.
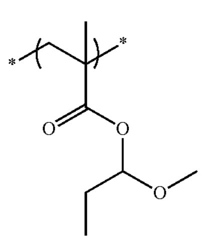
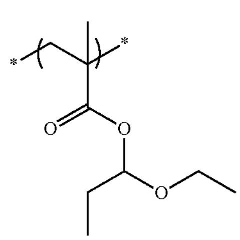
-continued
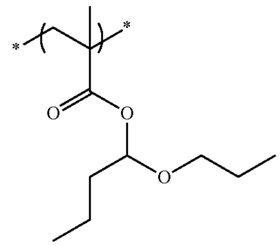
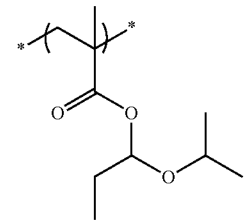
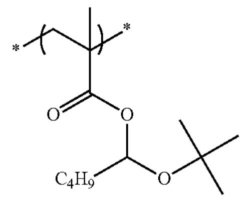
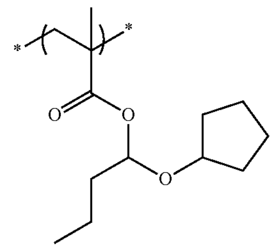
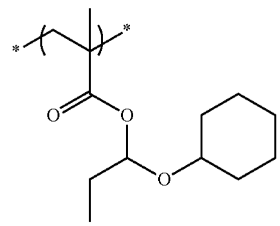
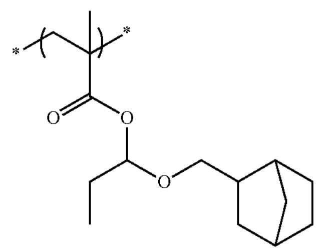
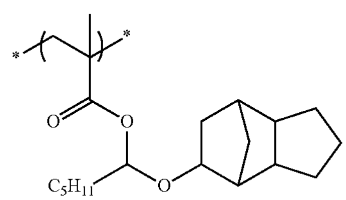
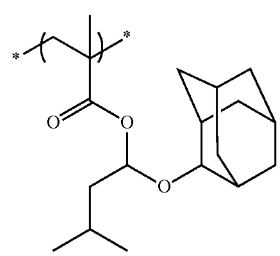
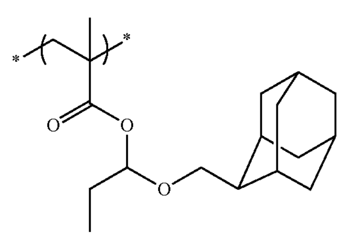

-continued
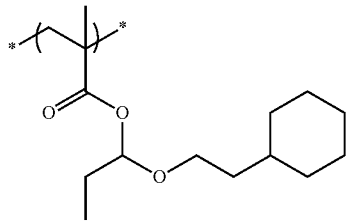
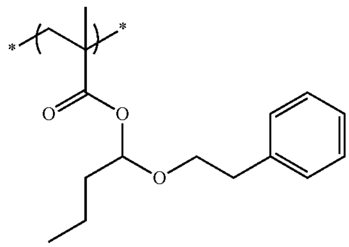
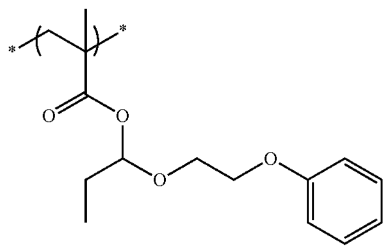
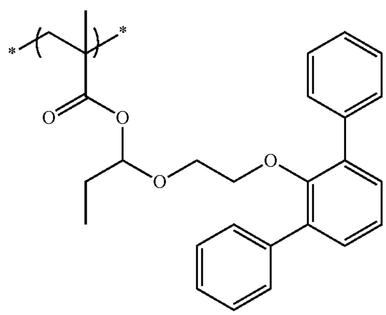
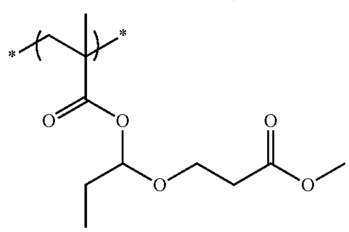
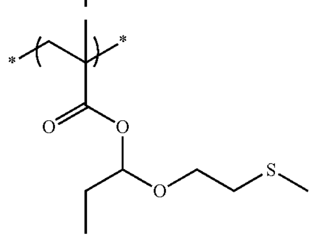
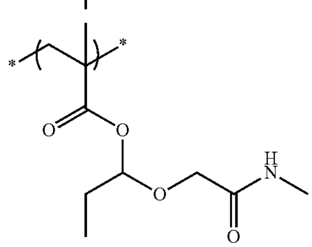
-continued
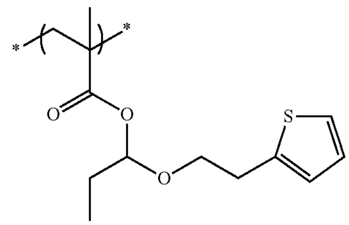
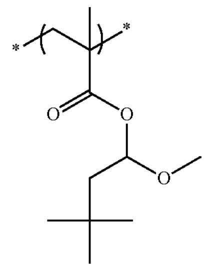
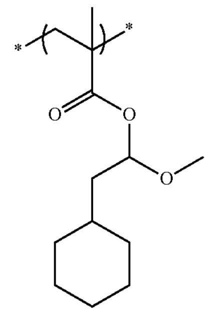
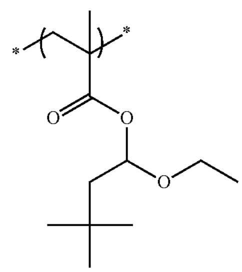
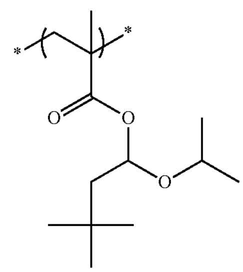
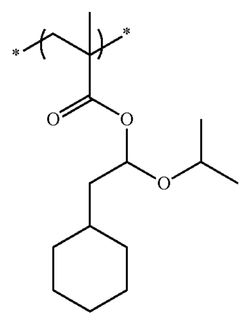
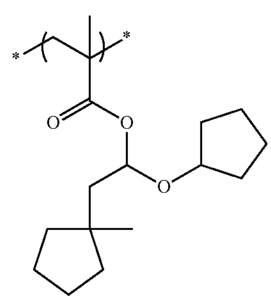
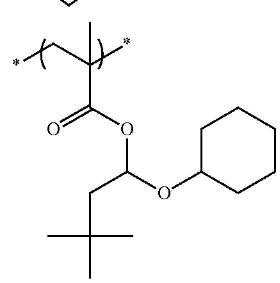

-continued
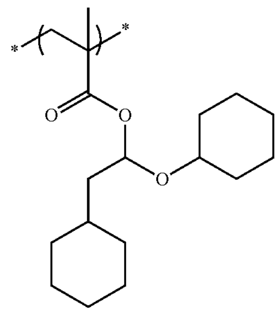
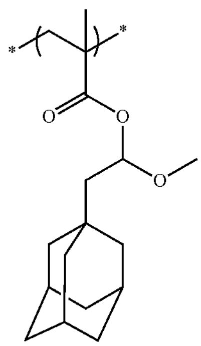
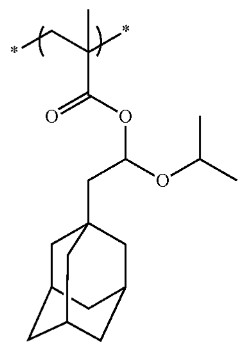
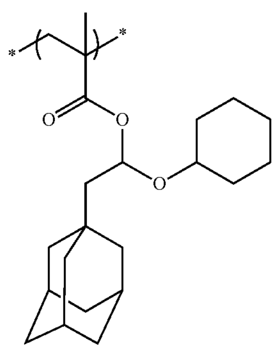
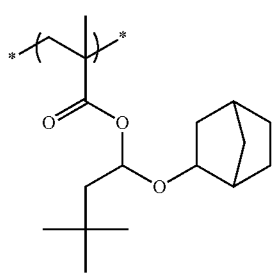
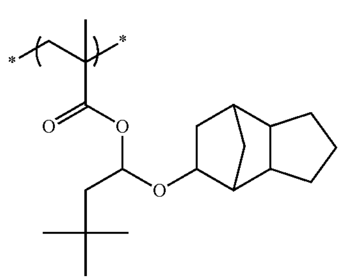
-continued
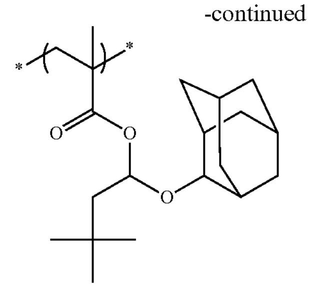
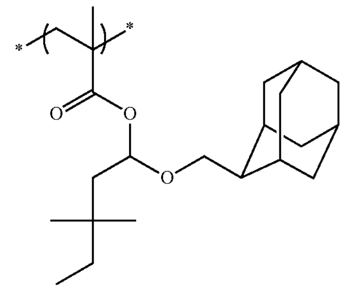
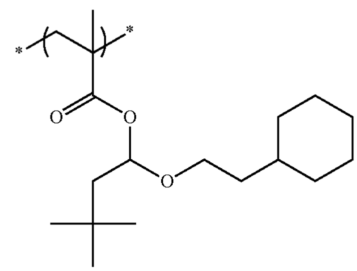
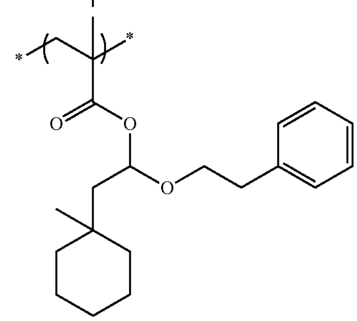
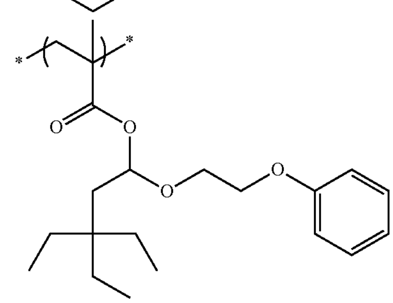
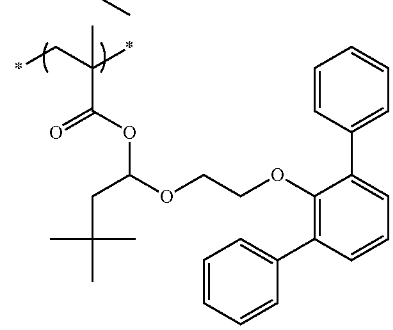

-continued
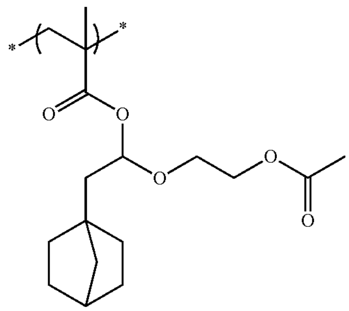
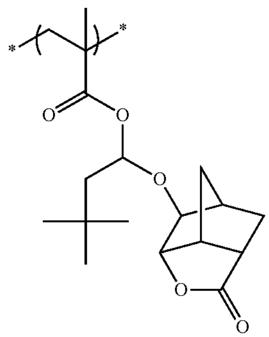
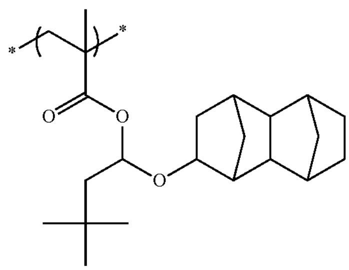
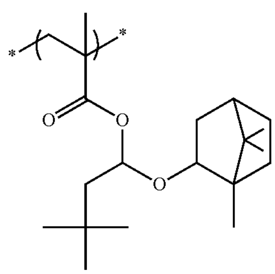
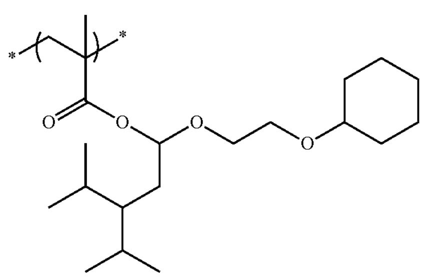
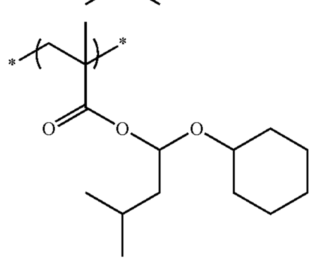
-continued
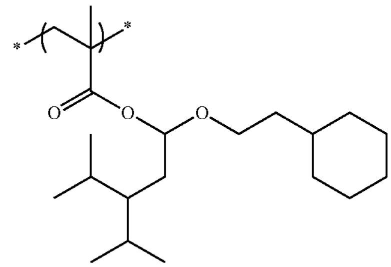
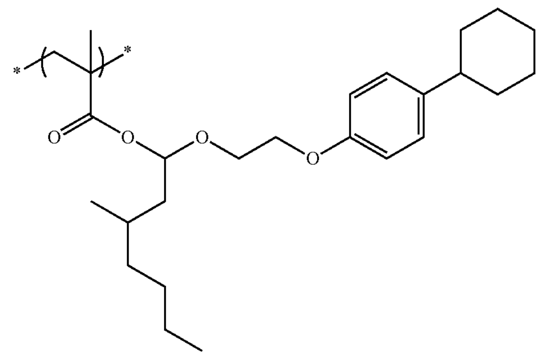
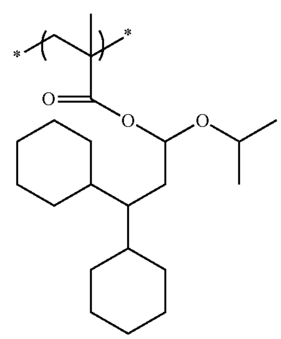
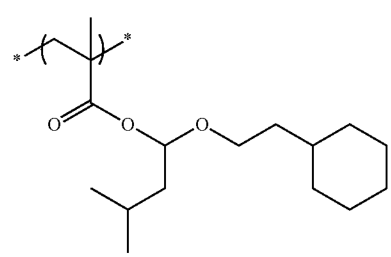
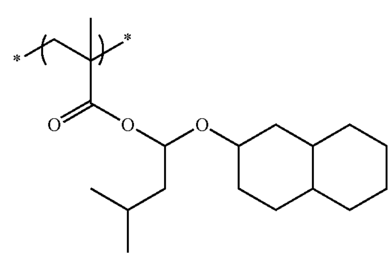

-continued
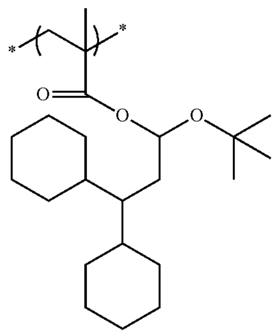
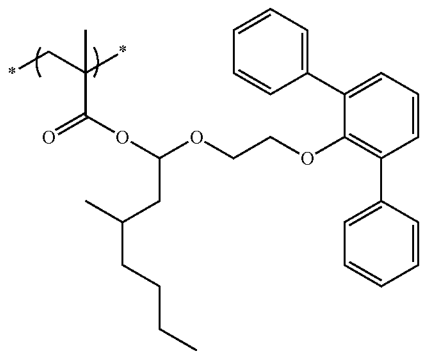
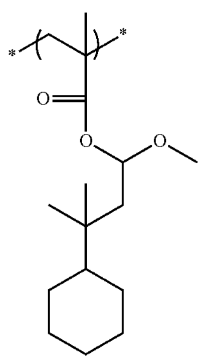
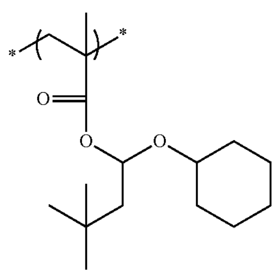
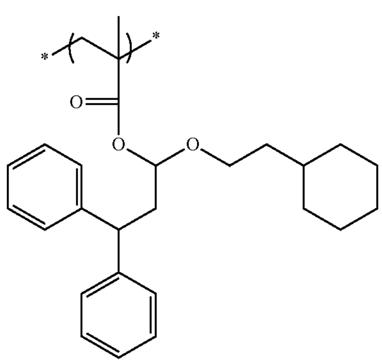
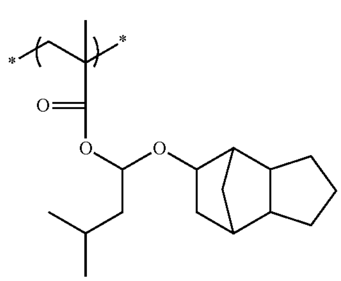
-continued
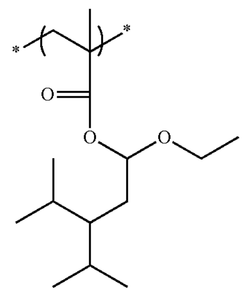
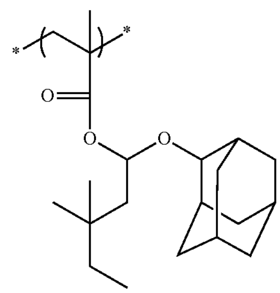
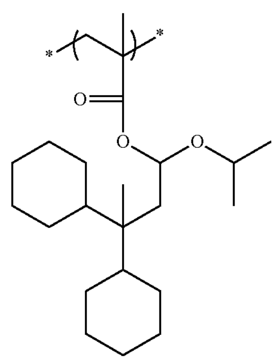
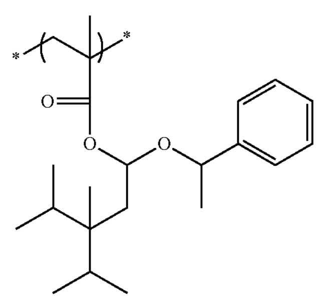
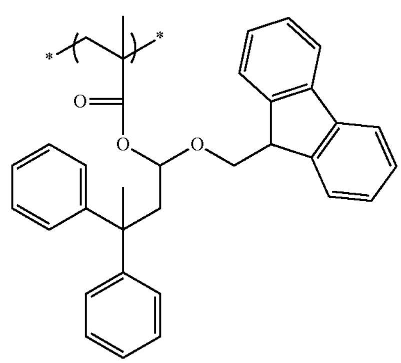

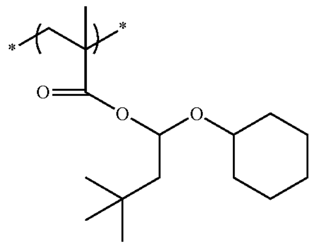
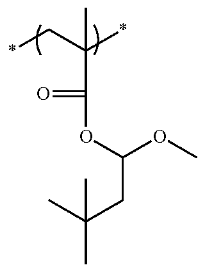
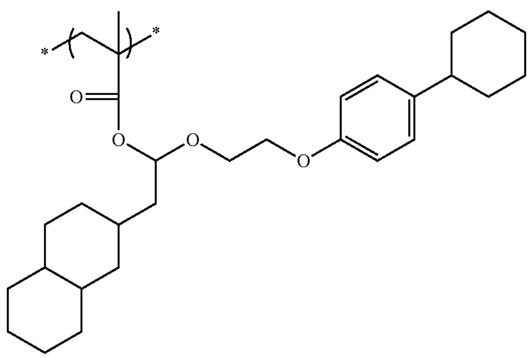
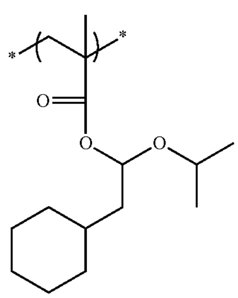
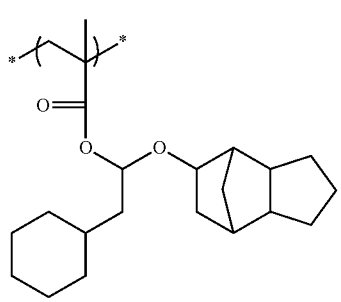
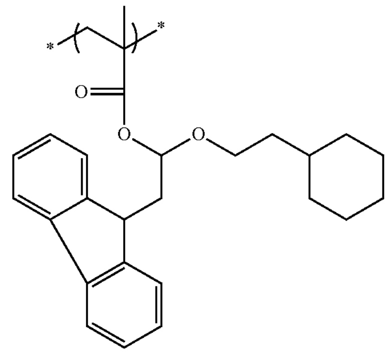
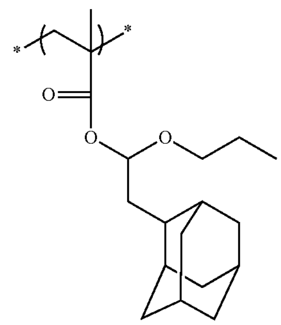
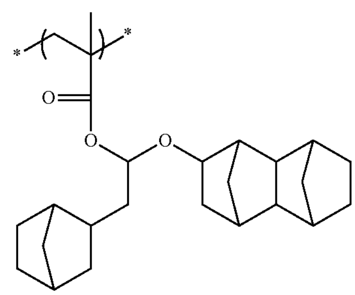
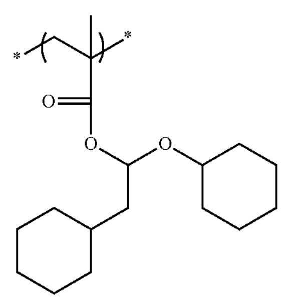
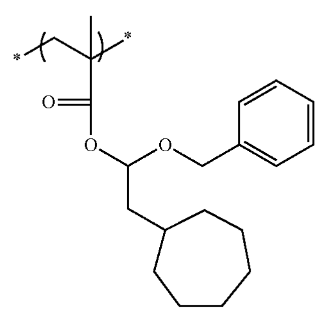

-continued
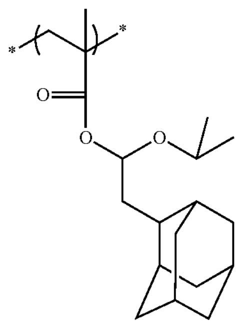
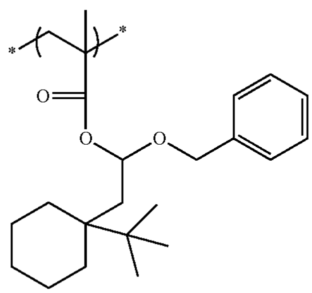
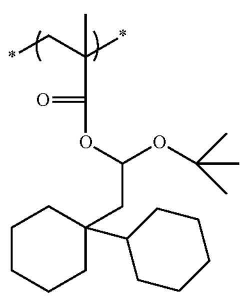
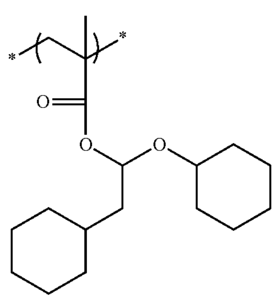
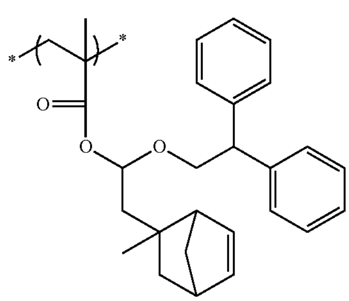
-continued
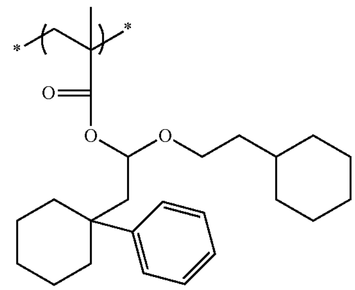
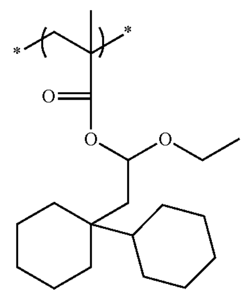
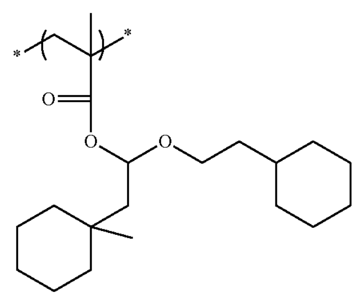
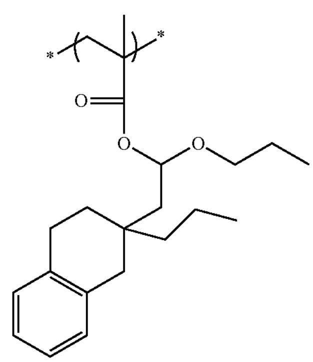
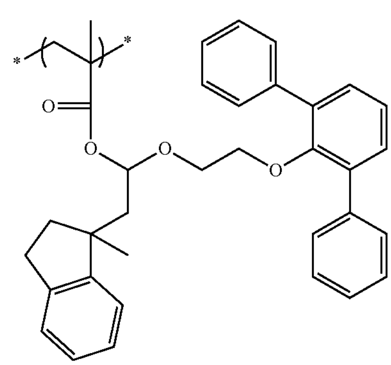

-continued
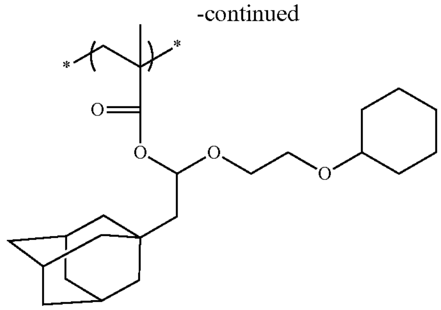
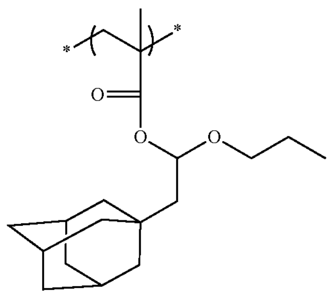
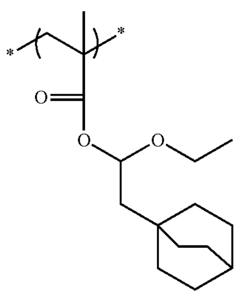
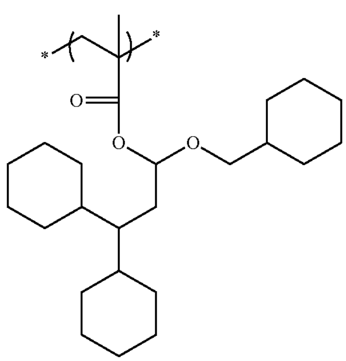
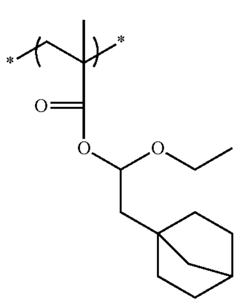
-continued
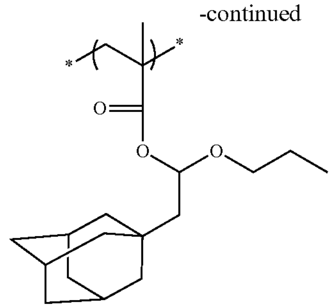
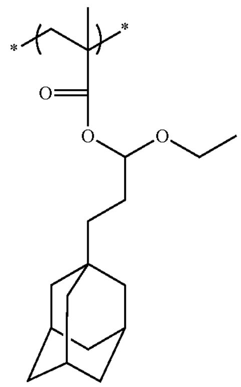
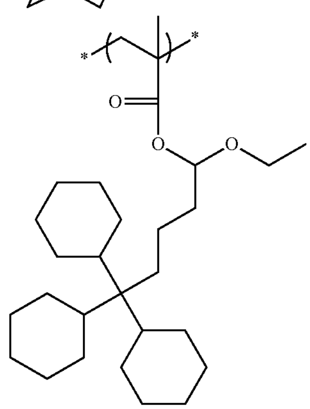
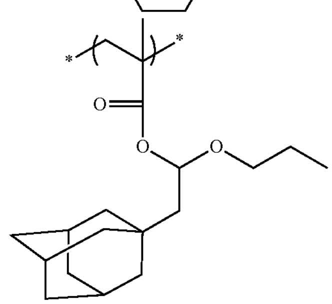
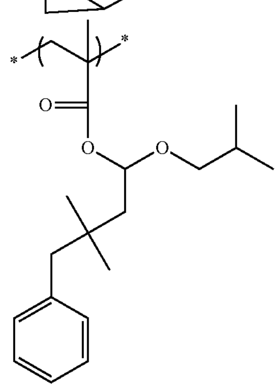

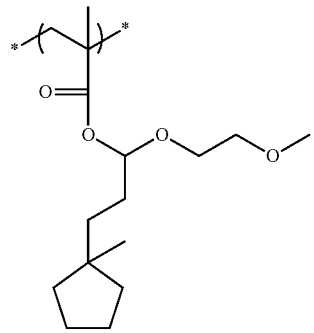

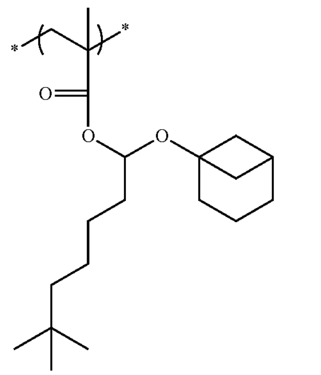

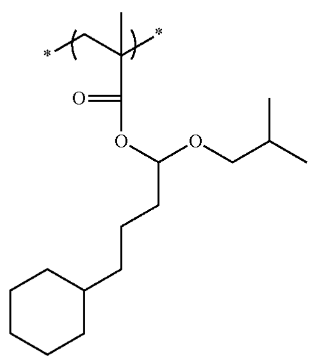

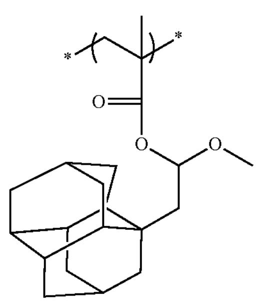

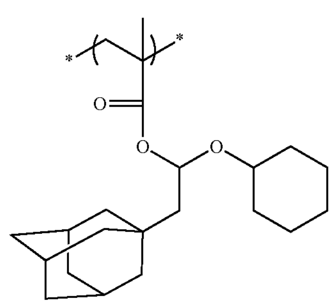

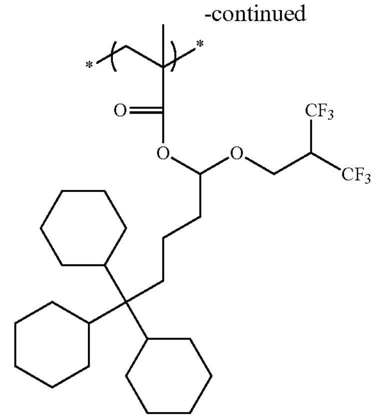

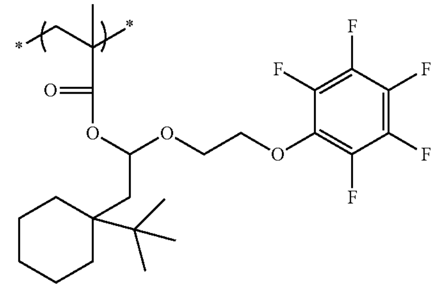

In the resin (P), as for the repeating unit (a) represented by formula (1), one kind may be used, or two or more kinds may be used in combination.

The content of the repeating unit (a) represented by formula (1) is preferably from 1 to 90 mol %, more preferably from 5 to 80 mol %, still more preferably from 20 to 70 mol %, based on all repeating units in the resin (P).

From the standpoint of more unfailingly achieving the effects of the present invention, the resin (P) is preferably a resin containing a phenolic hydroxyl group-containing repeating unit represented by the following formula out of the later-described phenolic hydroxyl group-containing repeating units and a repeating unit represented by the following formula (1-2):

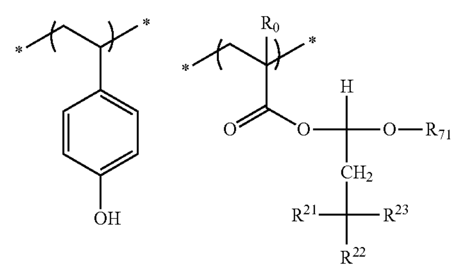

(1-2)

In formula (1-2), $R_0$ represents a hydrogen atom or a methyl group.

Each of $R^{21}$ to $R^{23}$ independently represents a hydrogen atom, an alkyl group, a cycloalkyl group, an aryl group, an aralkyl group or a heterocyclic group, and each of at least two members of $R^{21}$ to $R^{23}$ independently represents an alkyl group, a cycloalkyl group, an aryl group, an aralkyl group or a heterocyclic group.

At least two of $R^{21}$ to $R^{23}$ may combine with each other to form a ring. However, the case where at least one of $R^{21}$ to $R^{23}$ combines with $R_{71}$ to form a ring is excluded.

$R_{71}$ represents an unsubstituted alkyl group, a cycloalkyl group-substituted alkyl group, a cycloalkyl group, an aralkyl group, an aryloxyalkyl group or a heterocyclic group.

Specific examples and preferred examples of each of the groups for $R^{21}$ to $R^{23}$ are as described above.

The unsubstituted alkyl group, cycloalkyl group-substituted alkyl group, cycloalkyl group, aralkyl group, aryloxyalkyl group and heterocyclic group of $R_{71}$ are as described above for the group represented by $-M^1-Q^1$.

The resin (P) may further contain a repeating unit having a phenolic hydroxyl group. The repeating unit having a phenolic hydroxyl group includes, for example, a repeating unit represented by the following formula (5) or (6), and a repeating unit represented by formula (5) is preferred.

(5)

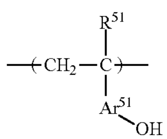

(6)

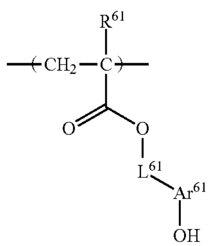

In formulae (5) and (6), each of $R^{51}$ and $R^{61}$ independently represents a hydrogen atom or a methyl group, and each of $Ar^{51}$ and $Ar^{61}$ independently represents an arylene group. $L^{61}$ represents a single bond or an alkylene group.

$R^{51}$ is preferably a hydrogen atom, and $R^{61}$ is preferably a methyl group.

The arylene group represented by $Ar^{51}$ and $Ar^{61}$ may have a substituent. The arylene group is preferably an arylene group having a carbon number of 6 to 18, which may have a substituent, more preferably a phenylene or naphthylene group which may have a substituent, and most preferably a phenylene group which may have a substituent. Examples of the substituent which may be substituted on such a group include an alkyl group, a halogen atom, a hydroxyl group, an alkoxy group, a carboxyl group, and an alkoxycarbonyl group.

As described above, $L^{61}$ represents a single bond or an alkylene group. The alkylene group is preferably an alkylene group having a carbon number of 1 to 8, more preferably an alkylene group having a carbon number of 1 to 4, and examples thereof include a methylene group, an ethylene group, a propylene group, a butylene group, a hexylene group and an octylene group, with a methylene group and an ethylene group being preferred.

Specific examples of the repeating unit represented by formula (5) are illustrated below, but the present invention is not limited thereto.

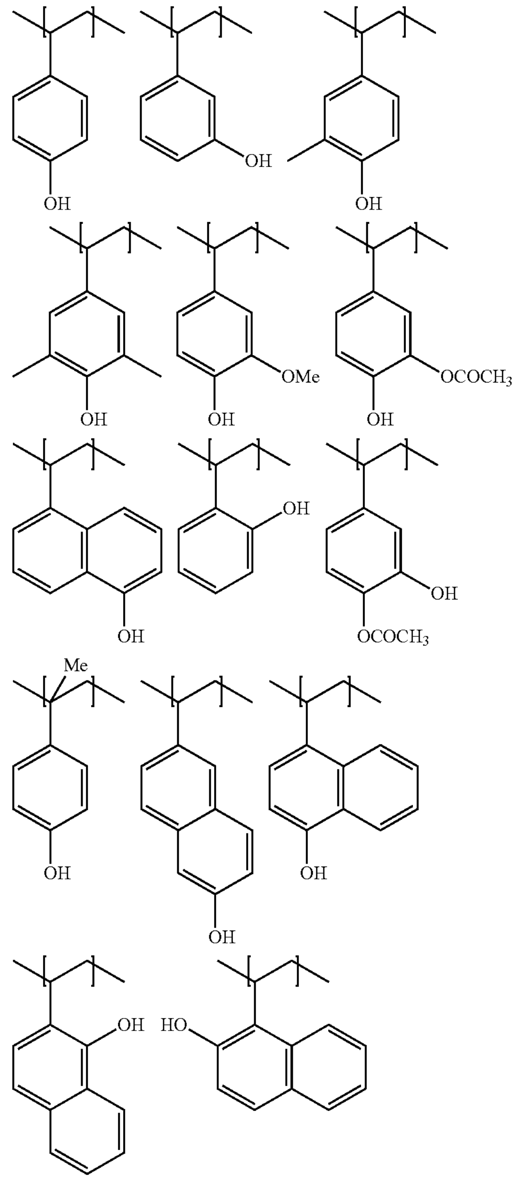

Specific examples of the repeating unit represented by formula (6) are illustrated below, but the present invention is not limited thereto.

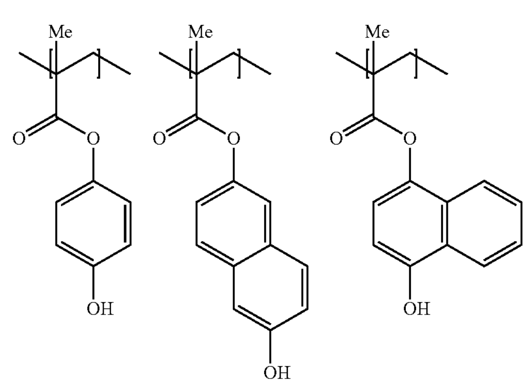

-continued

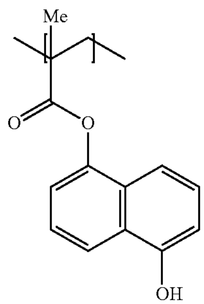
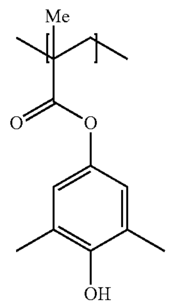
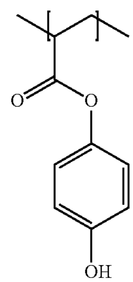
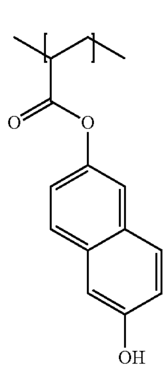
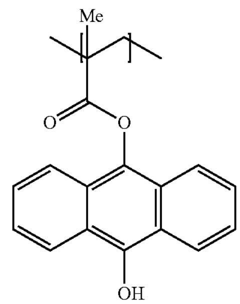
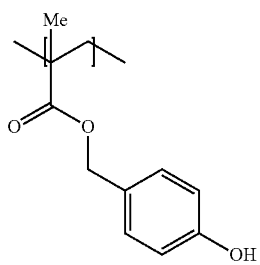
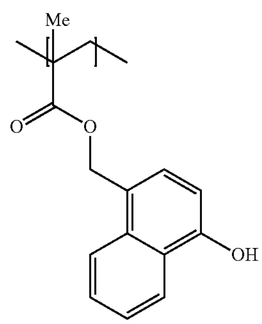
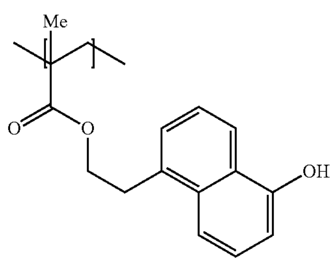
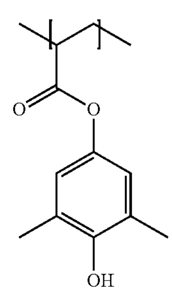
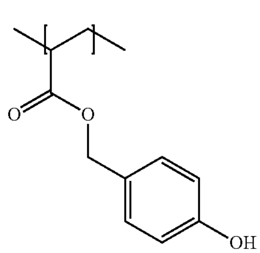

The resin (P) may or may not contain a repeating unit having a phenolic hydroxyl group, but in the case where the resin (P) contains a repeating unit having a phenolic hydroxyl group, the content of the repeating unit having a phenolic hydroxyl group (preferably the repeating unit represented by formula (5) or (6)) in the resin (P) is preferably from 10 to 85 mol %, more preferably from 15 to 80 mol %, still more preferably from 25 to 75 mol %, based on all repeating units in the resin (P).

The resin (P) may contain a repeating unit having a group capable of decomposing by the action of an acid (hereinafter, sometimes referred to as "acid-decomposable group"), in addition to the repeating unit represented by formula (1).

The preferred acid-decomposable group used in combination includes a tertiary alkyl carboxylate, a secondary benzyl carboxylate, an acetal-protected phenolic hydroxyl group, a tert-butoxy carbonyl group-protected or tertiary ether-protected phenolic hydroxy group, an acetal-protected alcoholic hydroxyl group, and a tert-butoxy carbonyl group-protected or tertiary ether-protected alcoholic hydroxyl group, and these may be mixed and used. Incidentally, specific preferred examples of the acid-decomposable group include those described in JP-A-2010-217884.

As for the acid-decomposable group-containing repeating unit other than the repeated unit represented by formula (1), one kind may be used or two or more kinds may be used in combination.

The content of the acid-decomposable group-containing repeating unit other than the repeated unit represented by formula (1) (in the case of containing a plurality of kinds, the total thereof) is preferably from 1 to 30 mol %, more preferably from 3 to 25 mol %, still more preferably from 5 to 20 mol %, based on all repeating units in the resin (P).

The resin (P) may further contain a repeating unit represented by the following formula (4):

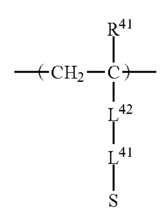

(4)

$R^{41}$ represents a hydrogen atom or a methyl group. $L^{41}$ represents a single bond or a divalent linking group. $L^{42}$ represents a divalent linking group. S represents a structural moiety capable of decomposing upon irradiation with an actinic ray or radiation to generate an acid on the side chain.

Specific examples of the repeating unit represented by formula (4) are illustrated below, but the present invention is not limited thereto.

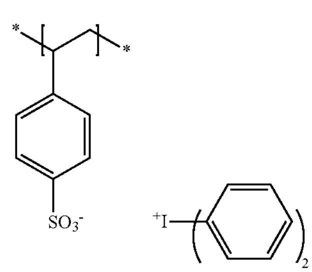

-continued
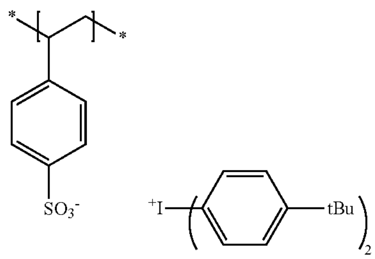
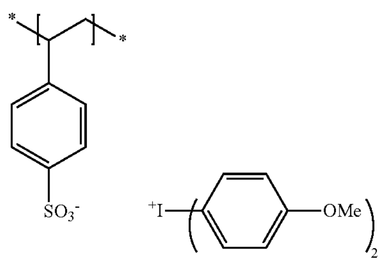
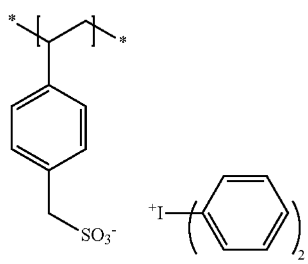
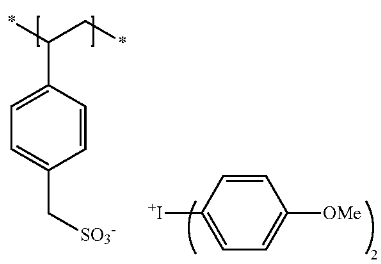
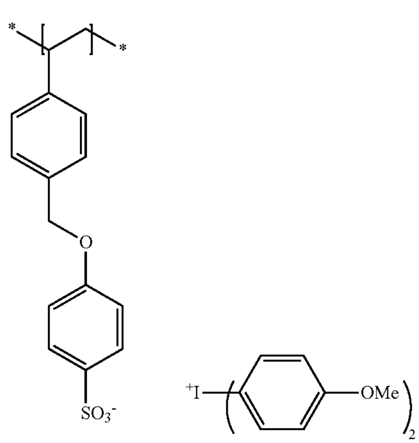
-continued
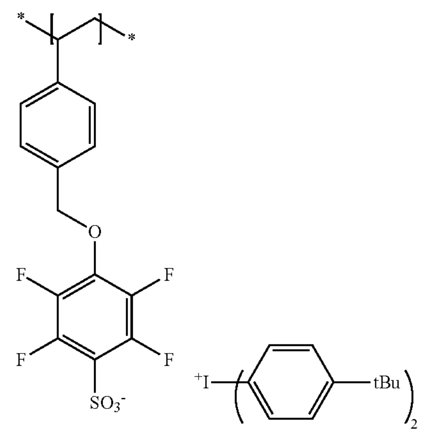
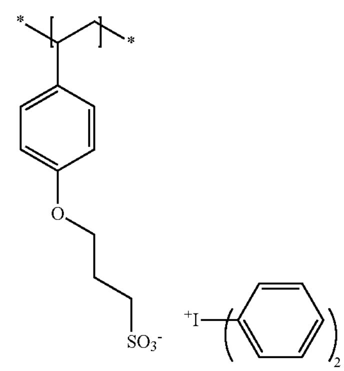
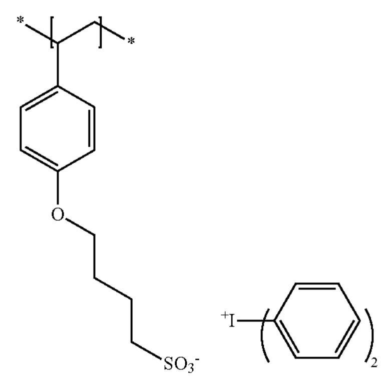
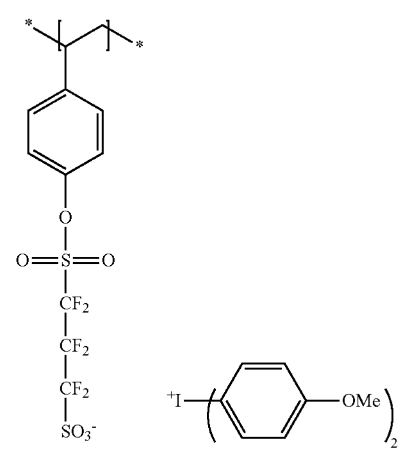

-continued
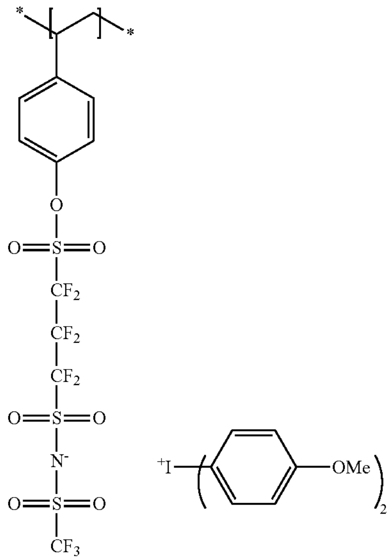
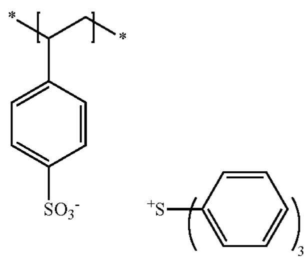
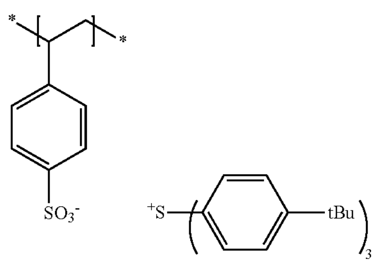
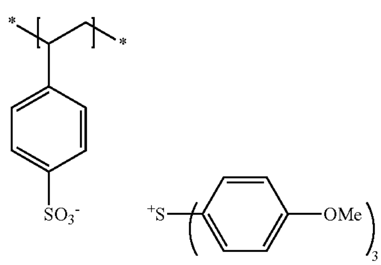
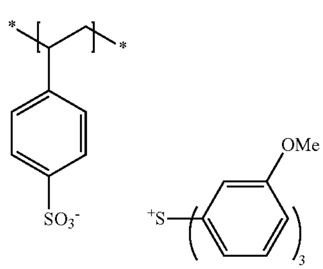
-continued
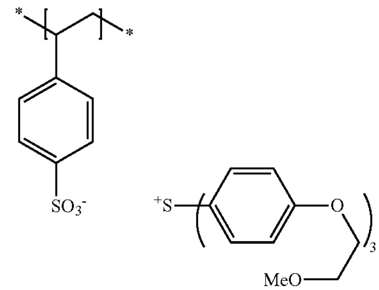
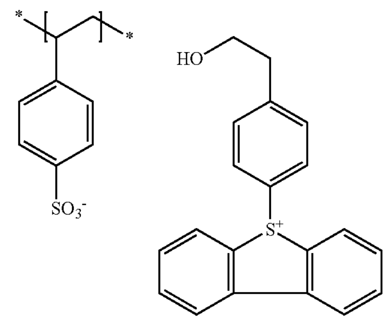
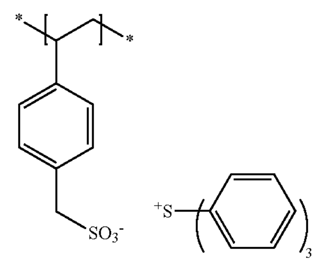
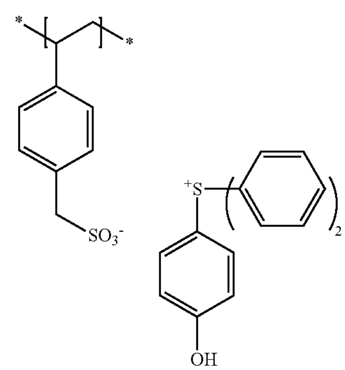
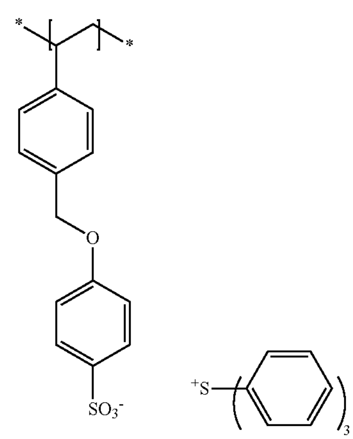

-continued
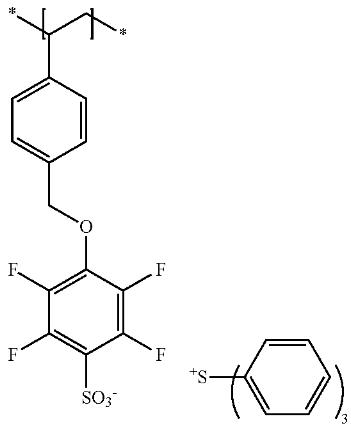
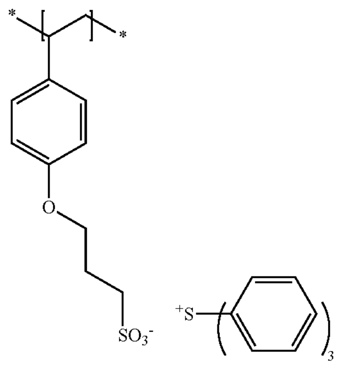
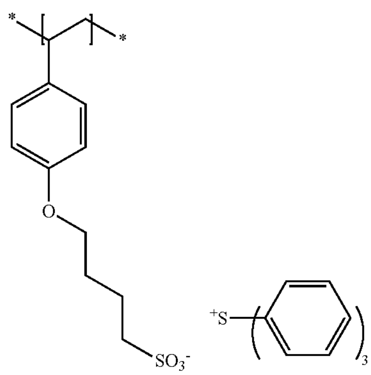
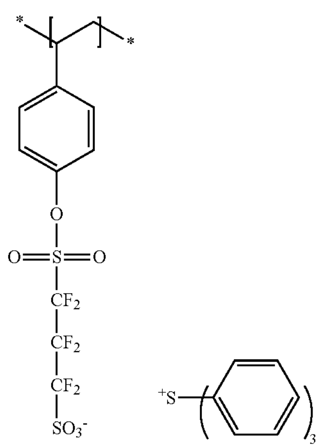
-continued
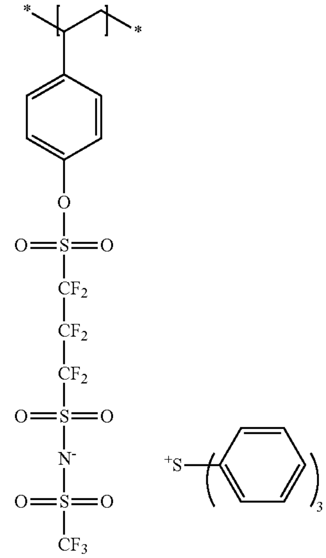
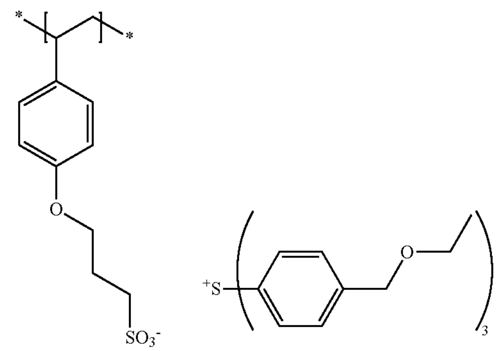
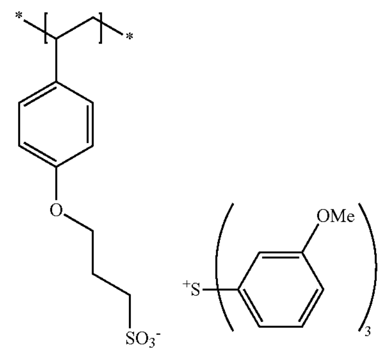
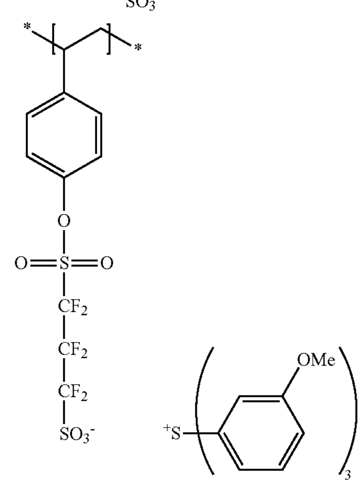

-continued
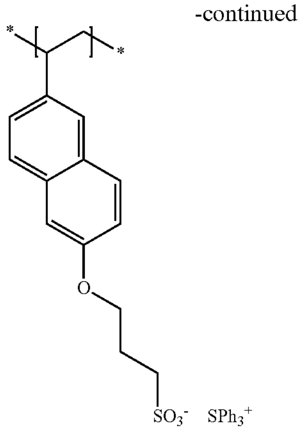
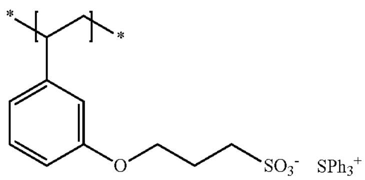
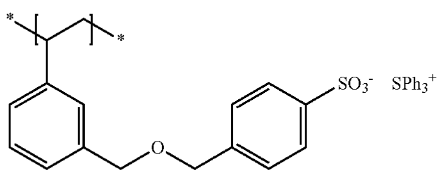
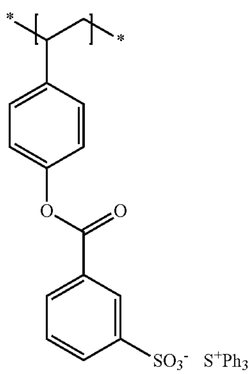
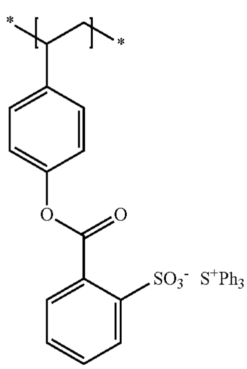
-continued
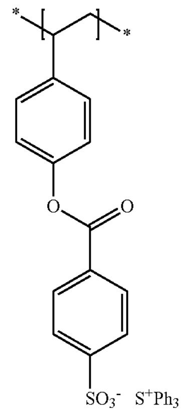
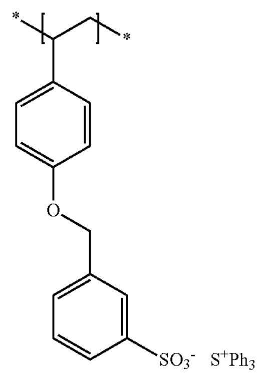
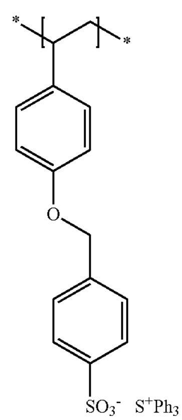
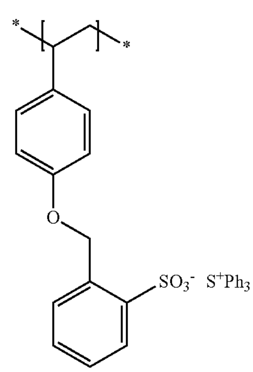

-continued
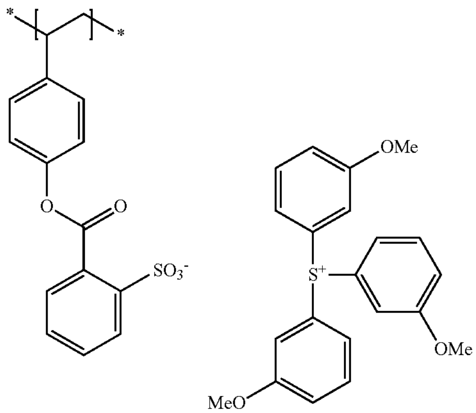
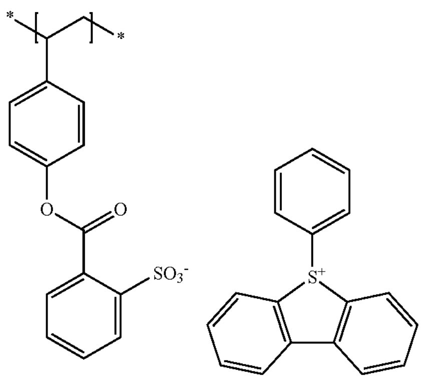
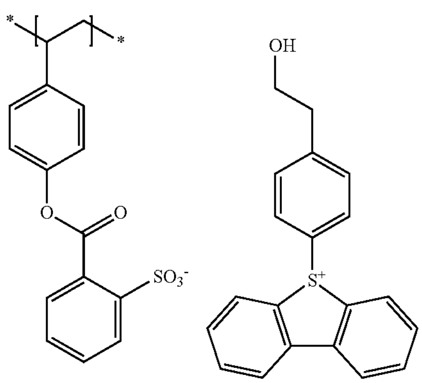
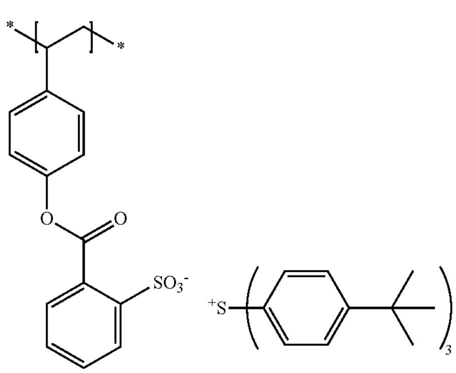
-continued
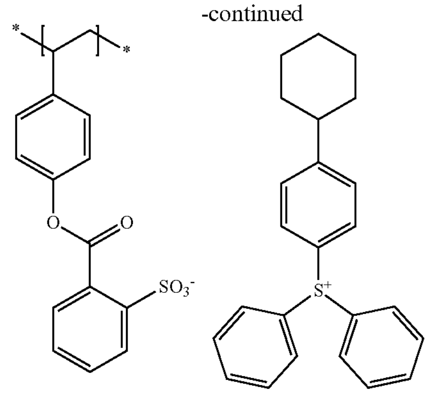
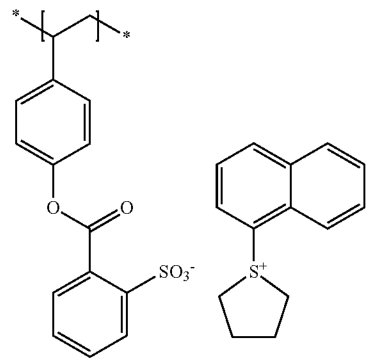
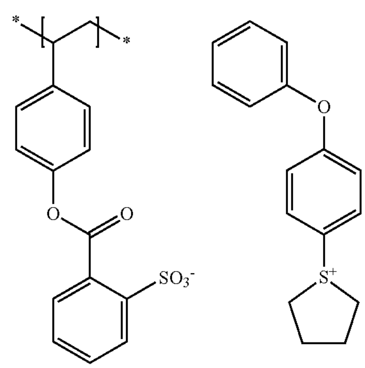
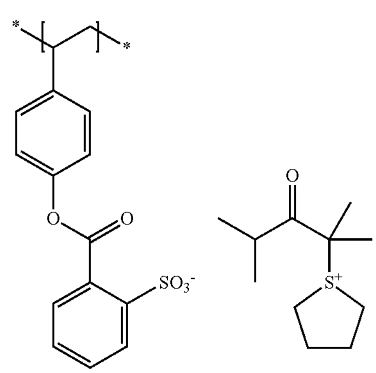

-continued
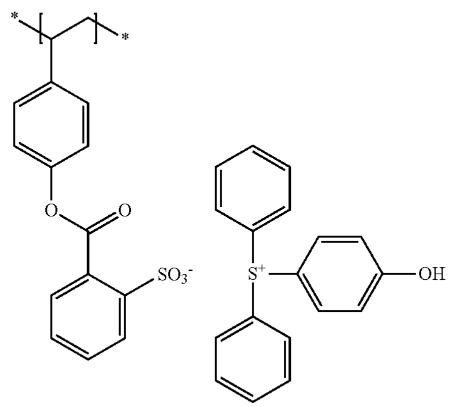
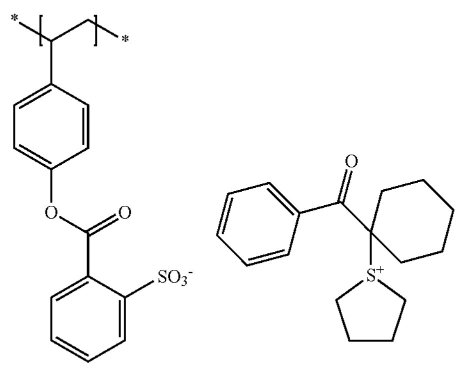
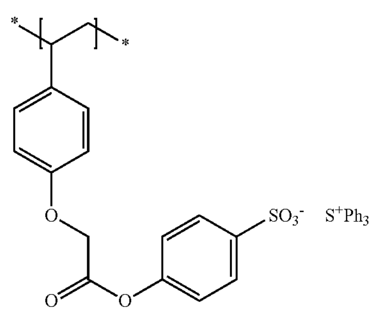
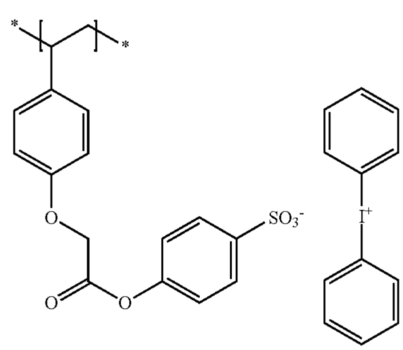
-continued
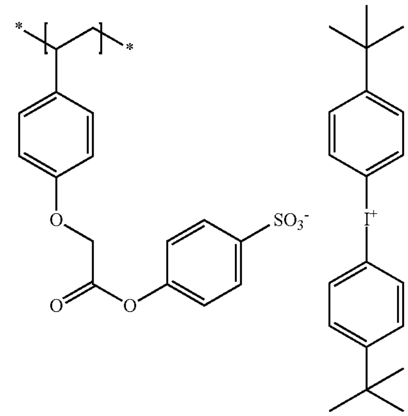
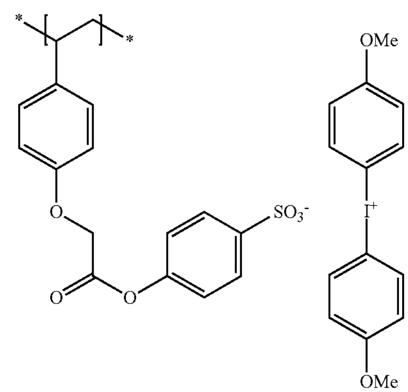
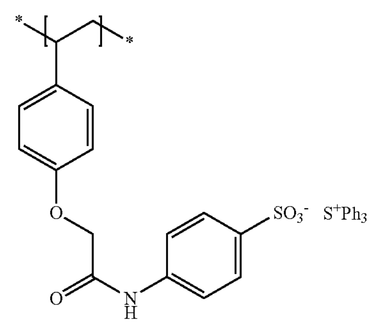
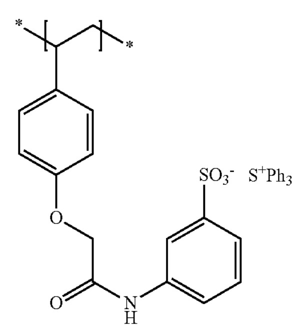

-continued
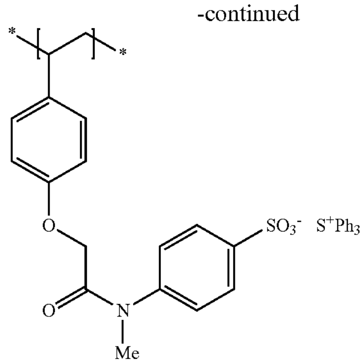
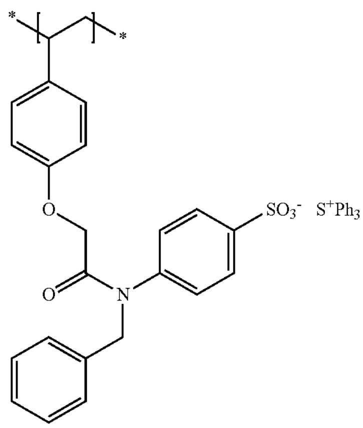
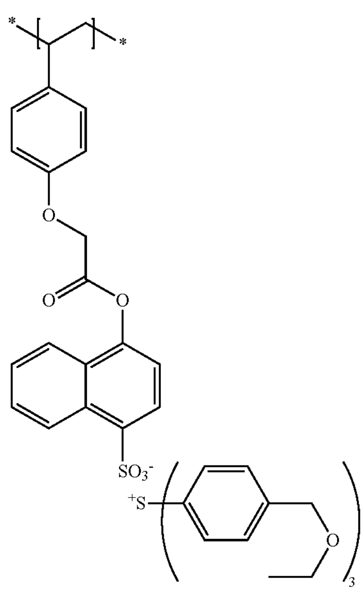
-continued
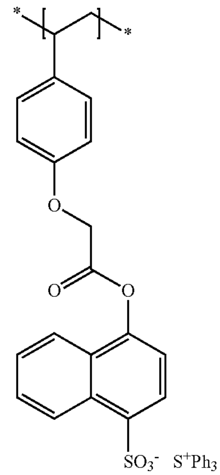
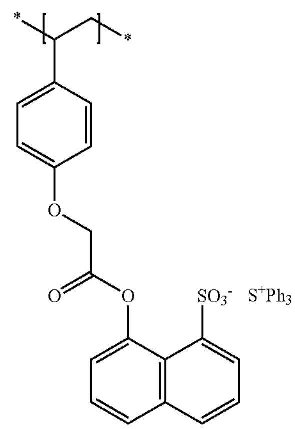
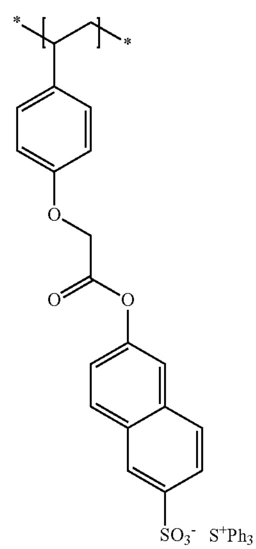

-continued
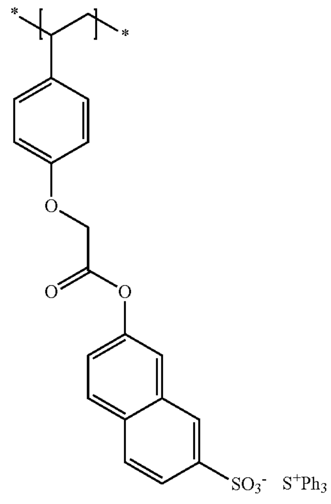
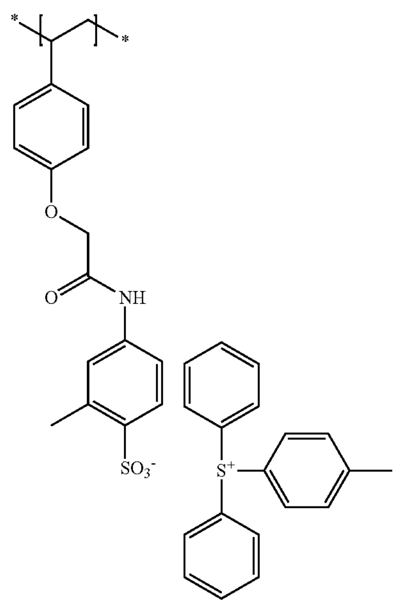
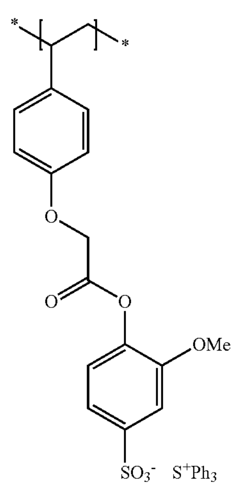
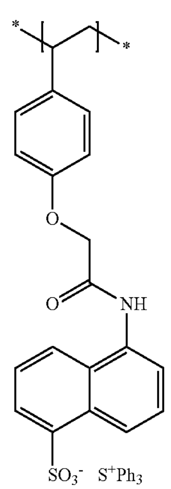
-continued
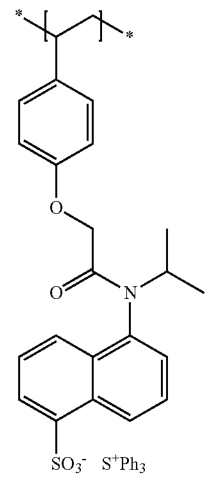
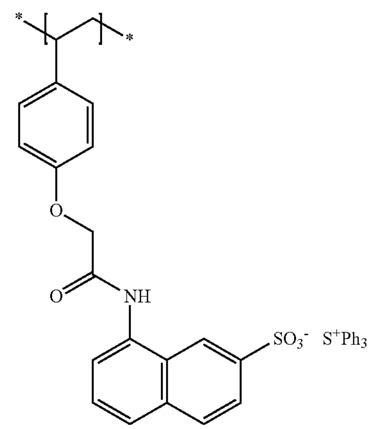
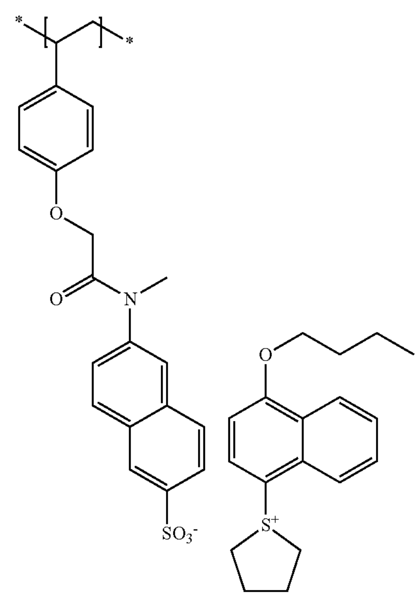

-continued
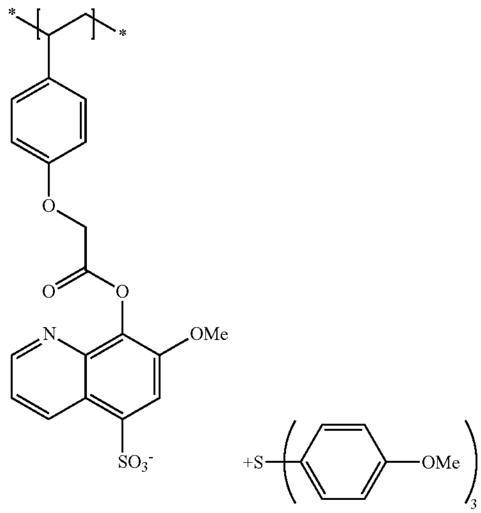
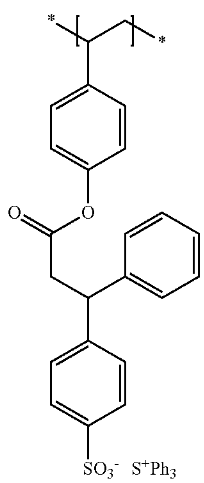
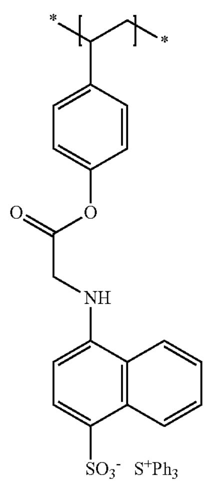
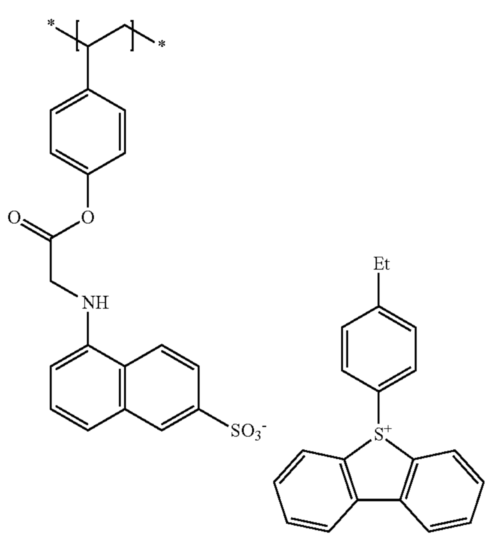
-continued
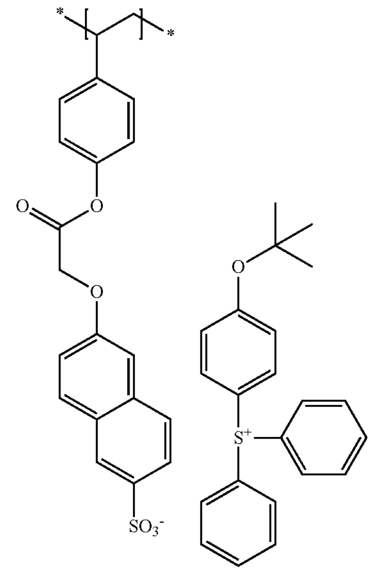
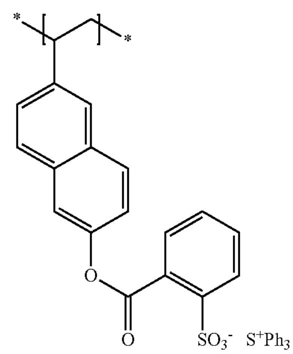
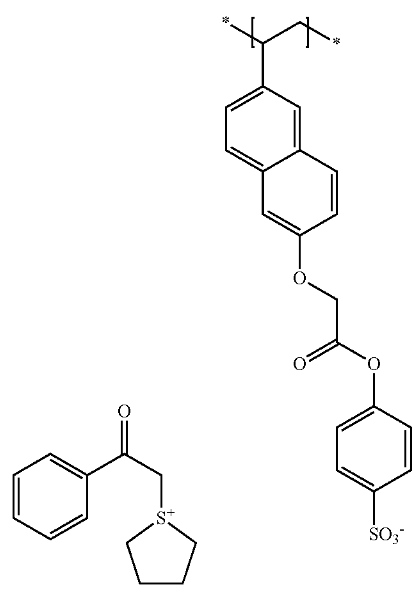

-continued
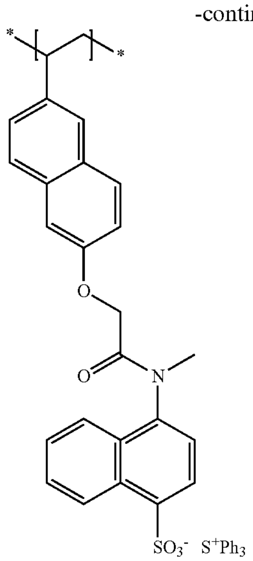
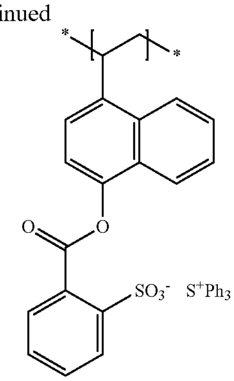
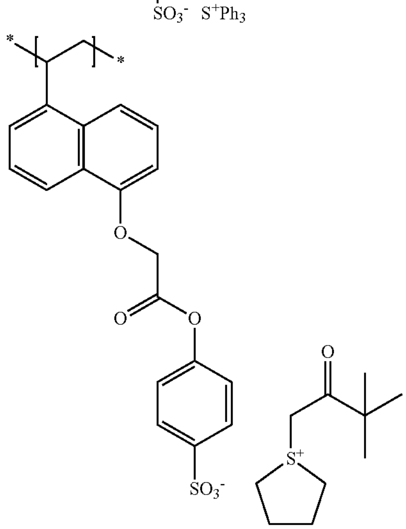
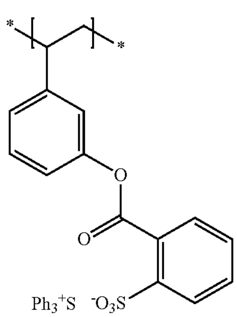
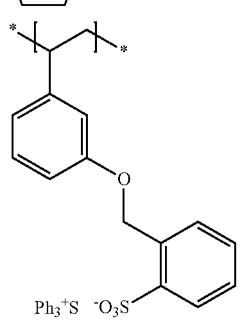
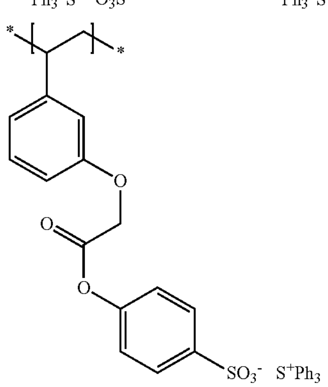
-continued
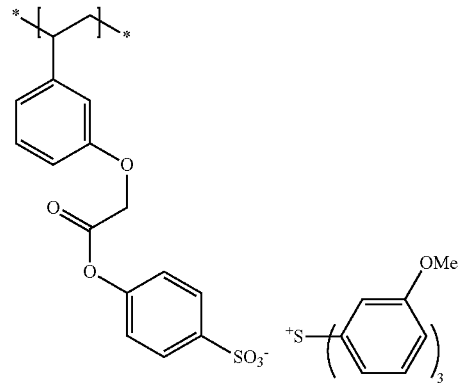
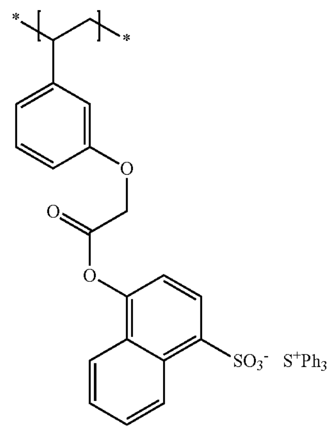
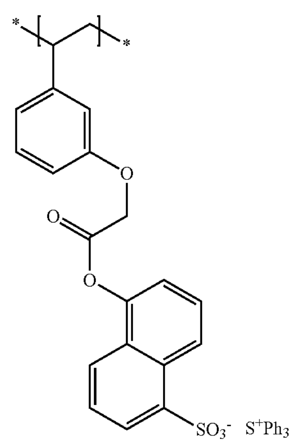
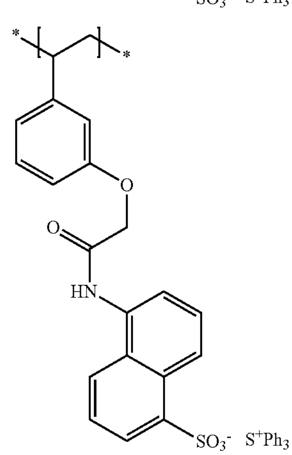

-continued
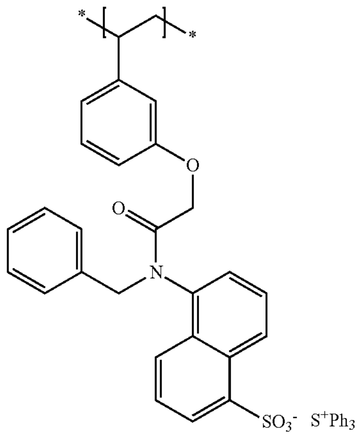
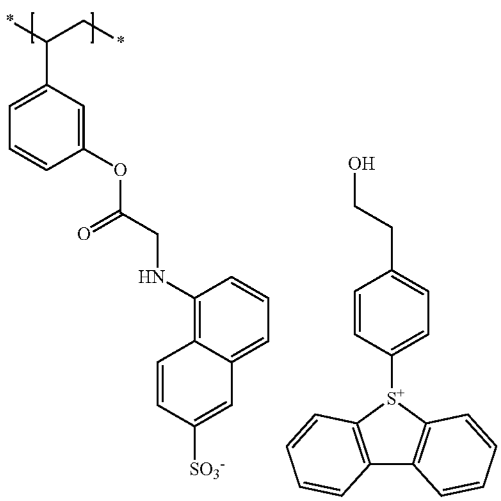
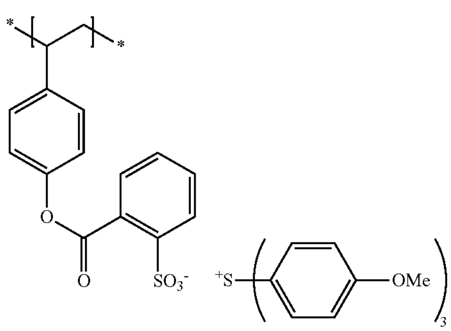
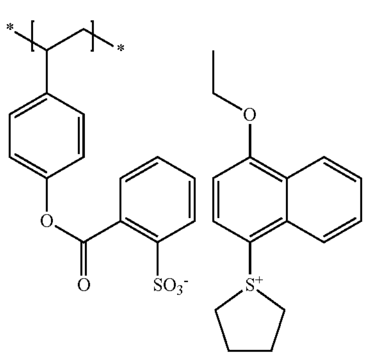
-continued
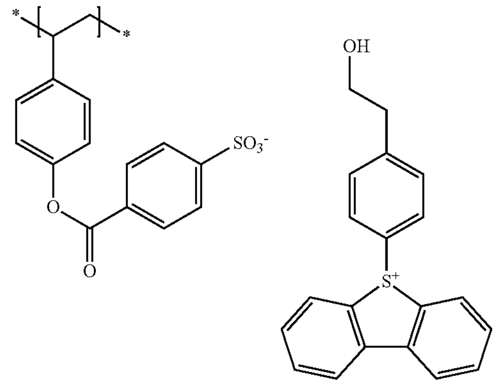
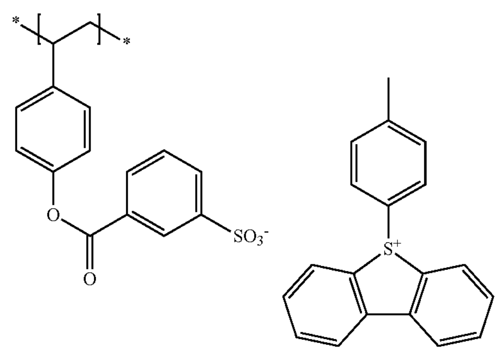
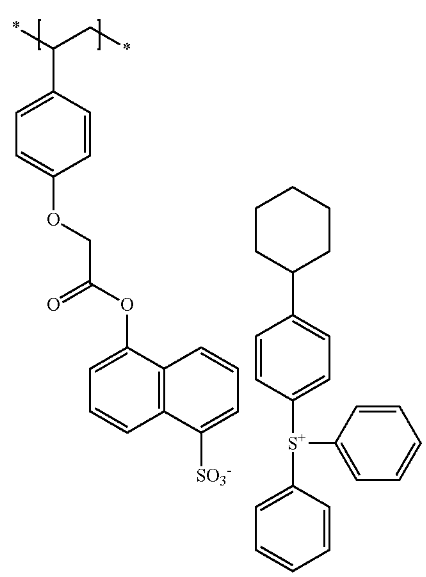

-continued
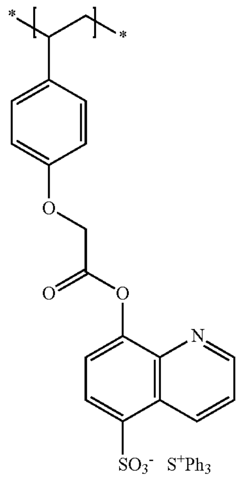
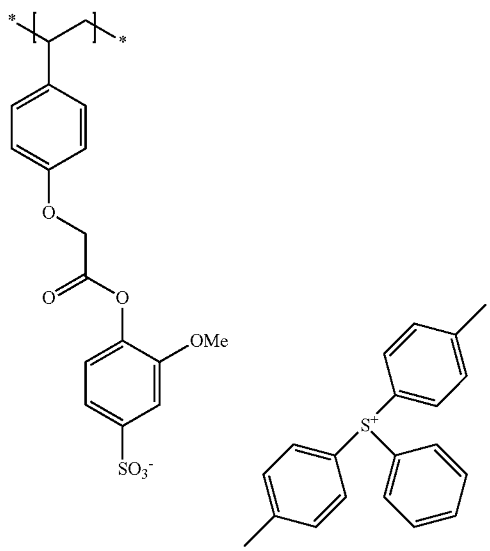
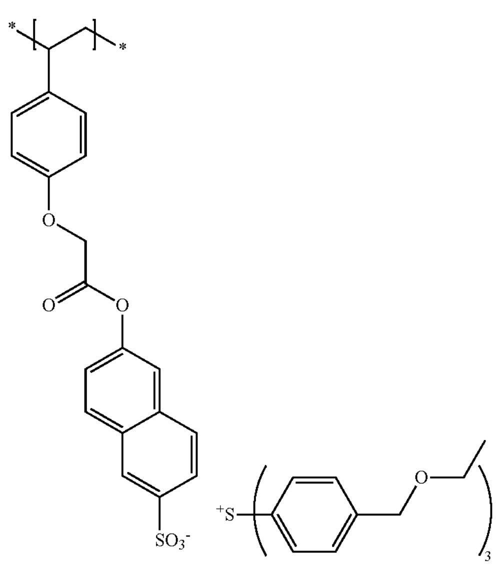
-continued
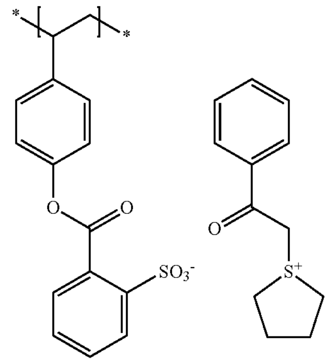
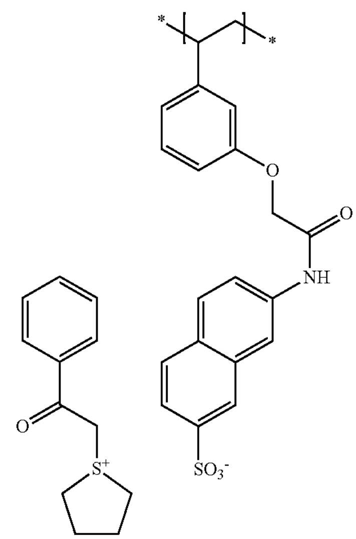
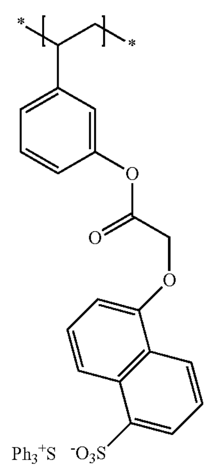

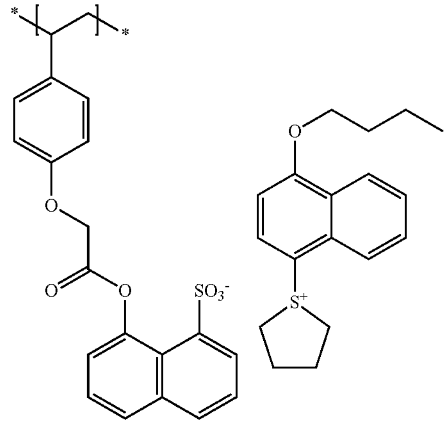
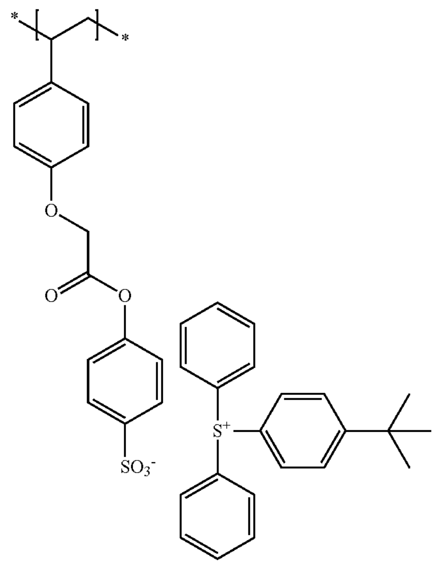
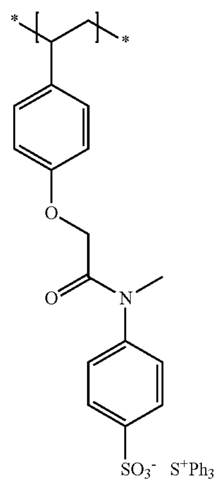
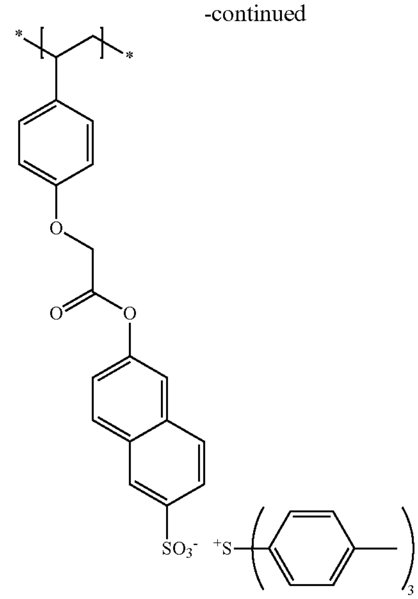
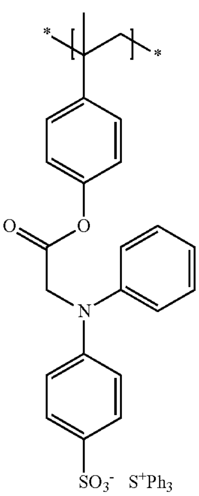
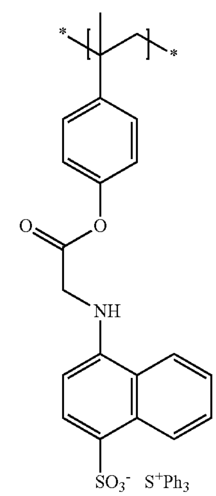
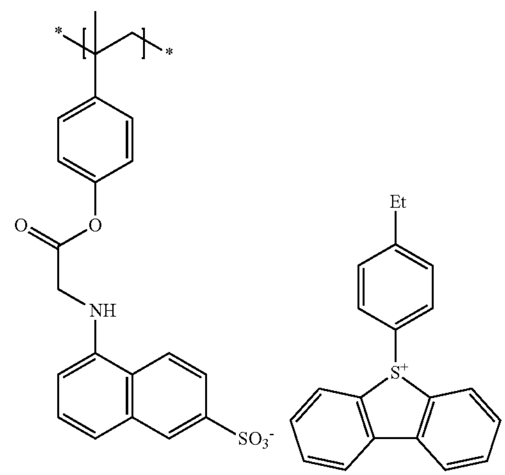

-continued
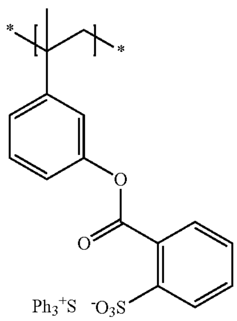
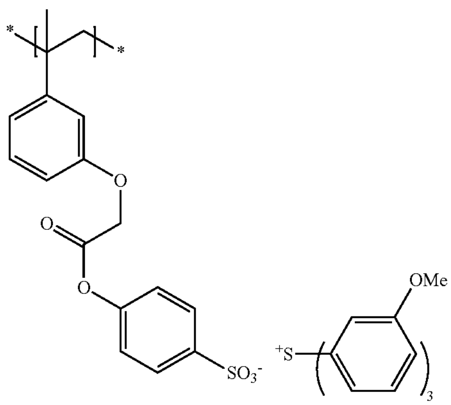
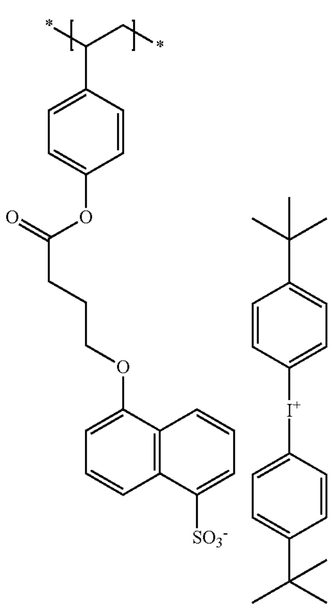
-continued
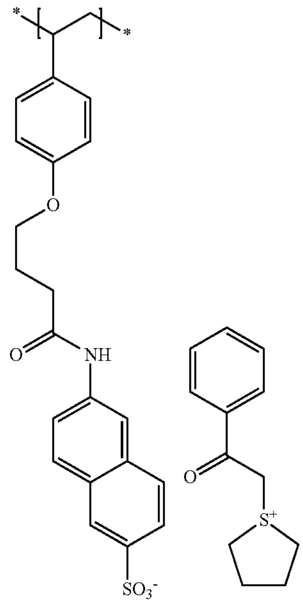
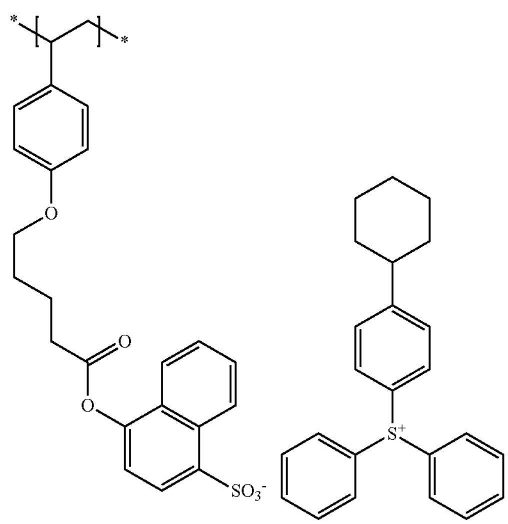
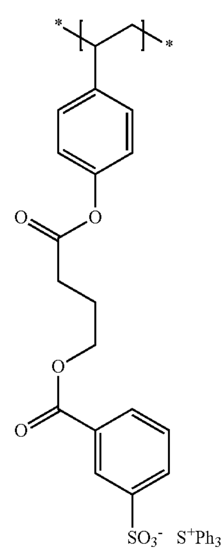
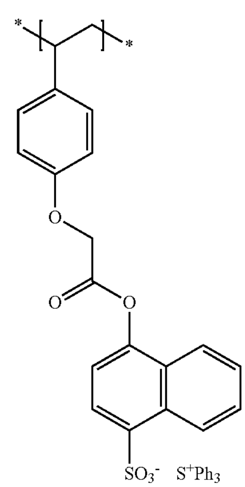

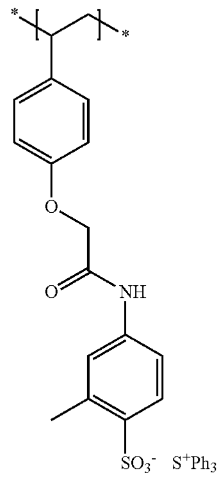
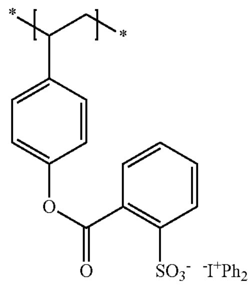
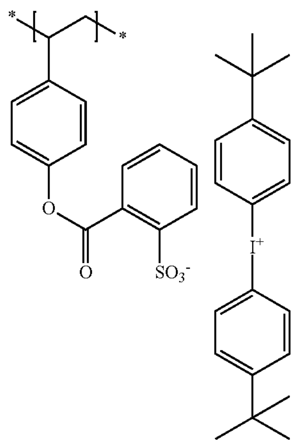
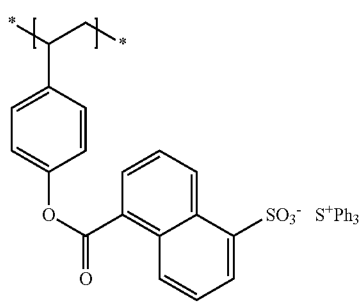
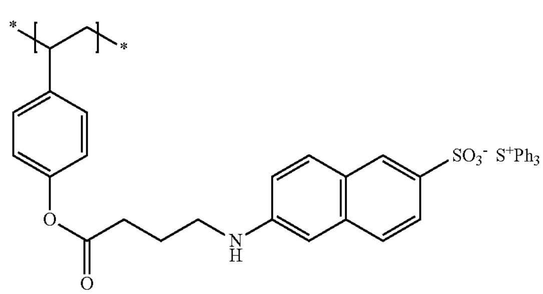
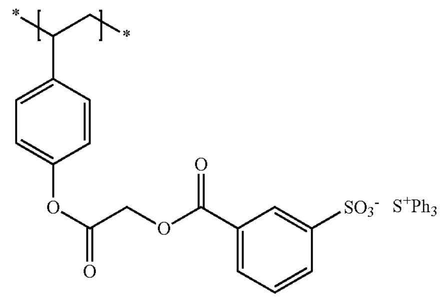
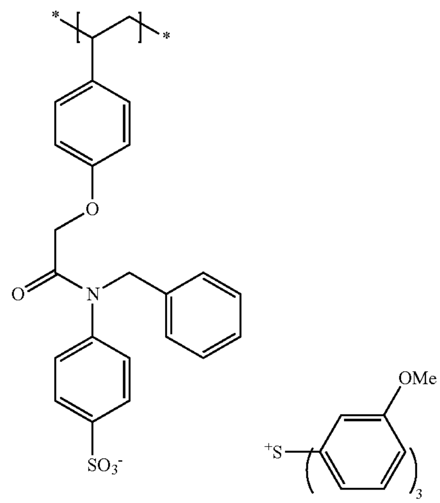
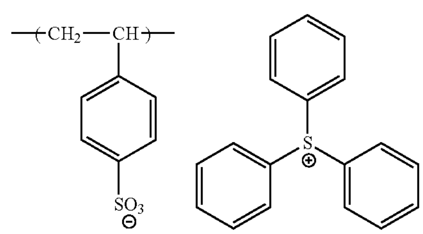
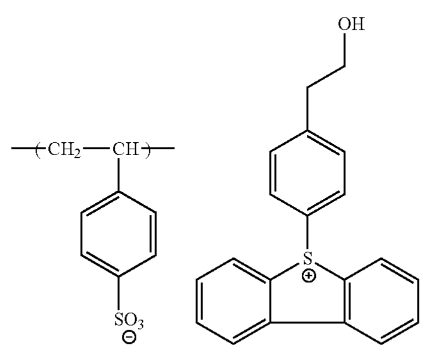
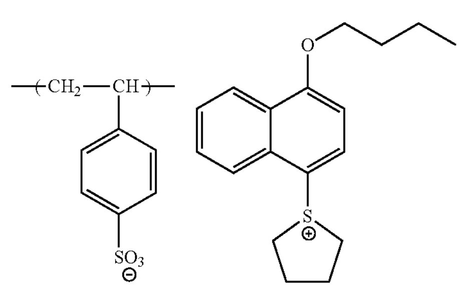

-continued
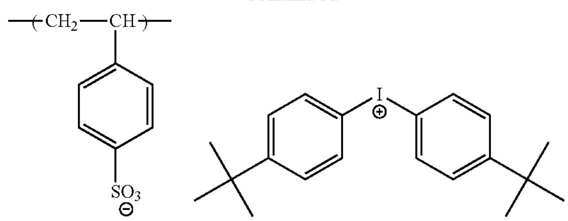
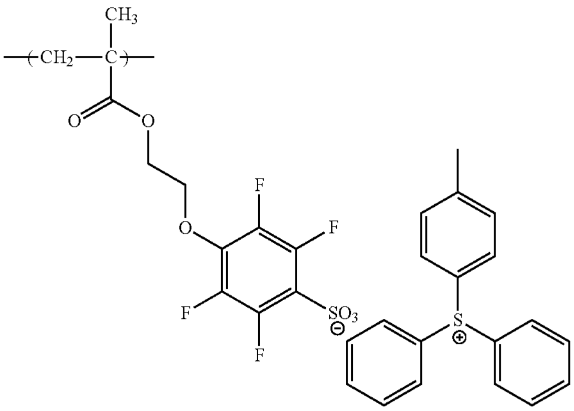
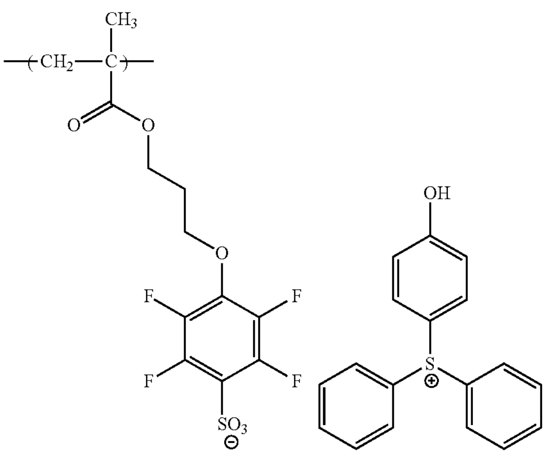
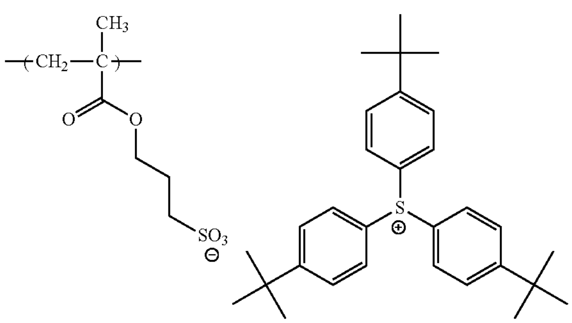
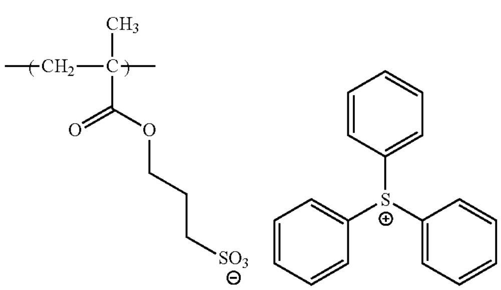
-continued
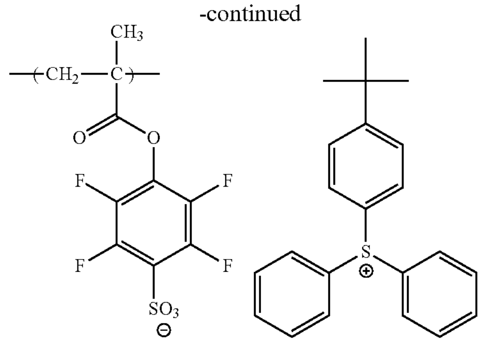
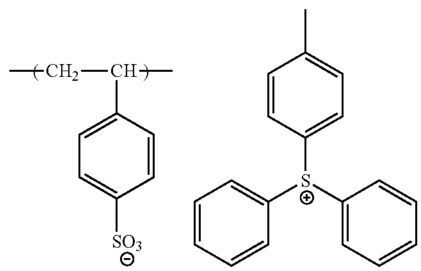
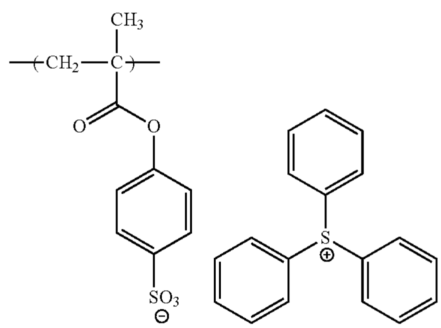
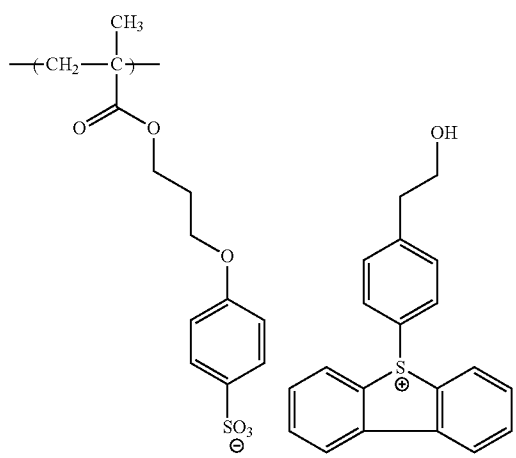

-continued
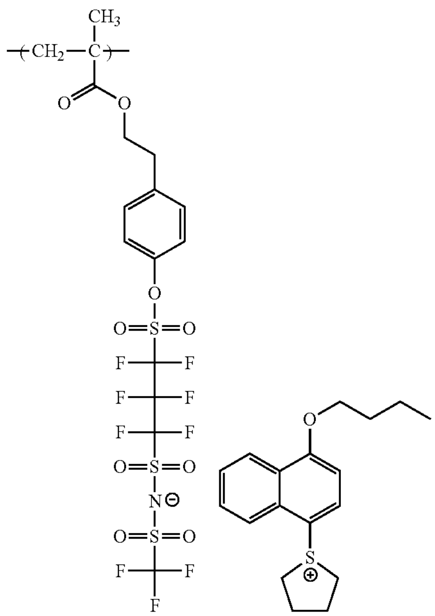
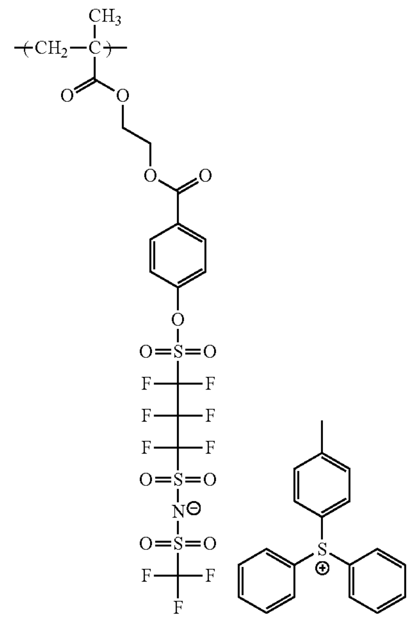
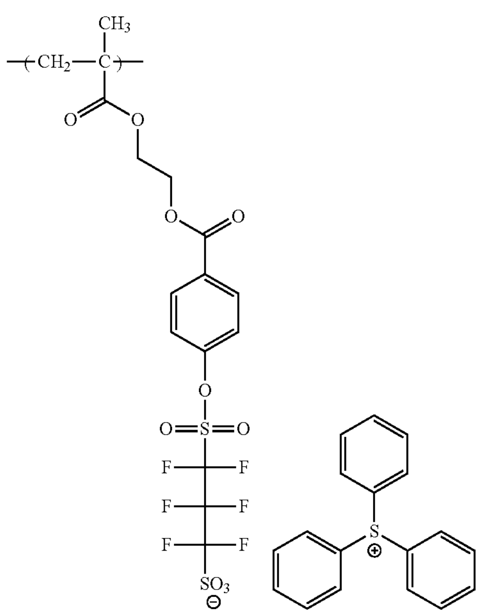
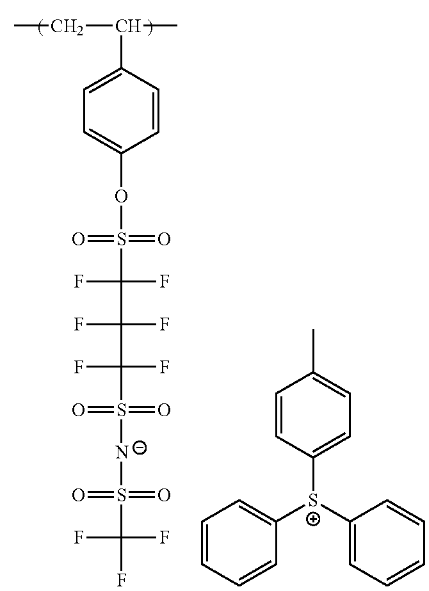
-continued

-continued
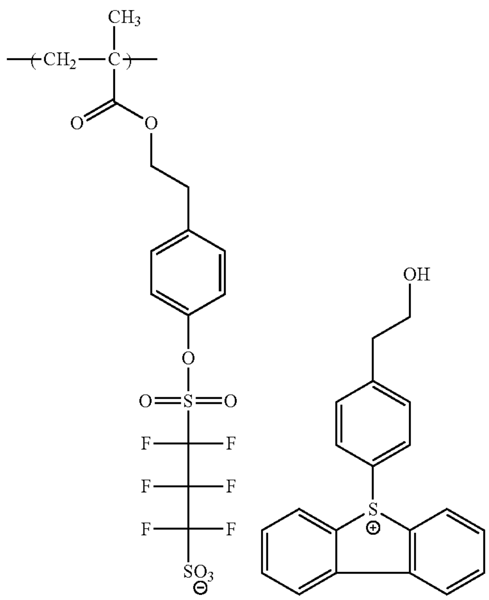
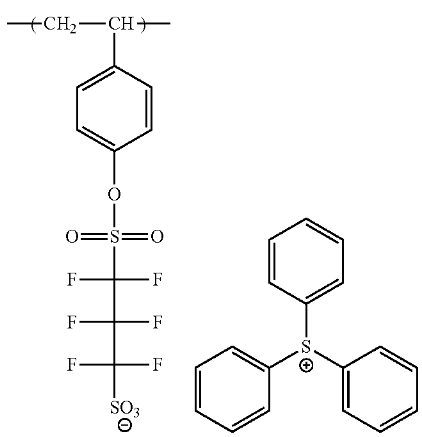
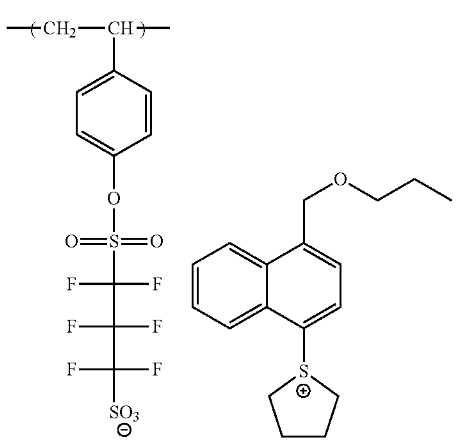
-continued
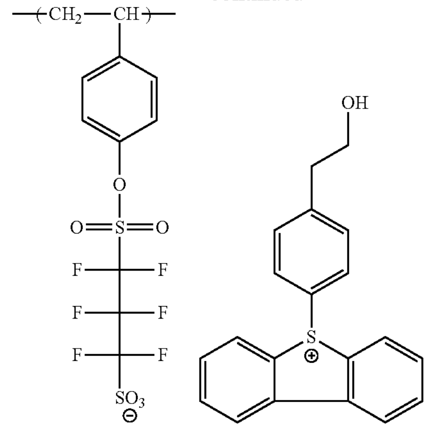
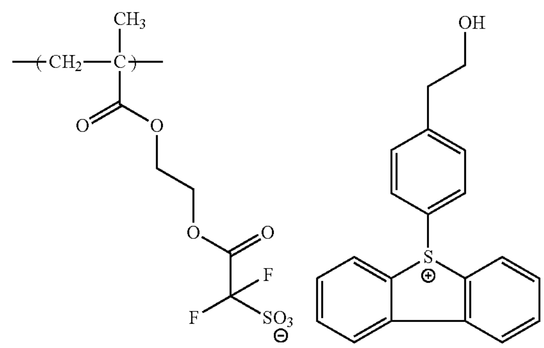
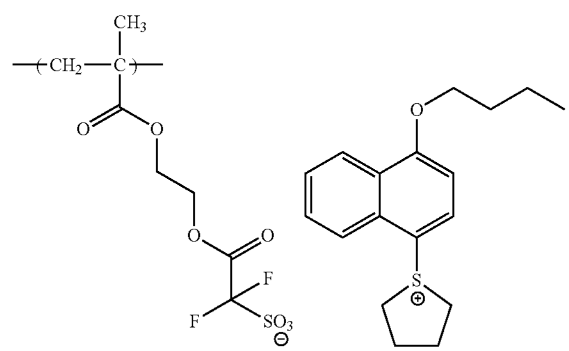
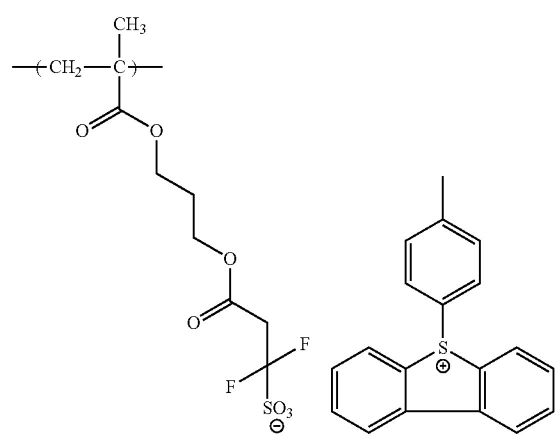

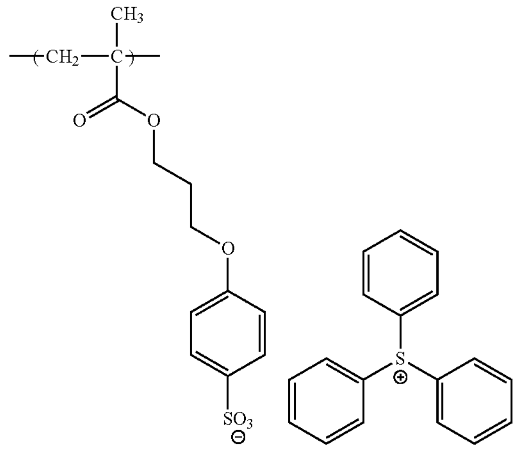
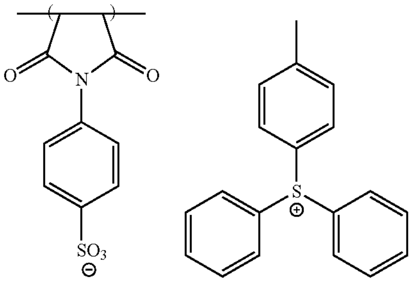
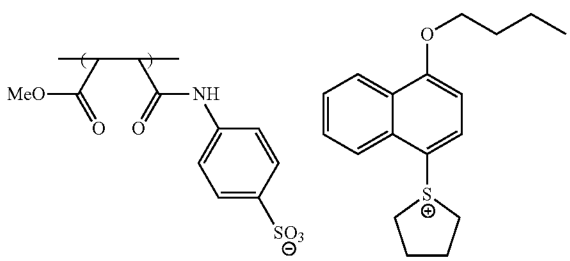
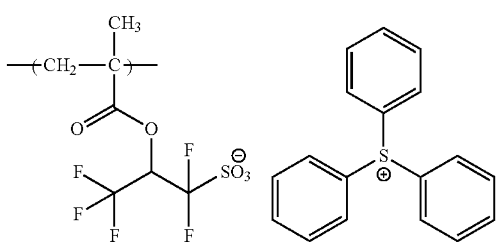
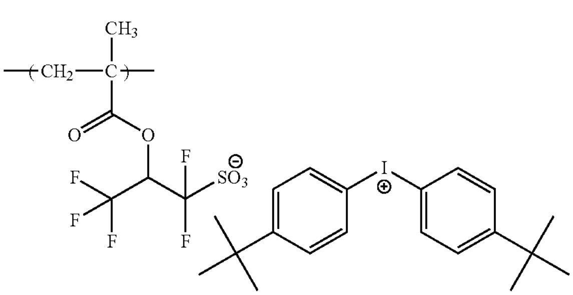
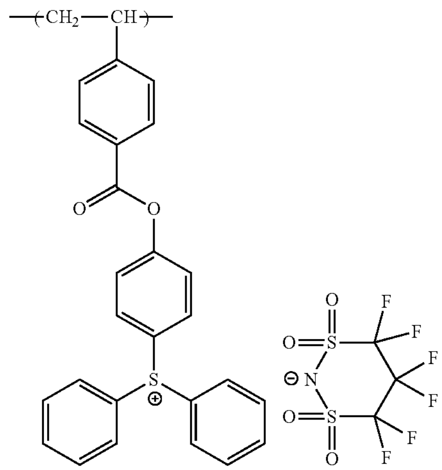
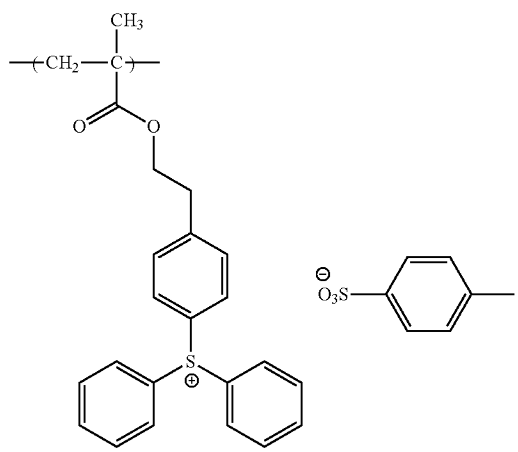
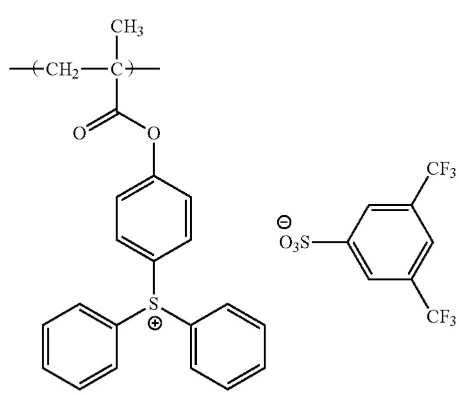

-continued
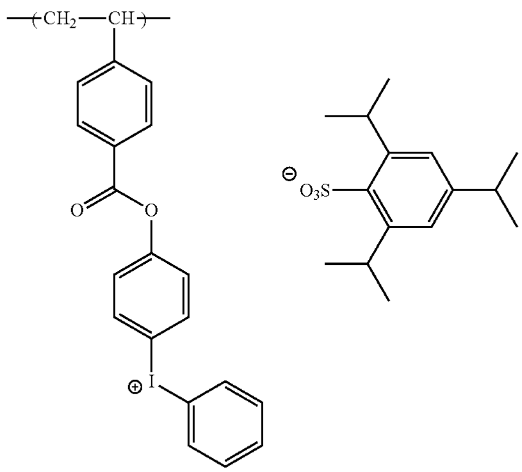
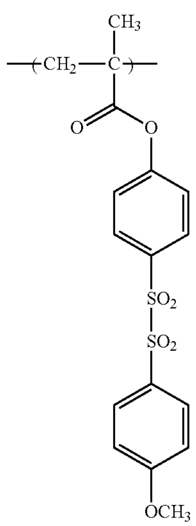
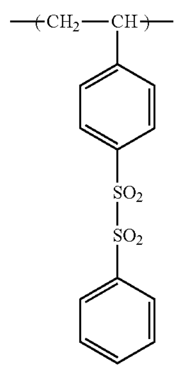
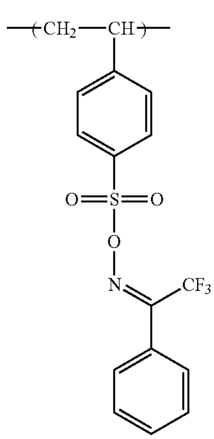
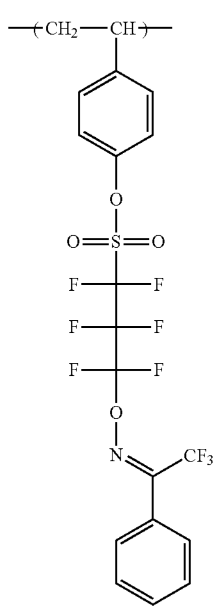
-continued
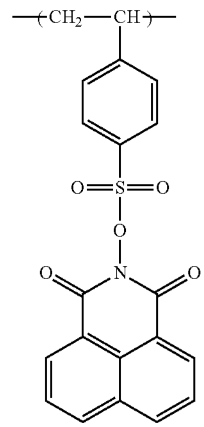
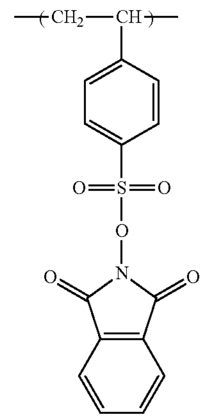
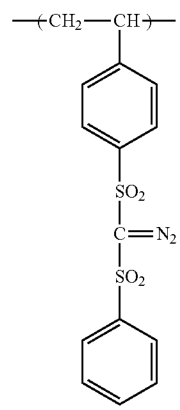
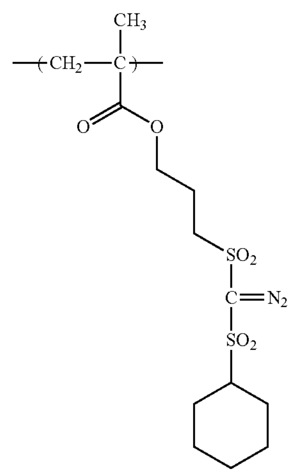
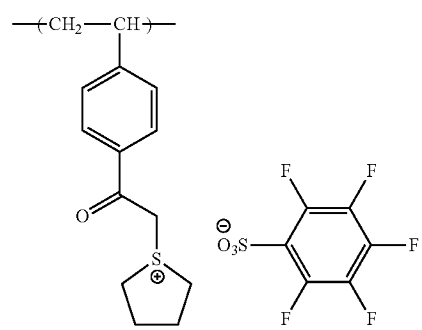
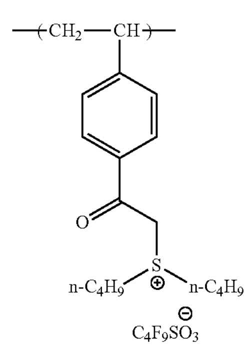

-continued
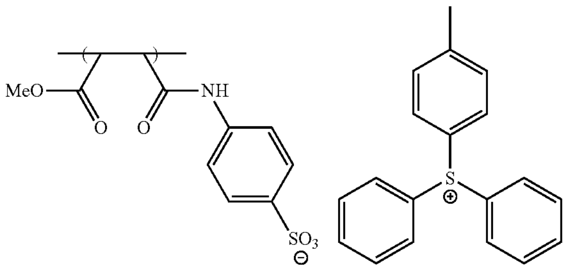
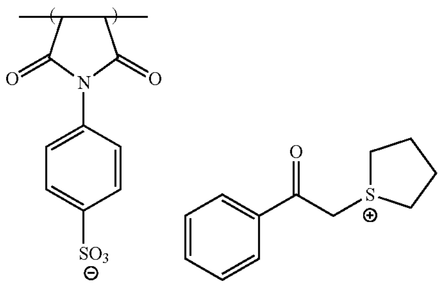
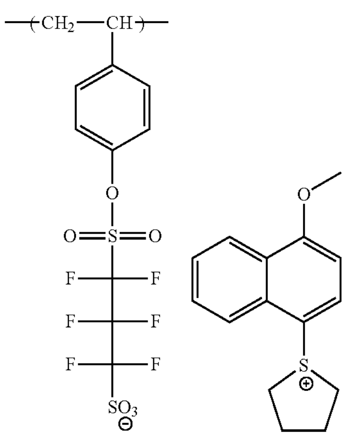
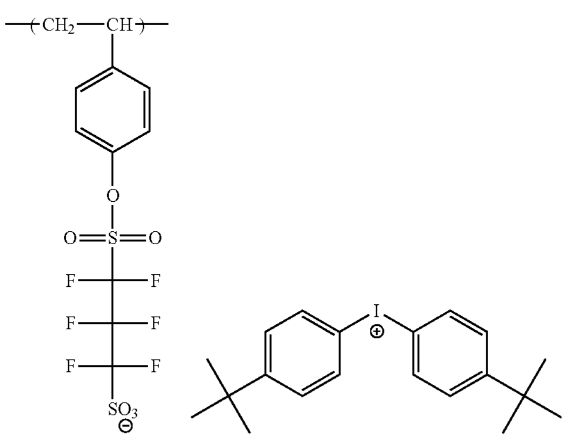
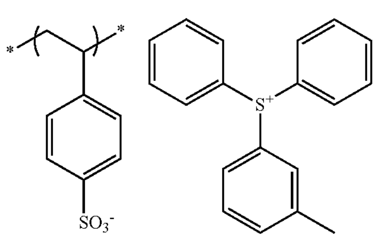
-continued
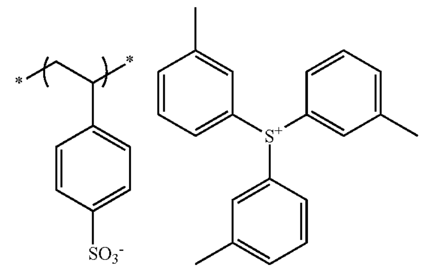
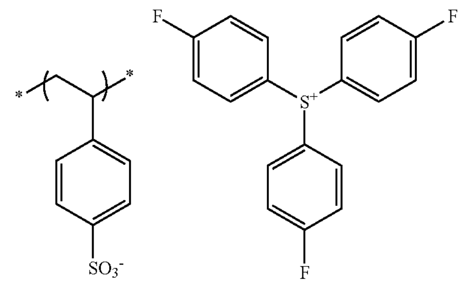
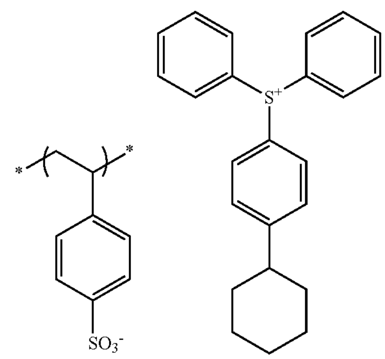
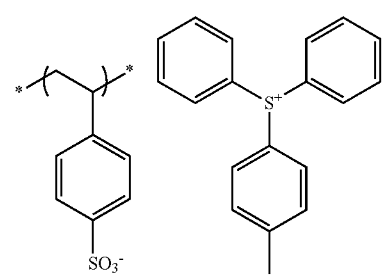
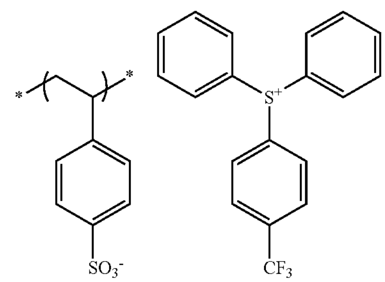

-continued
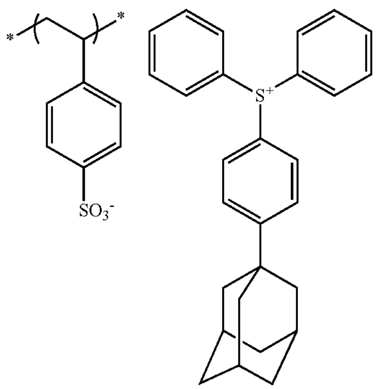
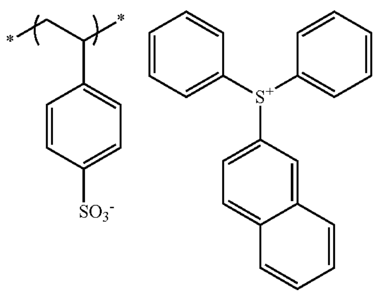
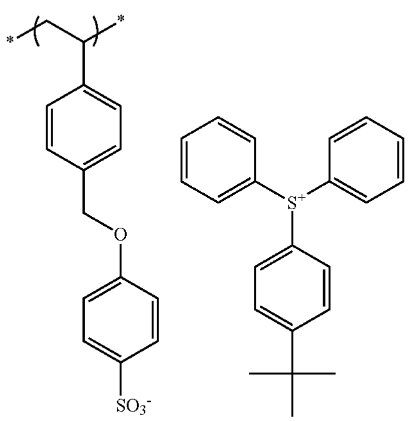
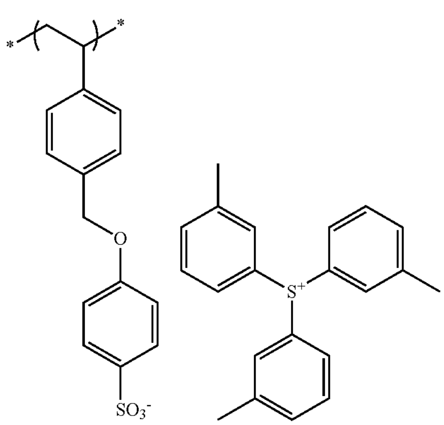
-continued
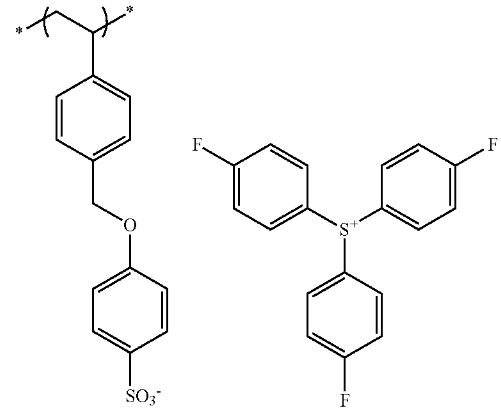
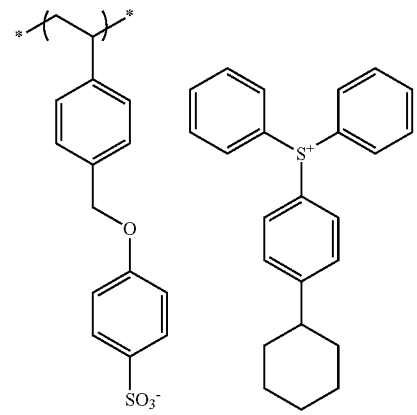
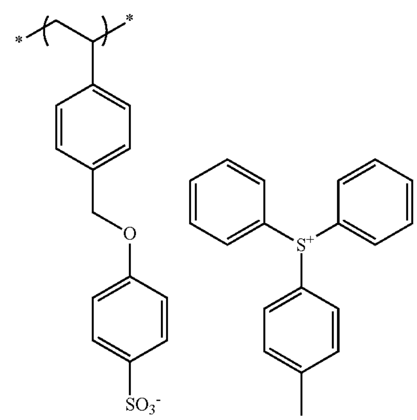
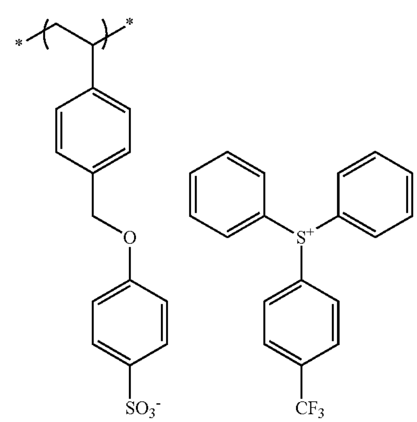

-continued
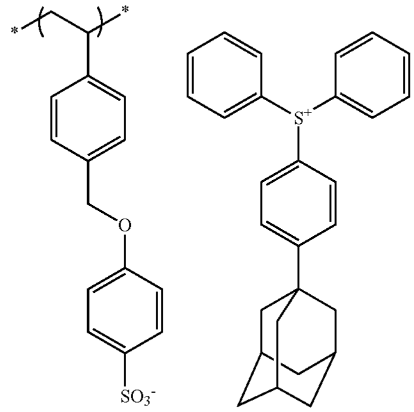
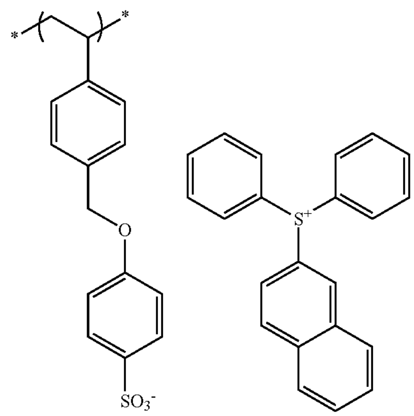
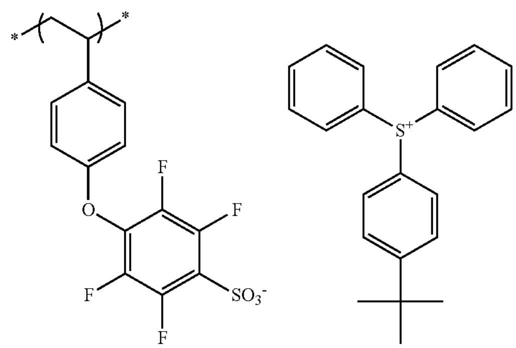
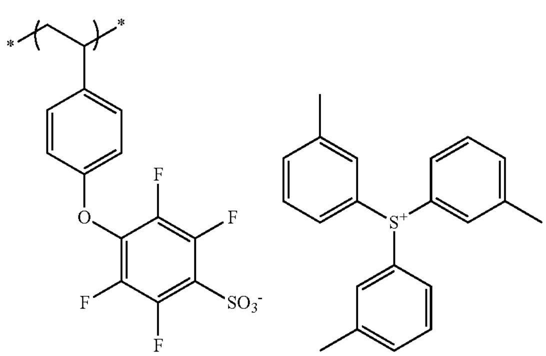
-continued
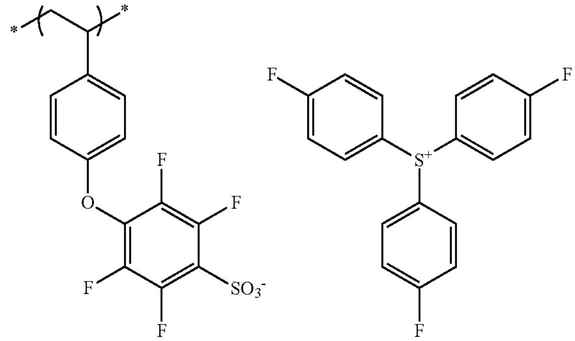
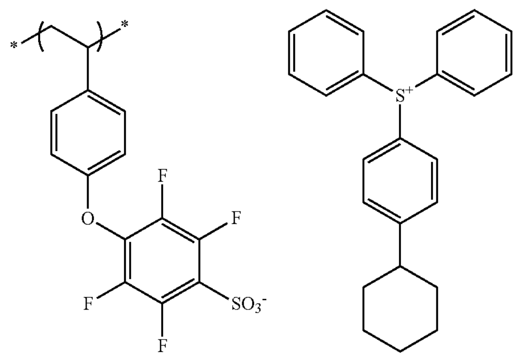
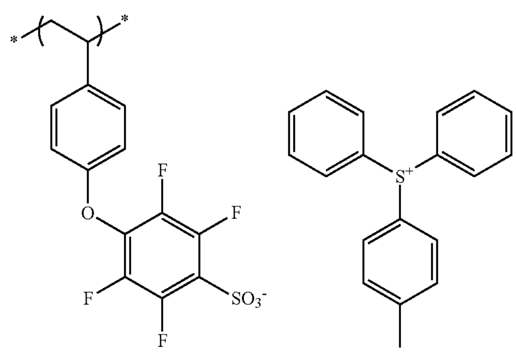
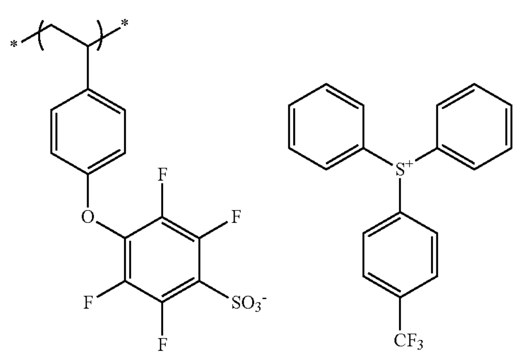

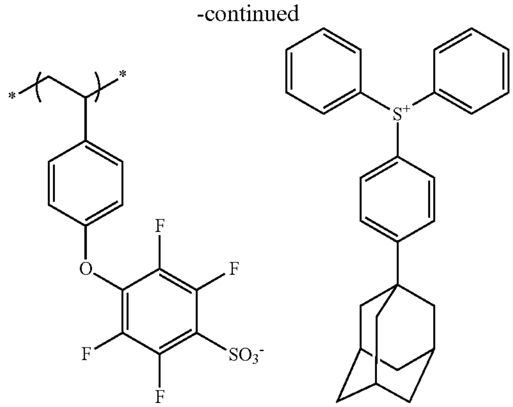
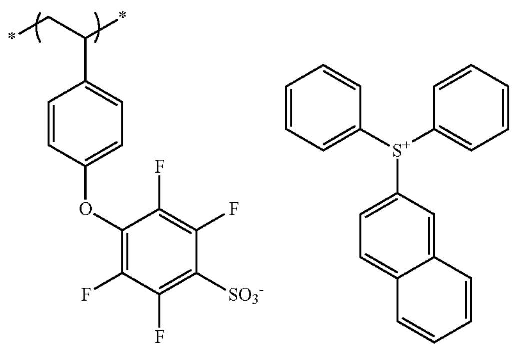
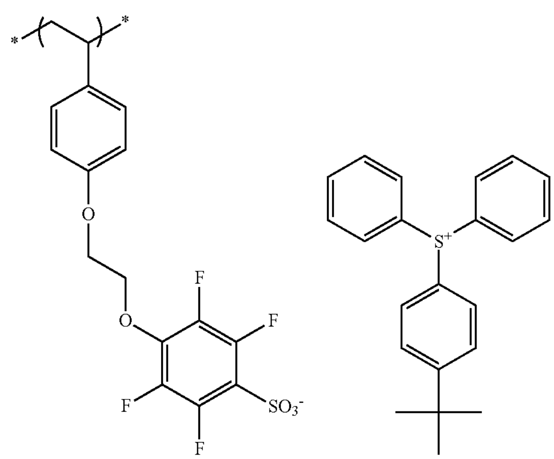
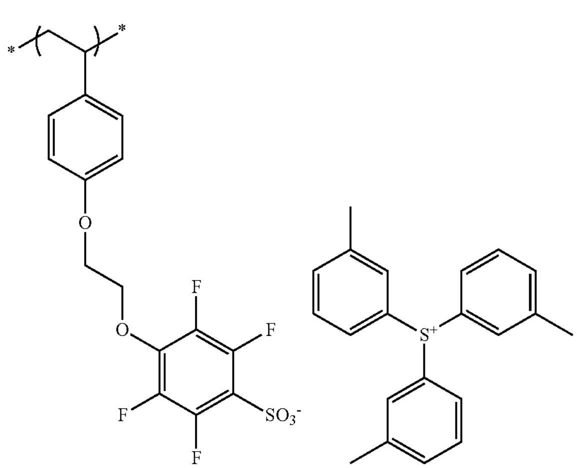
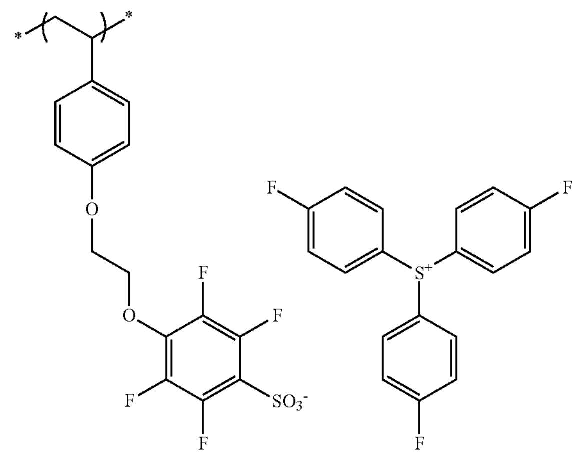
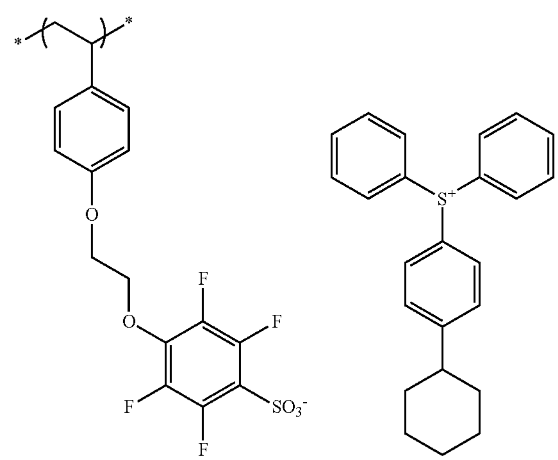
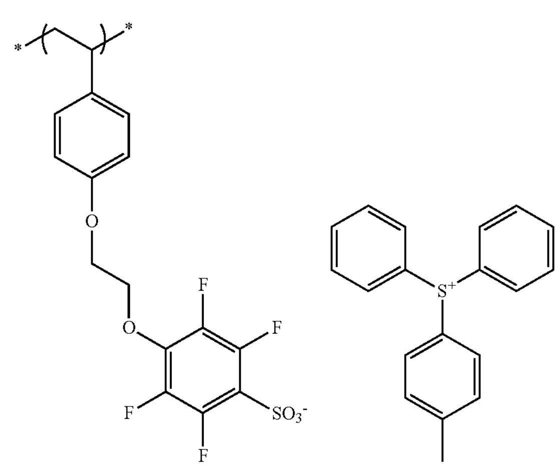

-continued
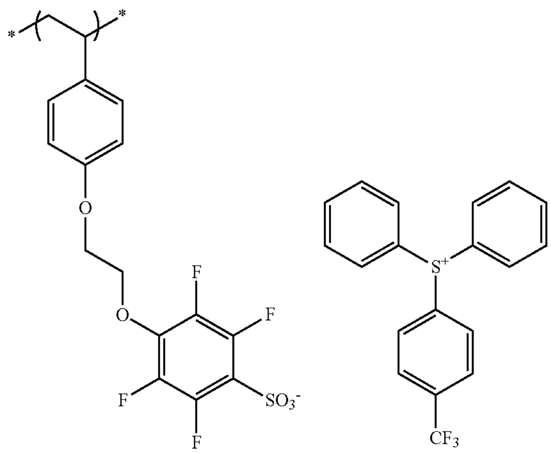
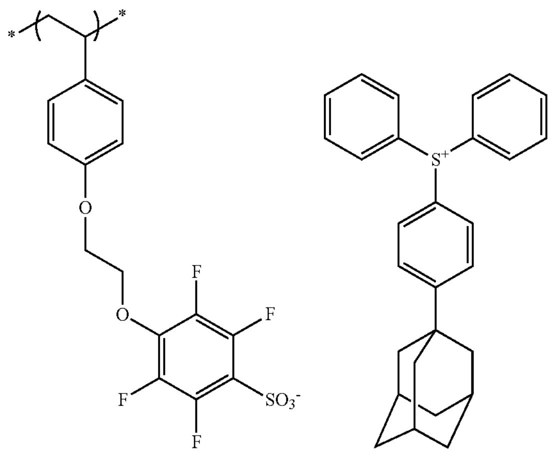
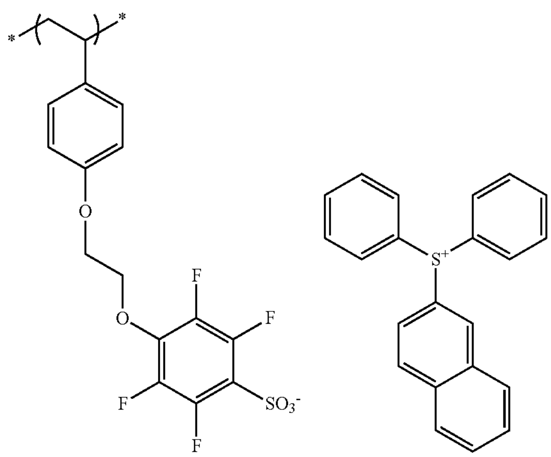
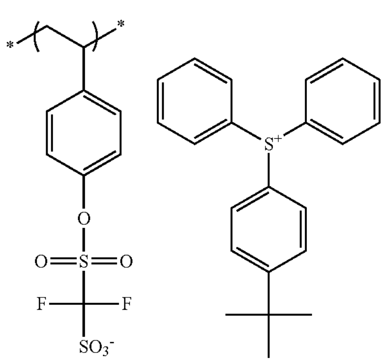
-continued
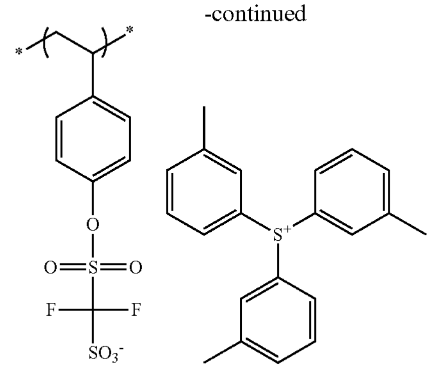
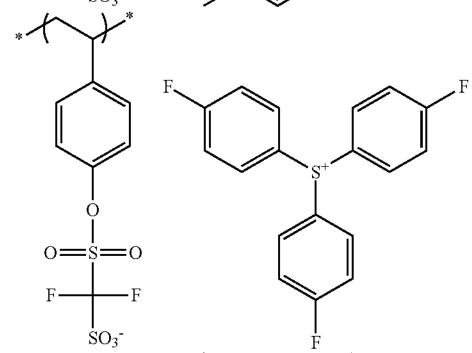
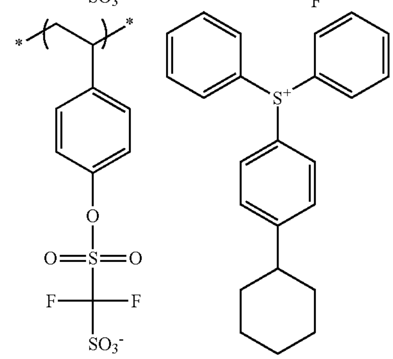
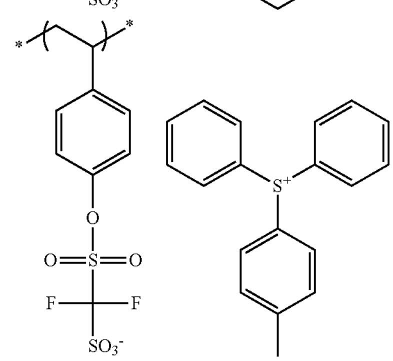
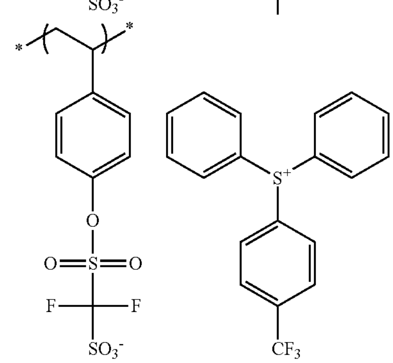

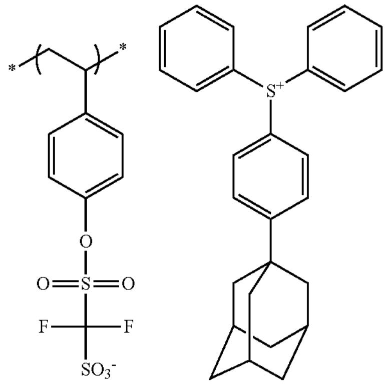
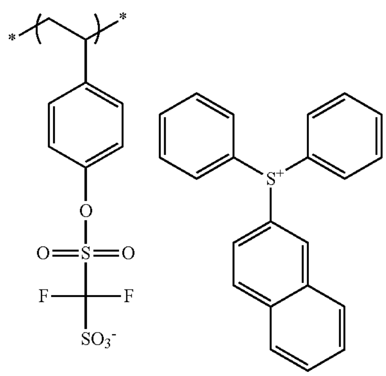
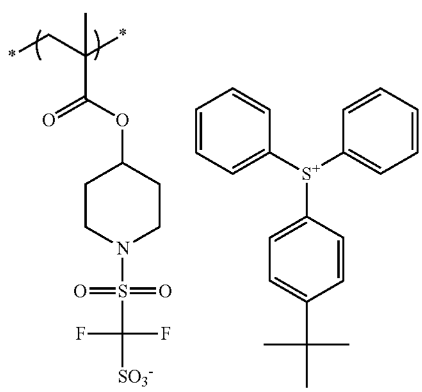
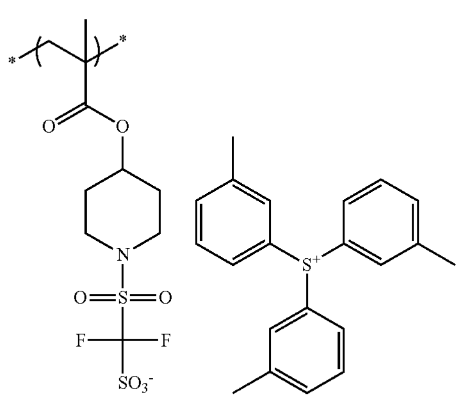
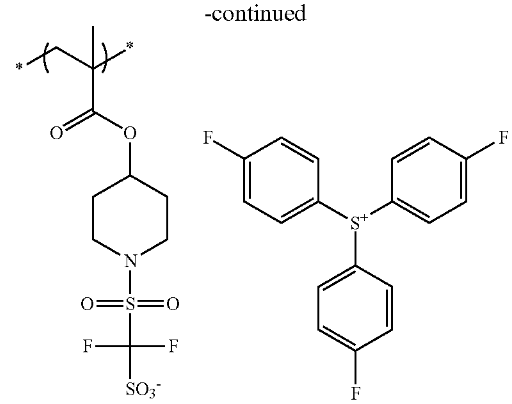
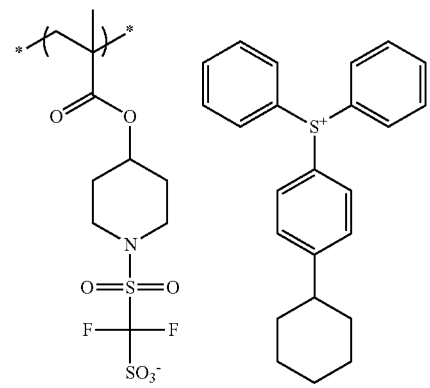
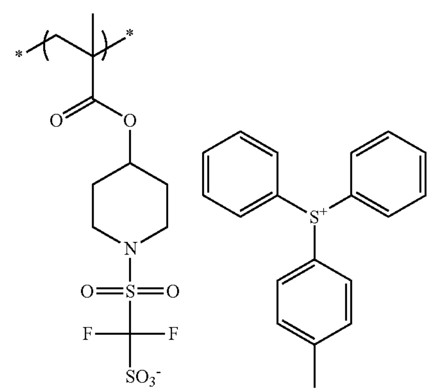
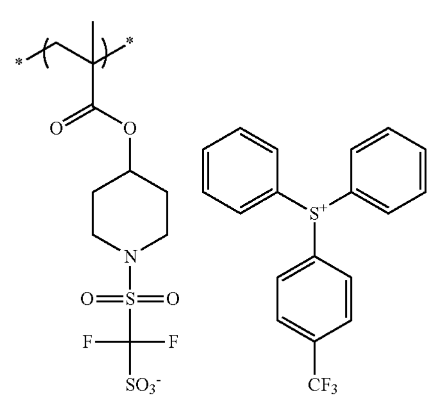

-continued
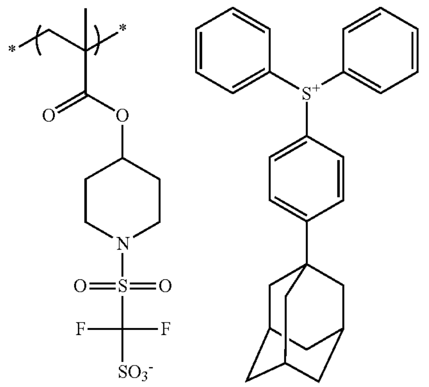
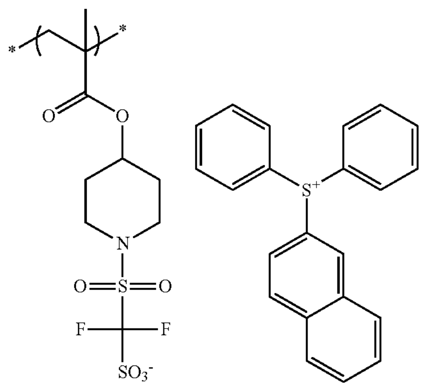
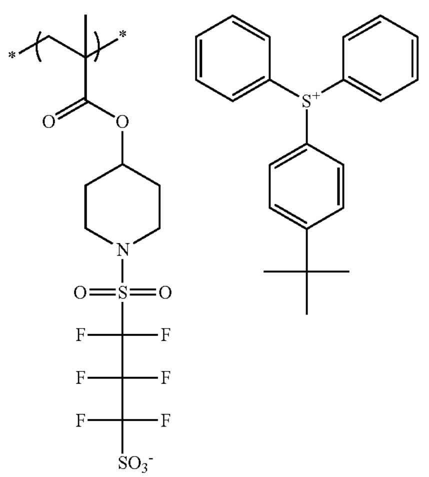
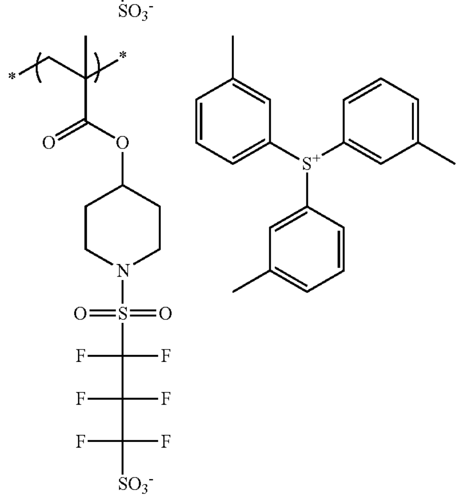
-continued
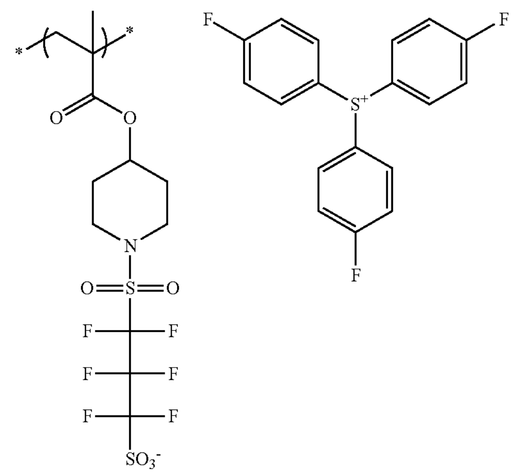
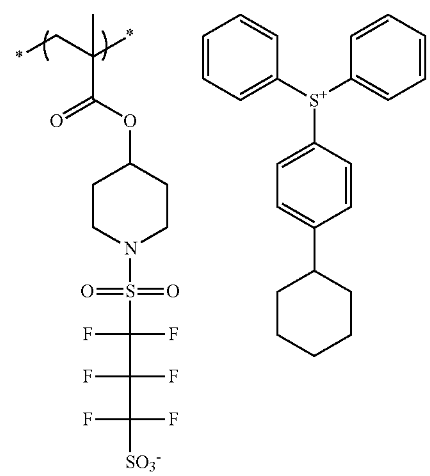
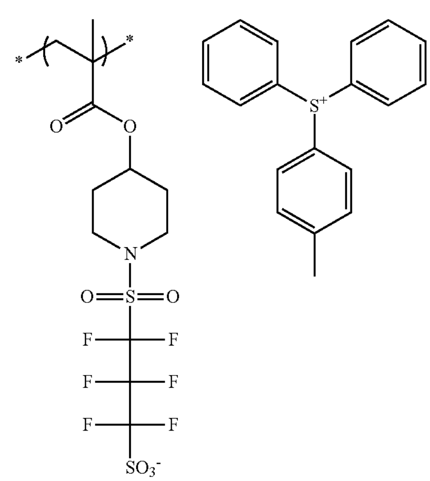

-continued
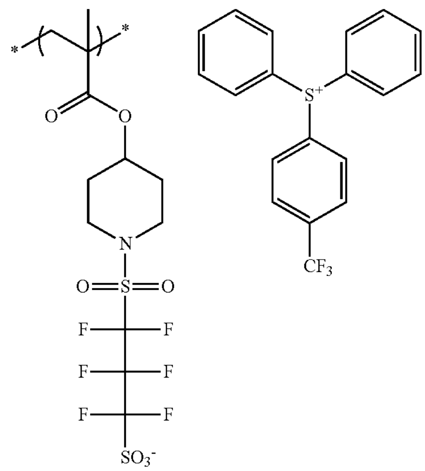
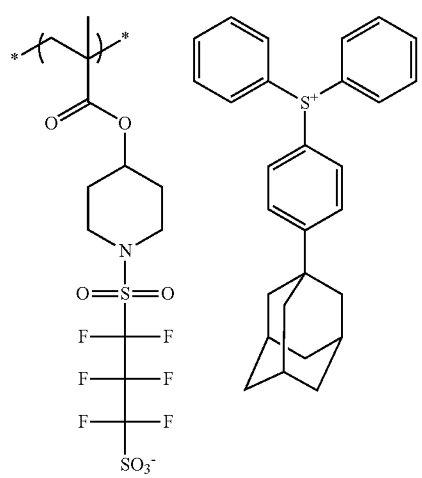
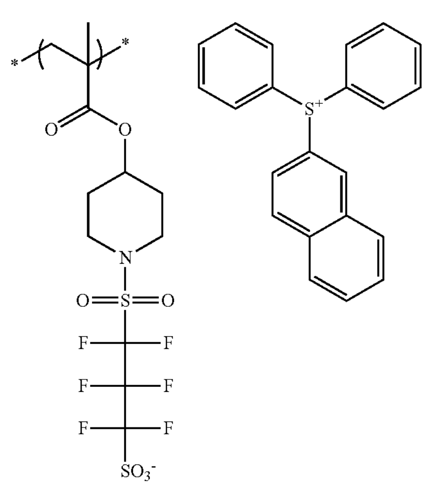
-continued
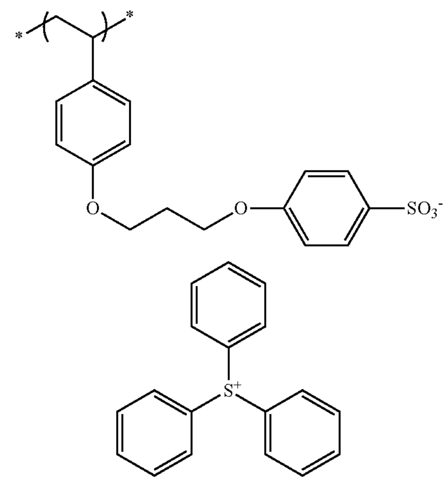
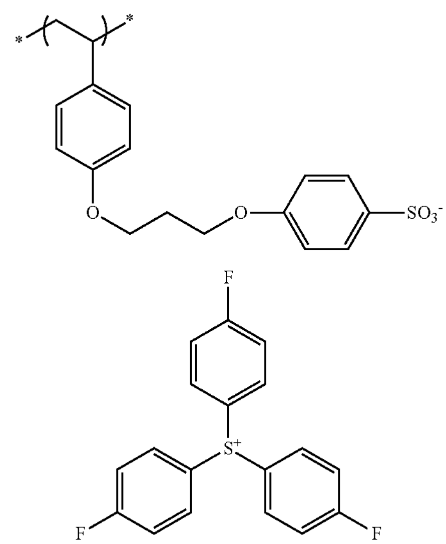
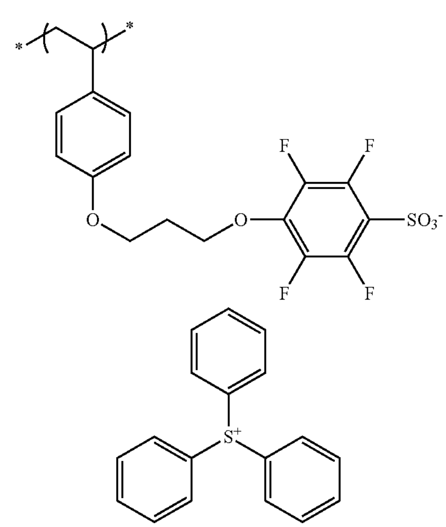

-continued

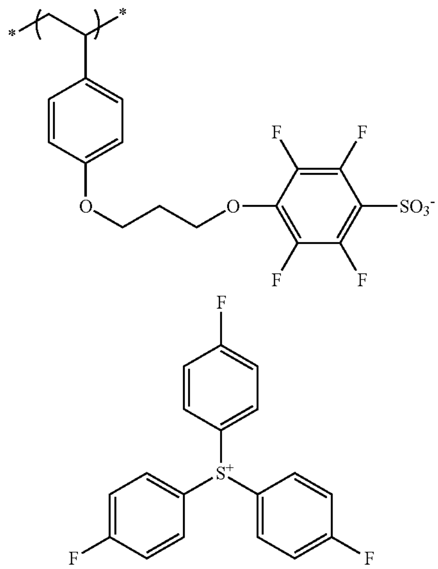

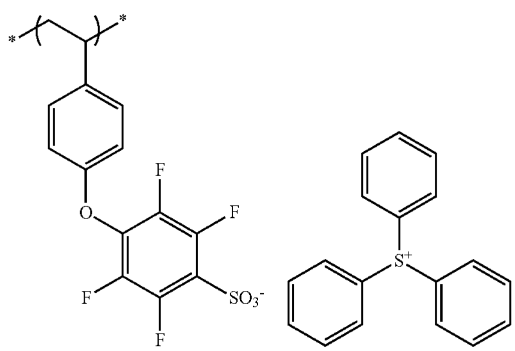

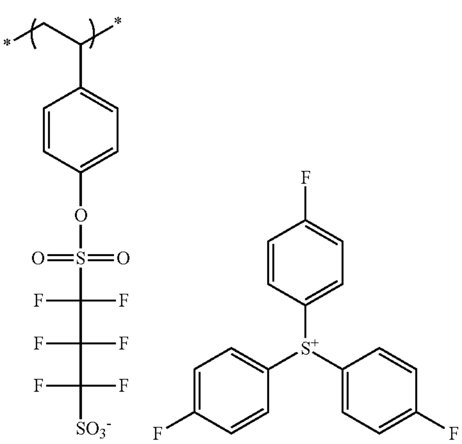

-continued

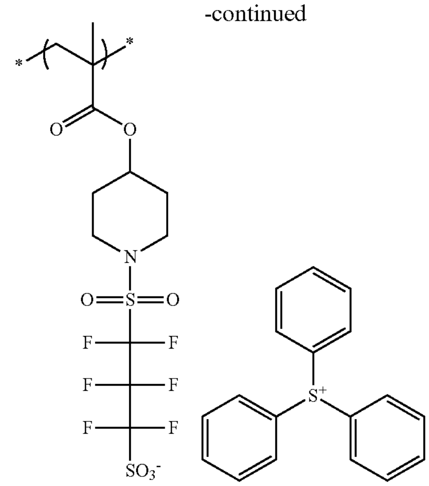

The content of the repeating unit represented by formula (4) in the resin (P) is preferably from 1 to 40 mol %, more preferably from 2 to 30 mol %, still more preferably from 5 to 25 mol %, based on all repeating units in the resin (P).

It is also preferred that the resin (P) further contains the following repeating units as other repeating units.

(a) Repeating Unit Having a Polar Group

The resin (P) may contain a repeating unit having a polar group. By containing the repeating unit having a polar group, for example, the sensitivity of the composition containing the resin can be more enhanced. The repeating unit having a polar group is preferably a non-acid-decomposable repeating unit (that is, has no acid-decomposable group).

The "polar group" which can be contained in the repeating unit having a polar group includes, for example, the following (1) to (4). In the following, the "electronegativity" means a Pauling's value.

(1) A Functional Group Containing a Structure where an Oxygen Atom and an Atom with the Electronegativity Difference from Oxygen Atom being 1.1 or More are Bonded Through a Single Bond Examples of this polar group include a group containing a structure represented by O—H, such as hydroxy group.

(2) A Functional Group Containing a Structure where a Nitrogen Atom and an Atom with the Electronegativity Difference from Nitrogen Atom being 0.6 or More are Bonded Through a Single Bond Examples of this polar group include a group containing a structure represented by N—H, such as amino group.

(3) A Functional Group Containing a Structure where Two Atoms Differing in the Electronegativity by 0.5 or More are Bonded Through a Double Bond or a Triple Bond Examples of this polar group include a group containing a structure represented by C≡N, C═O, N═O, S═O or C═N.

(4) A Functional Group Having an Ionic Moiety

Examples of this polar group include a group having a moiety represented by $N^+$ or $S^+$.

Specific examples of the partial structure which can be contained in the "polar group" are illustrated below.

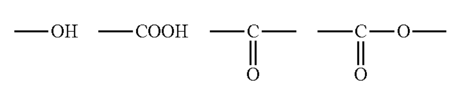

-continued

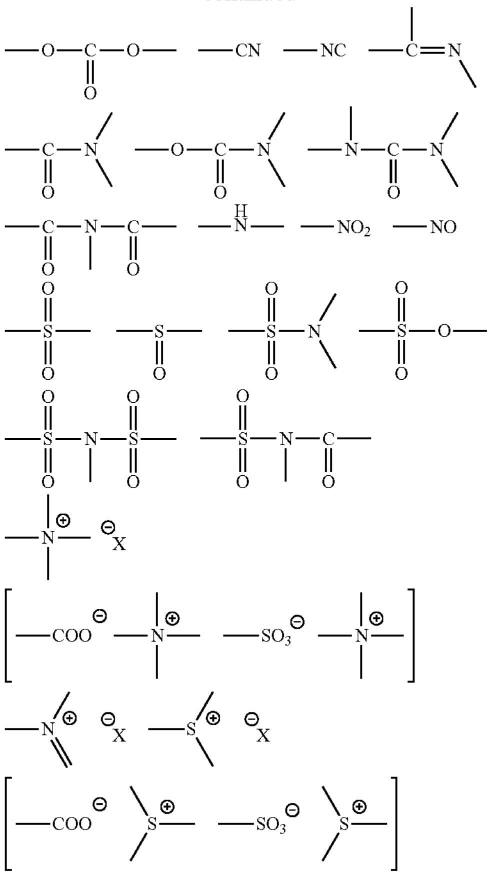

The polar group is preferably selected from a hydroxyl group, a cyano group, a lactone group, a sultone group, a carboxylic acid group, a sulfonic acid group, an amide group, a sulfonamide group, an ammonium group, a sulfonium group, a carbonate group (—O—CO—O—) (for example, a cyclic carbonic acid ester structure), and a group formed by combining two or more thereof, more preferably an alcoholic hydroxy group, a cyano group, a lactone group, a sultone group or a cyanolactone structure-containing group.

When a repeating unit having an alcoholic hydroxy group is further incorporated into the resin, the exposure latitude (EL) of a composition containing the resin can be more enhanced.

When a repeating unit having a cyano group is further incorporated into the resin, the sensitivity of a composition containing the resin can be more enhanced.

When a repeating unit having a lactone group is further incorporated into the resin, the dissolution contrast for an organic solvent-containing developer can be more enhanced. Also, a composition containing the resin can be more improved in the dry etching resistance, coatability and adherence to substrate.

When a repeating unit having a group containing a cyano group-containing lactone structure is further incorporated into the resin, the dissolution contrast for an organic solvent-containing developer can be more enhanced. Also, a composition containing the resin can be more improved in the sensitivity, dry etching resistance, coatability and adherence to substrate. In addition, functions attributable to a cyano group and a lactone group, respectively, can be undertaken by a single repeating unit and the latitude in designing the resin can be more broadened.

In the case where the polar group contained in the repeating unit having a polar group is an alcoholic hydroxyl group, the repeating unit is preferably represented by at least one of the following formulae (I-1H) to (I-10H), more preferably represented by at least one of the following formulae (I-1H) to (I-3H), still more preferably represented by the following formula (I-1H).

(I-1H)

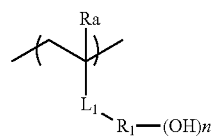

(I-2H)

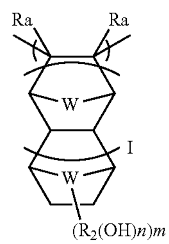

(I-3H)

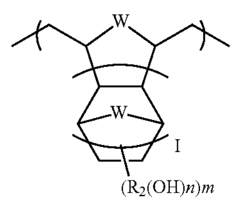

(I-4H)

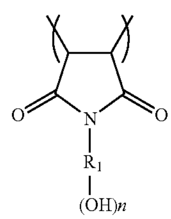

(I-5H)

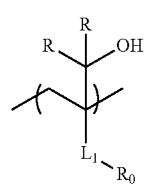

(I-6H)

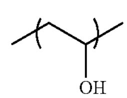

(I-7H)

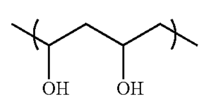

(I-8H)

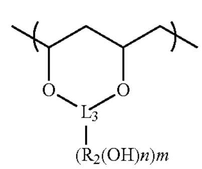

-continued (I-9H)

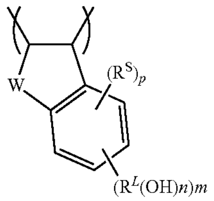

(I-10H)

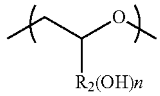

In the formulae, each Ra independently represents a hydrogen atom, an alkyl group or a group represented by —$CH_2$—O—$Ra_2$, wherein $Ra_2$ represents a hydrogen atom, an alkyl group or an acyl group.

$R_1$ represents an (n+1)-valent organic group.

$R_2$ represents, when m≥2, each independently represents, a single bond or an (n+1)-valent organic group.

W represents a methylene group, an oxygen atom or a sulfur atom, n and m represent an integer of 1 or more. Incidentally, in the case where $R_2$ in formula (I-2H), (I-3H) or (I-8H) represents a single bond, n is 1.

l represents an integer of 0 or more.

$L_1$ represents a linking group represented by —COO—, —OCO—, —CONH—, —O—, —Ar—, —$SO_3$— or —$SO_2$NH—, wherein Ar represents a divalent aromatic ring group.

Each R independently represents a hydrogen atom or an alkyl group.

$R_0$ represents a hydrogen atom or an organic group.

$L_3$ represents an (m+2)-valent linking group.

$R^L$ represents, when m≥2, each independently represents, an (n+1)-valent linking group.

$R^S$ represents, when p≥2, each independently represents, a substituent, and when p≥2, the plurality of $R^S$ may combine with each other to form a ring.

p represents an integer of 0 to 3.

Ra represents a hydrogen atom, an alkyl group or a group represented by —$CH_2$—O—$Ra_2$. Ra is preferably a hydrogen atom or an alkyl group having a carbon number of 1 to 10, more preferably a hydrogen atom or a methyl group.

W represents a methylene group, an oxygen atom or a sulfur atom. W is preferably a methylene group or an oxygen atom.

$R_1$ represents an (n+1)-valent organic group. $R_1$ is preferably a non-aromatic hydrocarbon group. In this case, $R_1$ may be a chain hydrocarbon group or an alicyclic hydrocarbon group. $R_1$ is more preferably an alicyclic hydrocarbon group.

$R_2$ represents a single bond or an (n+1)-valent organic group. $R_2$ is preferably a single bond or a non-aromatic hydrocarbon group. In this case, $R_2$ may be a chain hydrocarbon group or an alicyclic hydrocarbon group.

In the case where $R_1$ and/or $R_2$ are a chain hydrocarbon group, the chain hydrocarbon group may be a linear or branched-chain hydrocarbon group. The carbon number of the chain hydrocarbon group is preferably from 1 to 8. For example, when $R_1$ and/or $R_2$ are an alkylene group, $R_1$ and/or $R_2$ are preferably a methylene group, an ethylene group, an n-propylene group, an isopropylene group, an n-butylene group, an isobutylene group or a sec-butylene group.

In the case where $R_1$ and/or $R_2$ are an alicyclic hydrocarbon group, the alicyclic hydrocarbon group may be monocyclic or polycyclic. The alicyclic hydrocarbon group has, for example, a monocycle, bicyclo, tricyclo or tetracyclo structure. The carbon number of the alicyclic hydrocarbon group is usually 5 or more, preferably from 6 to 30, more preferably from 7 to 25.

The alicyclic hydrocarbon group includes, for example, those having a partial structure illustrated below. Each of these partial structures may have a substituent. Also, in each of these partial structures, the methylene group (—$CH_2$—) may be substituted with an oxygen atom (—O—), a sulfur atom (—S—), a carbonyl group [—C(═O)—], a sulfonyl group [—S(═O)$_2$—], a sulfinyl group [—S(═O)—] or an imino group [—N(R)—](wherein R is a hydrogen atom or an alkyl group).

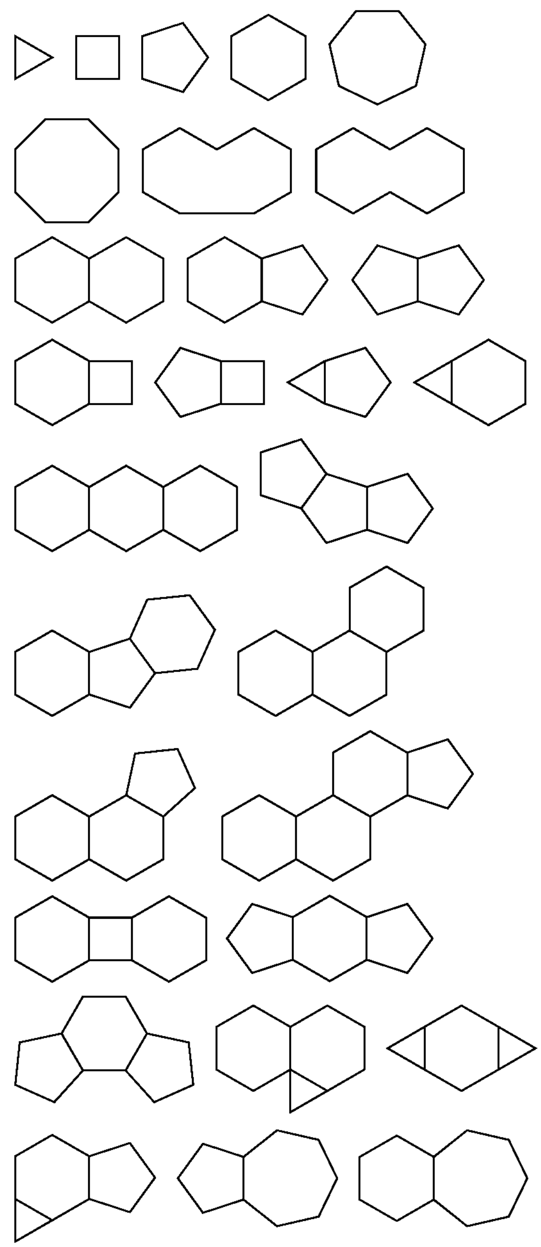

-continued

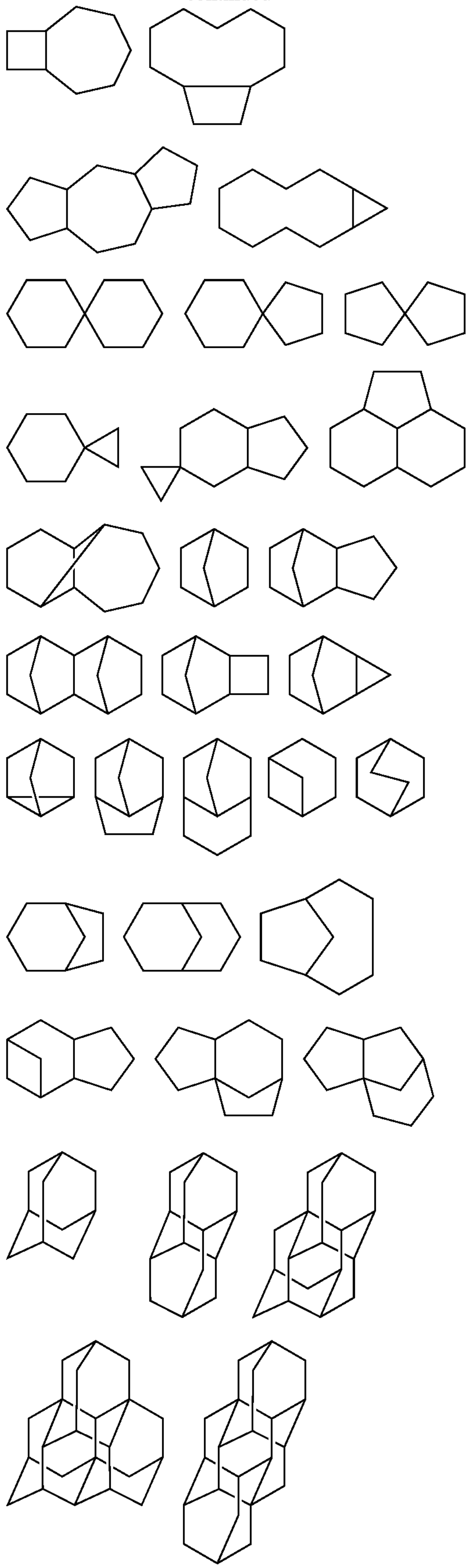

-continued

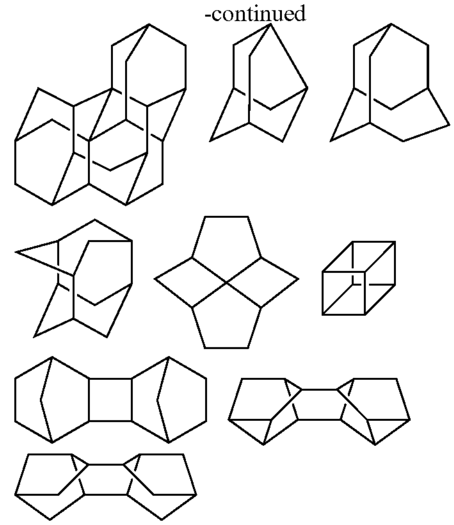

For example, when $R_1$ and/or $R_2$ are a cycloalkylene group, $R_1$ and/or $R_2$ are preferably an adamantylene group, a noradamantylene group, a decahydronaphthalene group, a tricyclodecanylene group, a tetracyclododecanylene group, a norbornylene group, a cyclopentylene group, a cyclohexylene group, a cycloheptylene group, a cyclooctylene group, a cyclodecanylene group or a cyclododecanylene group, more preferably an adamantylene group, a norbornylene group, a cyclohexylene group, a cyclopentylene group, a tetracyclododecanylene group or a tricyclodecanylene group.

The non-aromatic hydrocarbon group of $R_1$ and/or $R_2$ may have a substituent. Examples of this substituent include an alkyl group having a carbon number of 1 to 4, a halogen atom, a hydroxy group, an alkoxy group having a carbon number of 1 to 4, a carboxy group, and an alkoxycarbonyl group having a carbon number of 2 to 6. These alkyl group, alkoxy group and alkoxycarbonyl group may further have a substituent, and examples of the substituent include a hydroxy group, a halogen atom, and an alkoxy group.

$L_1$ represents a linking group represented by —COO—, —OCO—, —CONH—, —O—, —Ar—, $—SO_3—$ or $—SO_2NH—$, wherein Ar represents a divalent aromatic ring group. $L_1$ is preferably a linking group represented by —COO—, —CONH— or —Ar—, more preferably a linking group represented by —COO— or —CONH—.

R represents a hydrogen atom or an alkyl group. The alkyl group may be a linear alkyl group or a branched-chain alkyl group. The carbon number of this alkyl group is preferably from 1 to 6, more preferably from 1 to 3. R is preferably a hydrogen atom or a methyl group, more preferably a hydrogen atom.

$R_0$ represents a hydrogen atom or an organic group. Examples of the organic group include an alkyl group, a cycloalkyl group, an aryl group, an alkynyl group and an alkenyl group. $R_0$ is preferably a hydrogen atom or an alkyl group, more preferably a hydrogen atom or a methyl group.

$L_3$ represents an (m+2)-valent linking group. That is, $L_3$ represents a trivalent or higher valent linking group. Examples of such a linking group include corresponding groups in specific examples illustrated later.

$R^L$ represents an (n+1)-valent linking group. That is, $R^L$ represents a divalent or higher valent linking group. Examples of such a linking group include an alkylene group, a cycloalkylene group, and corresponding groups in specific examples illustrated later. $R^L$ may combine with another $R^L$ or with $R^S$ to form a ring structure.

$R^S$ represents a substituent. Examples of the substituent include an alkyl group, an alkenyl group, an alkynyl group, an aryl group, an alkoxy group, an acyloxy group, an alkoxycarbonyl group, and a halogen atom.

n is an integer of 1 or more. n is preferably an integer of 1 to 3, more preferably 1 or 2. Also, when n is an integer of 2 or more, the dissolution contrast for an organic solvent-containing developer can be more enhanced and in turn, the limiting resolution and roughness characteristics can be more improved.

m is an integer of 1 or more. m is preferably an integer of 1 to 3, more preferably 1 or 2.

l an integer of 0 or more. l is preferably 0 or 1.

p is an integer of 0 to 3.

When a repeating unit having a group capable of decomposing by the action of an acid to produce an alcoholic hydroxy group and a repeating unit represented by at least one formula selected from the group consisting of formulae (I-1H) to (I-10H) are used in combination, for example, thanks to suppression of acid diffusion by the alcoholic hydroxy group and increase in the sensitivity brought about by the group capable of decomposing by the action of an acid to produce an alcoholic hydroxy group, the exposure latitude (EL) can be improved without deteriorating other performances.

In the case of having an alcoholic hydroxy group, the content of this repeating unit is preferably from 1 to 60 mol %, more preferably from 3 to 50 mol %, still more preferably from 5 to 40 mol %, based on all repeating units in the resin (P).

Specific examples of the repeating unit represented by any one of formulae (I-1H) to (I-101H) are illustrated below. In specific examples, Ra has the same meaning as in formulae (I-1H) to (I-10H).

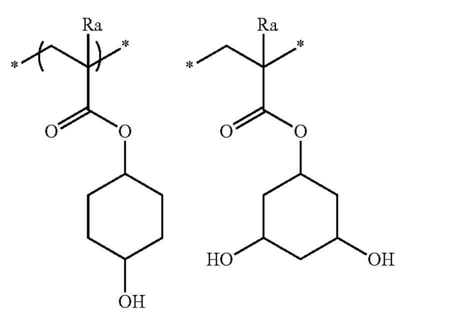

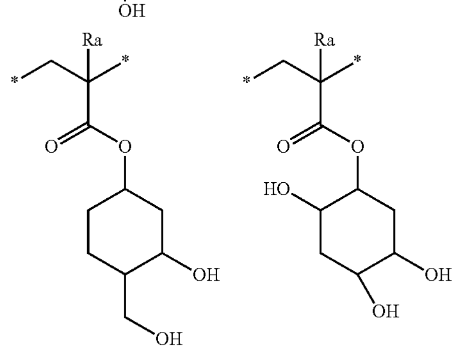

-continued

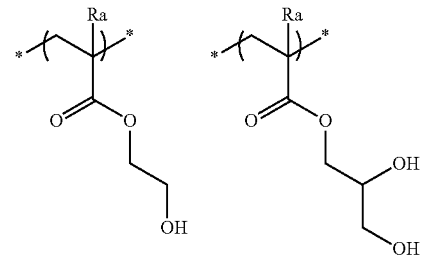

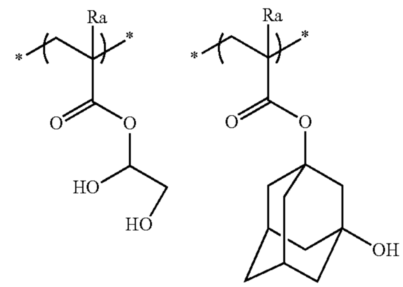

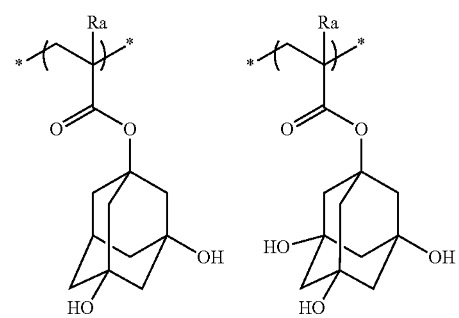

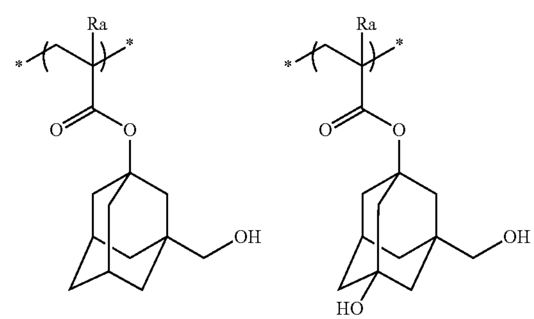

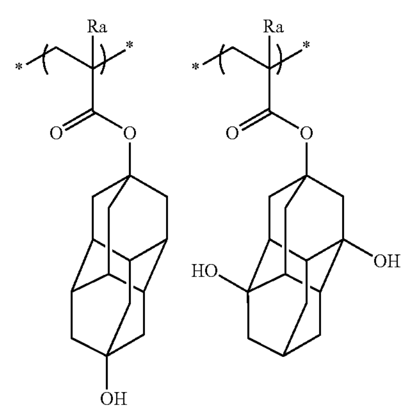

-continued

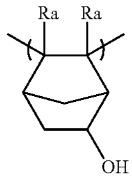
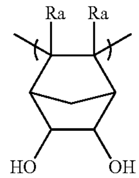
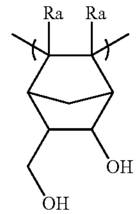
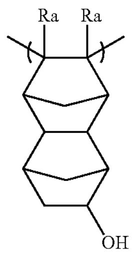
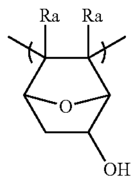
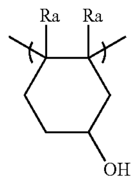
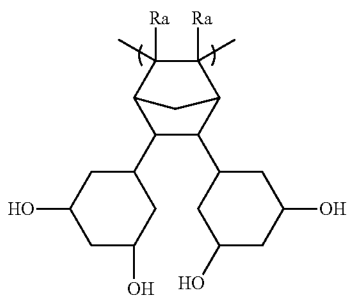
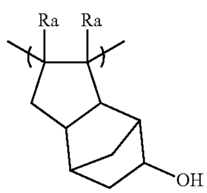
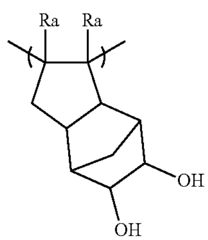
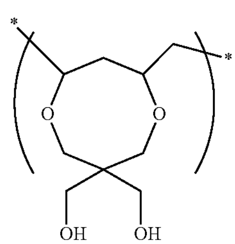

In the case where the polar group contained in the repeating unit having a polar group is an alcoholic hydroxy group or a cyano group, one preferred embodiment of the repeating unit is a repeating unit having an alicyclic hydrocarbon structure substituted with a hydroxyl group or a cyano group. At this time, the repeating unit preferably has no acid-decomposable group. The alicyclic hydrocarbon structure in the alicyclic hydrocarbon structure substituted with a hydroxyl group or a cyano group is preferably an adamantyl group, a diamantyl group or a norbornane group. The alicyclic hydrocarbon structure substituted with a hydroxyl group or a cyano group is preferably a partial structure represented by the following formulae (VIIa) to (VIIc). Thanks to this repeating unit, adherence to substrate and affinity for developer are enhanced.

(VIIa)

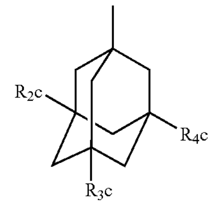

(VIIb)

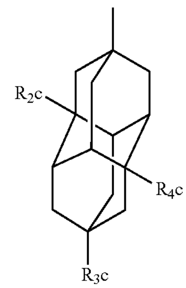

(VIIc)

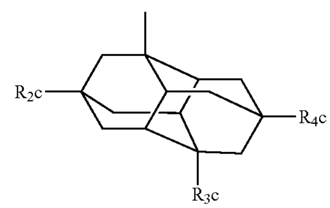

In formulae (VIIa) to (VIIc), each of $R_2c$ to $R_4c$ independently represents a hydrogen atom, a hydroxyl group or a cyano group, provided that at least one of $R_2c$ to $R_4c$ represents a hydroxyl group. A structure where one or two members of $R_2c$ to $R_4c$ are a hydroxyl group with the remaining being a hydrogen atom is preferred. In formula (VIIa), it is more preferred that two members of $R_2c$ to $R_4c$ are a hydroxyl group and the remaining is a hydrogen atom.

The repeating unit having a partial structure represented by formulae (VIIa) to (VIIc) includes repeating units represented by the following formulae (AIIa) to (AIIc):

(AIIa)

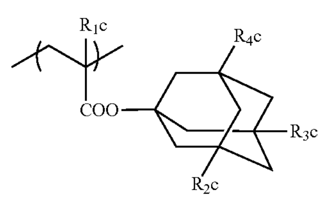

(AIIb)

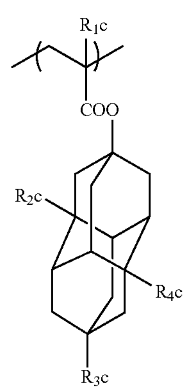

-continued (AIIc)

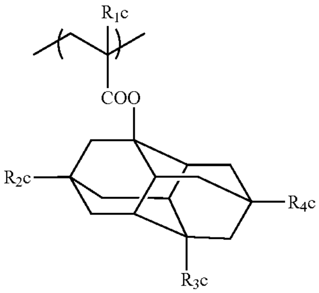

In formulae (AIIa) to (AIIc), $R_1c$ represents a hydrogen atom, a methyl group, a trifluoromethyl group or a hydroxymethyl group.

$R_2c$ to $R_4c$ have the same meanings as $R_2c$ to $R_4c$ in formulae (VIIa) to (VIIc).

The resin (P) may or may not contain a repeating unit having a hydroxyl group or a cyano group, but in the case of containing a repeating unit having a hydroxyl group or a cyano group, the content thereof is preferably from 1 to 60 mol %, more preferably from 3 to 50 mol %, still more preferably from 5 to 40 mol %, based on all repeating units in the resin (P).

Specific examples of the repeating unit having a hydroxyl group or a cyano group are illustrated below, but the present invention is not limited thereto.

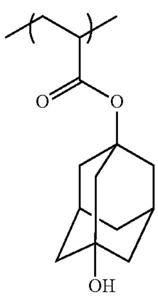
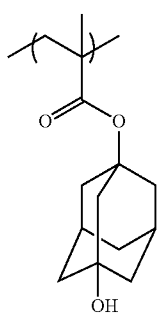
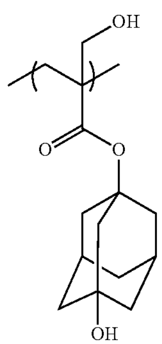
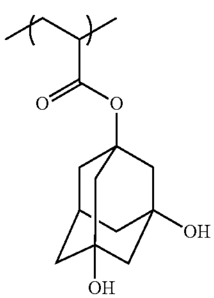
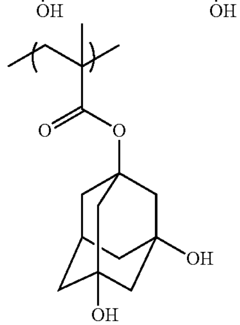
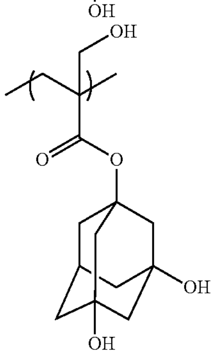
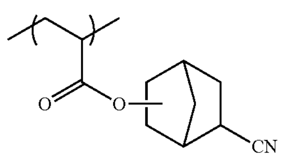

-continued

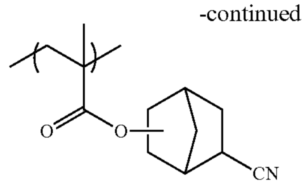
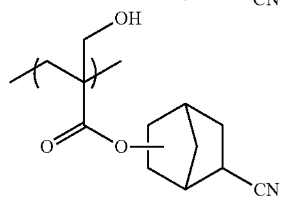
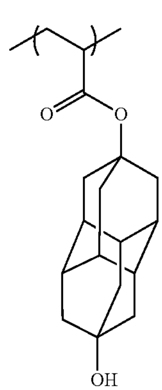
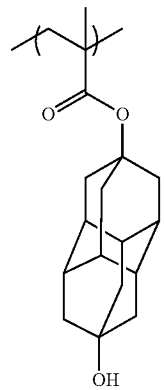
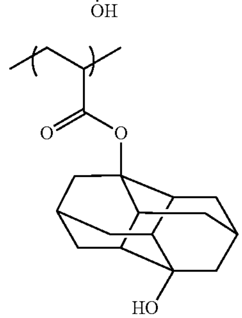
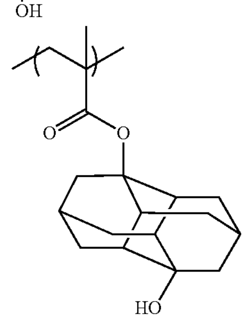

The repeating unit having a polar group may be a repeating unit having a lactone structure as the polar group.

The repeating unit having a lactone structure is preferably a repeating unit represented by the following formula (AII):

(AII)

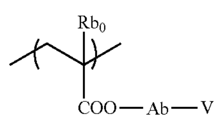

In formula (AII), $Rb_0$ represents a hydrogen atom, a halogen atom or an alkyl group (preferably having a carbon number of 1 to 4) which may have a substituent.

Preferred substituents which the alkyl group of $Rb_0$ may have include a hydroxyl group and a halogen atom. The halogen atom of $Rb_0$ includes a fluorine atom, a chlorine atom, a bromine atom and an iodine atom. $Rb_0$ is preferably a hydrogen atom, a methyl group, a hydroxymethyl group or a trifluoromethyl group, more preferably a hydrogen atom or a methyl group.

Ab represents a single bond, an alkylene group, a divalent linking group having a monocyclic or polycyclic cycloalkyl structure, an ether bond, an ester bond, a carbonyl group, or a divalent linking group formed by combining these. Ab is preferably a single bond or a divalent linking group represented by -$Ab_1$-$CO_2$—.

$Ab_1$ is a linear or branched alkylene group or a monocyclic or polycyclic cycloalkylene group and is preferably a methylene group, an ethylene group, a cyclohexylene group, an adamantylene group or a norbornylene group.

V represents a group having a lactone structure.

As the group having a lactone structure, any group may be used as long as it has a lactone structure, but a 5- to 7-membered ring lactone structure is preferred, and a 5- to 7-membered ring lactone structure to which another ring structure is fused to form a bicyclo or spiro structure is preferred. It is more preferred to contain a repeating unit having a lactone structure represented by any one of the following formulae (LC1-1) to (LC1-17). The lactone structure may be bonded directly to the main chain. Preferred lactone structures are (LC1-1), (LC1-4), (LC1-5), (LC1-6), (LC1-8), (LC1-13) and (LC1-14).

LC1-1

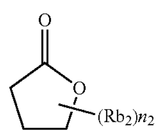

LC1-2

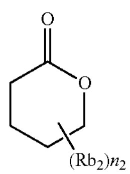

LC1-3

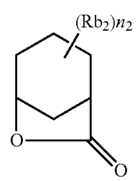

LC1-4

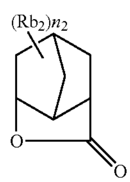

LC1-5

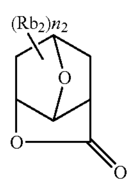

LC1-6

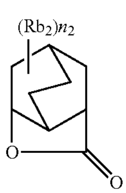

-continued

LC1-7

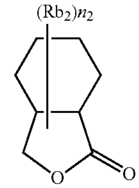

LC1-8

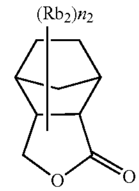

LC1-9

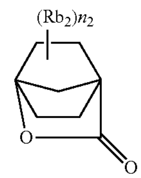

LC1-10

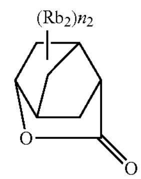

LC1-11

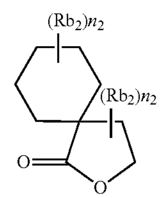

LC1-12

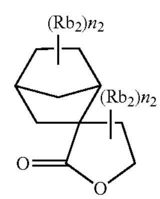

LC1-13

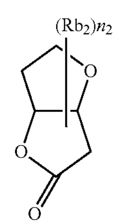

LC1-14

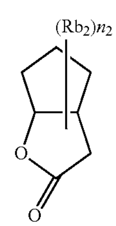

-continued

LC1-15

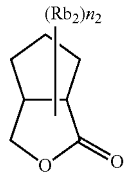

LC1-16

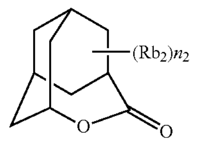

LC1-17

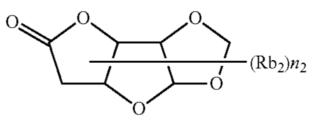

The lactone structure moiety may or may not have a substituent ($Rb_2$). Preferred examples of the substituent ($Rb_2$) include an alkyl group having a carbon number of 1 to 8, a monovalent cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group, and an acid-decomposable group. Among these, an alkyl group having a carbon number of 1 to 4, a cyano group and an acid-decomposable group are more preferred. $n_2$ represents an integer of 0 to 4. When $n_2$ is 2 or more, each substituent ($Rb_2$) may be the same as or different from every other substituents ($Rb_2$) and also, the plurality of substituents ($Rb_2$) may combine with each other to form a ring.

The repeating unit having a lactone group usually has an optical isomer, and any optical isomer may be used. One optical isomer may be used alone, or a mixture of a plurality of optical isomers may be used. In the case of mainly using one optical isomer, the optical purity (ee) thereof is preferably 90% or more, more preferably 95% or more.

The resin (P) may or may not contain a repeating unit having a lactone structure, but in the case of containing a repeating unit having a lactone structure, the content of the repeating unit in the resin (P) is preferably from 1 to 70 mol %, more preferably from 3 to 65 mol %, still more preferably from 5 to 60 mol %, based on all repeating units.

Specific examples of the lactone structure-containing repeating unit in the resin (P) are illustrated below, but the present invention is not limited thereto. In the formulae, Rx represents H, $CH_3$, $CH_2OH$ or $CF_3$.

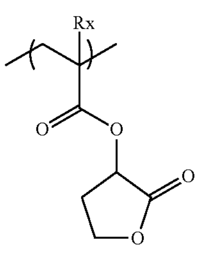

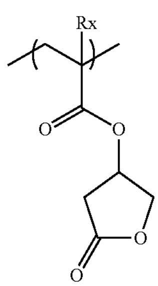

-continued

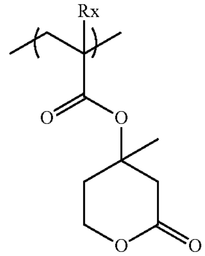

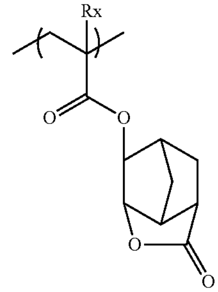

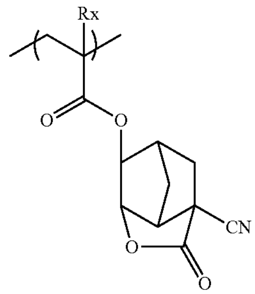

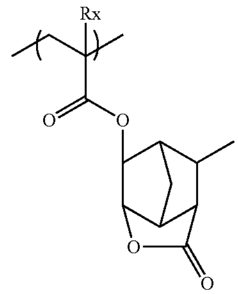

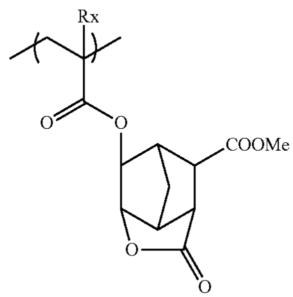

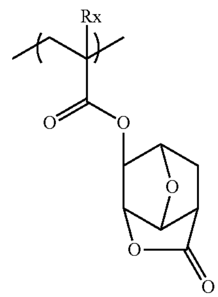

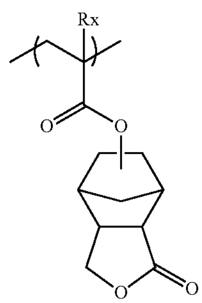

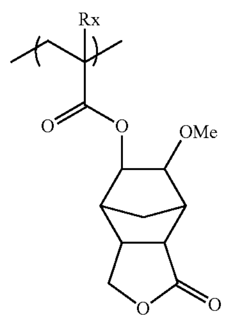

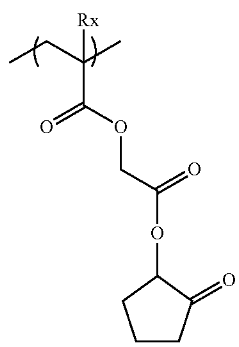

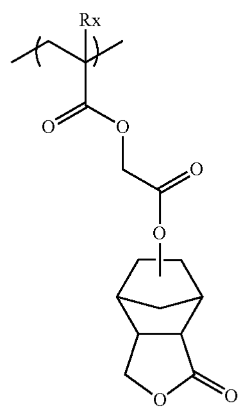

-continued

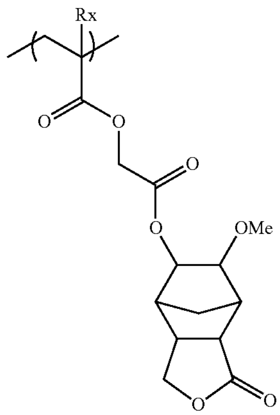

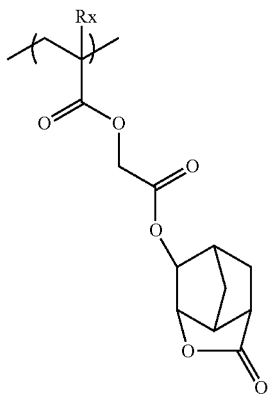

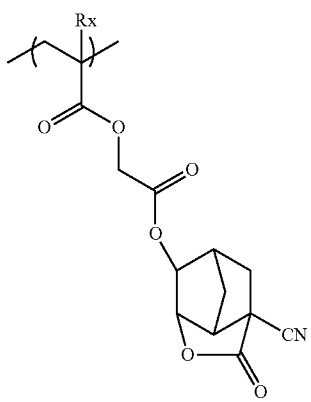

The sultone group which may be contained in the resin (P) is preferably a sultone group represented by the following formula (SL-1) or (SL-2). In the formulae, $Rb_2$ and $n_2$ have the same meanings as in formulae (LC1-1) to (LC1-17).

SL1-1

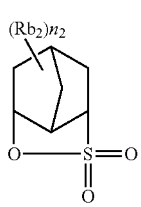

-continued

SL1-2

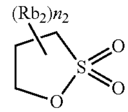

The sultone group-containing repeating unit which may be contained in the resin (P) is preferably a repeating unit where the lactone group in the above-described lactone group-containing repeating unit is replaced by a sultone group.

It is also one of particularly preferred embodiments that the polar group which can be contained in the repeating unit having a polar group is an acidic group. Preferred acidic groups include a phenolic hydroxyl group, a carboxylic acid group, a sulfonic acid group, a fluorinated alcohol group (such as hexafluoroisopropanol group), a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group. Among others, the repeating unit (b) is preferably a repeating unit having a carboxyl group. By virtue of containing a repeating unit having an acidic group, the resolution increases in usage of forming contact holes. As the repeating unit having an acidic group, all of a repeating unit where an acidic group is directly bonded to the main chain of the resin, such as repeating unit by an acrylic acid or a methacrylic acid, a repeating unit where an acidic group is bonded to the main chain of the resin through a linking group, and a repeating unit where an acidic group is introduced into the polymer chain terminal by using an acidic group-containing polymerization initiator or chain transfer agent at the polymerization, are preferred. In particular, a repeating unit by an acrylic acid or a methacrylic acid is preferred.

The acidic group which can be contained in the repeating unit having a polar group may or may not contain an aromatic ring. In the case where the repeating unit having a polar group contains an acidic group, the content of the repeating unit having an acidic group is preferably 30 mol % or less, more preferably 20 mol % or less, based on all repeating units in the resin (P). In the case where the resin (P) contains a repeating unit having an acidic group, the content of the repeating unit having an acidic group in the resin (P) is usually 1 mol % or more.

Specific examples of the repeating unit having an acidic group are illustrated below, but the present invention is not limited thereto.

In specific examples, Rx represents H, $CH_3$, $CH_2OH$ or $CF_3$.

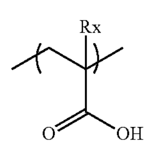

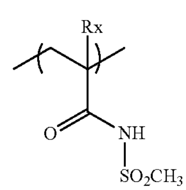

-continued

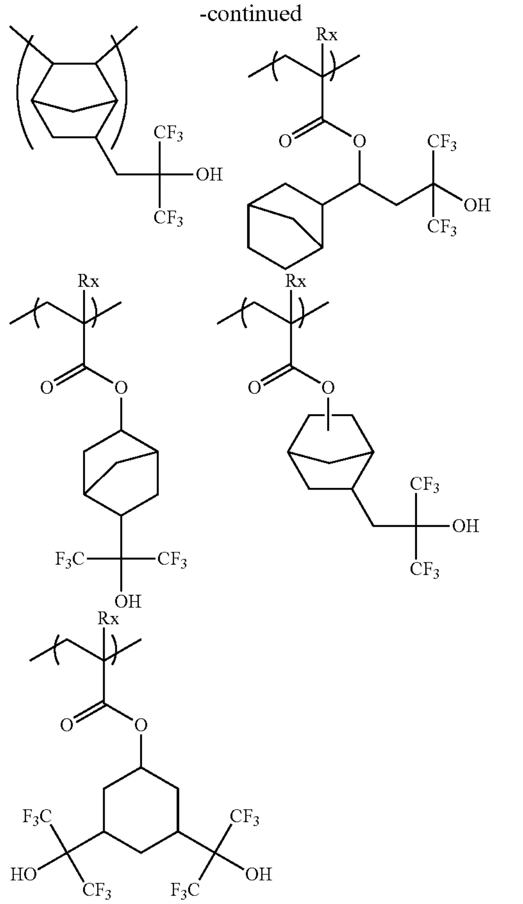

Also, the polar group that can be contained in the repeating unit having a polar group may be a carbonate group such as cyclic carbonic acid ester structure, and it is preferred that the resin (P) contains a repeating unit having a cyclic carbonic acid ester structure.

The repeating unit having a cyclic carbonic acid ester structure is preferably a repeating unit represented by the following formula (A-1):

(A-1)

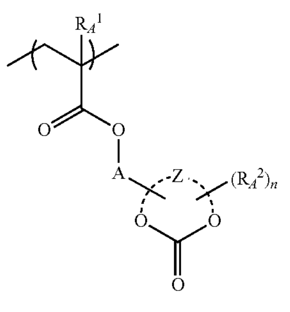

In formula (A-1), $R_A^1$ represents a hydrogen atom or an alkyl group.

$R_A^2$ represents, when n is 2 or more, each independently represents, a substituent.

A represents a single bond or a divalent linking group.

Z represents an atomic group necessary for forming a monocyclic or polycyclic structure together with the group represented by —O—C(═O)—O— in the formula.

n represents an integer of 0 or more.

Formula (A-1) is described in detail below.

The alkyl group represented by $R_A^1$ may have a substituent such as fluorine atom. $R_A^1$ preferably represents a hydrogen atom, a methyl group or a trifluoromethyl group, more preferably represents a methyl group.

The substituent represented by $R_A^2$ is, for example, an alkyl group, a cycloalkyl group, a hydroxyl group, an alkoxy group, an amino group or an alkoxycarbonyl group and is preferably an alkyl group having a carbon number of 1 to 5, and examples thereof include a linear alkyl group having a carbon number of 1 to 5, such as methyl group, ethyl group, propyl group and butyl group, and a branched alkyl group having a carbon number of 3 to 5, such as isopropyl group, isobutyl group and tert-butyl group. The alkyl may have a substituent such as hydroxyl group.

n represents the number of substituents and is an integer of 0 or more. For example, n is preferably from 0 to 4, more preferably 0.

The divalent linking group represented by A includes, for example, an alkylene group, a cycloalkylene group, an ester bond, an amido bond, an ether bond, a urethane bond, a urea bond, and a combination thereof. The alkylene group is preferably an alkylene group having a carbon number of 1 to 10, more preferably an alkylene group having a carbon number of 1 to 5, and examples thereof include a methylene group, an ethylene group, and a propylene group.

In one embodiment of the present invention, A is preferably a single bond or an alkylene group.

The monocyclic ring containing —O—C(═O)—O— represented by Z includes, for example, a 5- to 7-membered ring where in the cyclic carbonic acid ester represented by the following formula (a), $n_A$ is from 2 to 4, and is preferably a 5- or 6-membered ring ($n_A$ is 2 or 3), more preferably a 5-membered ring ($n_A$ is 2).

The polycyclic ring containing —O—C(═O)—O— represented by Z includes, for example, a structure where the cyclic carbonic acid ester represented by the following formula (a) forms a condensed ring together with one other ring structure or two or more other ring structures, and a structure where a spiro ring is formed. The "other ring structure" capable of forming a condensed ring or a spiro ring may be an alicyclic hydrocarbon group or an aromatic hydrocarbon group or may be a heterocyclic ring.

(a)

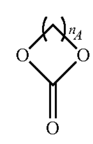

The monomer corresponding to the repeating unit represented by formula (A-1) can be synthesized by a conventionally known method described, for example, in *Tetrahedron Letters*, Vol. 27, No. 32, page 3741 (1986), and *Organic Letters*, Vol. 4, No. 15, page 2561 (2002).

In the resin (P), one of repeating units represented by formula (A-1) may be contained alone, or two or more thereof may be contained.

Specific examples of the repeating unit having a cyclic carbonic acid ester structure are illustrated below, but the present invention is not limited thereto.

In specific examples, $R_A^1$ has the same meaning as $R_A^1$ in formula (A-1).

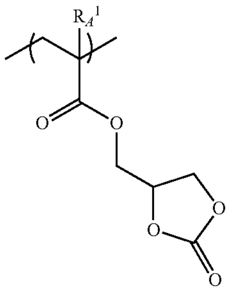
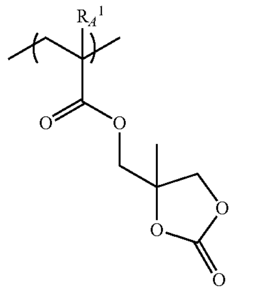
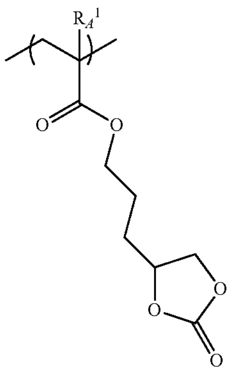
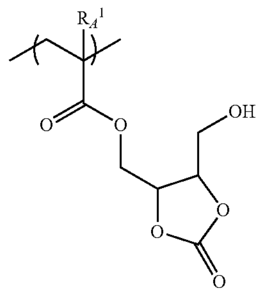
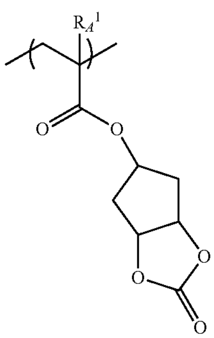
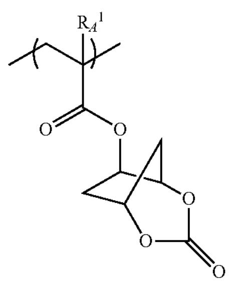
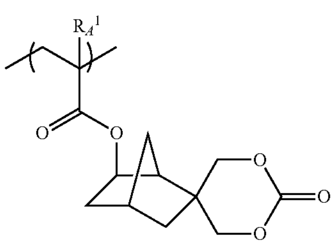
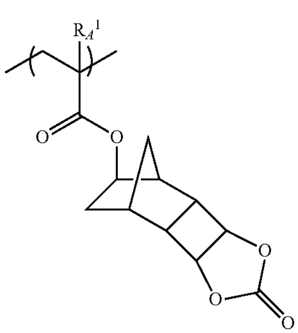
-continued
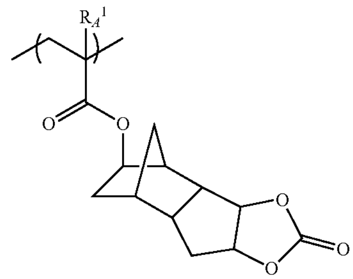
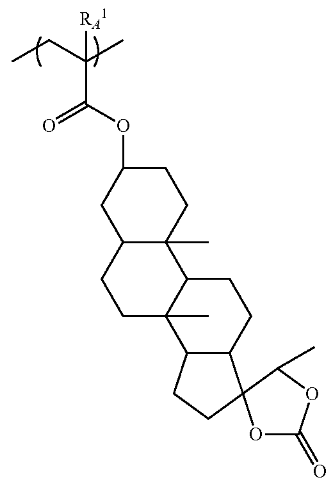
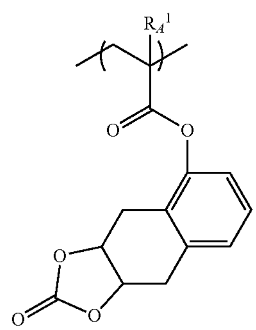
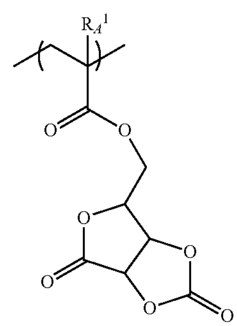
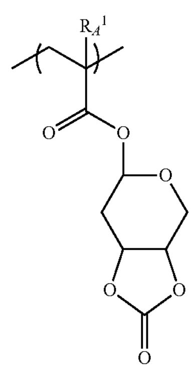
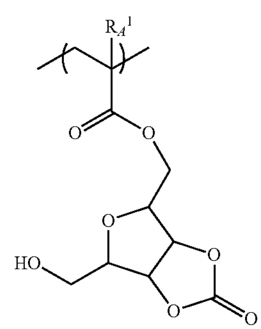

-continued

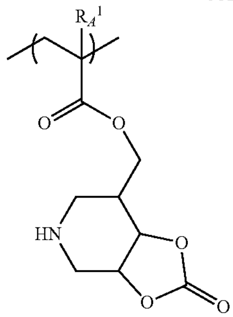

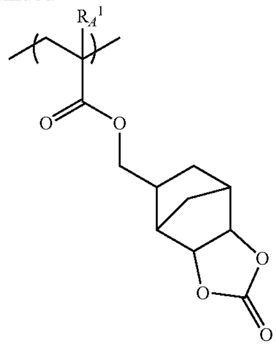

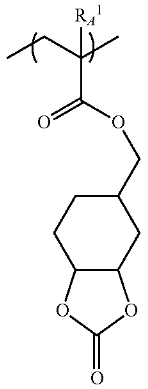

As for the repeating unit having a cyclic carbonic acid ester structure, the resin (P) may contain one repeating unit alone or may contain two or more repeating units.

In the case where the resin (P) contains a repeating unit having a cyclic carbonic acid ester structure, the content of the repeating unit having a cyclic carbonic acid ester structure is preferably from 5 to 60 mol %, more preferably from 5 to 55 mol %, still more preferably from 10 to 50 mol %, based on all repeating units in the resin (P).

(Repeating Unit Having a Plurality of Aromatic Rings)

The resin (P) may contain a repeating unit having a plurality of aromatic rings represented by the following formula (c1):

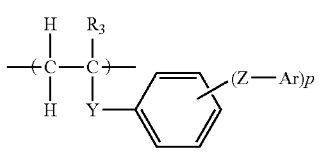

(c1)

In formula (c1), $R_3$ represents a hydrogen atom, an alkyl group, a halogen atom, a cyano group or a nitro group;

Y represents a single bond or a divalent linking group;

Z represents a single bond or a divalent linking group;

Ar represents an aromatic ring group; and p represents an integer of 1 or more.

The alkyl group as $R_3$ may be either linear or branched, and examples thereof include a methyl group, an ethyl group, an n-propyl group, an i-propyl group, an n-butyl group, a sec-butyl group, a tert-butyl group, an n-pentyl group, an n-hexyl group, an n-heptyl group, an n-octyl group, an n-nonyl group, an n-decanyl group, and an i-butyl group. The alkyl group may further have a substituent, and preferred examples of the substituent include an alkoxy group, a hydroxyl group, a halogen atom, and a nitro group. Among others, the alkyl group having a substituent is preferably, for example, a $CF_3$ group, an alkyloxycarbonylmethyl group, an alkylcarbonyloxymethyl group, a hydroxymethyl group or an alkoxymethyl group.

The halogen atom as $R_3$ includes fluorine atom, chlorine atom, bromine atom and iodine atom, with fluorine atom being preferred.

Y represents a single bond or a divalent linking group, and examples of the divalent linking group include an ether group (oxygen atom), a thioether group (sulfur atom), an alkylene group, an arylene group, a carbonyl group, a sulfide group, a sulfone group, —COO—, —CONH—, —$SO_2$NH—, —$CF_2$—, —$CF_2CF_2$—, —$OCF_2O$—, —$CF_2OCF_2$—, —SS—, —$CH_2SO_2CH_2$—, —$CH_2COCH_2$—, —$COCF_2CO$—, —COCO—, —OCOO—, —$OSO_2O$—, an amino group (nitrogen atom), an acyl group, an alkylsulfonyl group, —CH═CH—, —C≡C—, an aminocarbonylamino group, an aminosulfonylamino group, and a group formed by a combination thereof. Y preferably has a carbon number of 15 or less, more preferably a carbon number of 10 or less.

Y is preferably a single bond, a —COO— group, a —COS— group or a —CONH— group, more preferably a —COO— group or a —CONH— group, still more preferably a —COO— group.

Z represents a single bond or a divalent linking group, and examples of the divalent linking group include an ether group (oxygen atom), a thioether group (sulfur atom), an alkylene group, an arylene group, a carbonyl group, a sulfide group, a sulfone group, —COO—, —CONH—, —$SO_2$NH—, an amino group (nitrogen atom), an acyl group, an alkylsulfonyl group, —CH—CH—, an aminocarbonylamino group, an aminosulfonylamino group, and a group formed by a combination thereof.

Z is preferably a single bond, an ether group, a carbonyl group or —COO—, more preferably a single bond or an ether group, still more preferably a single bond.

Ar represents an aromatic ring group, and specific examples thereof include a phenyl group, a naphthyl group, an anthracenyl group, a phenanthrenyl group, a quinolinyl group, a furanyl group, a thiophenyl group, a fluorenyl-9-on-yl group, an anthraquinolinyl group, a phenanthraquinolinyl group, and a pyrrole group, with a phenyl group being preferred. Such an aromatic ring group may further have a substituent, and preferred examples of the substituent include an alkyl group, an alkoxy group, a hydroxy group, a halogen atom, a nitro group, an acyl group, an acyloxy group, an acylamino group, a sulfonylamino group, an aryl group such as phenyl group, an aryloxy group, an arylcarbonyl group, and a heterocyclic residue. Among these, from the standpoint of preventing deterioration of the exposure latitude or pattern profile due to out-of-band light, a phenyl group is preferred.

p is an integer of 1 or more and is preferably an integer of 1 to 3.

The repeating unit having a plurality of aromatic rings is more preferably a repeating unit represented by the following formula (c2):

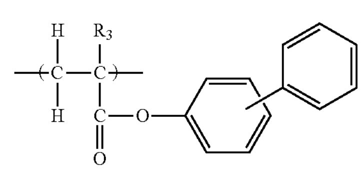

(c2)

In formula (c2), $R_3$ represents a hydrogen atom or an alkyl group. Preferred examples of the alkyl group as $R_3$ are the same as in formula (c1).

Here, as concerns the extreme-ultraviolet (EUV) exposure, leakage light (out-of-band light) generated in the ultraviolet region at a wavelength of 100 to 400 nm worsens the surface roughness, as a result, the resolution and LWR performance tend to be impaired due to bridge between patterns or disconnection of pattern.

However, the aromatic ring in the repeating unit having a plurality of aromatic rings functions as an internal filter capable of absorbing the above-described out-of-band light. Accordingly, in view of high resolution and low LWR, the resin (P) preferably contains the repeating unit having a plurality of aromatic rings.

In this connection, from the standpoint of obtaining high resolution, the repeating unit having a plurality of aromatic rings is preferably free from a phenolic hydroxyl group (a hydroxyl group bonded directly on an aromatic ring).

Specific examples of the repeating unit having a plurality of aromatic rings are illustrated below, but the present invention is not limited thereto.

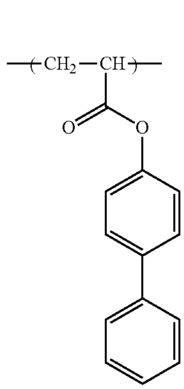

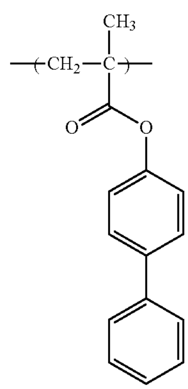

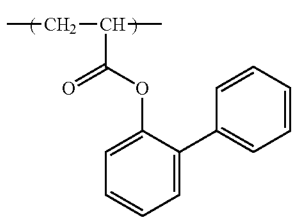

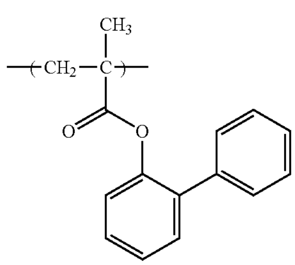

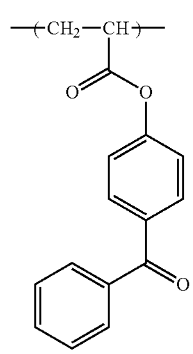

-continued

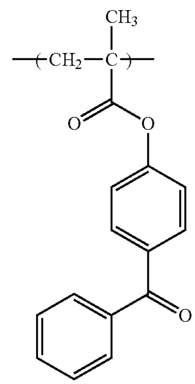

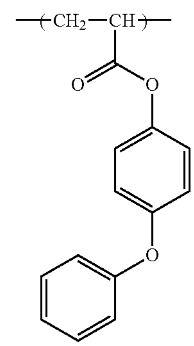

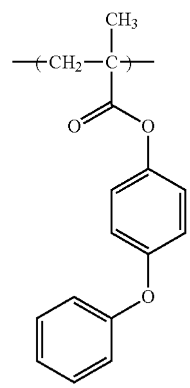

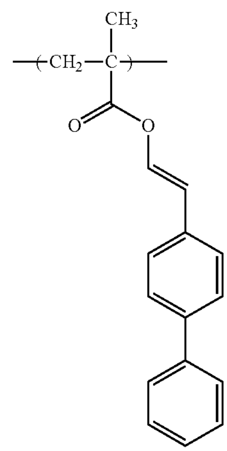

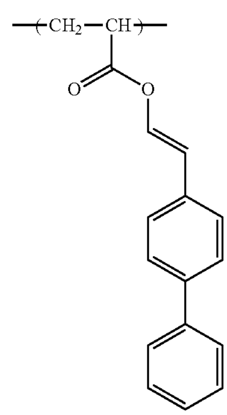

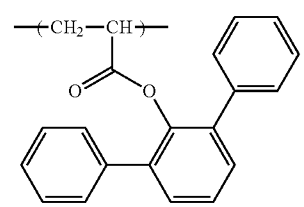

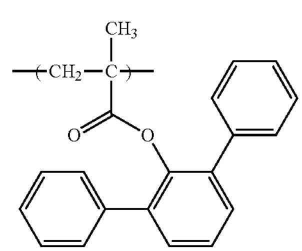

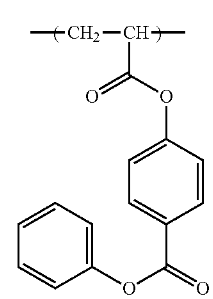

-continued
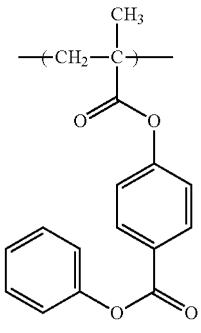
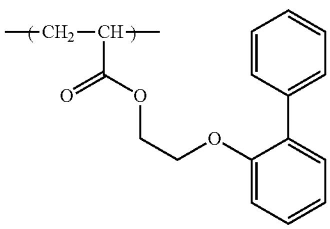
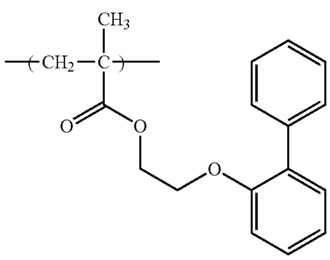
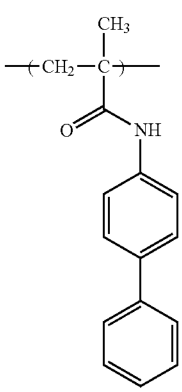
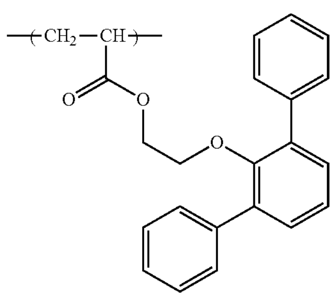
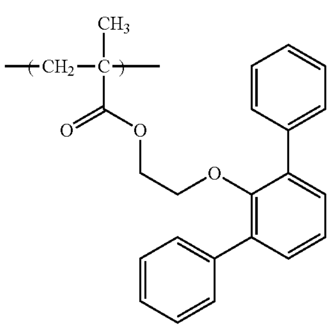
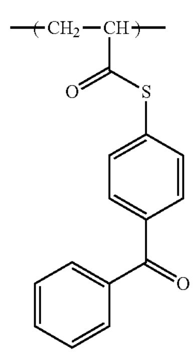
-continued
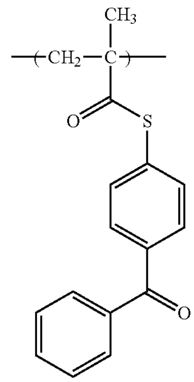
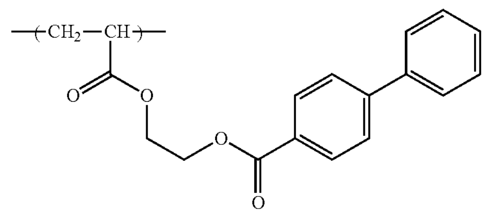
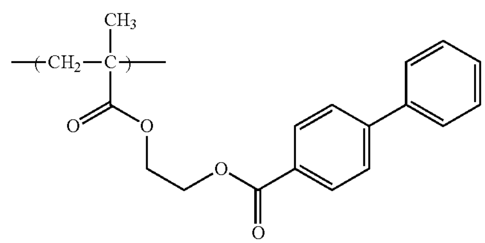
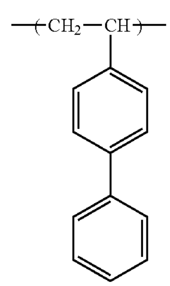
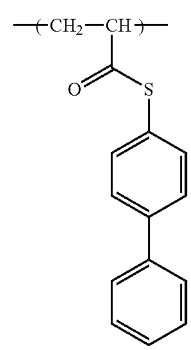
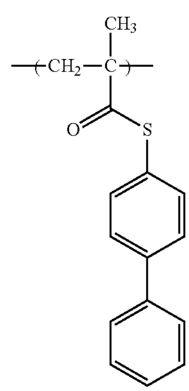
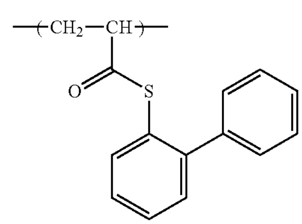

-continued
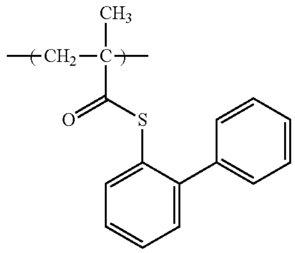
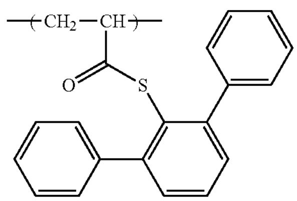
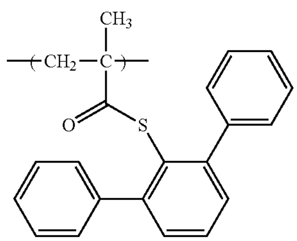
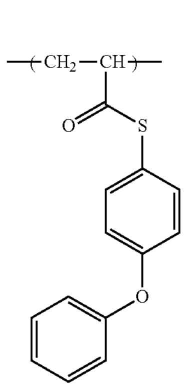
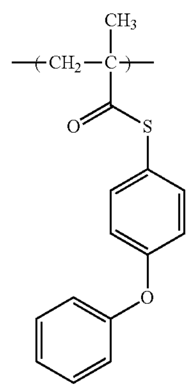
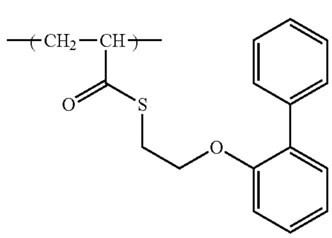
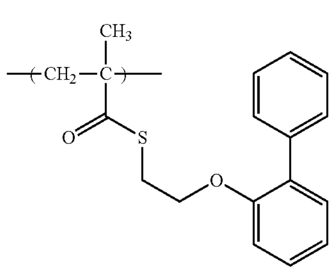
-continued
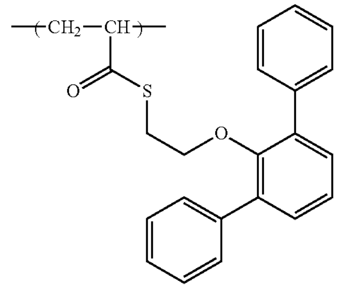
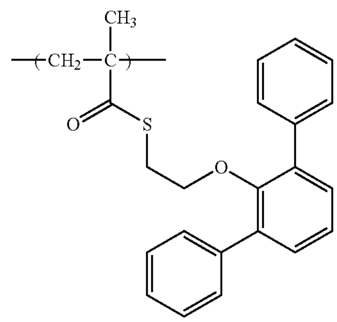
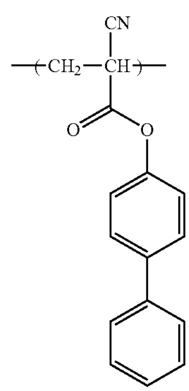
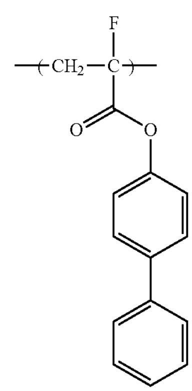
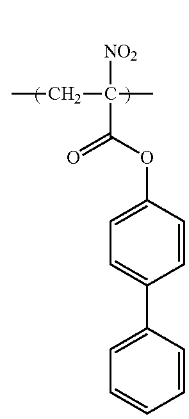
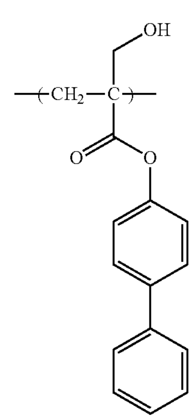

-continued

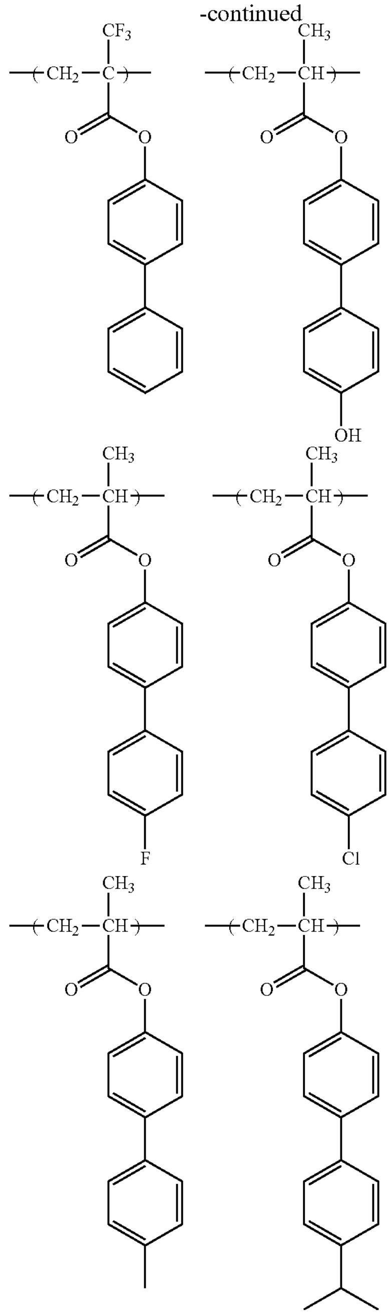

The resin (P) may or may not contain a repeating unit having a plurality of aromatic rings, but in the case containing a repeating unit having a plurality of aromatic rings, the content of the repeating unit is preferably from 1 to 30 mol %, more preferably from 1 to 20 mol %, still more preferably from 1 to 15 mol %, based on all repeating units in the resin (P). As for the repeating unit having a plurality of aromatic rings, which is contained in the resin (P), two or more kinds of repeating units may be contained in combination.

The resin (P) for use in the present invention may appropriately contain a repeating unit other than the repeating units described above. As an example of such a repeating unit, the resin may contain a repeating unit having an alicyclic hydrocarbon structure free from a polar group (for example, the above-described acid group, a hydroxyl group or a cyano group) and not exhibiting acid decomposability. Thanks to this configuration, the solubility of the resin at the development using an organic solvent-containing developer can be appropriately adjusted. Such a repeating unit includes a repeating unit represented by formula (IV):

(IV)

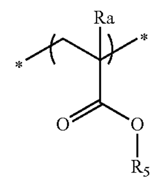

In formula (IV), $R_5$ represents a hydrocarbon group having at least one cyclic structure and having no polar group.

Ra represents a hydrogen atom, an alkyl group or a —$CH_2$—O—$Ra_2$ group, wherein $Ra_2$ represents a hydrogen atom, an alkyl group or an acyl group. Ra is preferably a hydrogen atom, a methyl group, a hydroxymethyl group or a trifluoromethyl group, more preferably a hydrogen atom or a methyl group.

The cyclic structure contained in $R_5$ includes a monocyclic hydrocarbon group and a polycyclic hydrocarbon group. Examples of the monocyclic hydrocarbon group include a cycloalkyl group having a carbon number of 3 to 12, such as cyclopentyl group, cyclohexyl group, cycloheptyl group and cyclooctyl group, and a cycloalkenyl group having a carbon number of 3 to 12, such as cyclohexenyl group. The monocyclic hydrocarbon group is preferably a monocyclic hydrocarbon group having a carbon number of 3 to 7, more preferably a cyclopentyl group or a cyclohexyl group.

The polycyclic hydrocarbon group includes a ring assembly hydrocarbon group and a crosslinked cyclic hydrocarbon group. Examples of the ring assembly hydrocarbon group include a bicyclohexyl group and a perhydronaphthalenyl group. Examples of the crosslinked cyclic hydrocarbon ring include a bicyclic hydrocarbon ring such as pinane ring, bornane ring, norpinane ring, norbornane ring and bicyclooctane ring (e.g., bicyclo[2.2.2]octane ring, bicyclo[3.2.1]octane ring), a tricyclic hydrocarbon ring such as homobledane ring, adamantane ring, tricyclo[5.2.1.$0^{2,6}$]decane ring and tricyclo[4.3.1.$1^{2,5}$]undecane ring, and a tetracyclic hydrocarbon ring such as tetracyclo[4.4.0.$1^{2,5}$.$1^{7,10}$]dodecane ring and perhydro-1,4-methano-5,8-methanonaphthalene ring. The crosslinked cyclic hydrocarbon ring also includes a condensed cyclic hydrocarbon ring, for example, a condensed ring formed by fusing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring.

Preferred examples of the crosslinked cyclic hydrocarbon ring include a norbornyl group, an adamantyl group, a bicyclooctanyl group, and a tricyclo[5,2,1,$0^{2,6}$]decanyl group. Among these crosslinked cyclic hydrocarbon rings, a norbornyl group and an adamantyl group are more preferred.

Such an alicyclic hydrocarbon group may have a substituent, and preferred examples of the substituent include a halogen atom, an alkyl group, a hydroxyl group with a hydrogen atom being substituted for, and an amino group with a hydrogen atom being substituted for. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which may be further substituted on the alkyl group includes a halogen atom, an alkyl group, a hydroxyl group with a hydrogen atom being substituted for, and an amino group with a hydrogen atom being substituted for.

Examples of the substituent for the hydrogen atom include an alkyl group, a cycloalkyl group, an aralkyl group, a substituted methyl group, a substituted ethyl group, an alkoxycarbonyl group, and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a ten-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group includes, for example, an alkoxycarbonyl group having a carbon number of 1 to 4.

The resin (P) may or may not contain a repeating unit having an alicyclic hydrocarbon structure free from a polar group and not exhibiting acid decomposability, but in the case of containing this repeating unit, the content thereof is preferably from 1 to 20 mol %, more preferably from 5 to 15 mol %, based on all repeating units in the resin (P).

Specific examples of the repeating unit having an alicyclic hydrocarbon structure free from a polar group and not exhibiting acid decomposability are illustrated below, but the present invention is not limited thereto. In the formulae, Ra represents H, $CH_3$, $CH_2OH$ or $CF_3$.

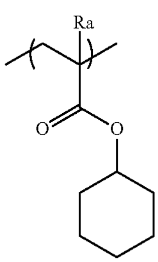

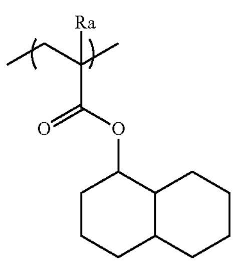

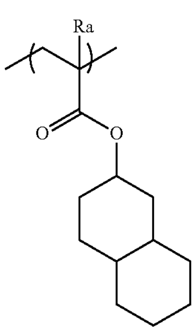

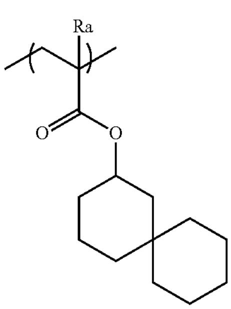

-continued

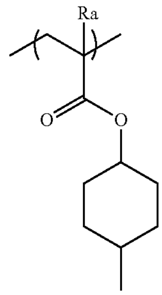

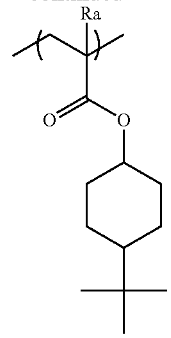

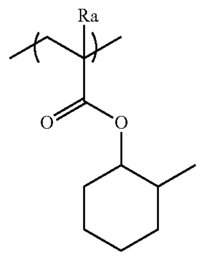

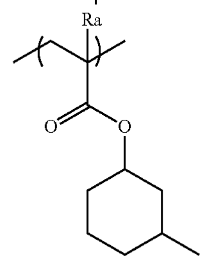

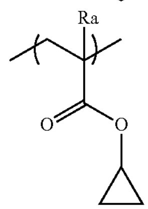

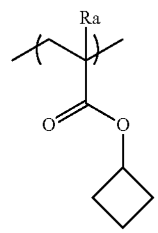

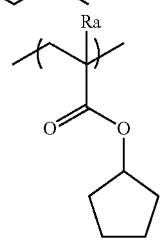

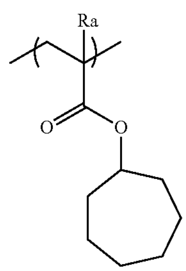

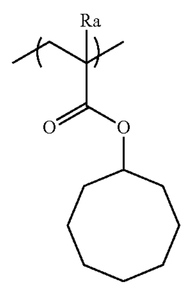

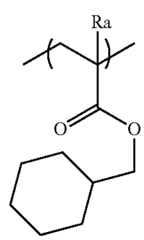

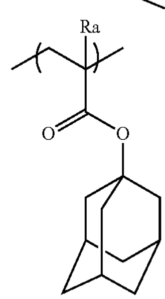

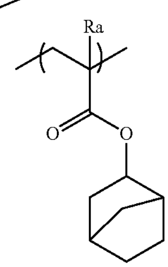

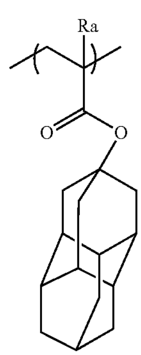

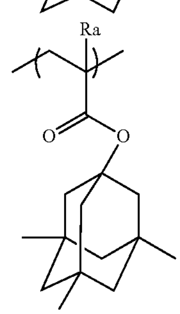

-continued

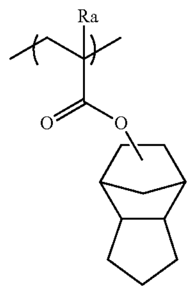

From the standpoint of elevating Tg, improving dry etching resistance and producing an effect such as internal filter for out-of-band-light, the resin (P) may contain the following monomer component.

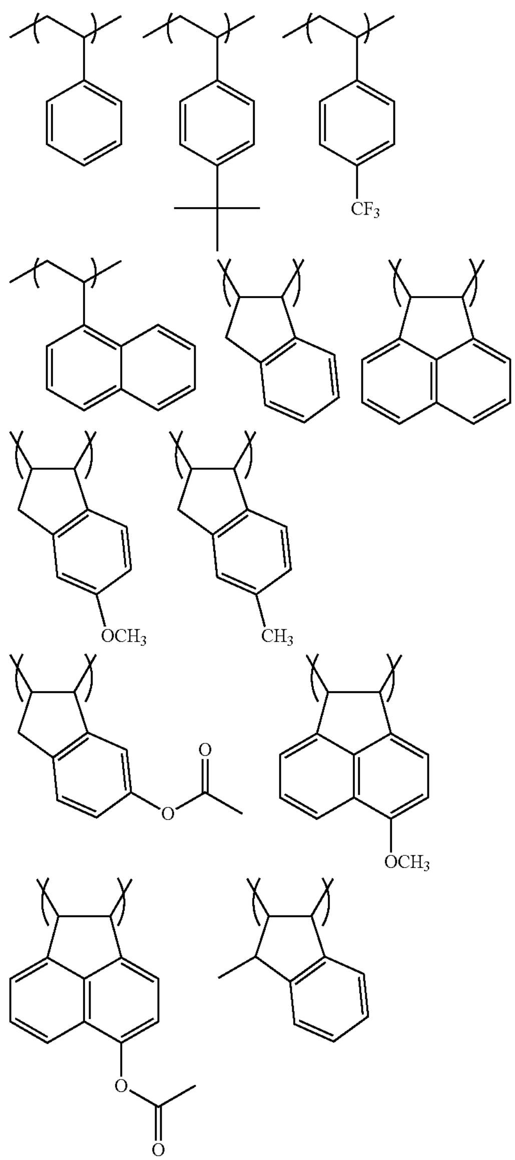

In the resin (P) for use in the composition of the present invention, the molar ratio of respective repeating structural units contained is appropriately set so as to control the dry etching resistance of resist, the suitability for standard developer, the adherence to substrate, the resist profile, and performances generally required of the resist, such as resolution, heat resistance and sensitivity.

The form of the resin (P) for use in the present invention may be any of random type, block type, comb type and star type.

The resin (P) can be synthesized, for example, by radical, cationic or anionic polymerization of unsaturated monomers corresponding to respective structures. It is also possible to obtain the target resin by polymerizing unsaturated monomers corresponding to precursors of respective structures and then performing a polymer reaction.

Examples of the general synthesis method include a batch polymerization method of dissolving unsaturated monomers and a polymerization initiator in a solvent and heating the solution, thereby effecting the polymerization, and a dropping polymerization method of adding dropwise a solution containing unsaturated monomers and a polymerization initiator to a heated solvent over 1 to 10 hours. A dropping polymerization method is preferred.

The solvent used for the polymerization includes, for example, a solvent which can be used when preparing the later-described actinic ray-sensitive or radiation-sensitive resin composition, and it is more preferred to perform the polymerization by using the same solvent as the solvent used in the composition of the present invention. By the use of this solvent, production of particles during storage can be suppressed.

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile, and dimethyl 2,2'-azobis (2-methylpropionate). If desired, the polymerization may be performed in the presence of a chain transfer agent (e.g., alkylmercaptan).

The concentration during the reaction is from 5 to 70 mass %, preferably from 10 to 50 mass %, and the reaction temperature is usually from 10 to 150° C., preferably from 30 to 120° C., more preferably from 40 to 100° C.

The reaction time is usually from 1 to 48 hours, preferably from 1 to 24 hours, more preferably from 1 to 12 hours.

After the completion of reaction, the reaction solution is allowed to cool to room temperature and purified. In the purification, a conventional method, for example, a liquid-liquid extraction method of applying water washing or combining an appropriate solvent to remove residual monomers or oligomer components, a purification method in a solution state, such as ultrafiltration of removing by extraction only polymers having a molecular weight lower than a specific molecular weight, a reprecipitation method of adding dropwise the resin solution to a poor solvent to solidify the resin in the poor solvent and thereby remove residual monomers or the like, or a purification method in a solid state, such as washing of the resin slurry with a poor solvent after separation of the slurry by filtration, may be applied. For example, the resin is precipitated as a solid by contacting the reaction solution with a solvent in which the resin is sparingly soluble or insoluble (poor solvent) and which is in a volumetric amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent to the polymer, and the solvent which can be used may be appropriately selected from a hydrocarbon, a halogenated hydrocarbon, a nitro compound, an ether, a ketone, an ester, a carbonate, an alcohol, a carboxylic acid, water, a mixed solvent containing such a solvent, and the like, according to the kind of the polymer. Among these solvents, a solvent containing at least an alcohol (particularly, methanol or the like) or water is preferred as the precipitation or reprecipitation solvent.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank, by a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volumetric amount of less than 10 times (preferably 5 times or less) the resin solution A, to precipitate a resin solid (step d), and separating the precipitated resin (step e).

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile, and dimethyl 2,2'-azobis (2-methylpropionate). The initiator is added additionally or in parts, if desired. After the completion of reaction, the reaction product is poured in a solvent, and the desired polymer is collected, for example, by a method for powder or solid recovery. The concentration during the reaction is from 5 to 50 mass %, preferably from 10 to 30 mass %, and the reaction temperature is usually from 10 to 150° C., preferably from 30 to 120° C., more preferably from 60 to 100° C.

The molecular weight of the resin (P) according to the present invention is not particularly limited, but the weight average molecular weight is preferably from 1,000 to 100,000, more preferably from 1,500 to 60,000, still more preferably from 2,000 to 30,000. When the weight average molecular weight is from 1,000 to 100,000, the heat resistance and dry etching resistance can be kept from deterioration and at the same time, the film-forming property can be prevented from becoming poor due to impairment of developability or increase in the viscosity. Here, the weight average molecular weight of the resin indicates a molecular weight in terms of polystyrene measured by GPC (carrier: THF or N-methyl-2-pyrrolidone (NMP)).

The polydispersity (Mw/Mn) is preferably from 1.00 to 5.00, more preferably from 1.03 to 3.50, still more preferably from 1.05 to 2.50. As the molecular weight distribution is narrower, the resolution and resist profile are more excellent, the side wall of the resist pattern is smoother, and the roughness is more improved.

As for the resin (P) used in the present invention, one kind of a resin may be used alone, or two or more kinds of resins may be used in combination. The content of the resin (P) is preferably from 20 to 99 mass %, more preferably from 30 to 89 mass %, still more preferably from 40 to 79 mass %, based on the total solid content in the actinic ray-sensitive or radiation-sensitive resin composition of the present invention. (In this specification, mass ratio is equal to weight ratio.)

Specific examples of the resin (P) are illustrated below, but the present invention is not limited thereto.

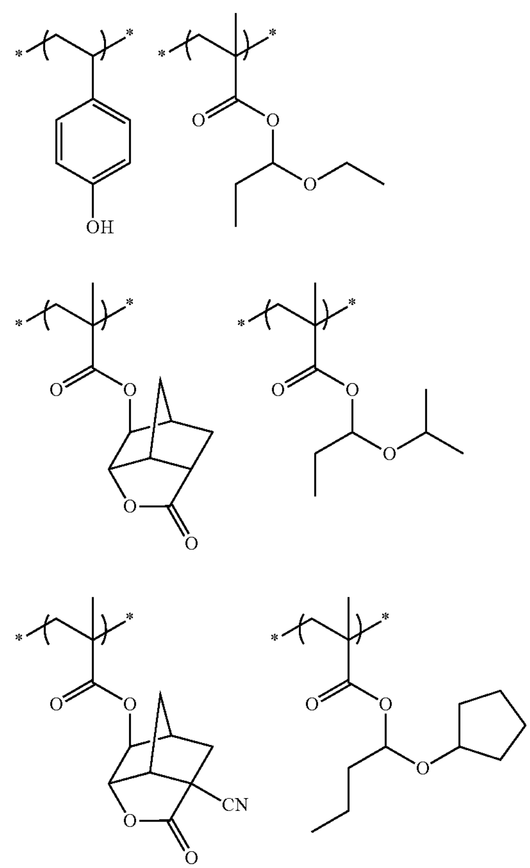

-continued
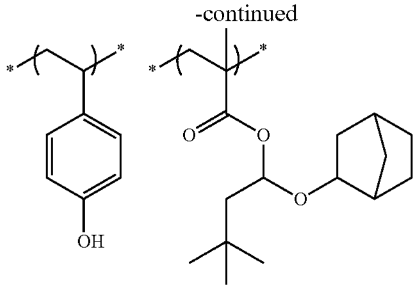
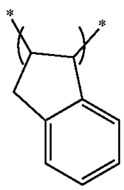
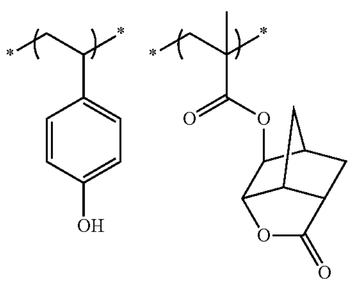
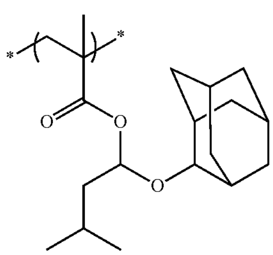
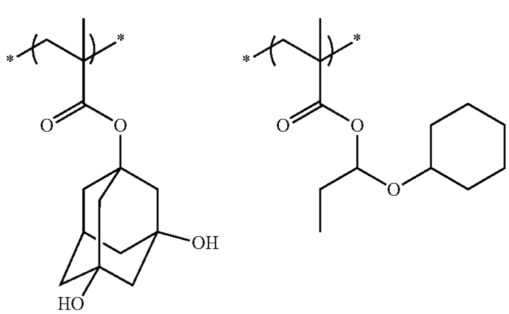
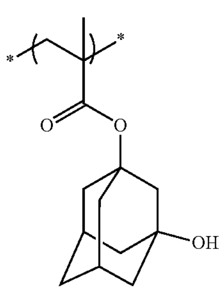
-continued
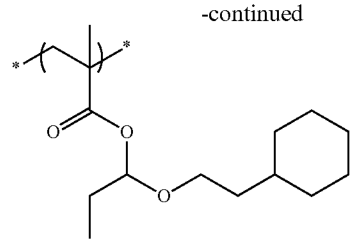
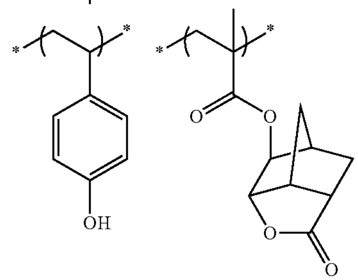
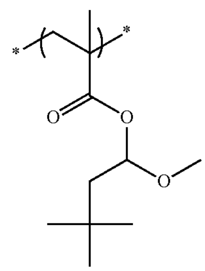
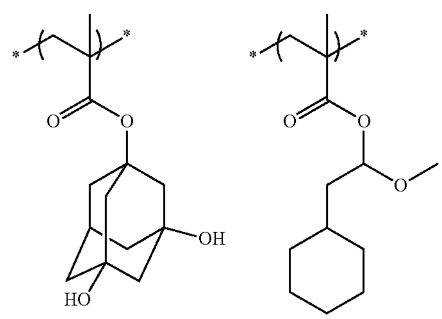
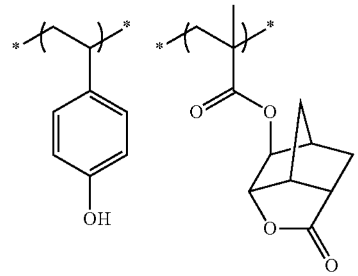
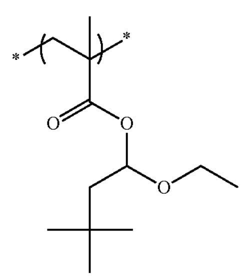

-continued
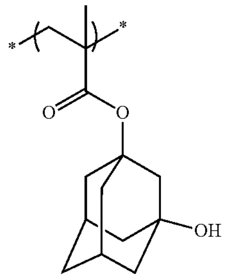
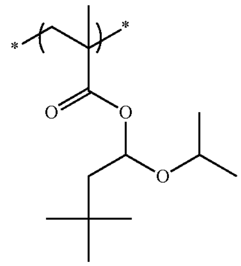
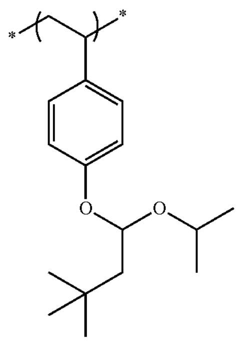
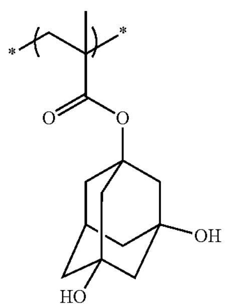
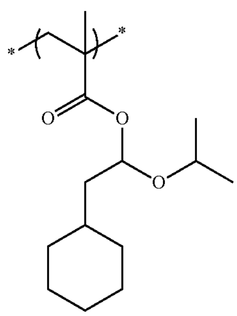
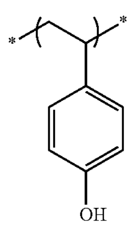
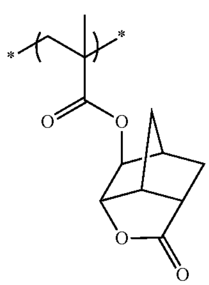
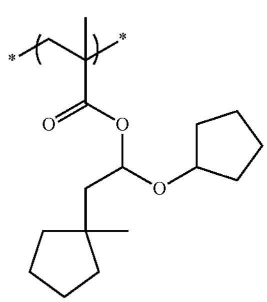
-continued
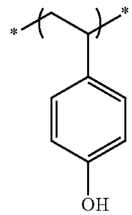
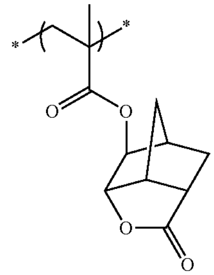
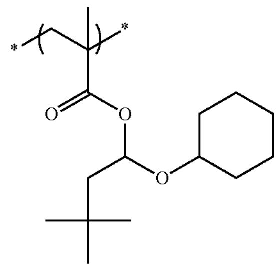
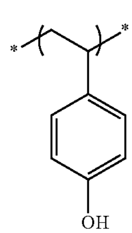
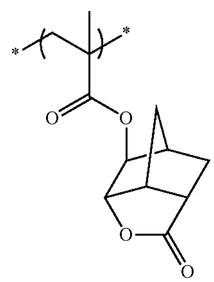
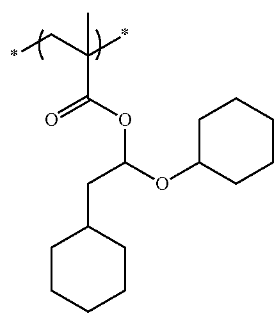
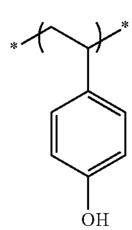
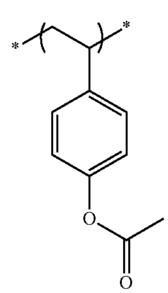

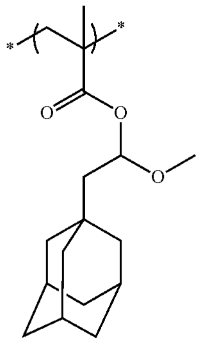
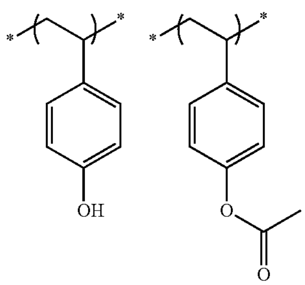
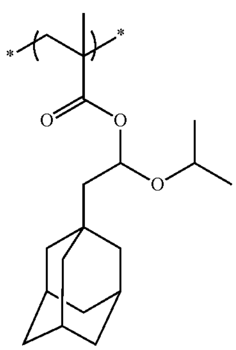
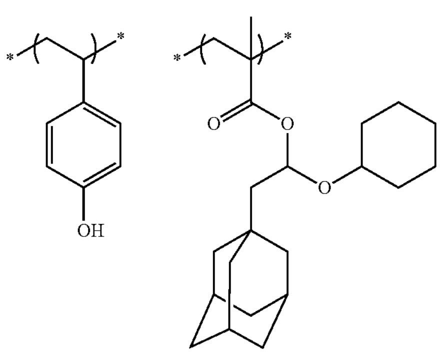
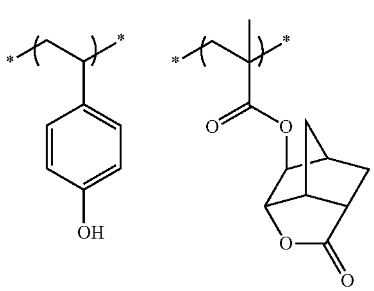
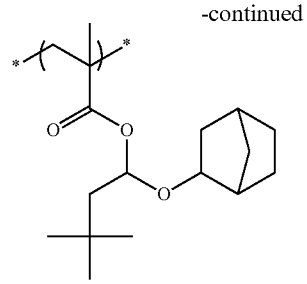
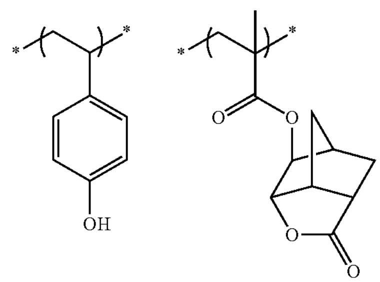
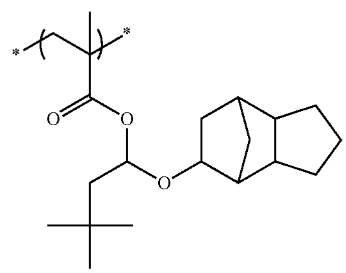
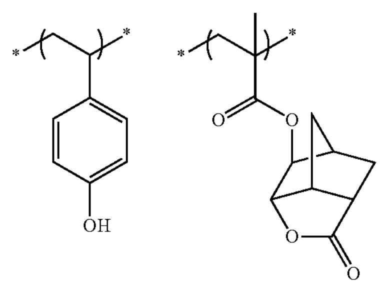
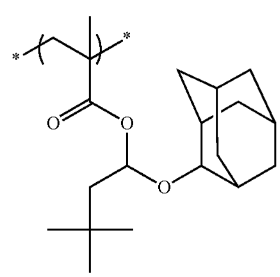
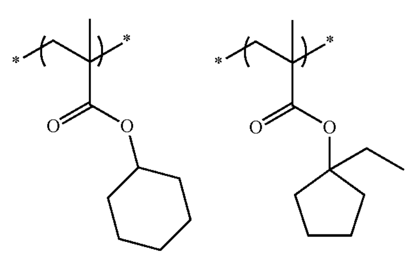

-continued
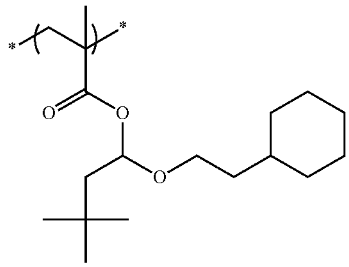
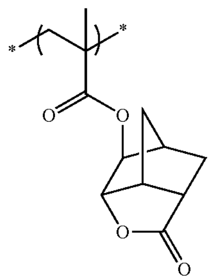
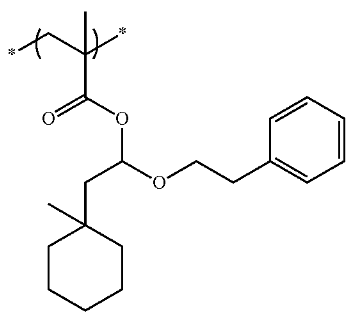
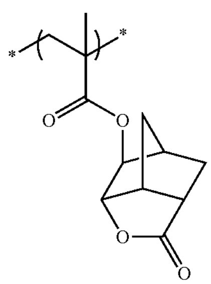
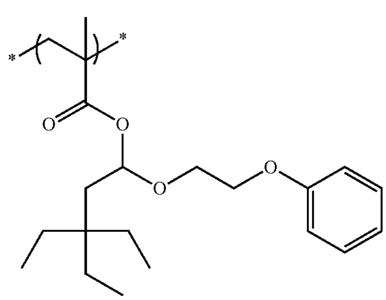
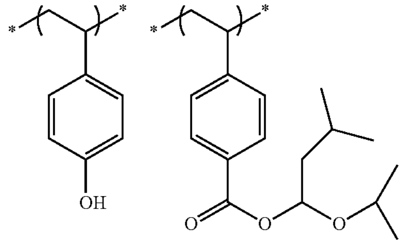
-continued
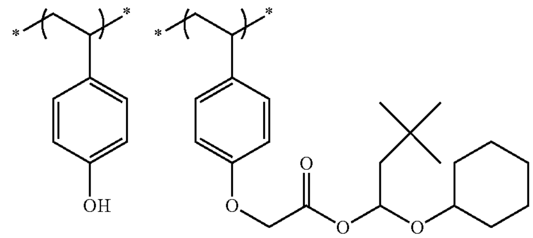
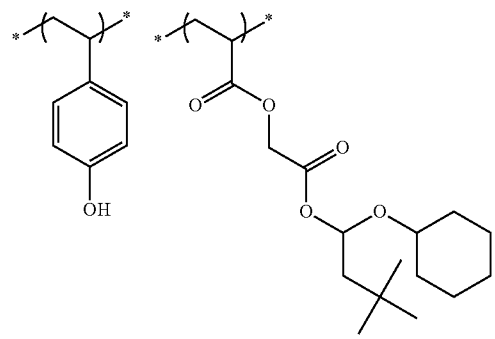
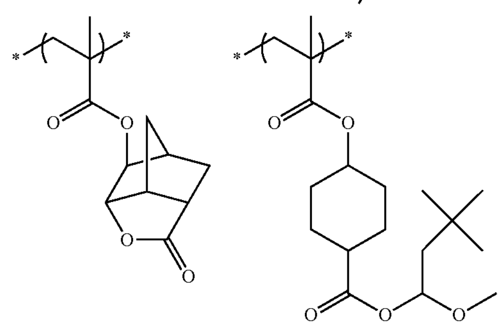
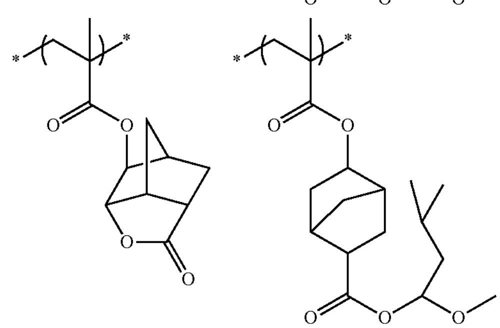
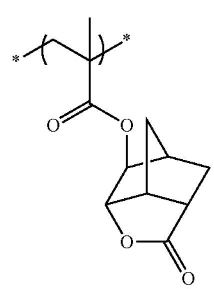
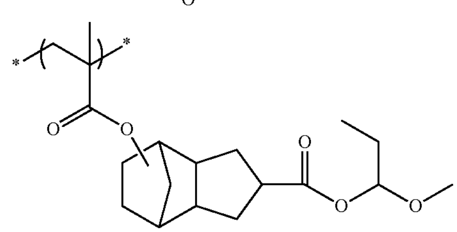

-continued
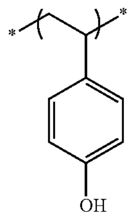
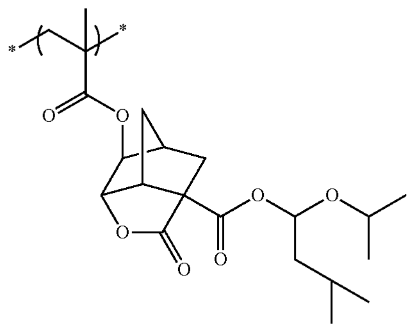
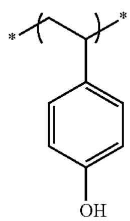
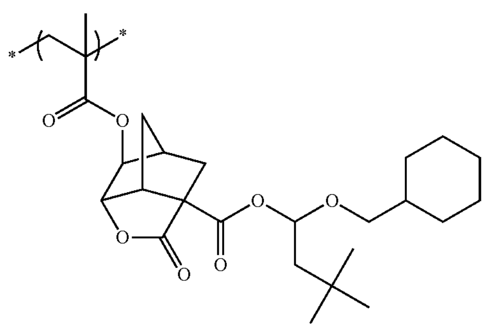
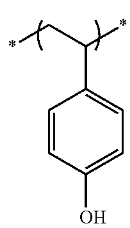
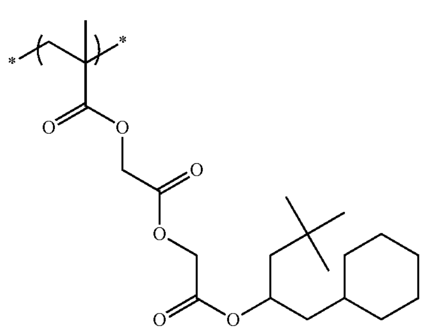
-continued
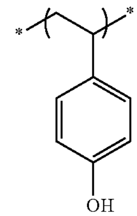
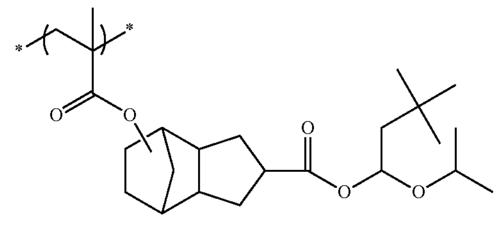
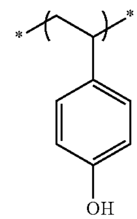
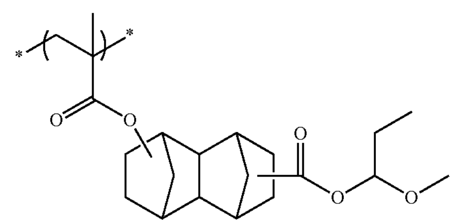
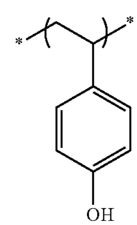
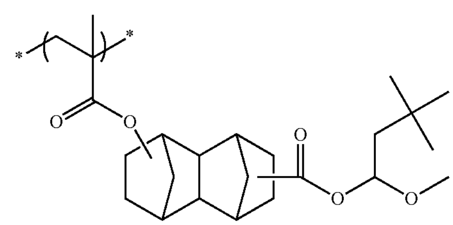
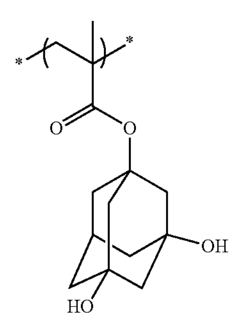

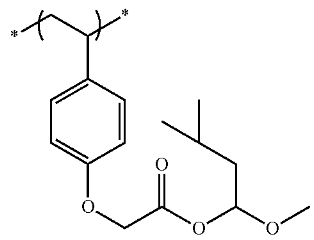
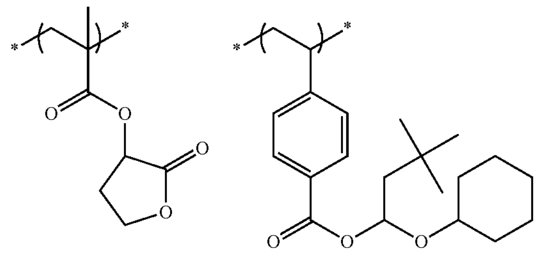
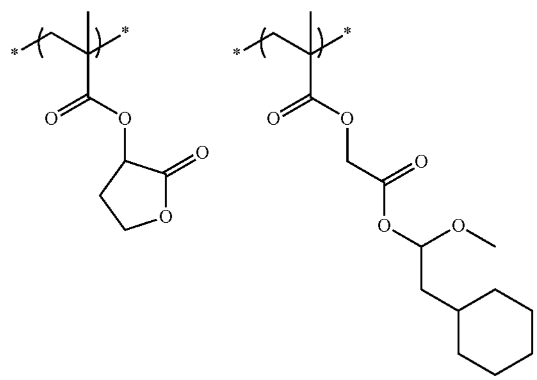
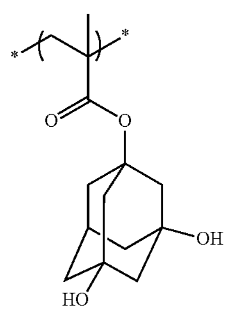
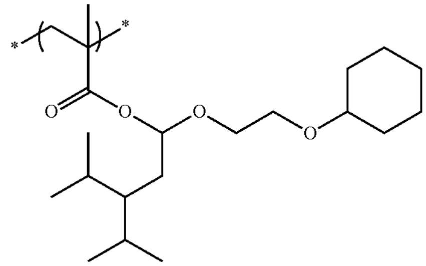
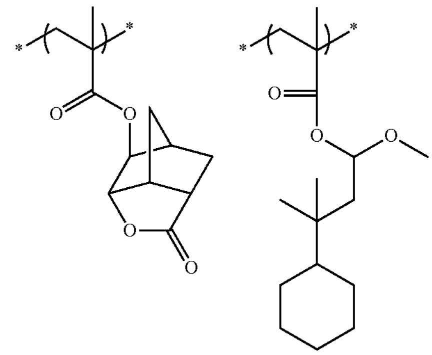
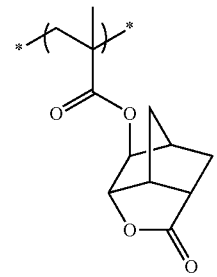
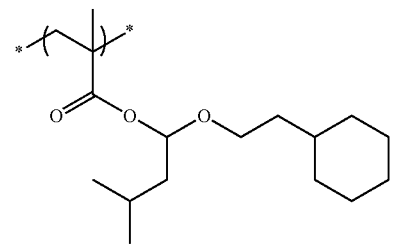
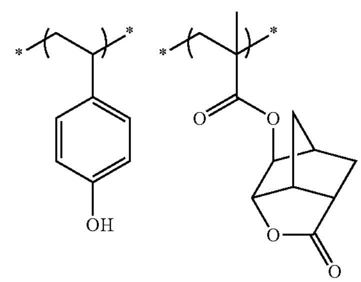
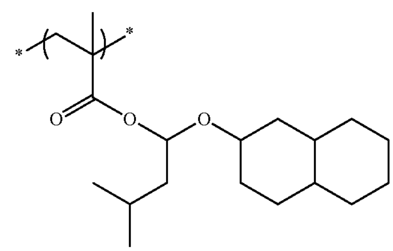
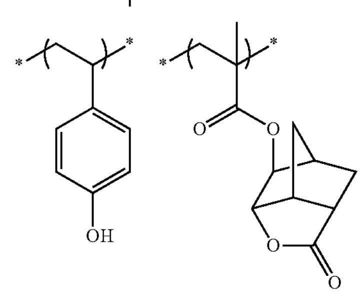

-continued
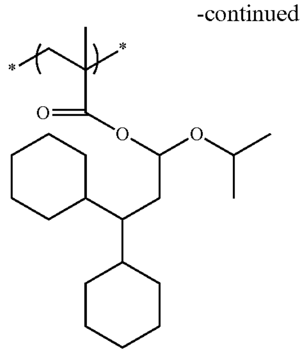
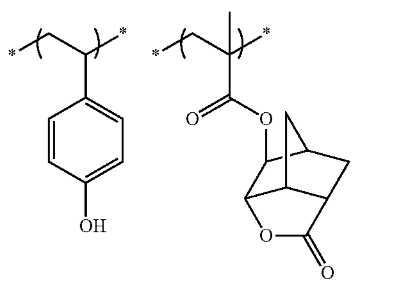
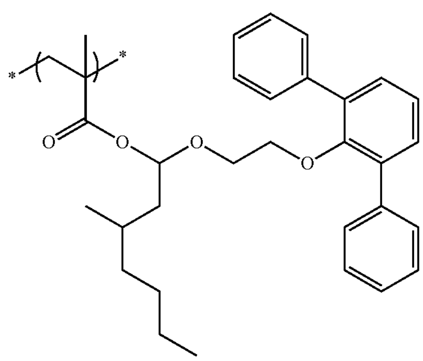
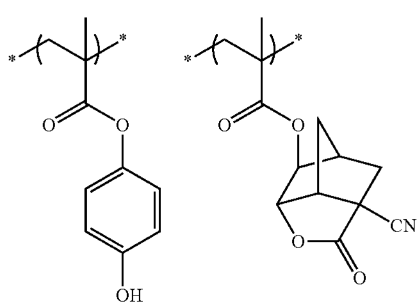
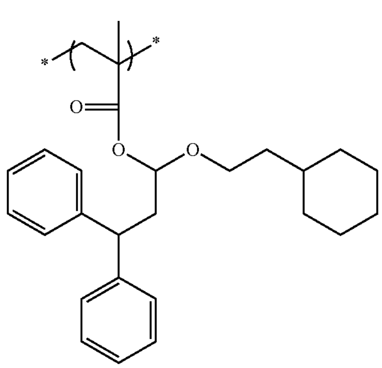
-continued
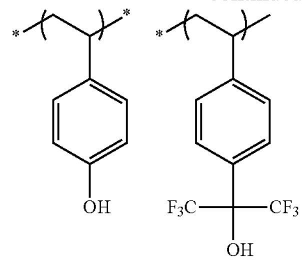
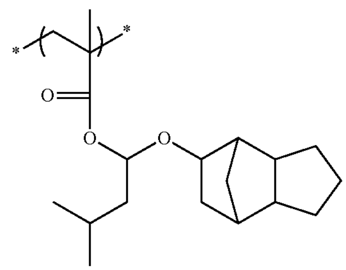
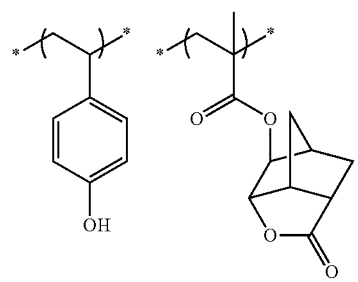
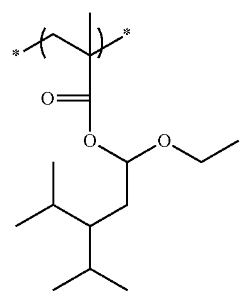
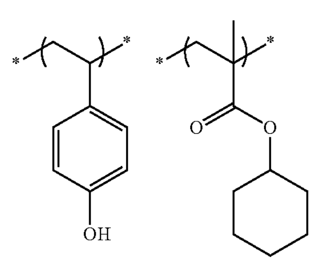
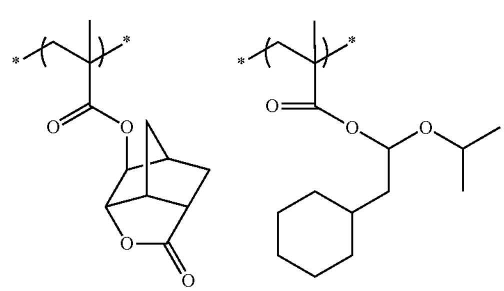

-continued
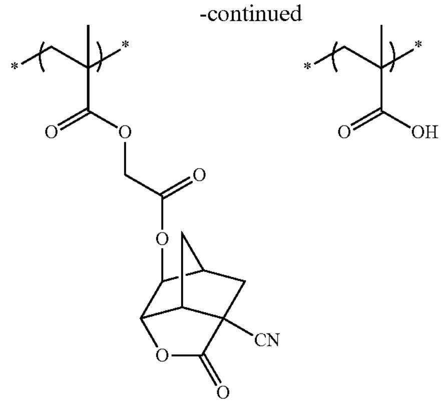
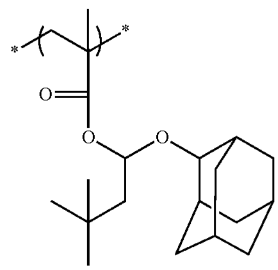
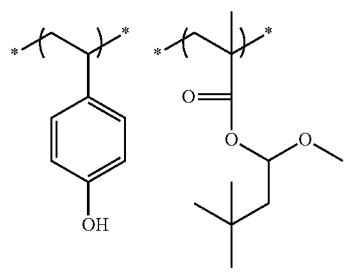
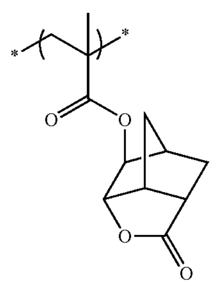
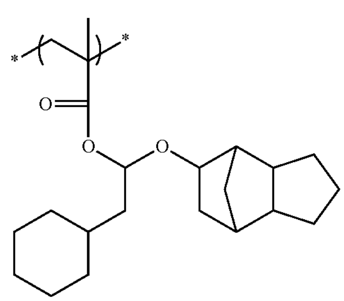
-continued
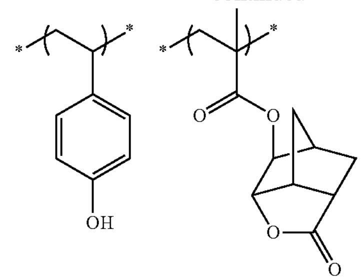
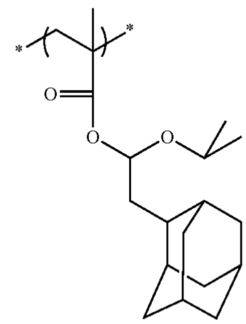
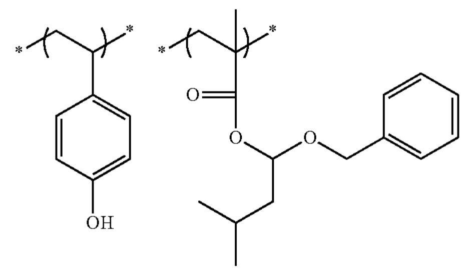
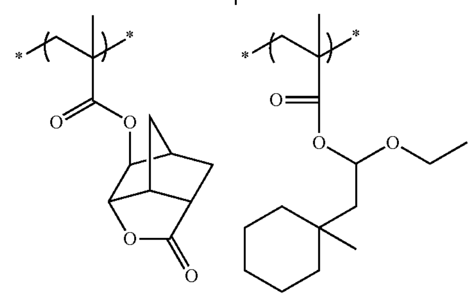
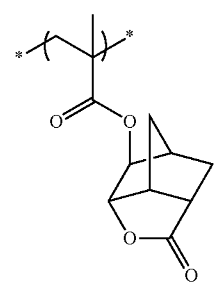
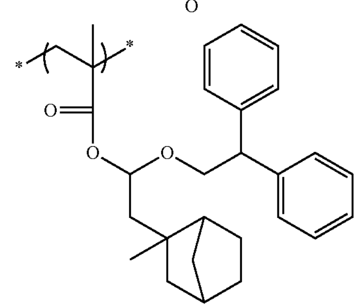

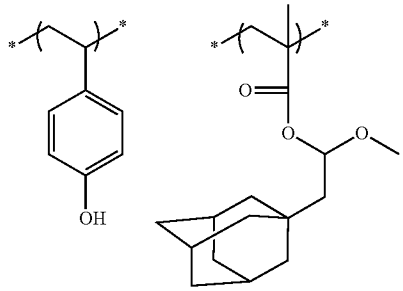
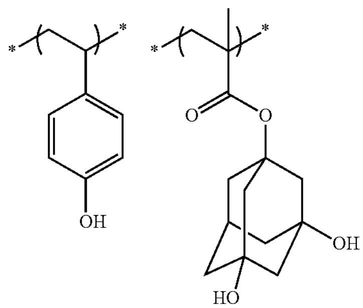
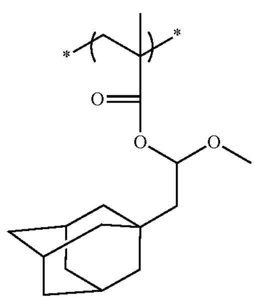
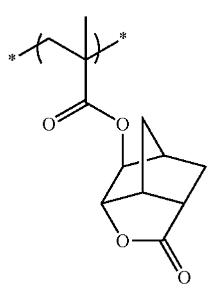
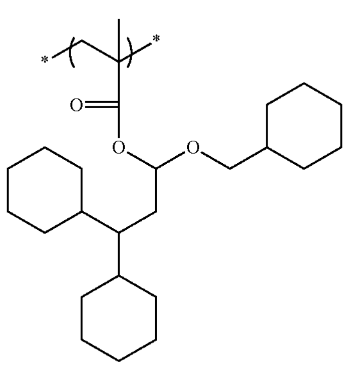
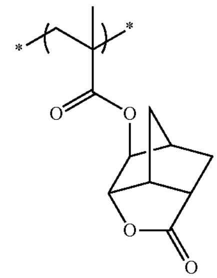
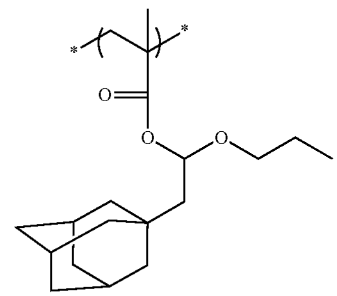
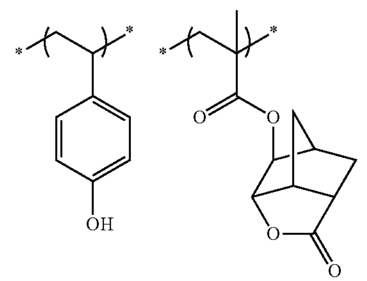
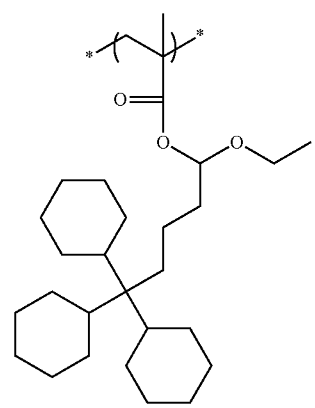
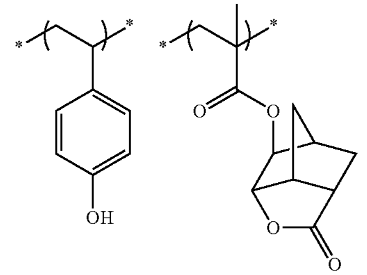

-continued
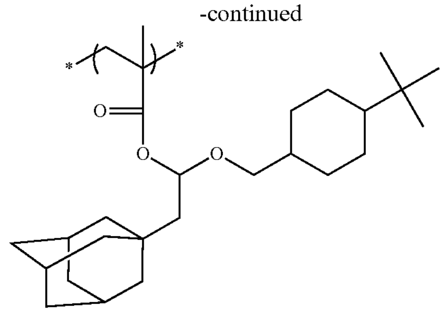
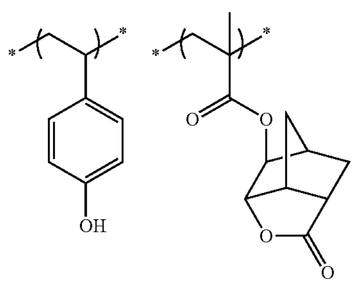
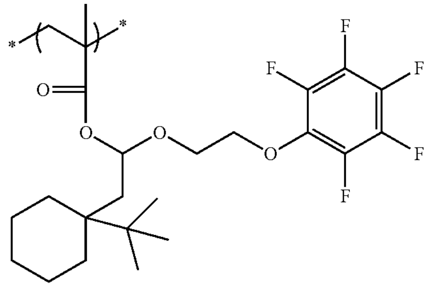
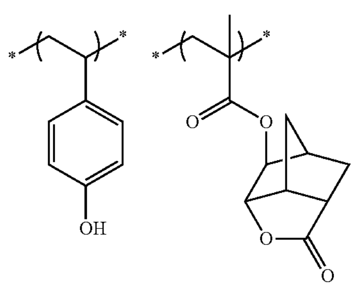
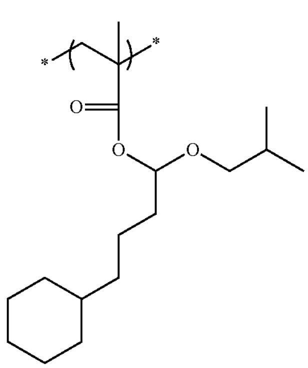
-continued
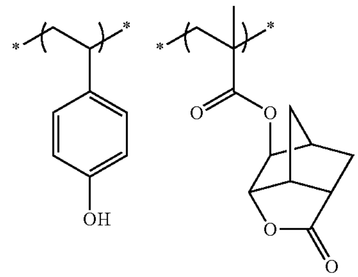
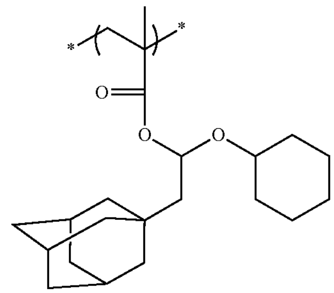
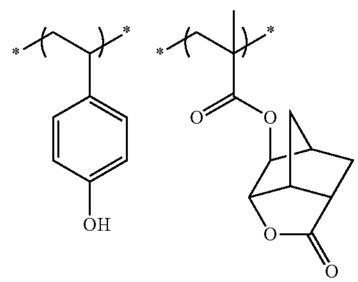
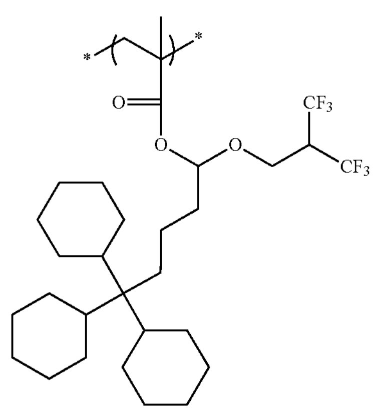
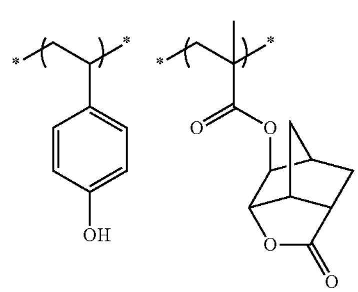

-continued
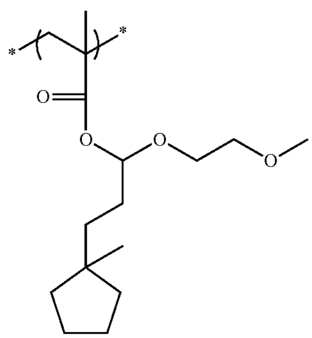
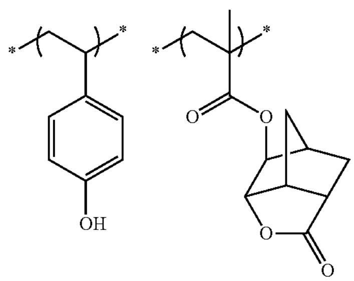
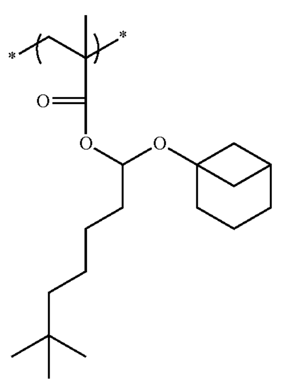
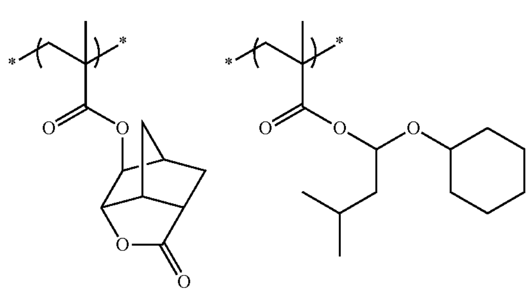
-continued
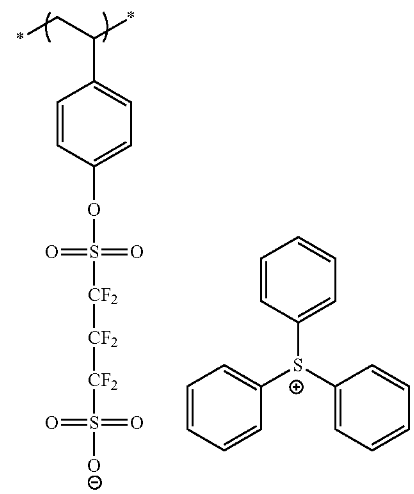
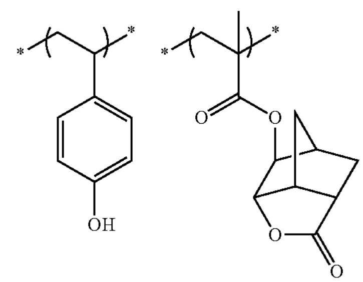
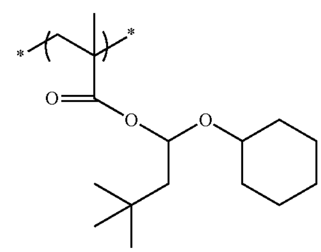
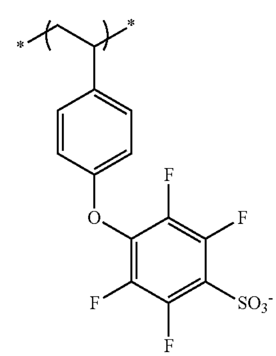
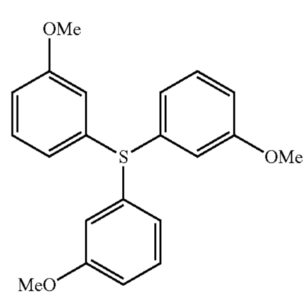

-continued
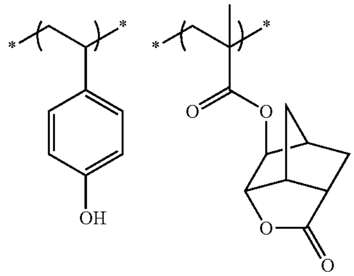
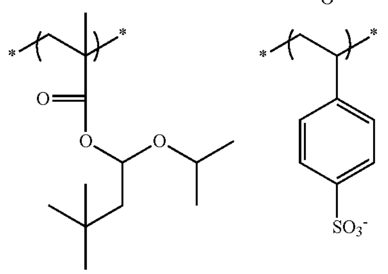
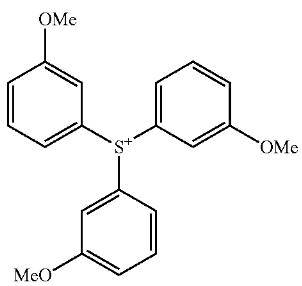
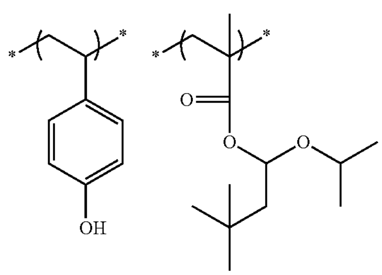
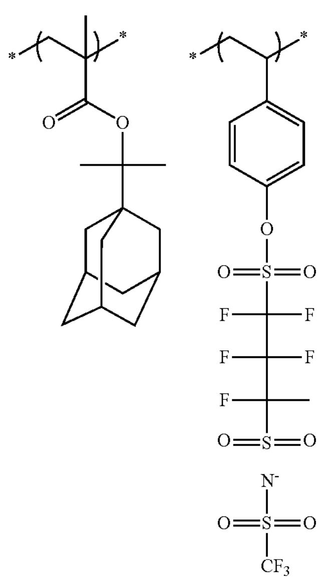
-continued
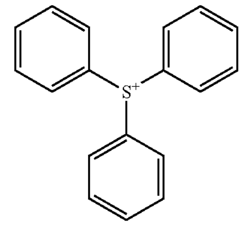
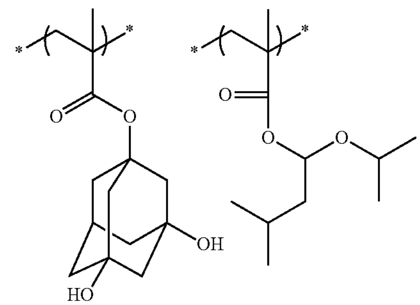
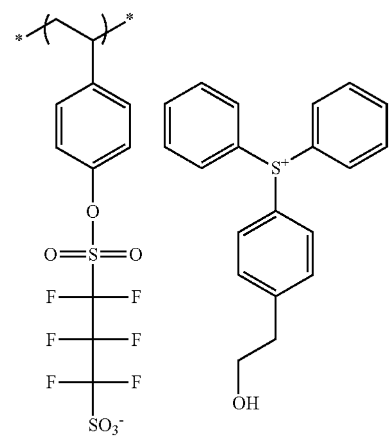
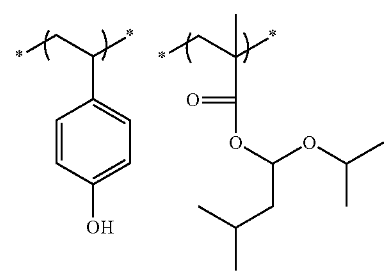
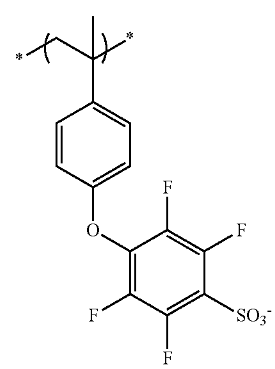

-continued
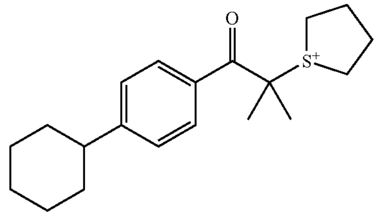
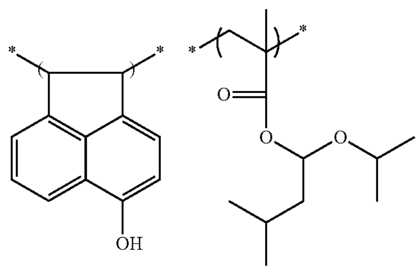
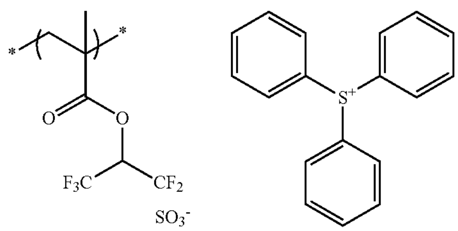
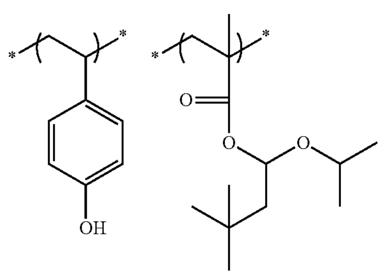
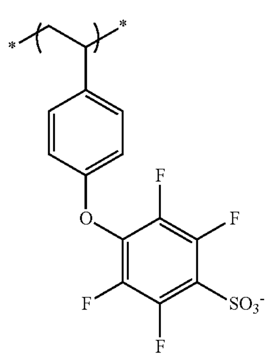
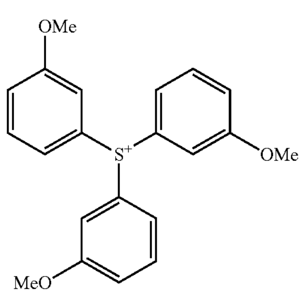
-continued
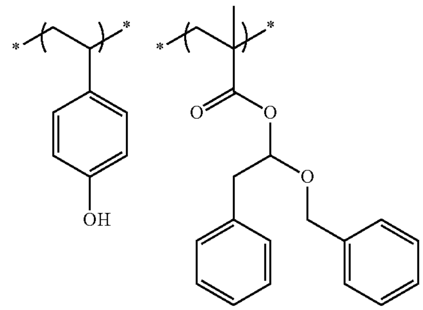
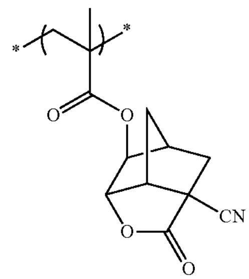
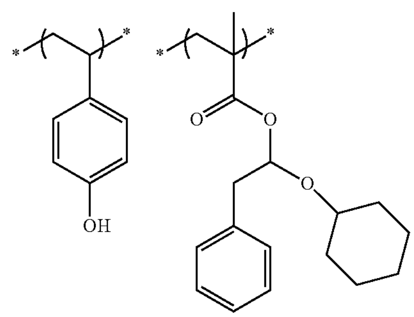
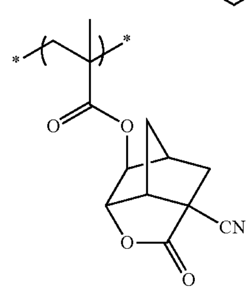
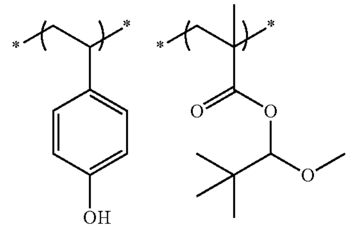
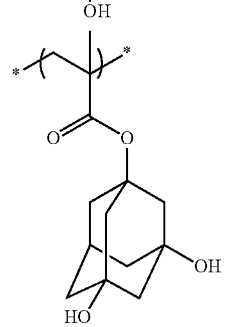

-continued
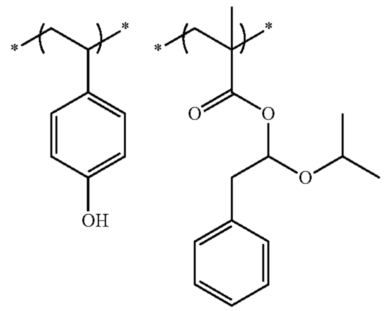
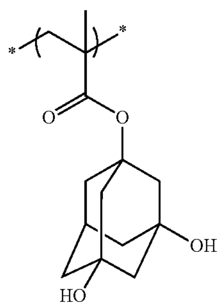
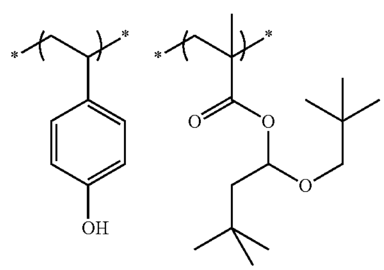
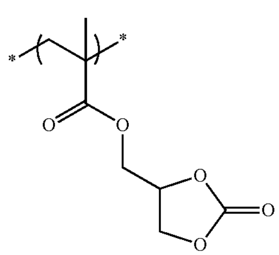
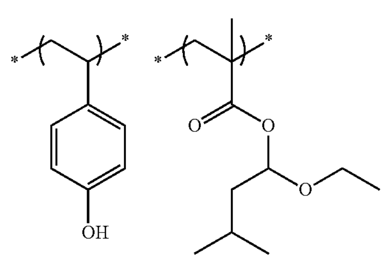
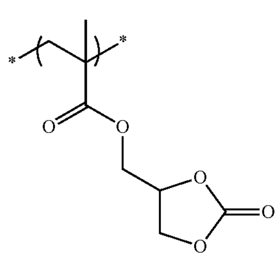
-continued
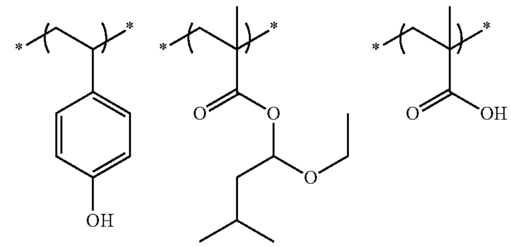
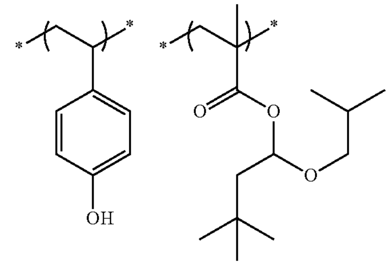
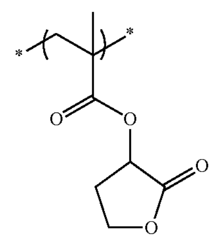
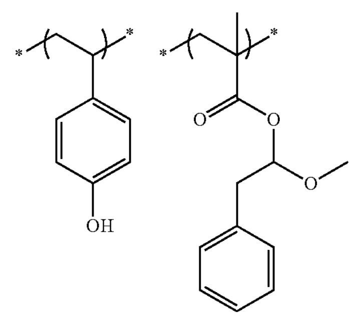
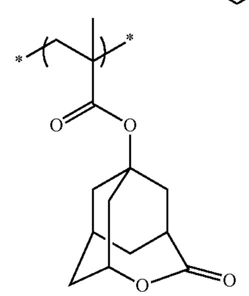
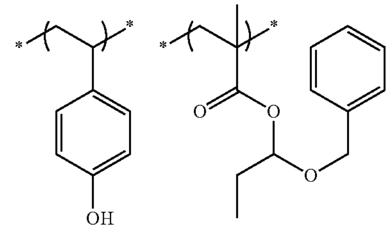
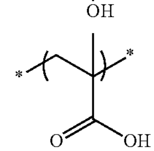

-continued
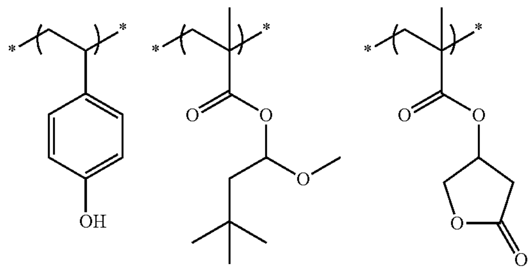
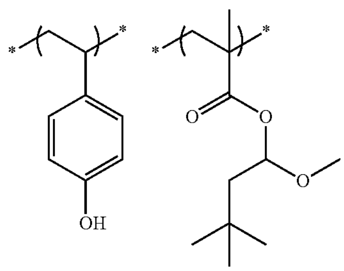
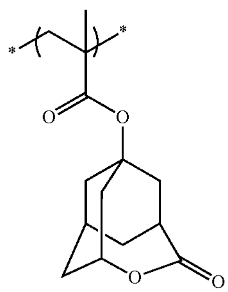
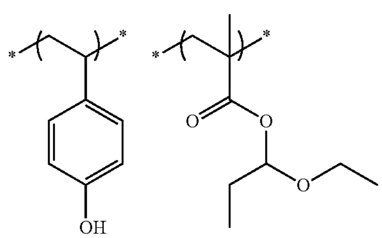
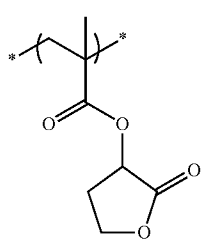
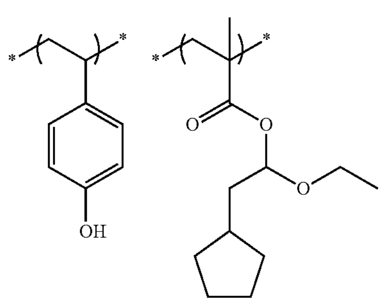
-continued
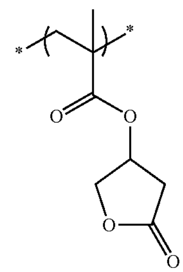
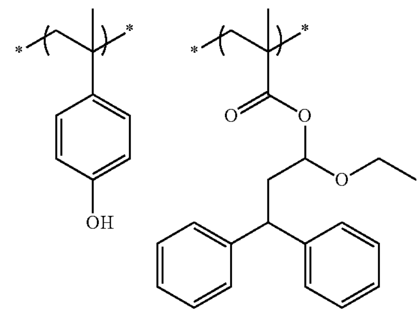
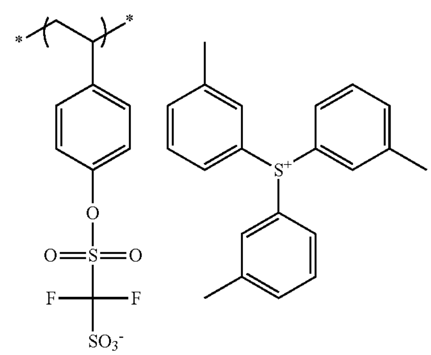
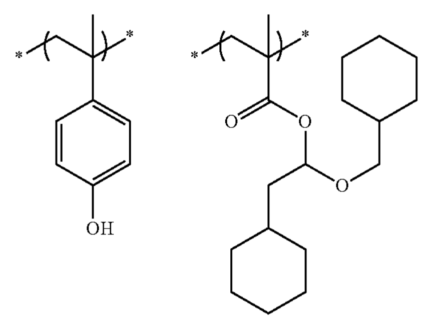
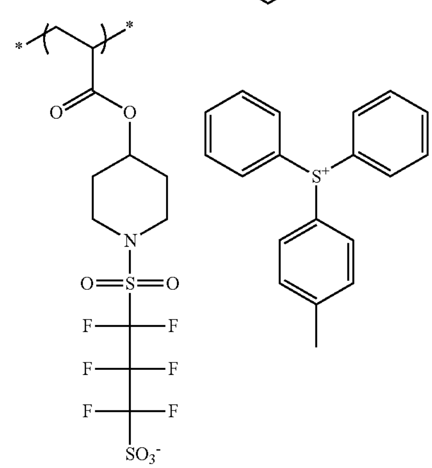

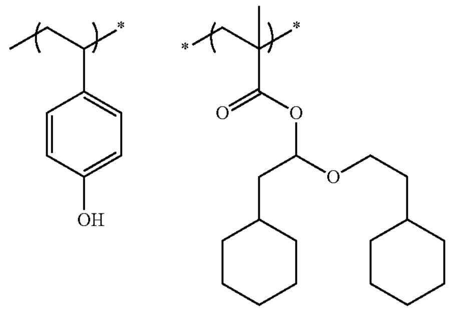
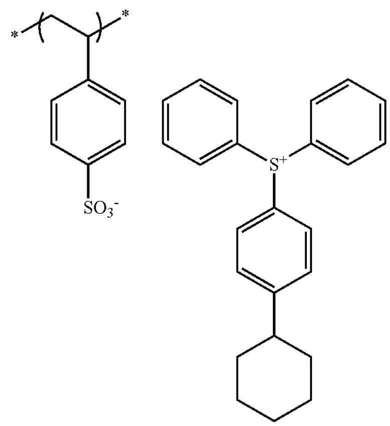
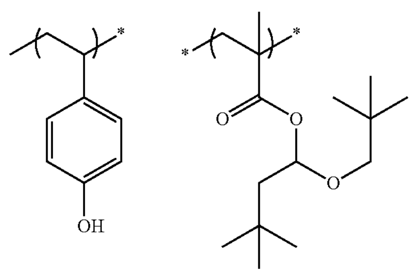
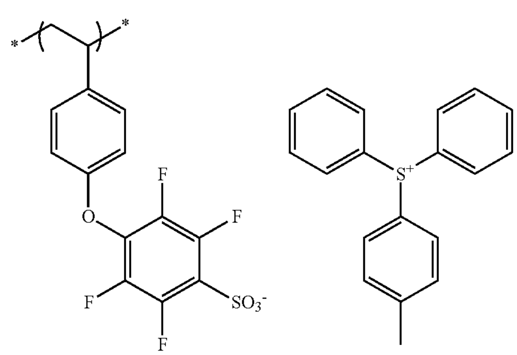
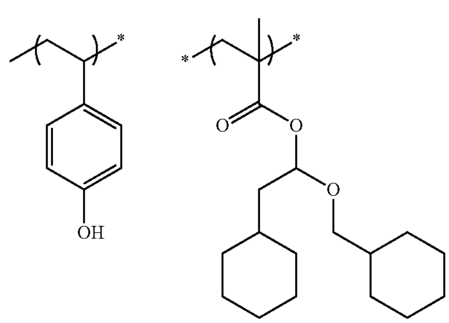
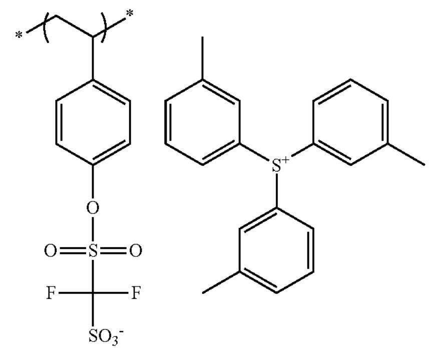
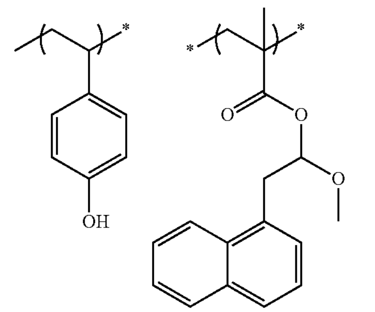
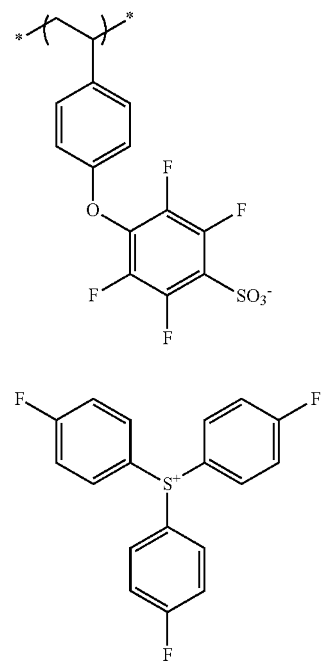
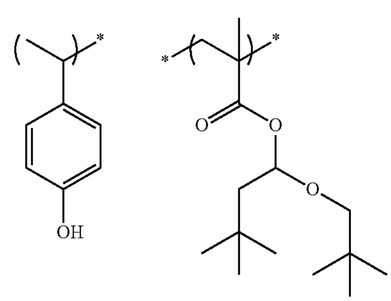

-continued

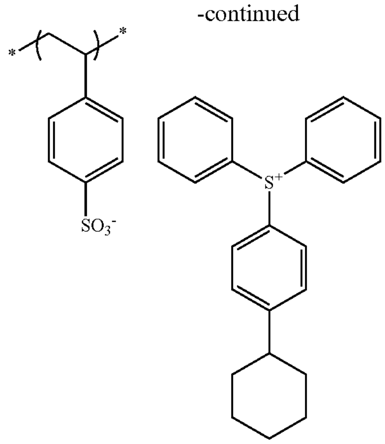

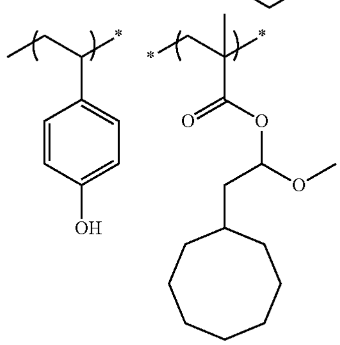

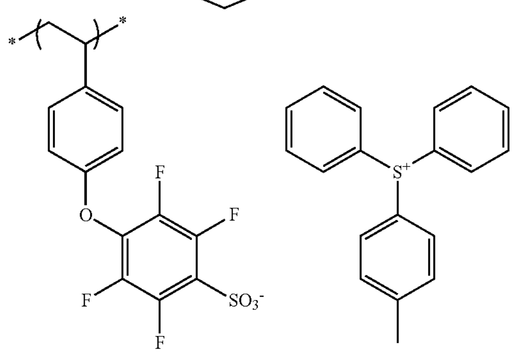

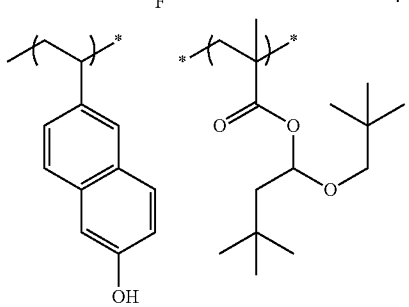

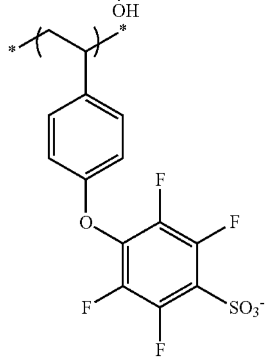

-continued

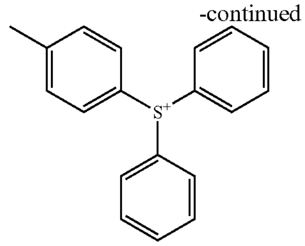

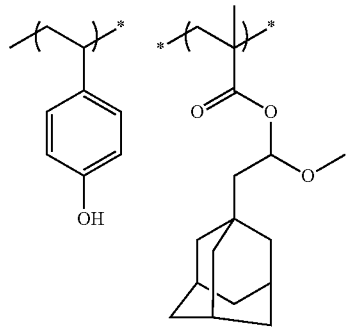

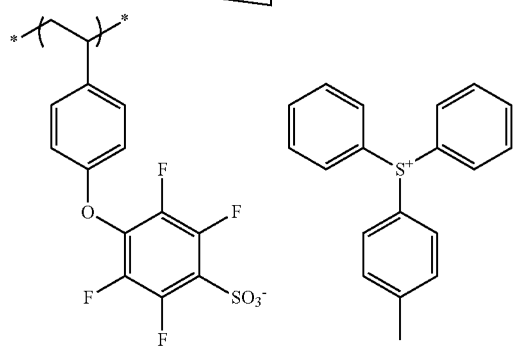

[2] (B) Resin capable of decomposing by the action of an acid to change in the solubility for a developer, which is different from the resin (P)

The actinic ray-sensitive or radiation-sensitive resin composition of the present invention may contain a resin capable of decomposing by the action of an acid to change in the solubility for a developer, which is different from the resin (P) (hereinafter, the resin is sometimes referred to as "resin (B)").

The resin (B) is a resin having a structure where a polar group is protected by a leaving group capable of decomposing and leaving by the action of an acid (hereinafter, sometimes referred to as "acid-decomposable group").

The resin (B) preferably contains a repeating unit having an acid-decomposable group.

Examples of the polar group include a carboxyl group, a phenolic hydroxyl group, a sulfonic acid group, a thiol group, and an alcoholic hydroxyl group.

Examples of the group capable of leaving by the action of an acid include —C($R_{36}$)($R^{37}$)($R_{38}$), —C($R_{36}$)($R_{37}$)($OR_{39}$), —C(═O)—O—C($R^{36}$)($R_{37}$)($R_{38}$), —C($R_{01}$)($R_{02}$)($OR_{39}$), and —C($R_{01}$)($R_{02}$)—C(═O)—O—C($R_{36}$)($R_{37}$)($R_{38}$).

In the formulae above, each of $R_{36}$ to $R_{39}$ independently represents an alkyl group, a cycloalkyl group, an aryl group, an aralkyl group or an alkenyl group, and $R^{36}$ and $R_{37}$ may combine with each other to form a ring. Each of $R_{01}$ and $R_{02}$ independently represents a hydrogen atom, an alkyl group, a cycloalkyl group, an aryl group, an aralkyl group or an alkenyl group.

The resin (B) can be synthesized by a conventional method (for example, radical polymerization).

The weight average molecular weight of the resin (B) is preferably from 1.000 to 200,000, more preferably from 2,000 to 20,000, still more preferably from 3,000 to 15,000, yet still more preferably from 3,000 to 10,000, in terms of polystyrene as measured by the GPC method. When the weight average molecular weight is from 1,000 to 200,000, the heat resistance and dry etching resistance can be kept from deterioration and at the same time, the film-forming property can be prevented from becoming poor due to impairment of developability or increase in the viscosity.

The polydispersity (molecular weight distribution) is usually from 1 to 3, preferably from 1 to 2.6, more preferably from 1 to 2, still more preferably from 1.4 to 1.7. As the molecular weight distribution is narrower, the resolution and resist profile are more excellent, the side wall of the resist pattern is smoother, and the roughness is more improved.

As for the resin (B), two or more kinds of resins may be used in combination.

The actinic ray-sensitive or radiation-sensitive resin composition of the present invention may or may not contain the resin (B), but in the case of containing the resin (B), the content thereof is usually from 1 to 50 mass %, preferably from 1 to 30 mass %, more preferably from 1 to 15 mass %, based on the total solid content of the actinic ray-sensitive or radiation-sensitive resin composition.

Examples of the resin (B) include those described in paragraphs [0214] to [0594] of Japanese Patent Application No. 2011-217048 and paragraphs [0059] to [0169] of JP-A-2010-217884 and the like.

[3] Compound capable of generating an acid upon irradiation with an actinic ray or radiation The actinic ray-sensitive or radiation-sensitive resin composition of the present invention may further contain a compound capable of generating an acid upon irradiation with an actinic ray or radiation (hereinafter, sometimes referred to as "photoacid generator").

The acid generator is not particularly limited as long as it is a known acid generator, but a compound capable of generating an organic acid, for example, at least any one of a sulfonic acid, a bis(alkylsulfonyl)imide and a tris(alkylsulfonyl)methide, upon irradiation with an actinic ray or radiation is preferred.

More preferred compounds include compounds represented by the following formulae (ZI), (ZII) and (ZIII):

(ZI)

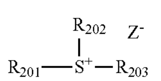

(ZII)

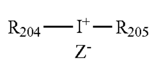

(ZIII)

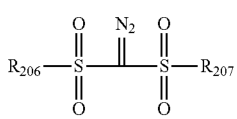

In formula (ZI), each of $R_{201}$, $R_{202}$ and $R_{203}$ independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain therein an oxygen atom, a sulfur atom, an ester bond, an amide bond or a carbonyl group. The group formed by combining two members out of $R_{201}$ to $R_{203}$ includes an alkylene group (e.g., butylene group, pentylene group).

$Z^-$ represents a non-nucleophilic anion (an anion having an extremely low ability of causing a nucleophilic reaction).

Examples of the non-nucleophilic anion include a sulfonate anion (such as aliphatic sulfonate anion, aromatic sulfonate anion and camphorsulfonate anion), a carboxylate anion (such as aliphatic carboxylate anion, aromatic carboxylate anion and aralkylcarboxylate anion), a sulfonylimide anion, a bis(alkylsulfonyl)imide anion, and a tris(alkylsulfonyl)methide anion.

The aliphatic moiety in the aliphatic sulfonate anion and aliphatic carboxylate anion may be an alkyl group or a cycloalkyl group but is preferably a linear or branched alkyl group having a carbon number of 1 to 30 or a cycloalkyl group having a carbon number of 3 to 30.

The aromatic group in the aromatic sulfonate anion and aromatic carboxylate anion is preferably an aryl group having a carbon number of 6 to 14, and examples thereof include a phenyl group, a tolyl group and a naphthyl group.

The alkyl group, cycloalkyl group and aryl group above may have a substituent. Specific examples of the substituent include a nitro group, a halogen atom such as fluorine atom, a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 2 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). The aryl group or ring structure, which each group has, may further have an alkyl group (preferably having a carbon number of 1 to 15) as a substituent.

The aralkyl group in the aralkylcarboxylate anion is preferably an aralkyl group having a carbon number of 6 to 12, and examples thereof include a benzyl group, a phenethyl group, a naphthylmethyl group, a naphthylethyl group and a naphthylbutyl group.

Examples of the sulfonylimide anion include saccharin anion.

The alkyl group in the bis(alkylsulfonyl)imide anion and tris(alkylsulfonyl)methide anion is preferably an alkyl group having a carbon number of 1 to 5, and examples of the substituent on this alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom and a fluorine atom-substituted alkyl group being preferred.

Also, the alkyl groups in the bis(alkylsulfonyl)imide anion may combine with each other to form a ring structure. In this case, the acid strength is increased.

Other examples of the non-nucleophilic anion include fluorinated phosphorus (e.g., $PF_6^-$), fluorinated boron (e.g., $BF_4^-$), and fluorinated antimony (e.g., $SbF_6^-$).

The non-nucleophilic anion is preferably an aliphatic sulfonate anion substituted with a fluorine atom at least at the α-position of the sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion (preferably having a carbon number of 4 to 8) or a fluorine atom-containing benzenesulfonate anion, still more preferably nonafluorobutanesulfonate anion, perfluorooctanesulfonate anion, pentafluorobenzenesulfonate anion or 3,5-bis(trifluoromethyl) benzenesulfonate anion.

As regards the acid strength, the pKa of the acid generated is preferably −1 or less for enhancing the sensitivity.

An anion represented by the following formula (AN1) is also a preferred embodiment of the non-nucleophilic anion:

(AN1)

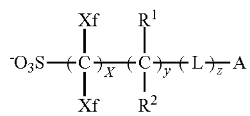

In the formula, each Xf independently represents a fluorine atom or an alkyl group substituted with at least one fluorine atom.

Each of $R^1$ and $R^2$ independently represents a hydrogen atom, a fluorine atom or an alkyl group, and when a plurality of $R^1$s or $R^2$s are present, each $R^1$ or $R^2$ may be the same as or different from every other $R^1$ or $R^2$.

L represents a divalent linking group, and when a plurality of L's are present, each L may be the same as or different from every other L.

A represents a cyclic organic group.

x represents an integer of 1 to 20, y represents an integer of 0 to 10, and z represents an integer of 0 to 10.

Formula (AN1) is described in more detail.

The alkyl group in the fluorine atom-substituted alkyl group of Xf is preferably an alkyl group having a carbon number of 1 to 10, more preferably from 1 to 4. Also, the fluorine atom-substituted alkyl group of Xf is preferably a perfluoroalkyl group.

Xf is preferably a fluorine atom or a perfluoroalkyl group having a carbon number of 1 to 4. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with a fluorine atom and $CF_3$ being preferred. In particular, it is preferred that both Xf's are a fluorine atom.

The alkyl group of $R^1$ and $R^2$ may have a substituent (preferably a fluorine atom) and is preferably an alkyl group having a carbon number of 1 to 4, more preferably a perfluoroalkyl group having a carbon number of 1 to 4. Specific examples of the alkyl group having a substituent of $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with $CF_3$ being preferred.

Each of $R^1$ and $R^2$ is preferably a fluorine atom or $CF_3$.

x is preferably from 1 to 10, more preferably from 1 to 5.

y is preferably from 0 to 4, more preferably 0.

z is preferably from 0 to 5, more preferably from 0 to 3.

The divalent linking group of L is not particularly limited and includes, for example, —COO—, —OCO—, —CO—, —O—, —S—, —SO—, —$SO_2$—, an alkylene group, a cycloalkylene group, an alkenylene group, and a linking group formed by combining a plurality thereof. A linking group having a total carbon number of 12 or less is preferred. Among these, —COO—, —OCO—, —CO— and —O— are preferred, and —COO—, —OCO— are more preferred.

The cyclic organic group of A is not particularly limited as long as it has a cyclic structure, and examples thereof include an alicyclic group, an aryl group and a heterocyclic group (including not only those having aromaticity but also those having no aromaticity).

The alicyclic group may be monocyclic or polycyclic and is preferably a monocyclic cycloalkyl group such as cyclopentyl group, cyclohexyl group and cyclooctyl group, or a polycyclic cycloalkyl group such as norbornyl group, tricyclodecanyl group, tetracyclodecanyl group, tetracyclododecanyl group and adamantyl group. Above all, an alicyclic group having a bulky structure with a carbon number of 7 or more, such as norbornyl group, tricyclodecanyl group, tetracyclodecanyl group, tetracyclododecanyl group and adamantyl group, is preferred from the standpoint that the diffusion in the film during heating after exposure can be suppressed and MEEF can be improved.

The aryl group includes a benzene ring, a naphthalene ring, a phenanthrene ring, and an anthracene ring.

The heterocyclic group includes those derived from a furan ring, a thiophene ring, a benzofuran ring, a benzothiophene ring, a dibenzofuran ring, a dibenzothiophene ring and a pyridine ring. Among these, heterocyclic groups derived from a furan ring, a thiophene ring and a pyridine ring are preferred.

The cyclic organic group also includes a lactone structure. Specific examples thereof include lactone structures represented by formulae (LC1-1) to (LC1-17) which may be contained in the resin (P).

The cyclic organic group may have a substituent, and examples of the substituent include an alkyl group (may be any of linear, branched or cyclic; preferably having a carbon number of 1 to 12), a cycloalkyl group (may be any of monocyclic, polycyclic or spirocyclic; preferably having a carbon number of 3 to 20), an aryl group (preferably having a carbon number of 6 to 14), a hydroxy group, an alkoxy group, an ester group, an amide group, a urethane group, a ureido group, a thioether group, a sulfonamido group, and a sulfonic acid ester group. Incidentally, the carbon constituting the cyclic organic group (the carbon contributing to ring formation) may be a carbonyl carbon.

Examples of the organic group of $R_{201}$, $R_{202}$ and $R_{203}$ include an aryl group, an alkyl group, and a cycloalkyl group.

At least one of three members $R_{201}$, $R_{202}$ and $R_{203}$ is preferably an aryl group, and it is more preferred that all of these three members are an aryl group. The aryl group may be a heteroaryl group such as indole residue and pyrrole residue, other than a phenyl group, a naphthyl group and the like. The alkyl group and cycloalkyl group of $R_{201}$ to $R_{203}$ may be preferably a linear or branched alkyl group having a carbon number of 1 to 10 and a cycloalkyl group having a carbon number of 3 to 10. More preferred examples of the alkyl group include a methyl group, an ethyl group, an n-propyl group, an i-propyl group, and an n-butyl group. More preferred examples of the cycloalkyl group include a cyclopropyl group, a cyclobutyl group, a cyclopentyl group, a cyclohexyl group, and a cycloheptyl group. These groups may further have a substituent, and examples of the substituent include, but are not limited to, a nitro group, a halogen atom such as fluorine atom, a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), and an alkoxycarbonyloxy group (preferably having a carbon number of 2 to 7).

In the case where two members out of $R_{201}$ to $R_{203}$ are combined to form a ring structure, the ring structure is preferably a structure represented by the following formula (A1):

(A1)

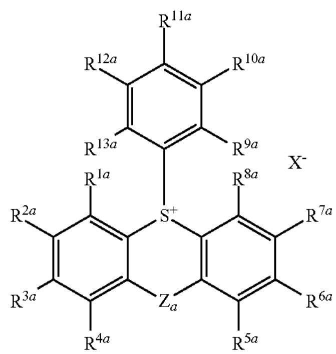

In formula (A1), each of $R^{1a}$ to $R^{13a}$ independently represents a hydrogen atom or a substituent.

It is preferred that from one to three members out of $R^{1a}$ to $R^{13a}$ are not a hydrogen atom; and it is more preferred that any one of $R^{9a}$ to $R^{13a}$ is not a hydrogen atom.

Za represents a single bond or a divalent linking group.

$X^-$ has the same meaning as $Z^-$ in formula (ZI).

Specific examples of $R^{1a}$ to $R^{13a}$ when these are not a hydrogen atom include a halogen atom, a linear, branched or cyclic alkyl group, an alkenyl group, an alkynyl group, an aryl group, a heterocyclic group, a cyano group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group (—$B(OH)_2$), a phosphato group (—$OPO(OH)_2$), a sulfato group (—$OSO_3H$), and other known substituents.

In the case where $R^{1a}$ to $R^{13a}$ are not a hydrogen atom, each of $R^{1a}$ to $R^{13a}$ is preferably a linear, branched or cyclic alkyl group substituted with a hydroxyl group.

Examples of the divalent linking group of Za include an alkylene group, an arylene group, a carbonyl group, a sulfonyl group, a carbonyloxy group, a carbonylamino group, a sulfonylamide group, an ether bond, a thioether bond, an amino group, a disulfide group, —$(CH_2)_n$—CO—, —$(CH_2)_n$—$SO_2$—, —CH═CH—, an aminocarbonylamino group, and an aminosulfonylamino group (n is an integer of 1 to 3).

Incidentally, when at least one of $R_{201}$, $R_{202}$ and $R_{203}$ is not an aryl group, the preferred structure includes a cation structure such as compounds described in paragraphs 0047 and 0048 of JP-A-2004-233661 and paragraphs 0040 to 0046 of JP-A-2003-35948, compounds illustrated as formulae (I-1) to (I-70) in U.S. Patent Application Publication No. 2003/0224288A1, and compounds illustrated as formulae (IA-1) to (IA-54) and formulae (IB-1) to (IB-24) in U.S. Patent Application Publication No. 2003/0077540A1.

In formulae (ZII) and (ZIII), each of $R_{204}$ to $R_{207}$ independently represents an aryl group, an alkyl group or a cycloalkyl group.

The aryl group, alkyl group and cycloalkyl group of $R_{201}$ to $R_{207}$ are the same as the aryl group, alkyl group and cycloalkyl group of $R_{201}$ to $R_{203}$ in the compound (ZI).

The aryl group, alkyl group and cycloalkyl group of $R_{04}$ to $R_{207}$ may have a substituent. Examples of the substituent include those of the substituent which the aryl group, alkyl group and cycloalkyl group of $R_{201}$ to $R_{203}$ in the compound (ZI) may have.

$Z^-$ represents a non-nucleophilic anion, and examples thereof are the same as those of the non-nucleophilic anion of $Z^-$ in formula (ZI).

The acid generator further includes compounds represented by the following formulae (ZIV), (ZV) and (ZVI):

$$Ar_3—SO_2—SO_2—Ar_4 \quad \text{(ZIV)}$$

(ZV)

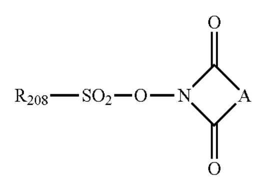

(ZVI)

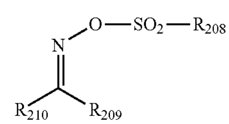

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Specific examples of the aryl group of $Ar_3$, $Ar_4$, $R_{208}$, $R_{209}$ and $R_{210}$ are the same as specific examples of the aryl group of $R_{201}$, $R_{202}$ and $R_{203}$ in formula (ZI).

Specific examples of the alkyl group and cycloalkyl group of $R_{208}$, $R_{209}$ and $R_{210}$ are the same as specific examples of the alkyl group and cycloalkyl group of $R_{201}$, $R_{202}$ and $R_{203}$ in formula (ZI).

The alkylene group of A includes an alkylene group having a carbon number of 1 to 12 (e.g., methylene group, ethylene group, propylene group, isopropylene group, butylenes group, isobutylene group); the alkenylene group of A includes an alkenylene group having a carbon number of 2 to 12 (e.g., ethenylene group, propenylene group, butenylene group); and the arylene group of A includes an arylene group having a carbon number of 6 to 10 (e.g., phenylene group, tolylene group, naphthylene group).
Out of the acid generators, particularly preferred examples are illustrated below.
(z1)
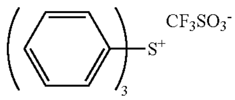
(z2)
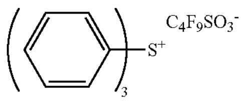
(z3)
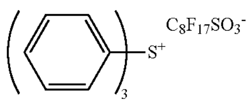
(z4)
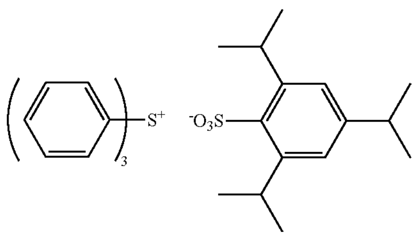
(z5)
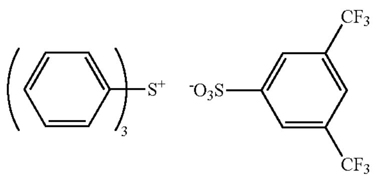
(z6)
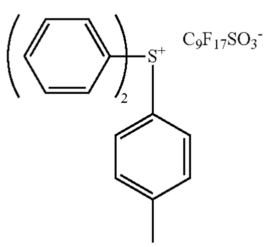
(z7)
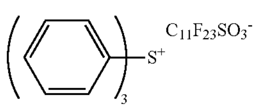
(z8)
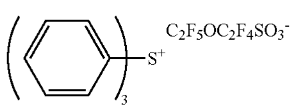
(z9)
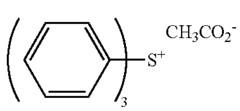
(z10)
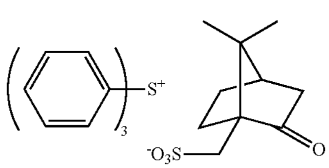
-continued
(z11)
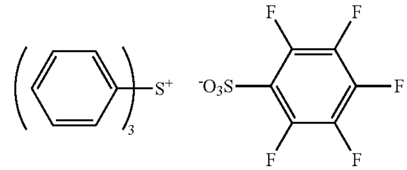
(z12)
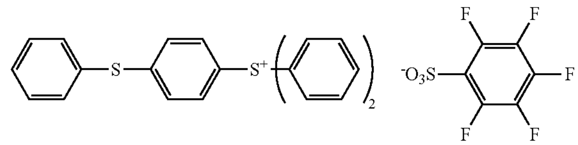
(z13)
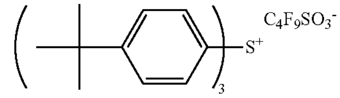
(z14)
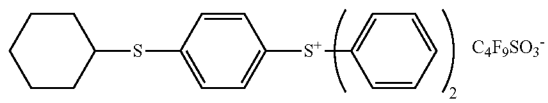
(z15)
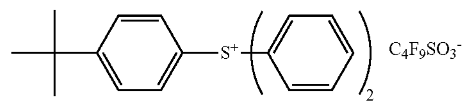
(z16)
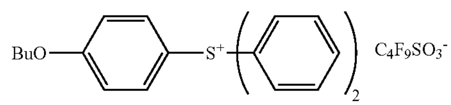
(z17)
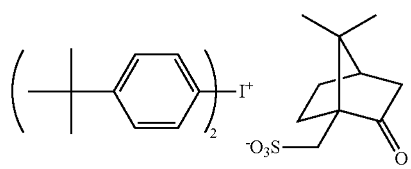
(z18)
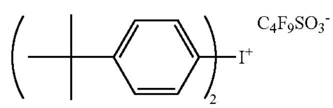
(z19)
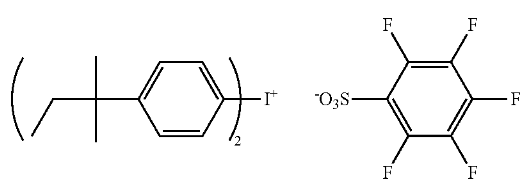
(z20)
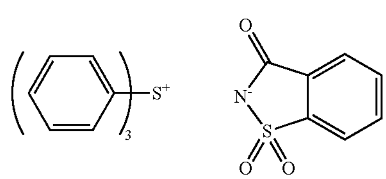
(z21)
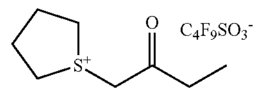

-continued
(z22)
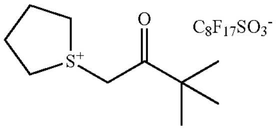
(z23)
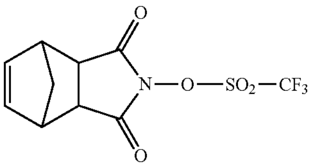
(z24)
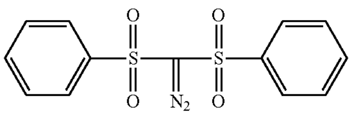
(z25)
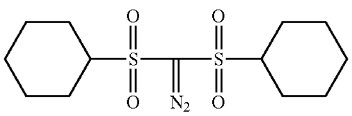
(z26)
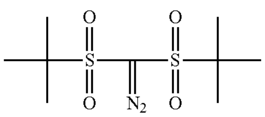
(z27)
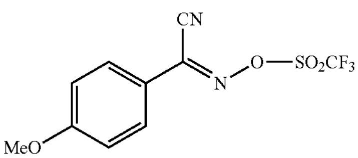
(z28)
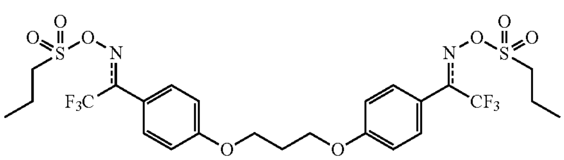
(z29)
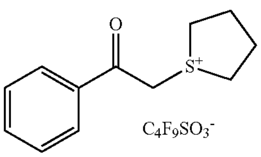
(z30)
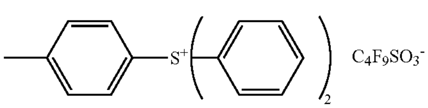
(z31)
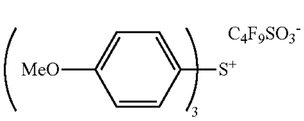
-continued
(z32)
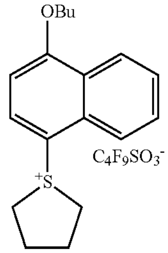
(z33)
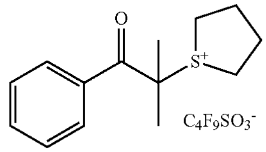
(z34)
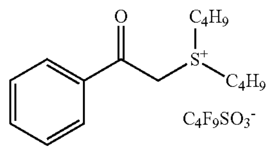
(z35)
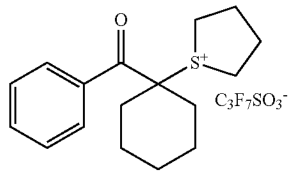
(z36)
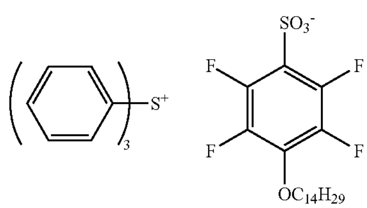
(z37)
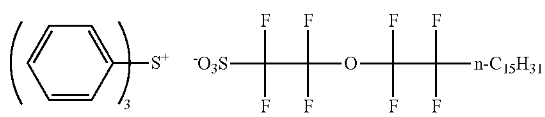
(z38)
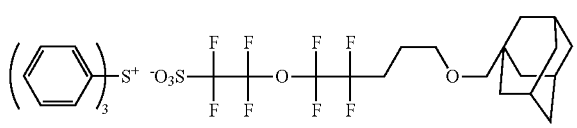
(z39)
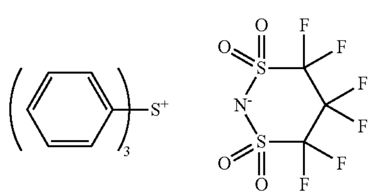
(z40)
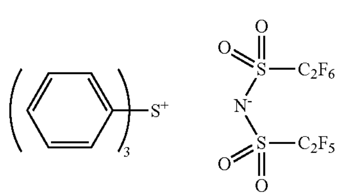

-continued
(z41)
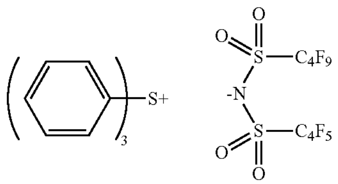
(z42)
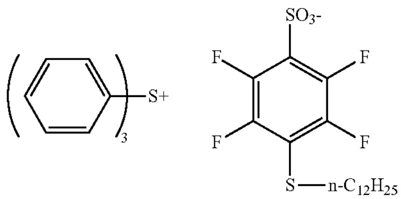
(z43)
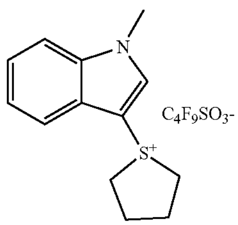
(z44)
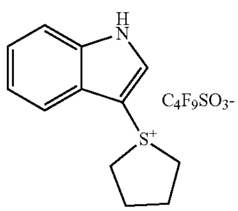
(z45)
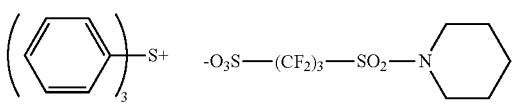
(z46)
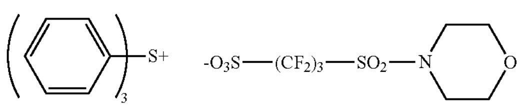
(z47)
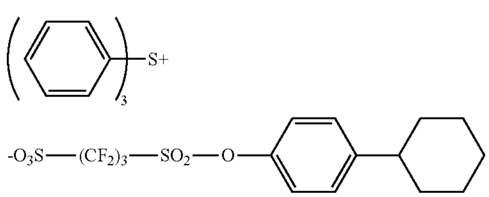
(z48)
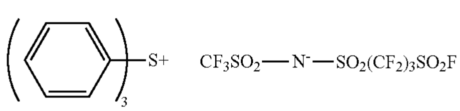
(z49)
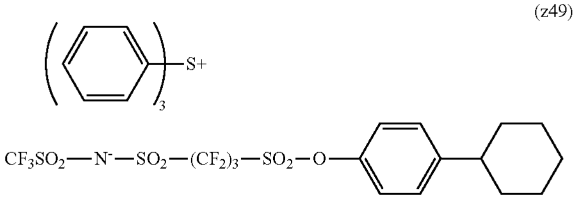
-continued
(z50)
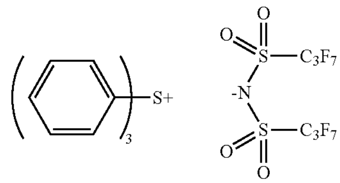
(z51)
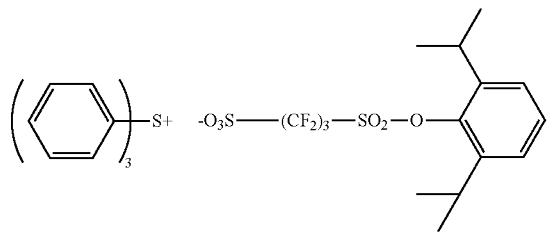
(z52)
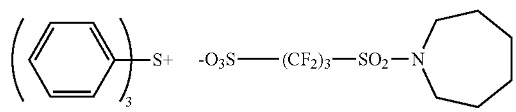
(z53)
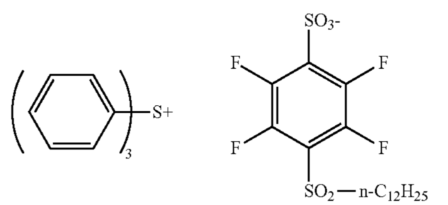
(z54)
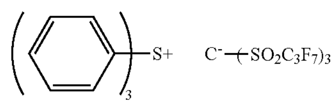
(z55)
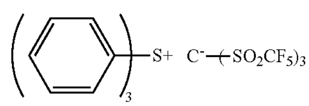
(z56)
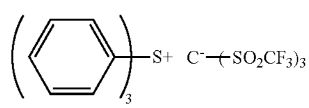
(z57)
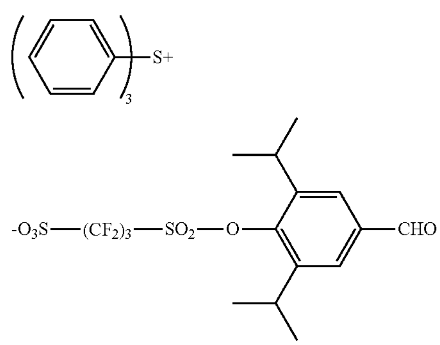
(z58)
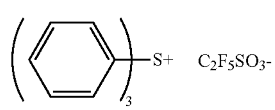

-continued
(z59)
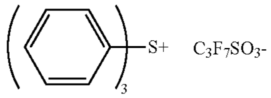
(z60)
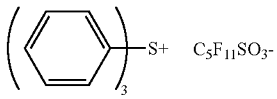
(z61)
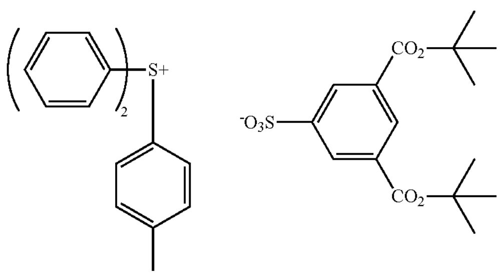
(Z62)
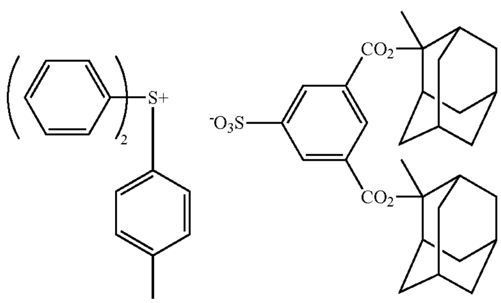
(z63)
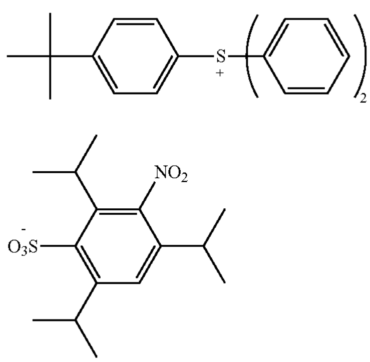
(z64)
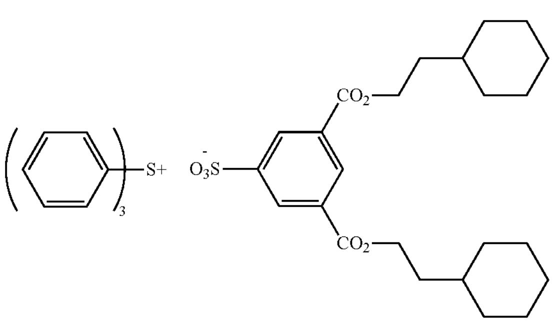
-continued
(z65)
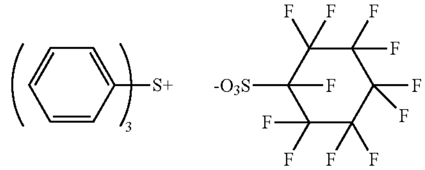
(z66)
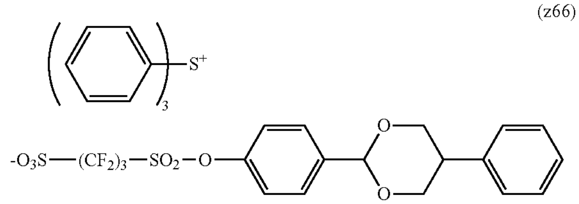
(z67)
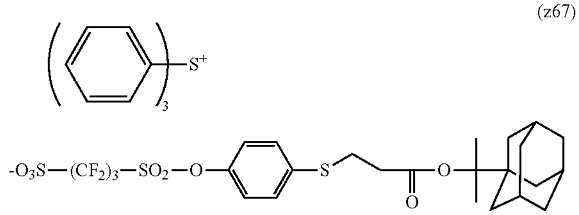
(z68)
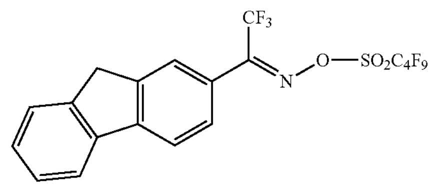
(z69)
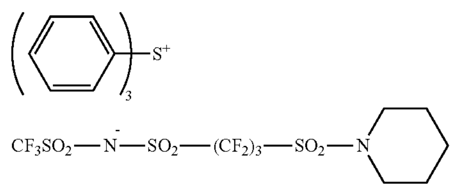
(z70)
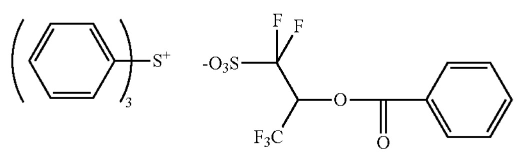
(z71)
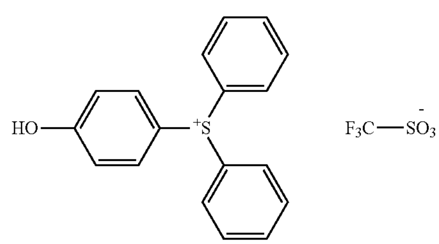
(z72)
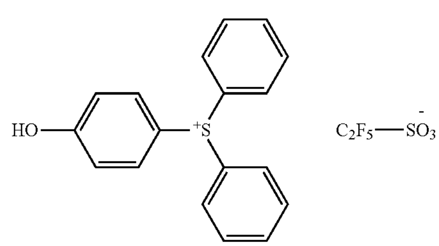

-continued
(z73)
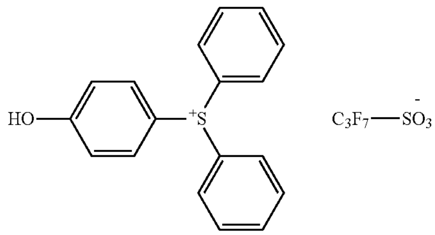
(z74)
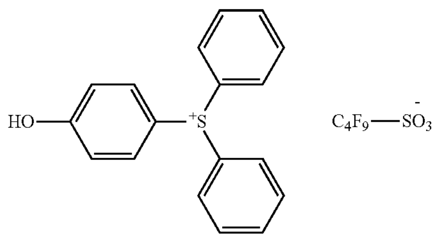
(z75)
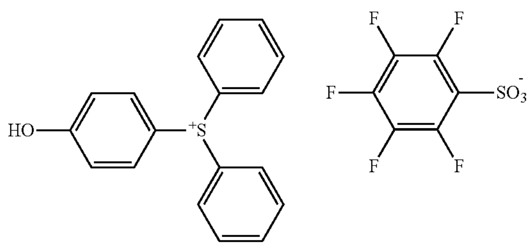
(z76)
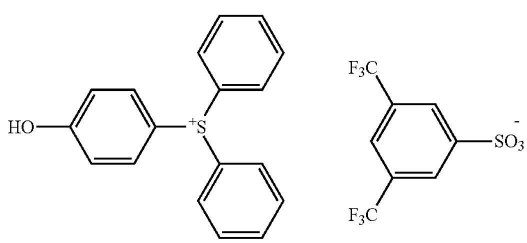
(z77)
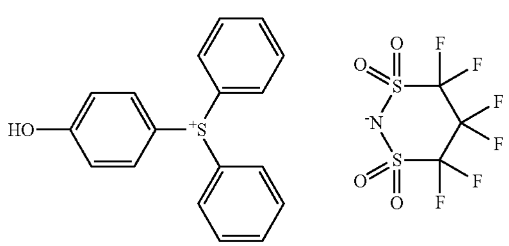
(z78)
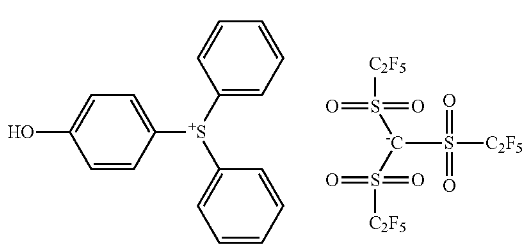
-continued
(z79)
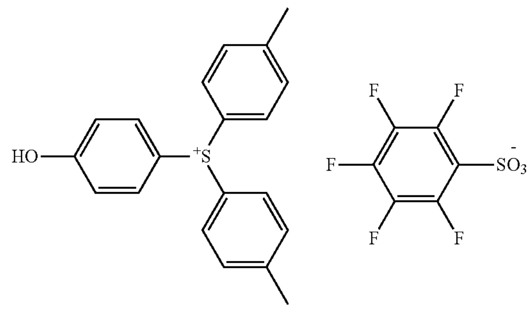
(z80)
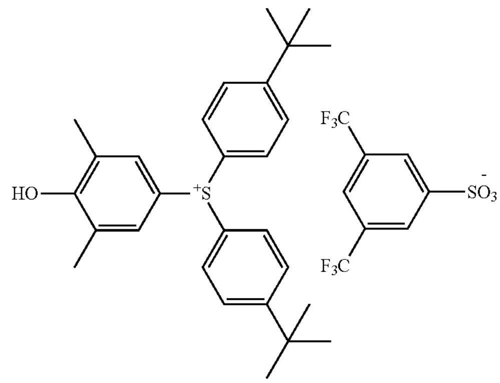
(z81)
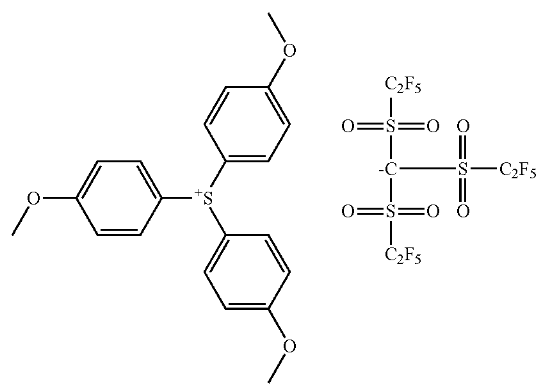
(z82)
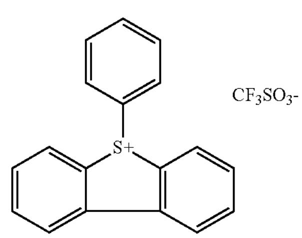
(z83)
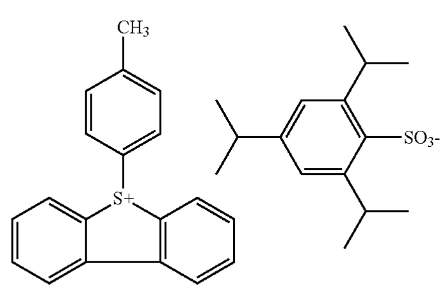

-continued
(z84)
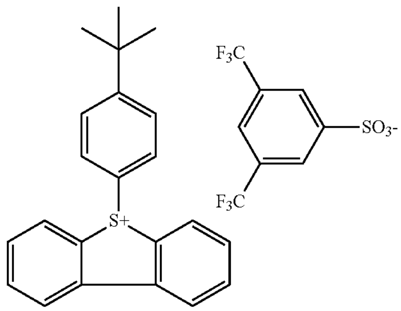
(z85)
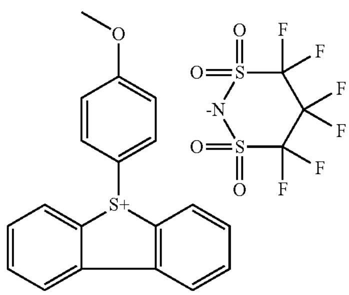
(z86)
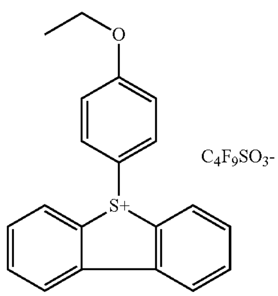
(z87)
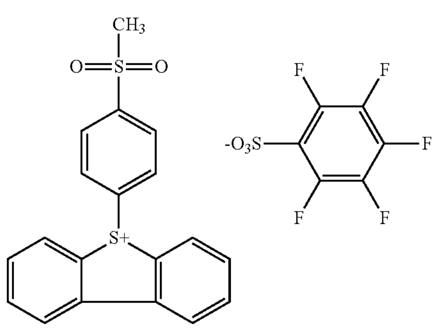
(z88)
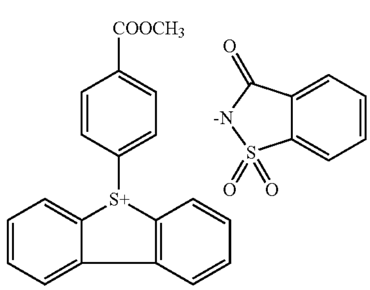
-continued
(z89)
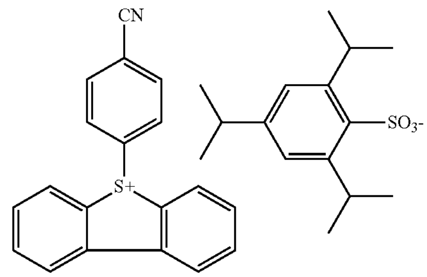
(z90)
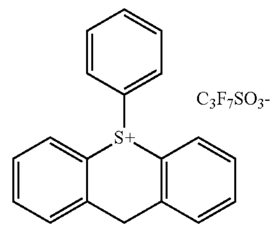
(z91)
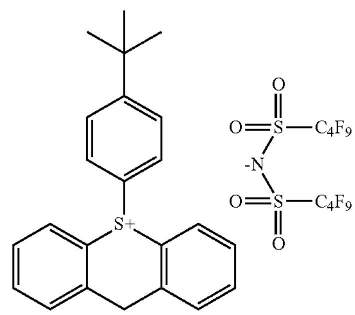
(z92)
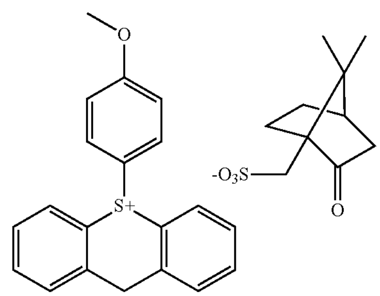
(z93)
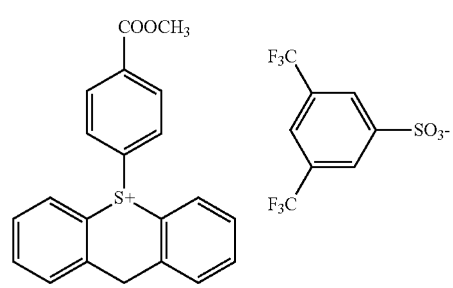

-continued
(z94)
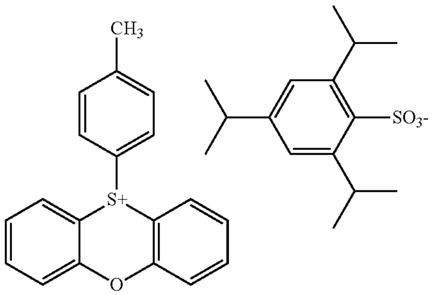
(z95)
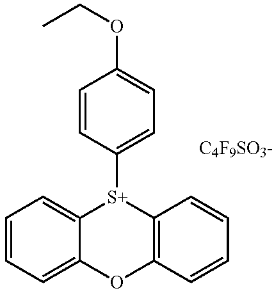
(z96)
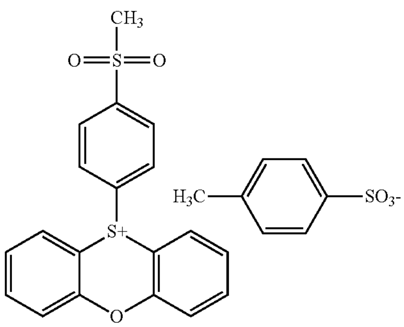
(z97)
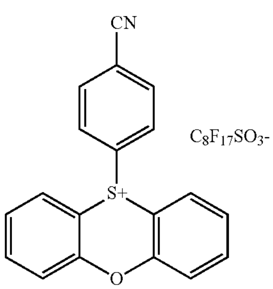
(z98)
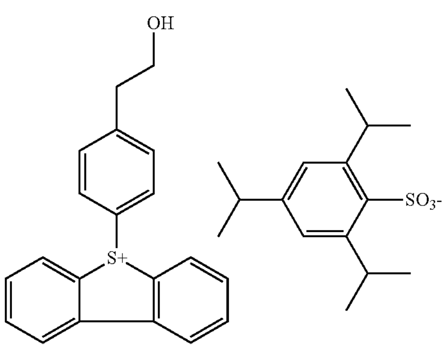
-continued
(z99)
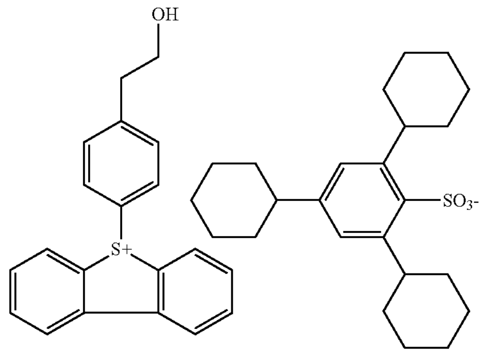
(z100)
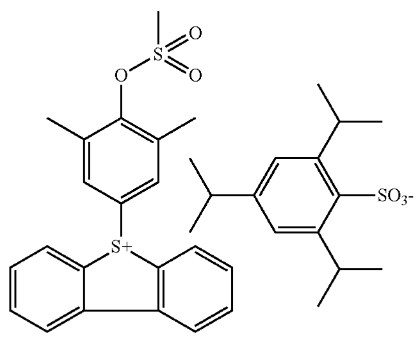
(z101)
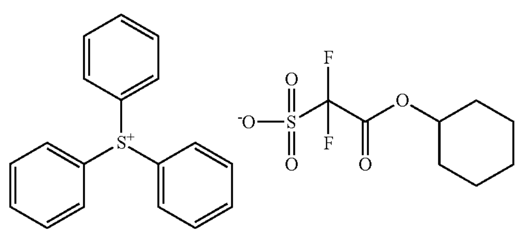
(z102)
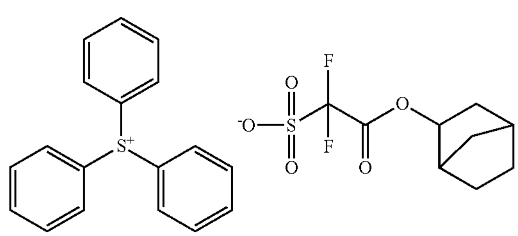
(z103)
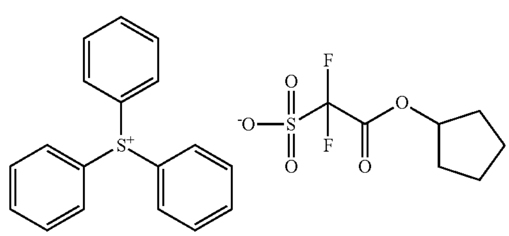

(z104)
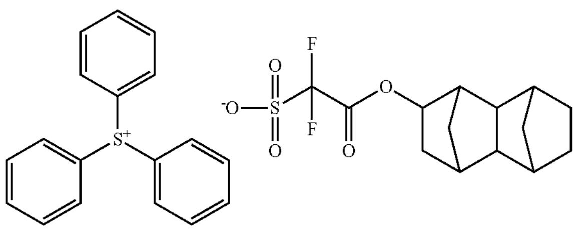
(z105)
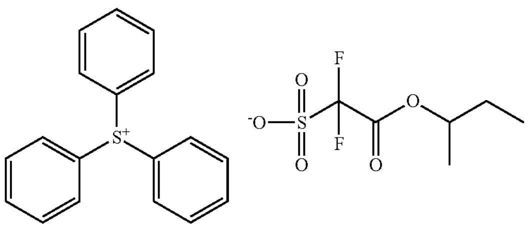
(z106)
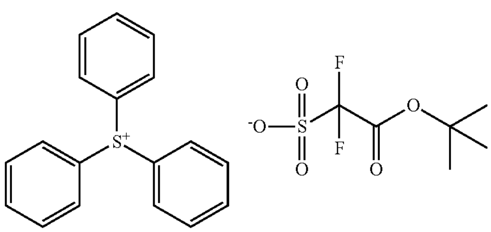
(z107)
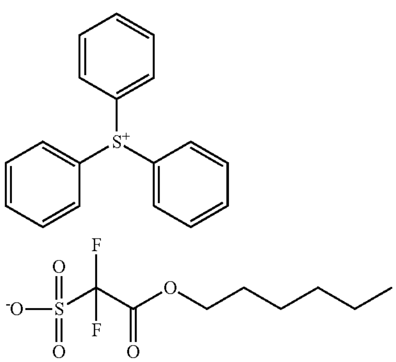
(z108)
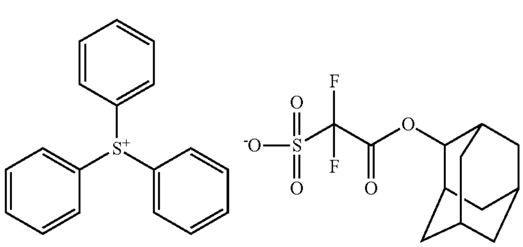
(z109)
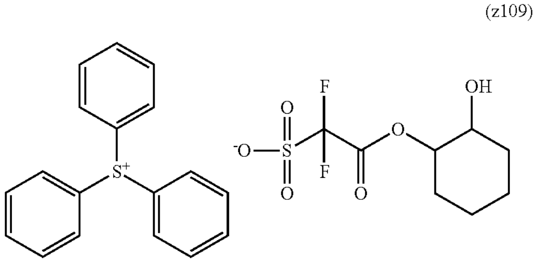
(z110)
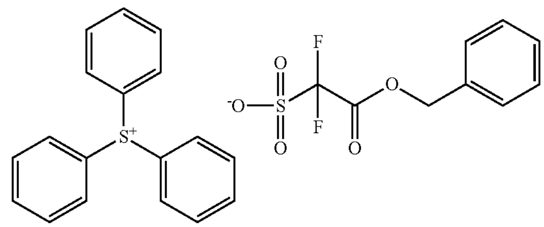
(z111)
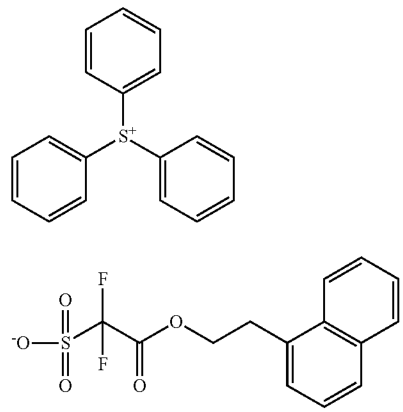
(z112)
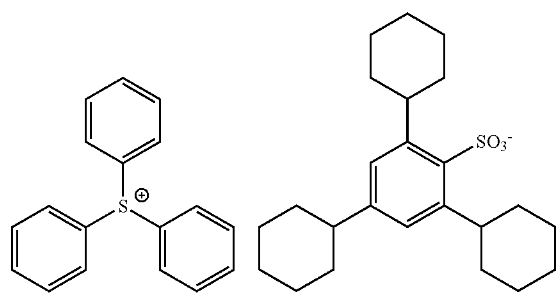
(z113)
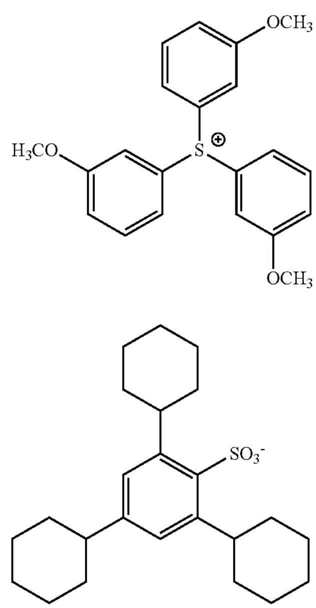

-continued
(z114)
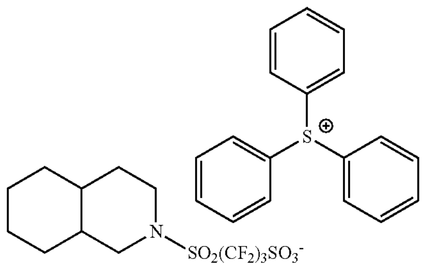
(z115)
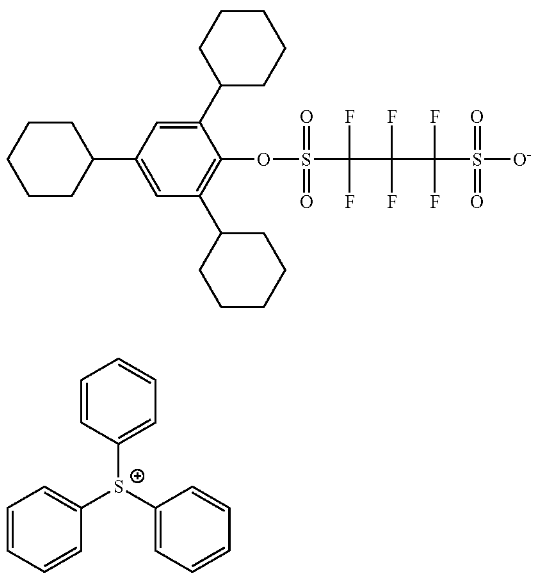
(z116)
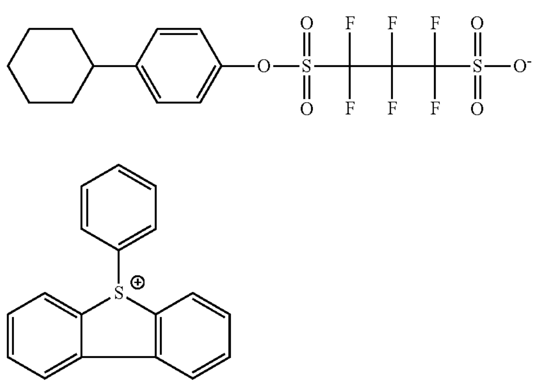
(z117)
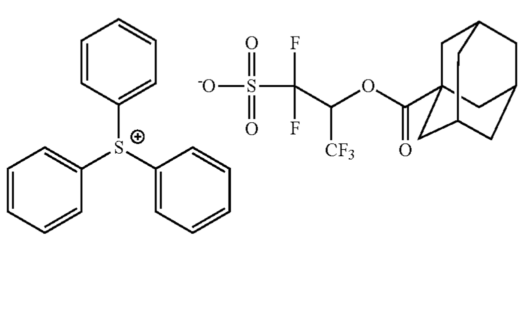
-continued
(z118)
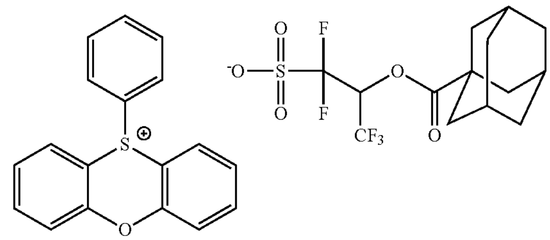
(z119)
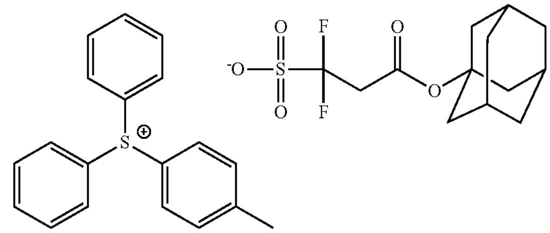
(z120)
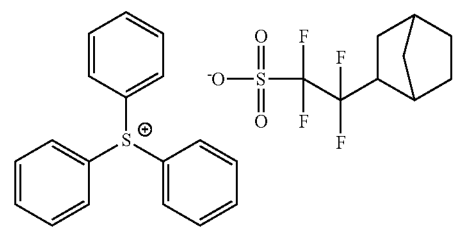
(z121)
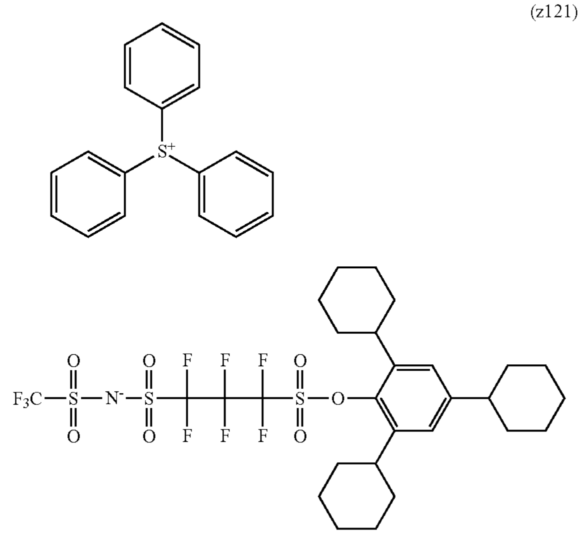
(z122)
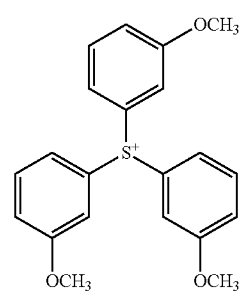

-continued
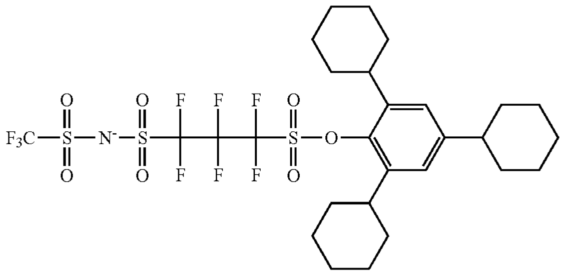
(z123)
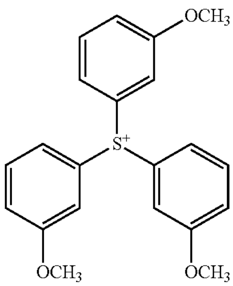
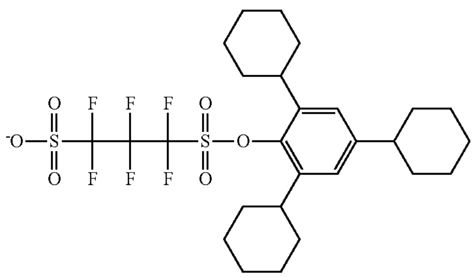
(z124)
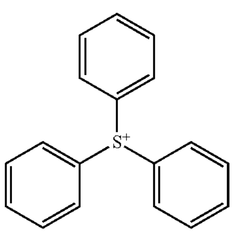
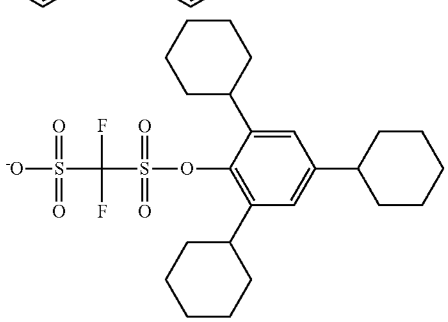
(z125)
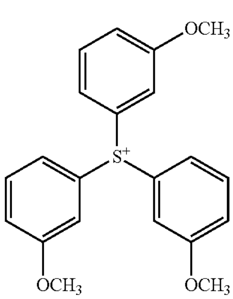
-continued
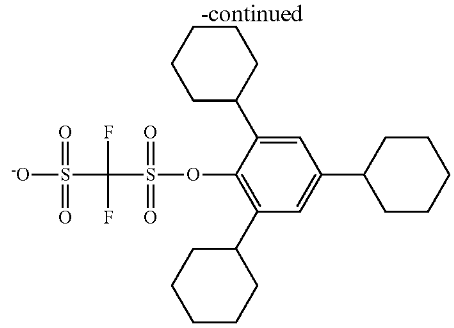
(z126)
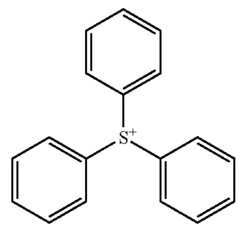
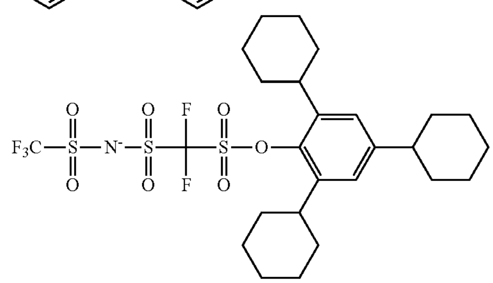
(z127)
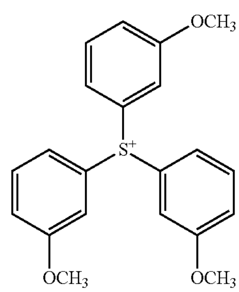
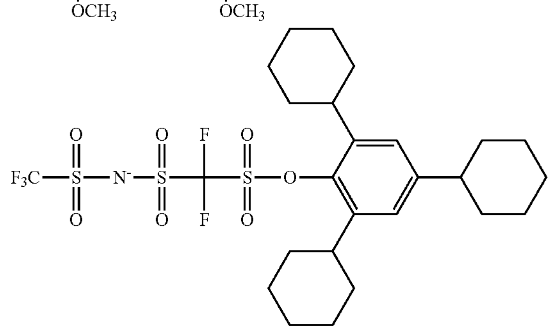
(z128)
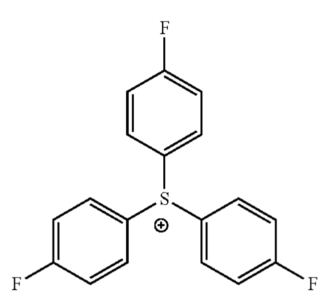

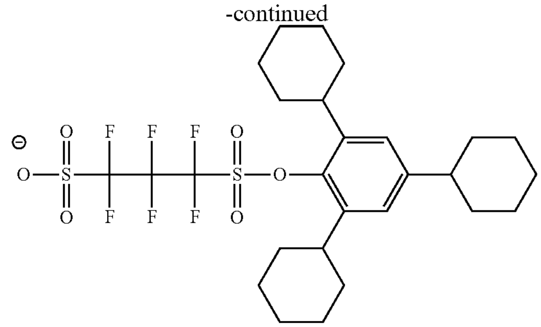
(z129)
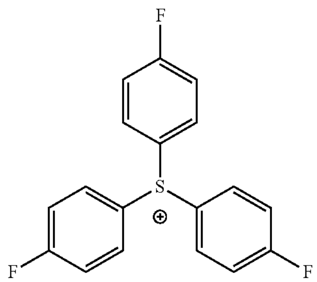
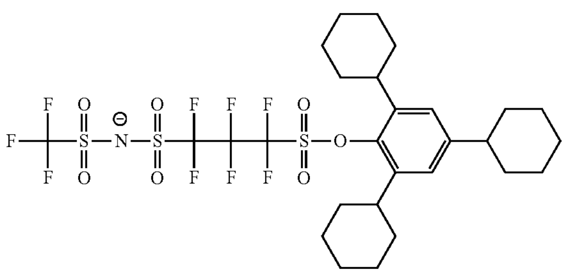
(z130)
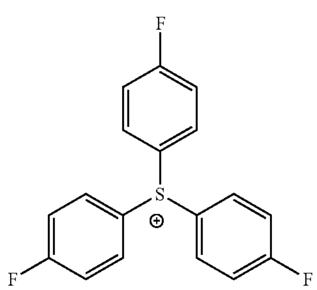
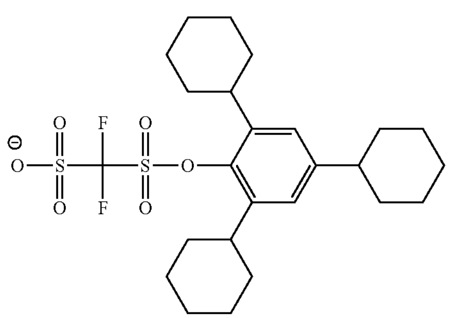
(z131)
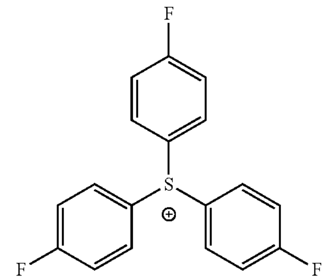
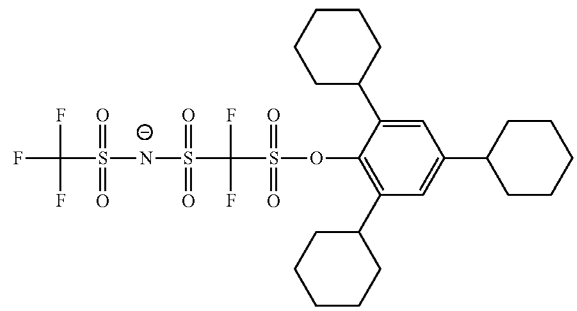
(z132)
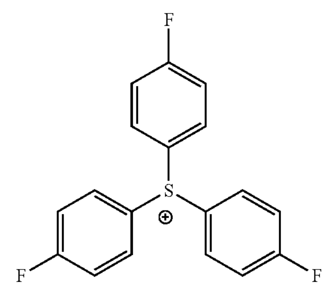
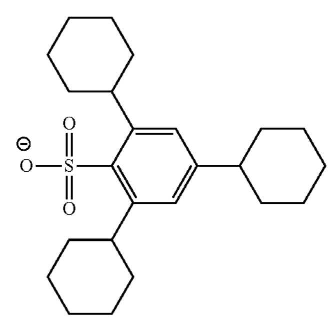
(z133)
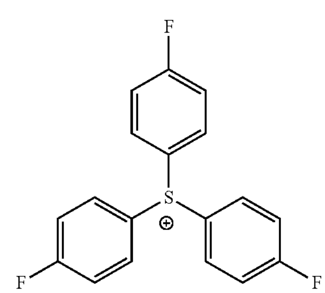

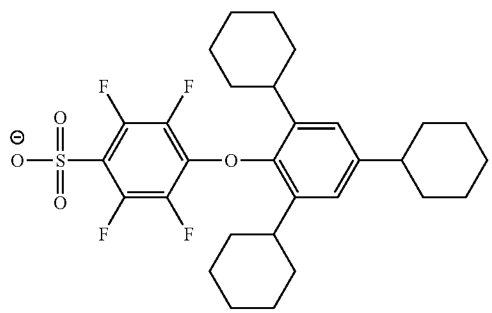
(z134)
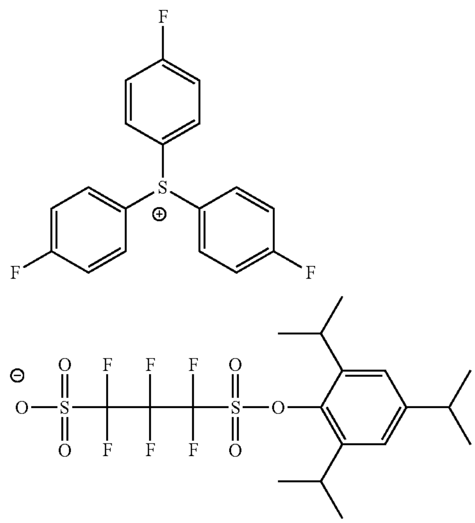
(z135)
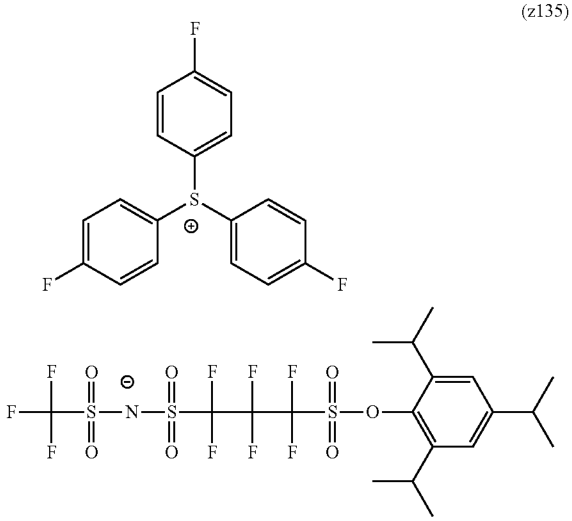
(z136)
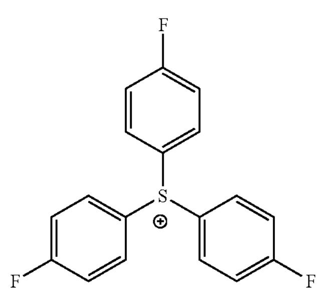
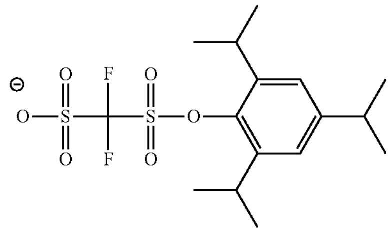
(z137)
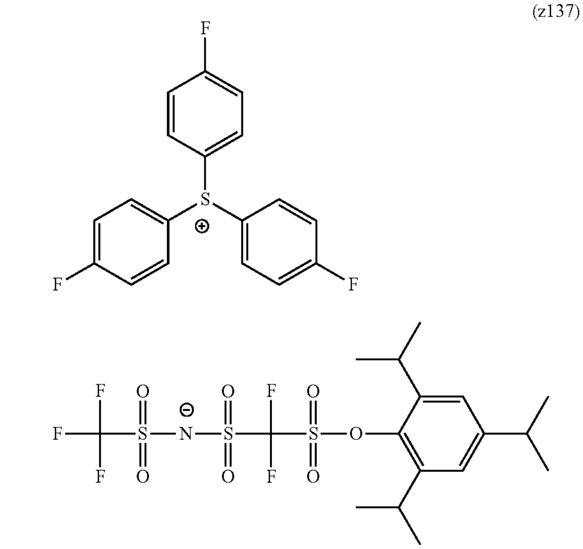
(z138)
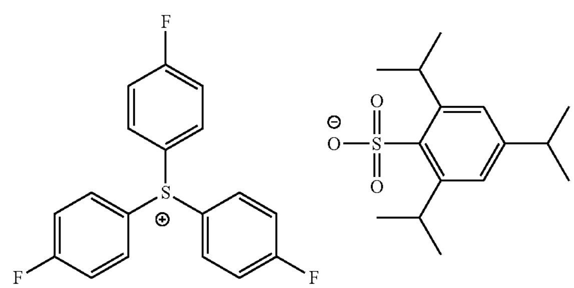
(z139)
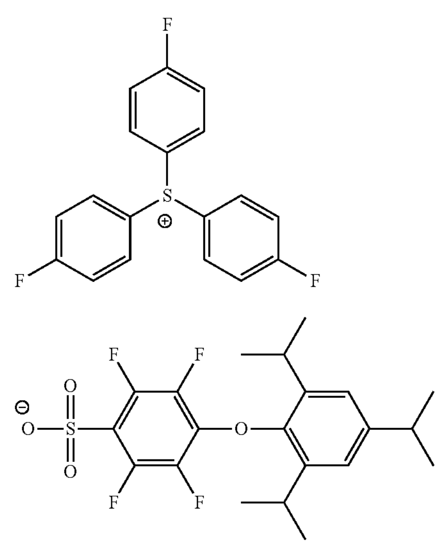

-continued (z140)

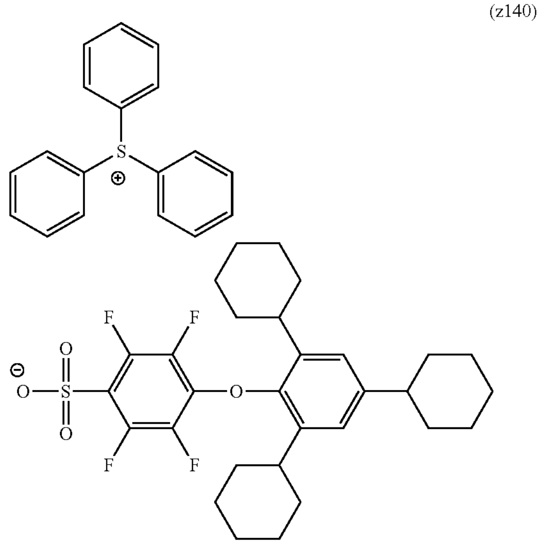

(z141)

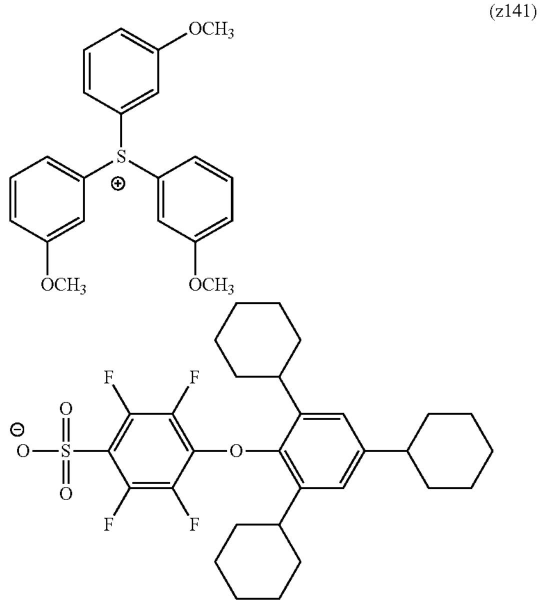

One kind of an acid generator may be used alone, or two or more kinds of acid generators may be used in combination.

The content of the photoacid generator is preferably from 0.1 to 50 mass %, more preferably from 0.5 to 45 mass %/o, still more preferably from 1 to 40 mass %, based on the total solid content of the composition.

[4] Compound capable of decomposing by the action of an acid to generate an acid The actinic ray-sensitive or radiation-sensitive resin composition of the present invention may further contain one compound or two or more compounds capable of decomposing by the action of an acid to generate an acid. The acid generated from the compound capable of decomposing by the action of an acid to generate an acid is preferably a sulfonic acid, a methide acid or an imide acid.

Examples of the compound capable of decomposing by the action of an acid to generate an acid, which can be used in the present invention, are illustrated below, but the present invention is not limited thereto.

(PA-1)

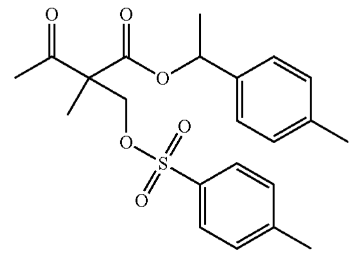

(PA-2)

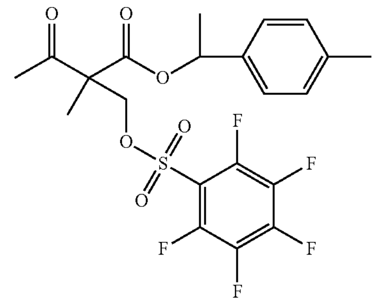

(PA-3)

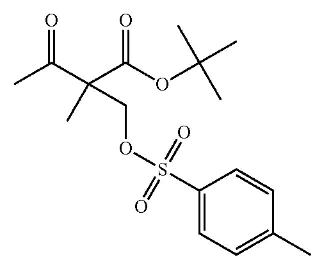

(PA-4)

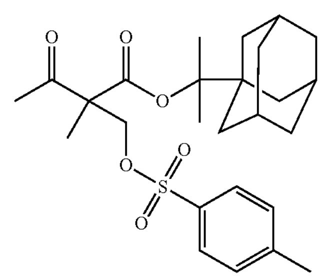

(PA-5)

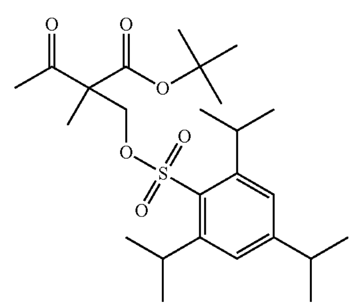

(PA-6)

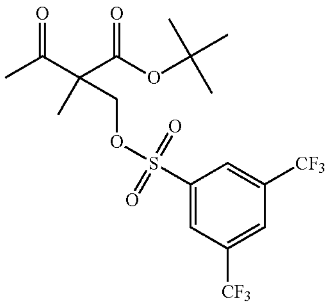

(PA-7)

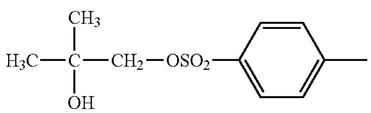

(PA-8)

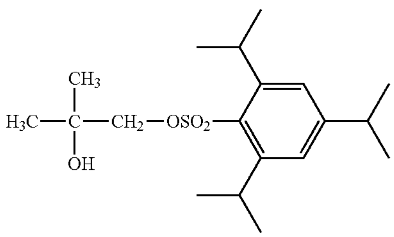

(PA-9)

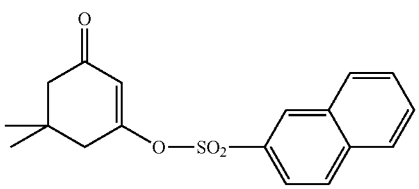

(PA-10)

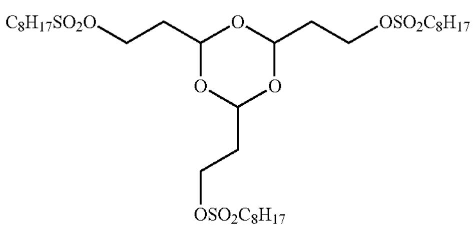

(PA-11)

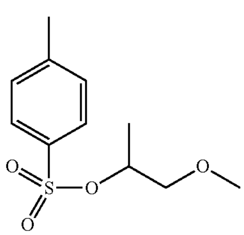

(PA-12)

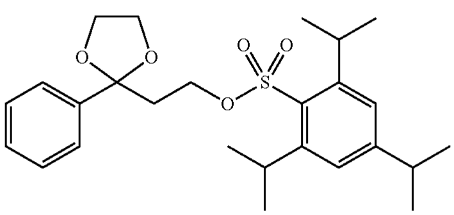

(PA-13)

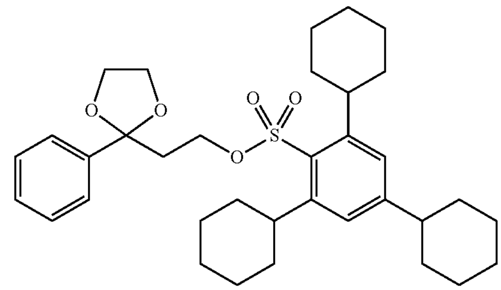

(PA-14)

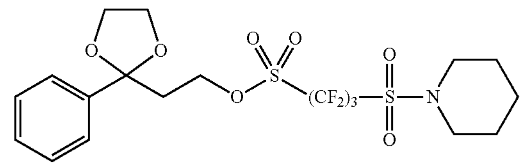

(PA-15)

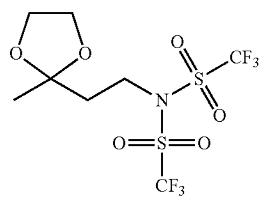

(PA-16)

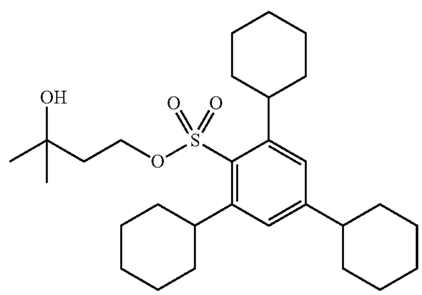

(PA-17)

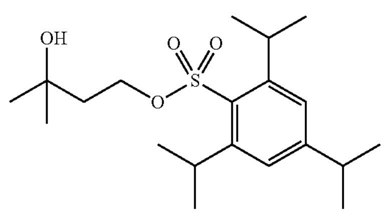

(PA-18)

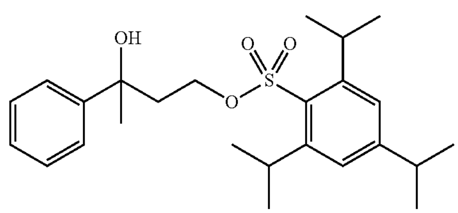

As for the compound capable of decomposing by the action of an acid to generate an acid, one compound may be used alone, or two or more compounds may be used in combination.

Incidentally, the content of the compound capable of decomposing by the action of an acid to generate an acid is preferably from 0.1 to 40 mass %, more preferably from 0.5 to 30 mass %, still more preferably from 1.0 to 20 mass %, based on the total solid content of the actinic ray-sensitive or radiation-sensitive resin composition.

[5] Resist Solvent (Coating Solvent)

The solvent which can be used when preparing the composition is not particularly limited as long as it dissolves respective components, but examples thereof include an alkylene glycol monoalkyl ether carboxylate (e.g., propylene glycol monomethyl ether acetate (PGMEA; another name: 1-methoxy-2-acetoxypropane)), an alkylene glycol monoalkyl ether (e.g., propylene glycol monomethyl ether (PGME; 1-methoxy-2-propanol)), a lactic acid alkyl ester (e.g., ethyl lactate, methyl lactate), a cyclic lactone (e.g., γ-butyrolactone; preferably having a carbon number of 4 to 10), a chain or cyclic ketone (e.g., 2-heptanone, cyclohexanone; preferably having a carbon number of 4 to 10), an alkylene carbonate (e.g., ethylene carbonate, propylene carbonate), an alkyl carboxylate (preferably an alkyl acetate such as butyl acetate), and an alkyl alkoxyacetate (e.g., ethyl ethoxypropionate). Other examples of the solvent which can be used include solvents described in paragraph [0244] et seq. of U.S. Patent Application Publication No. 2008/0248425A1.

Among the solvents above, an alkylene glycol monoalkyl ether carboxylate and an alkylene glycol monoalkyl ether are preferred.

One of these solvents may be used alone, or two or more thereof may be mixed and used. In the case of mixing two or more solvents, it is preferred to mix a solvent having a hydroxyl group and a solvent having no hydroxyl group. The mass ratio between the solvent having a hydroxyl group and the solvent having no hydroxyl group is from 1/99 to 99/1, preferably from 10/90 to 90/10, more preferably from 20/80 to 60/40.

The solvent having a hydroxy group is preferably an alkylene glycol monoalkyl ether, and the solvent having no hydroxyl group is preferably an alkylene glycol monoalkyl ether carboxylate.

[6] Basic Compound

The actinic ray-sensitive or radiation-sensitive resin composition of the present invention may further contain a basic compound. The basic compound is preferably a compound having basicity stronger than that of phenol. The basic compound is preferably an organic basic compound, more preferably a nitrogen-containing basic compound.

The nitrogen-containing basic compound which can be used is not particularly limited, but, for example, compounds classified into the following (1) to (7) may be used.

(1) Compound Represented by Formula (BS-1):

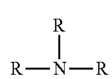

(BS-1)

In formula (BS-1), each R independently represents a hydrogen atom or an organic group, provided that at least one of three R is an organic group. The organic group is a linear or branched alkyl group, a monocyclic or polycyclic cycloalkyl group, an aryl group or an aralkyl group.

The carbon number of the alkyl group as R is not particularly limited but is usually from 1 to 20, preferably from 1 to 12.

The carbon number of the cycloalkyl group as R is not particularly limited but is usually from 3 to 20, preferably from 5 to 15.

The carbon number of the aryl group as R is not particularly limited but is usually from 6 to 20, preferably from 6 to 10. Specific examples thereof include a phenyl group and a naphthyl group.

The carbon number of the aralkyl group as R is not particularly limited but is usually from 7 to 20, preferably from 7 to 11. Specific examples thereof include a benzyl group.

In the alkyl group, cycloalkyl group, aryl group and aralkyl group as R, a hydrogen atom may be substituted for by a substituent. Examples of the substituent include an alkyl group, a cycloalkyl group, an aryl group, an aralkyl group, a hydroxy group, a carboxy group, an alkoxy group, an aryloxy group, an alkylcarbonyloxy group, and an alkyloxycarbonyl group.

In the compound represented by formula (BS-1), it is preferred that at least two R are an organic group.

Specific examples of the compound represented by formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, and 2,4,6-tri(tert-butyl)aniline.

Also, the preferred basic compound represented by formula (BS-1) includes a compound where at least one R is an alkyl group substituted with a hydrophilic group. Specific examples thereof include triethanolamine and N,N-dihydroxyethylaniline.

The alkyl group as R may have an oxygen atom in the alkyl chain. That is, an oxyalkylene chain may be formed. The oxyalkylene chain is preferably —$CH_2CH_2O$—. Specific examples thereof include tris(methoxyethoxyethyl)amine and compounds illustrated in column 3, line 60 et seq. of U.S. Pat. No. 6,040,112.

Out of basic compounds represented by formula (BS-1), examples of the compounds having a hydroxyl group, an oxygen atom or the like include the followings.

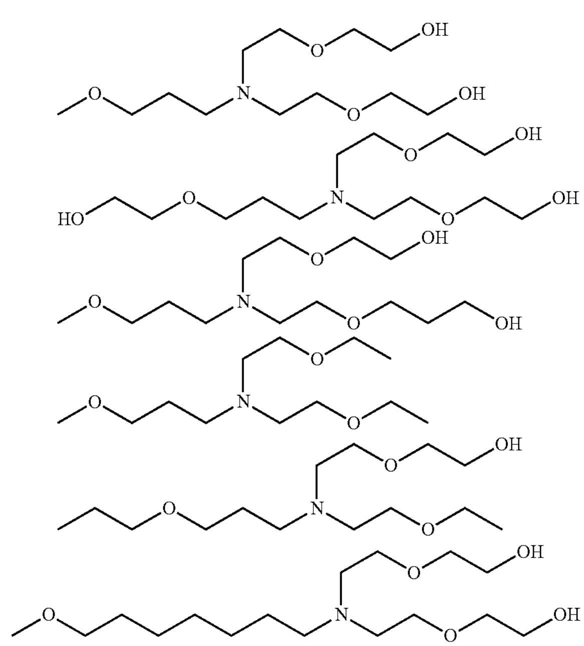

-continued

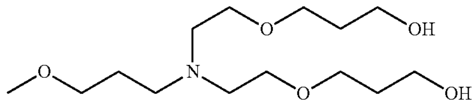

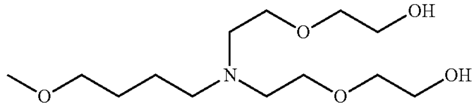

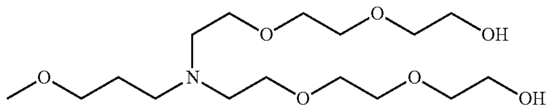

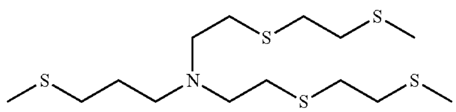

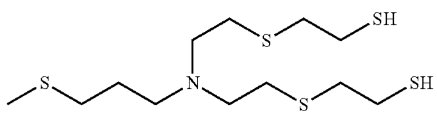

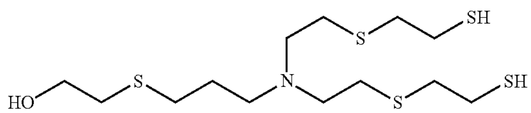

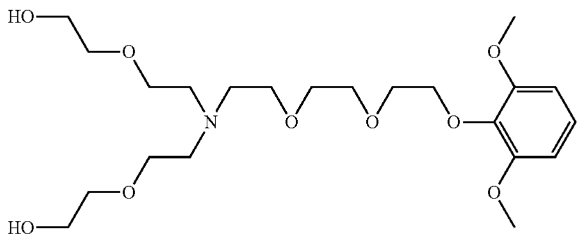

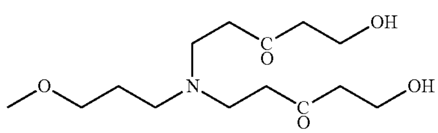

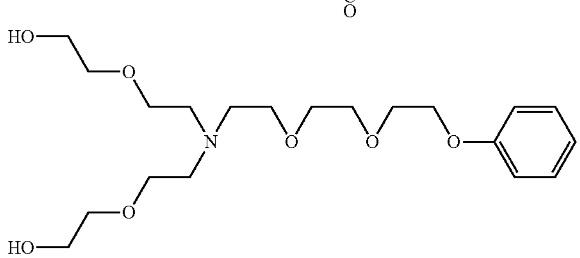

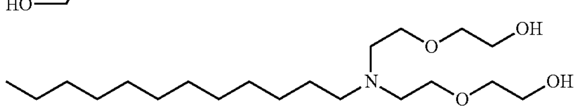

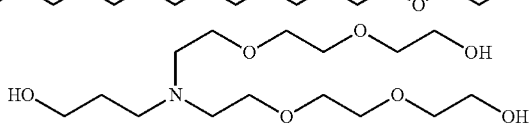

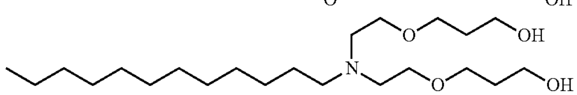

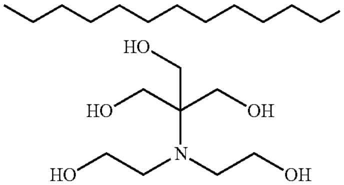

(2) Compound Having a Nitrogen-Containing Heterocyclic Structure

The nitrogen-containing heterocyclic ring may or may not have aromaticity, may contain a plurality of nitrogen atoms, and may further contain a heteroatom other than nitrogen. Specific examples of the compound include a compound having an imidazole structure (e.g., 2-phenylbenzimidazole, 2,4,5-triphenylimidazole), a compound having a piperidine structure [e.g., N-hydroxyethylpiperidine, bis(1,2,2,6,6-pentamethyl-4-piperidyl)sebacate], a compound having a pyridine structure (e.g., 4-dimethylaminopyridine), and a compound having an antipyrine structure (e.g., antipyrine, hydroxyantipyrine).

Preferred examples of the compound having a nitrogen-containing heterocyclic structure include guanidine, aminopyridine, aminoalkylpyridine, aminopyrrolidine, indazole, imidazole, pyrazole, pyrazine, pyrimidine, purine, imidazoline, pyrazoline, piperazine, aminomorpholine, and aminoalkylmorpholine. These compounds may further have a substituent.

Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group, and a cyano group.

More preferred examples of the basic compound include imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, S-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine.

A compound having two or more ring structures is also suitably used. Specific examples thereof include 1,5-diazabicyclo[4.3.0]non-5-ene and 1,8-diazabicyclo[5.4.0]undec-7-ene.

(3) Phenoxy Group-Containing Amine Compound

The phenoxy group-containing amine compound is a compound where the alkyl group contained in an amine compound has a phenoxy group at the terminal opposite the N atom. The phenoxy group may have a substituent such as alkyl group, alkoxy group, halogen atom, cyano group, nitro group, carboxy group, carboxylic acid ester group, sulfonic acid ester group, aryl group, aralkyl group, acyloxy group and aryloxy group.

The compound preferably has at least one oxyalkylene chain between the phenoxy group and the nitrogen atom. The number of oxyalkylene chains per molecule is preferably from 3 to 9, more preferably from 4 to 6. Among oxyalkylene chains, —$CH_2CH_2O$— is preferred.

Specific examples of the compound include 2-[2-{2-(2,2-dimethoxy-phenoxyethoxy)ethyl}-bis-(2-methoxyethyl)]-amine and Compounds (C1-1) to (C3-3) illustrated in paragraph [0066] of U.S. Patent Application Publication No. 2007/0224539A1.

The phenoxy group-containing amine compound is obtained, for example, by reacting a primary or secondary amine having a phenoxy group with a haloalkyl ether under heating and after adding an aqueous solution of a strong base such as sodium hydroxide, potassium hydroxide and tetraalkylammonium, extracting the reaction product with an organic solvent such as ethyl acetate and chloroform. The phenoxy group-containing amine compound can be also obtained by reacting a primary or secondary amine with a haloalkyl ether having a phenoxy group at the terminal under heating and after adding an aqueous solution of a strong base such as sodium hydroxide, potassium hydroxide and tetraalkylammonium, extracting the reaction product with an organic solvent such as ethyl acetate and chloroform.

(4) Ammonium Salt

An ammonium salt may be also appropriately used as the basic compound.

The cation of the ammonium salt is preferably a tetraalkylammonium cation substituted with an alkyl group having a carbon number of 1 to 18, more preferably a tetramethylammonium cation, a tetraethylammonium cation, a tetra(n-butyl)ammonium cation, a tetra(n-heptyl)ammonium cation, a tetra(n-octyl)ammonium cation, a dimethyl-hexadecylammonium cation, a benzyltrimethyl cation or the like, still more preferably a tetra(n-butyl)ammonium cation.

The anion of the ammonium salt includes, for example, hydroxide, carboxylate, halide, sulfonate, borate and phosphate. Among these, hydroxide and carboxylate are preferred.

The halide is preferably chloride, bromide or iodide.

The sulfonate is preferably an organic sulfonate having a carbon number of 1 to 20. Examples of the organic sulfonate include an alkylsulfonate having a carbon number of 1 to 20, and an arylsulfonate.

The alkyl group contained in the alkylsulfonate may have a substituent, and examples of the substituent include a fluorine atom, a chlorine atom, a bromine atom, an alkoxy group, an acyl group, and an aryl group. Specific examples of the alkylsulfonate include methanesulfonate, ethanesulfonate, butanesulfonate, hexanesulfonate, octanesulfonate, benzylsulfonate, trifluoromethanesulfonate, pentafluoroethanesulfonate, and nonafluorobutanesulfonate.

Examples of the aryl group contained in the arylsulfonate include a phenyl group, a naphthyl group, and an anthryl group. Such an aryl group may have a substituent. The substituent is preferably, for example, a linear or branched alkyl group having a carbon number of 1 to 6, or a cycloalkyl group having a carbon number of 3 to 6. Specific preferred examples thereof include a methyl group, an ethyl group, an n-propyl group, an isopropyl group, an n-butyl group, an i-butyl group, a tert-butyl group, an n-hexyl group and a cyclohexyl group. Other substituents include an alkoxy group having a carbon number of 1 to 6, a halogen atom, cyano, nitro, an acyl group, and an acyloxy group.

The carboxylate may be either an aliphatic carboxylate or an aromatic carboxylate, and examples thereof include acetate, lactate, pyruvate, trifluoroacetate, adamantanecarboxylate, hydroxyadamantanecarboxylate, benzoate, naphthoate, salicylate, phthalate, and phenolate. Among these, benzoate, naphthoate, phenolate and the like are preferred, and benzoate is most preferred.

In this case, the ammonium salt is preferably, for example, tetra(n-butyl)ammonium benzoate or tetra(n-butyl)ammonium phenolate.

In the case of a hydroxide, the ammonium salt is preferably a tetraalkylammonium hydroxide having a carbon number of 1 to 8 (e.g., tetramethylammonium hydroxide, tetraethylammonium hydroxide, tetra-(n-butyl)ammonium hydroxide).

(5) (PA) Compound Having a Proton Acceptor Functional Group and Undergoing Decomposition Upon Irradiation with an Actinic Ray or Radiation to Generate a Compound Reduced in or Deprived of the Proton Acceptor Property or Changed from Proton Acceptor-Functioning to Acidic The composition of the present invention may further contain, as a basic compound, a compound having a proton acceptor functional group and undergoing decomposition upon irradiation with an actinic ray or radiation to generate a compound reduced in or deprived of the proton acceptor property or changed from proton acceptor-functioning to acidic [hereinafter, sometimes referred to as "compound (PA)"].

The proton acceptor functional group is a functional group having a group or electron capable of electrostatically interacting with a proton and means, for example, a functional group having a macrocyclic structure such as cyclic polyether, or a functional group containing a nitrogen atom having an unshared electron pair not contributing π-conjugation. The nitrogen atom having an unshared electron pair not contributing to π-conjugation is, for example, a nitrogen atom having a partial structure represented by the following formulae:

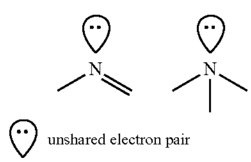

Preferred examples of the partial structure for the proton acceptor functional group include a crown ether structure, an aza-crown ether structure, a primary to tertiary amine structure, a pyridine structure, an imidazole structure, and a pyrazine structure.

The compound (PA) decomposes upon irradiation with an actinic ray or radiation to generate a compound reduced in or deprived of the proton acceptor property or changed from proton acceptor-functioning to acidic. The "reduced in or deprived of the proton acceptor property or changed from proton acceptor-functioning to acidic" as used herein indicates a change in the proton acceptor property due to addition of a proton to the proton acceptor functional group and specifically means that when a proton adduct is produced from the proton acceptor functional group-containing compound (PA) and a proton, the equilibrium constant in the chemical equilibrium decreases.

Specific examples of the compound (PA) are illustrated below, but the present invention is not limited thereto.

(PA-1)

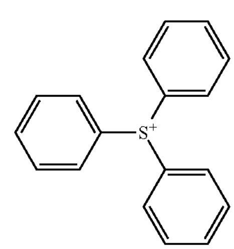

-continued
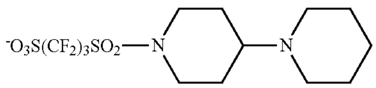
(PA-2)
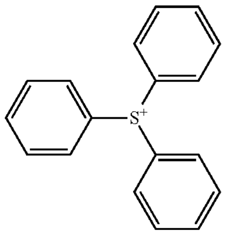
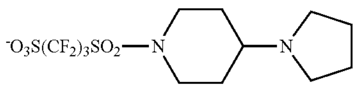
(PA-3)
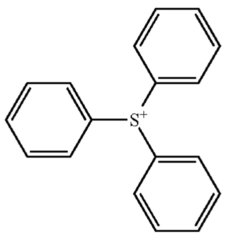
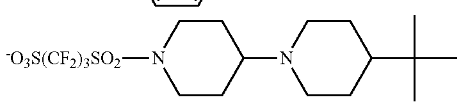
(PA-4)
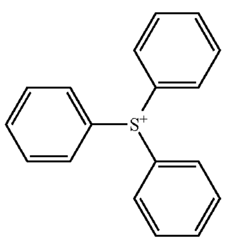
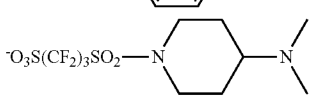
(PA-5)
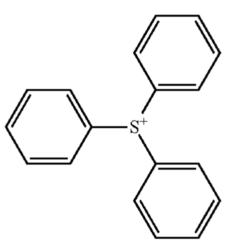
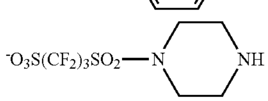
(PA-6)
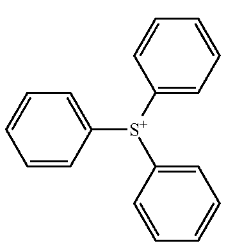
-continued
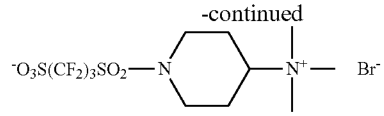
(PA-7)
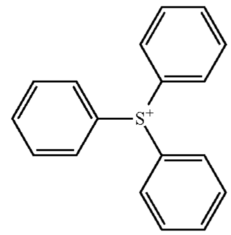
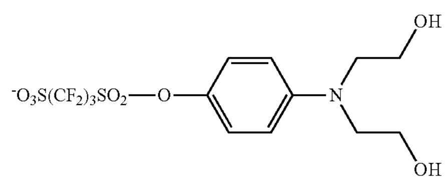
(PA-8)
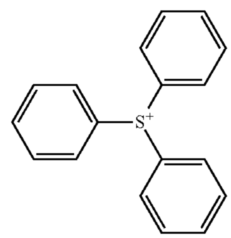
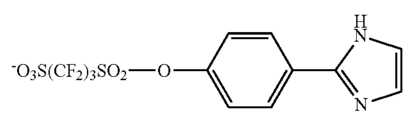
(PA-9)
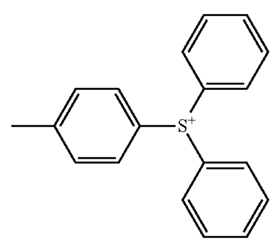
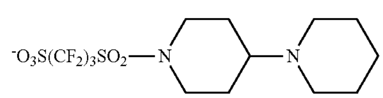
(PA-10)
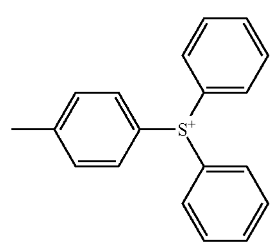
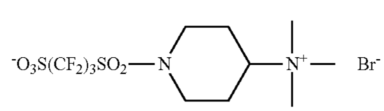

-continued
(PA-11)
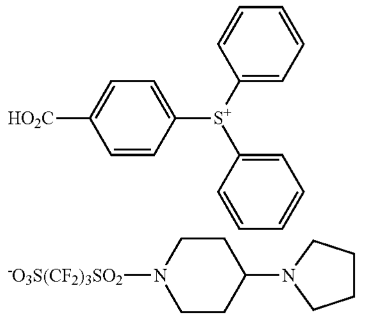
(PA-12)
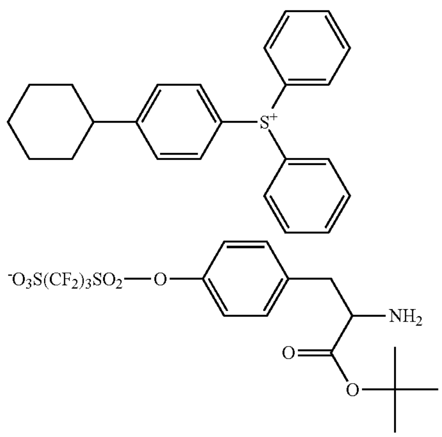
(PA-13)
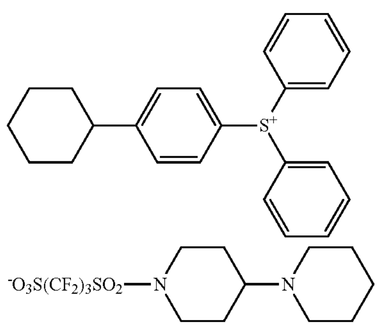
(PA-14)
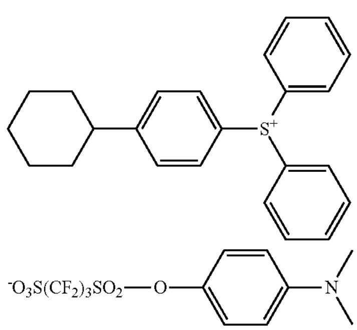
(PA-15)
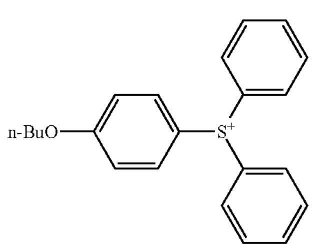
-continued
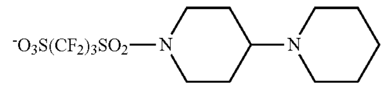
(PA-16)
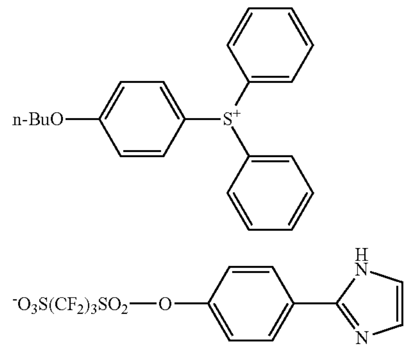
(PA-17)
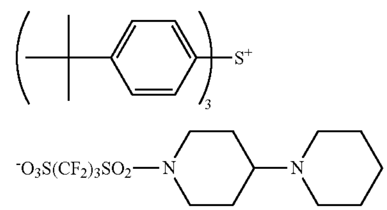
(PA-18)
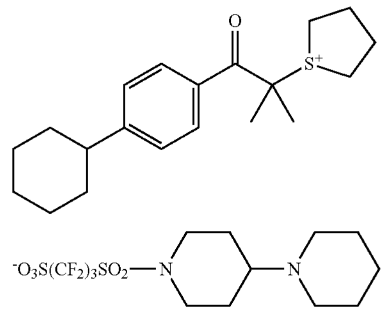
(PA-19)
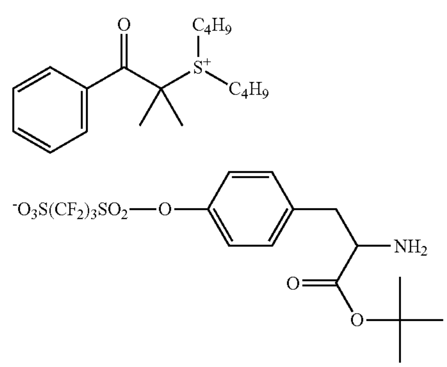
(PA-20)
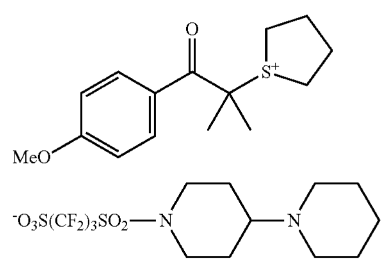

-continued
(PA-21)
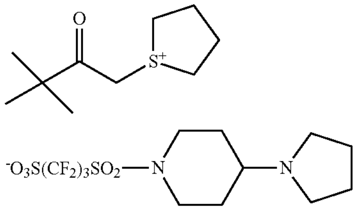
(PA-22)
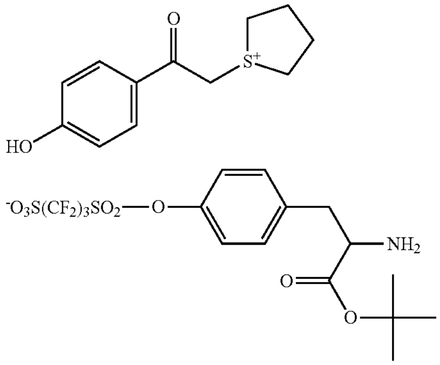
(PA-23)
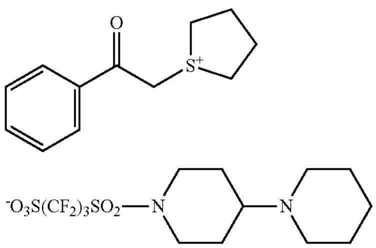
(PA-24)
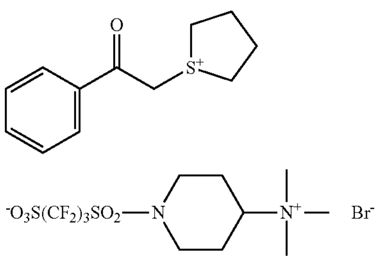
(PA-25)
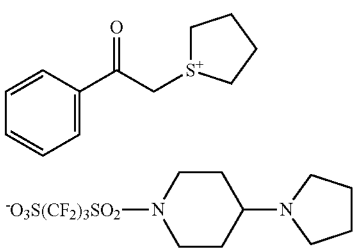
(PA-26)
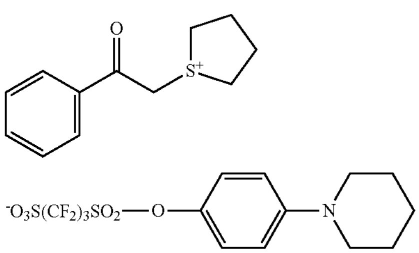
-continued
(PA-27)
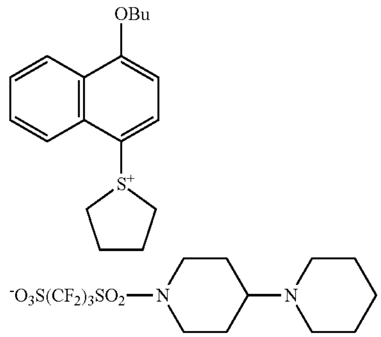
(PA-28)
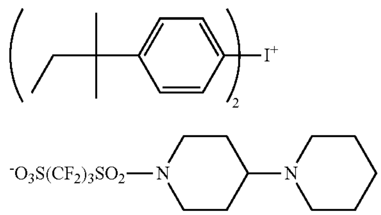
(PA-29)
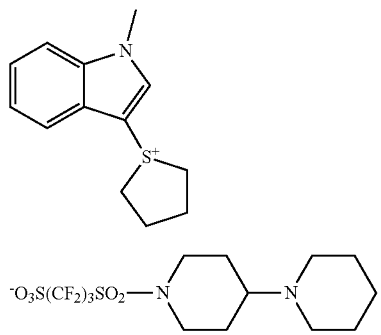
(PA-30)
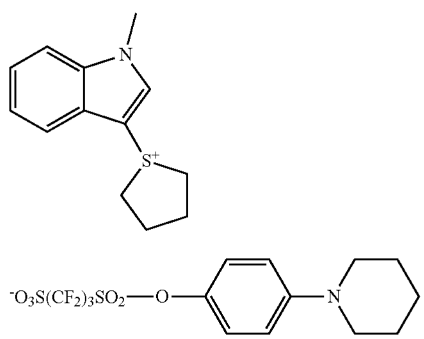
(PA-31)
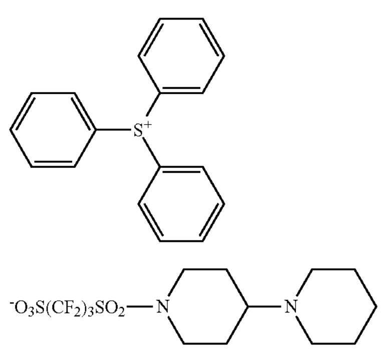

-continued
(PA-32)
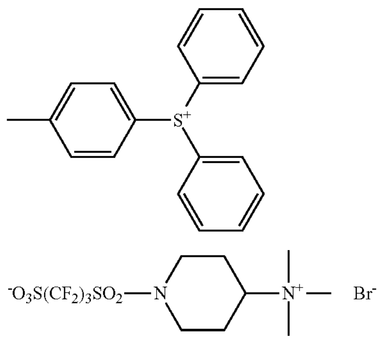
(PA-33)
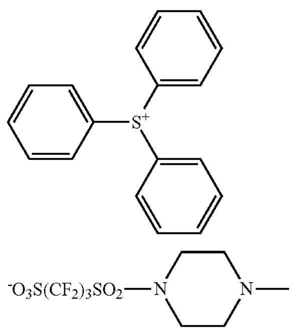
(PA-34)
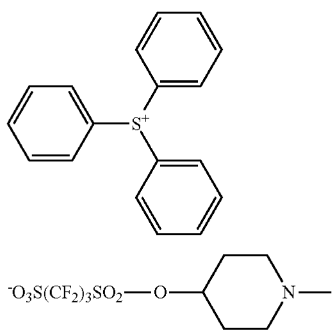
(PA-35)
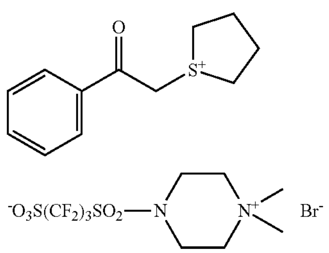
(PA-36)
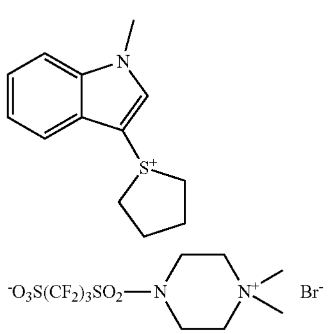
-continued
(PA-37)
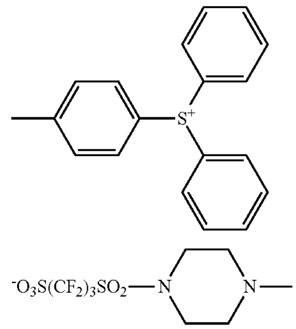
(PA-38)
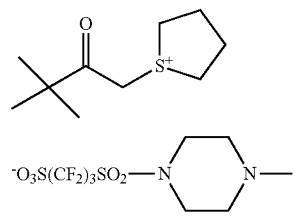
(PA-39)
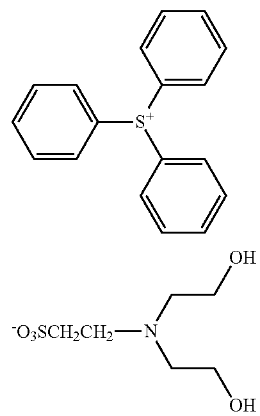
(PA-40)
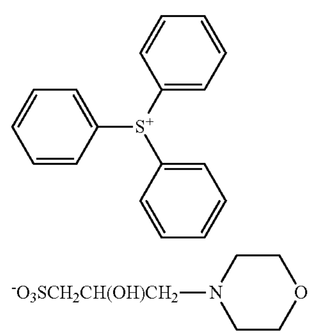
(PA-41)
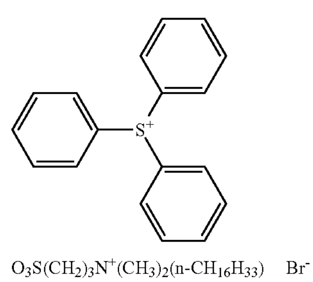

-continued
(PA-42)
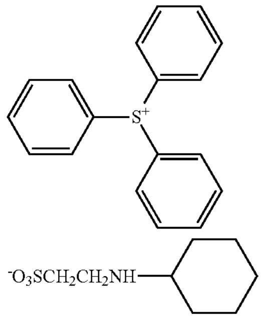
(PA-43)
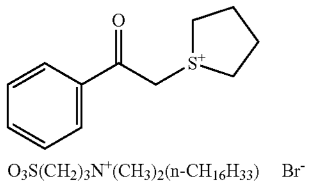
(PA-44)
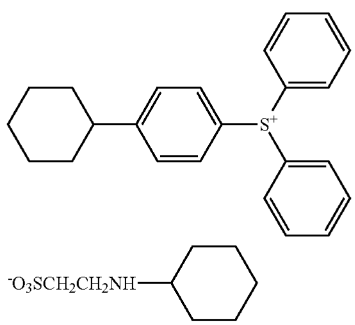
(PA-45)
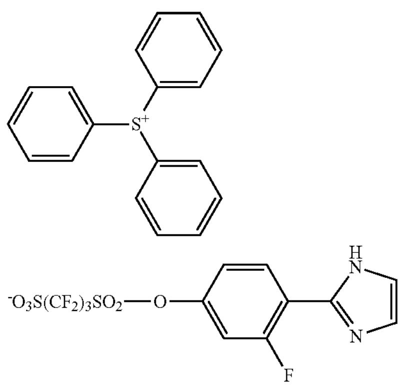
(PA-46)
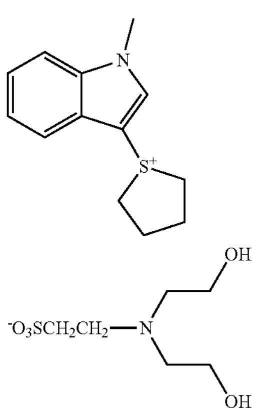
-continued
(PA-47)
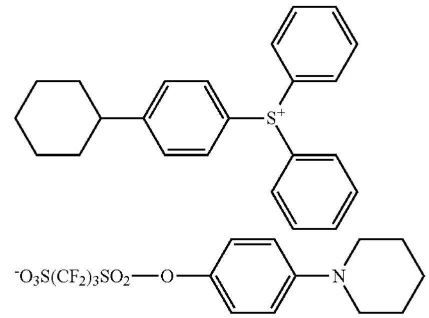
(PA-48)
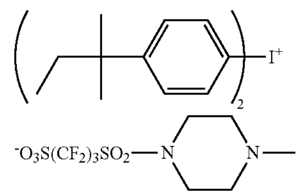
(PA-49)
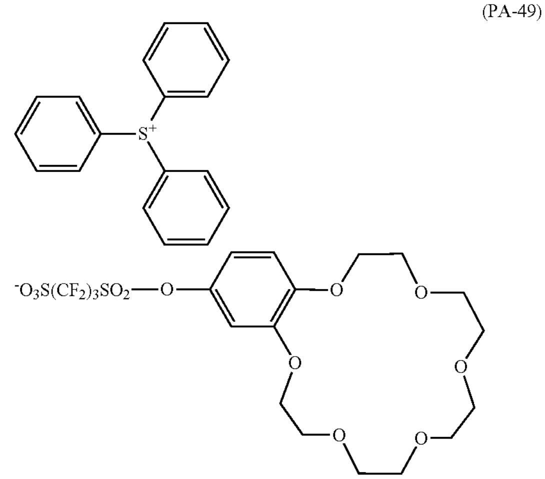
(PA-50)
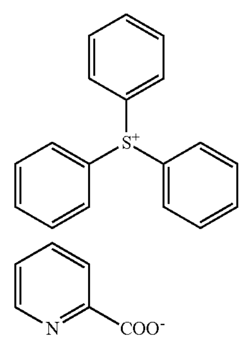
(PA-51)
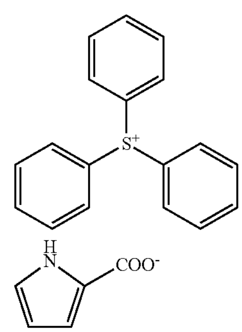

-continued
(PA-52)
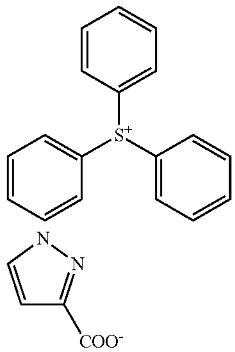
(PA-53)
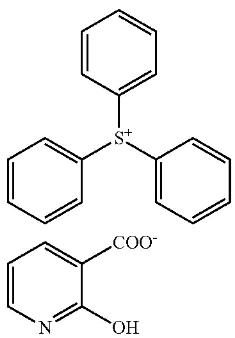
(PA-54)
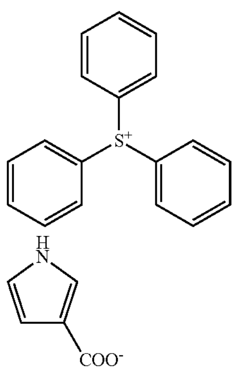
(PA-55)
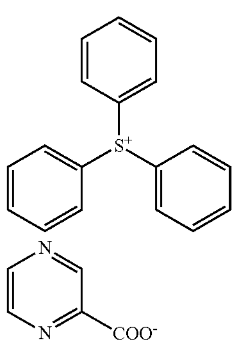
(PA-56)
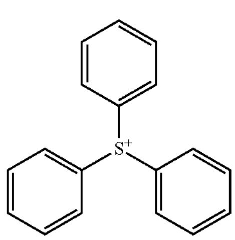
-continued
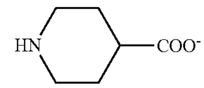
(PA-57)
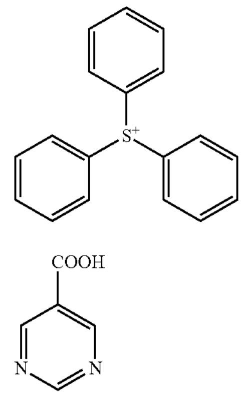
(PA-58)
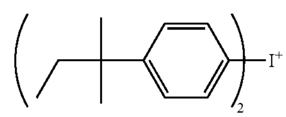
(PA-59)
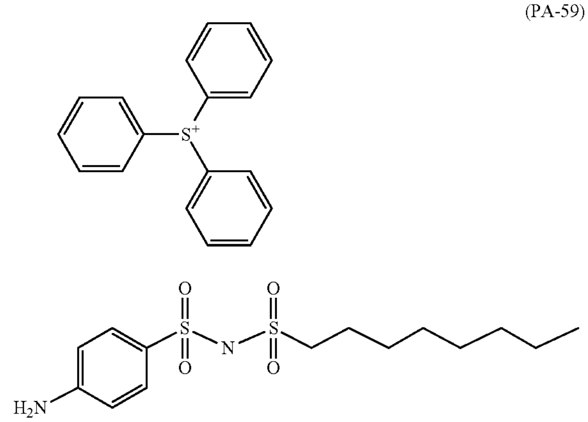
(PA-60)
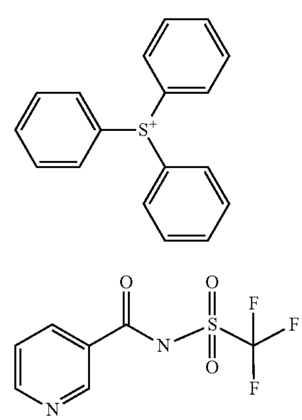

-continued
(PA-61)
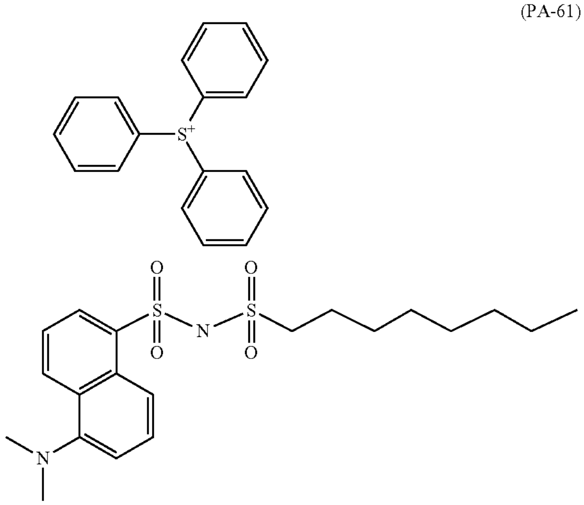
(PA-62)
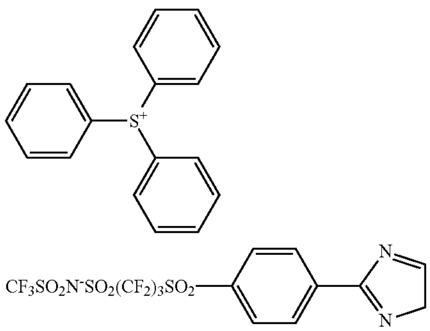
(PA-63)
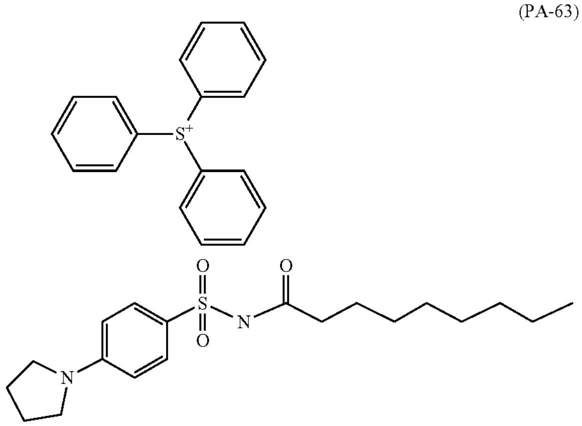
(PA-64)
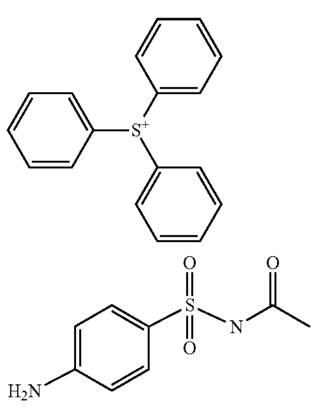
-continued
(PA-65)
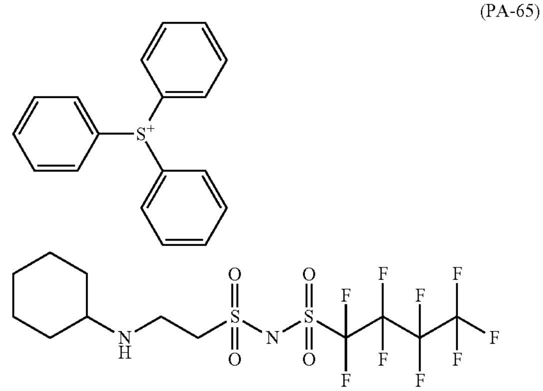
(PA-66)
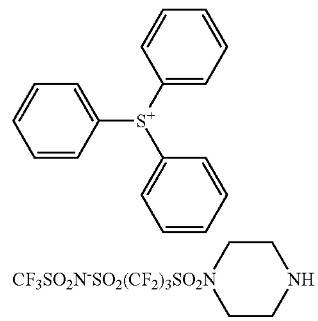
(PA-67)
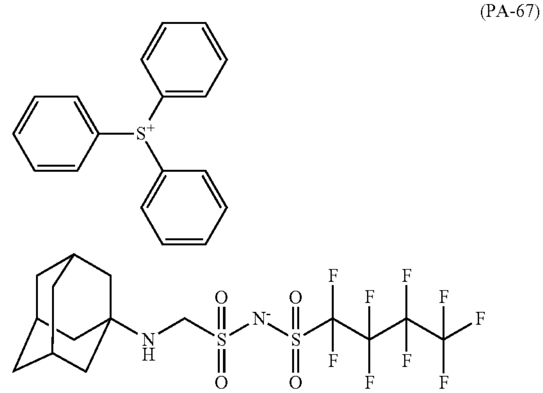
(PA-68)
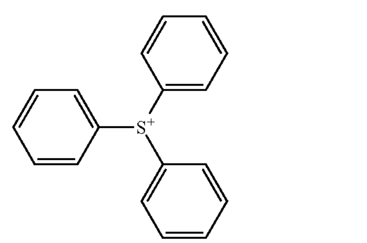
(PA-69)
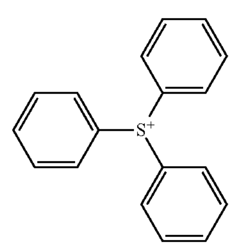

-continued
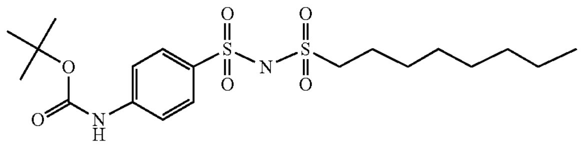
(PA-70)
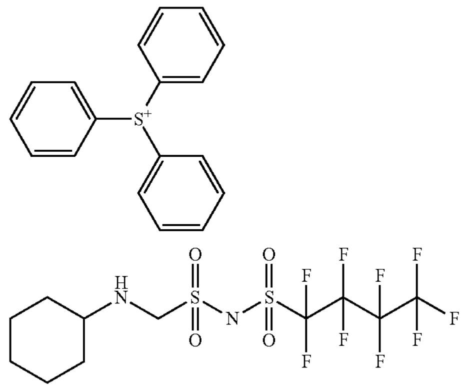
(PA-71)
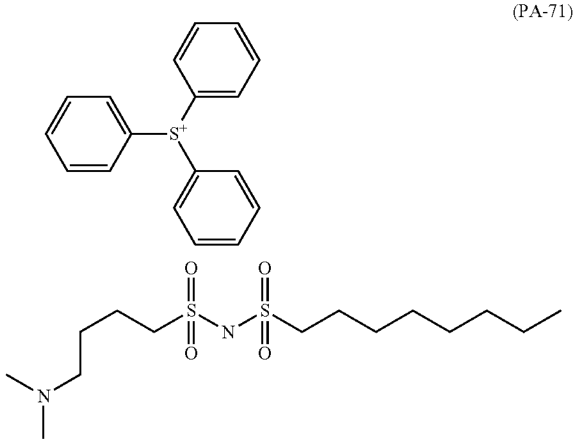
(PA-72)
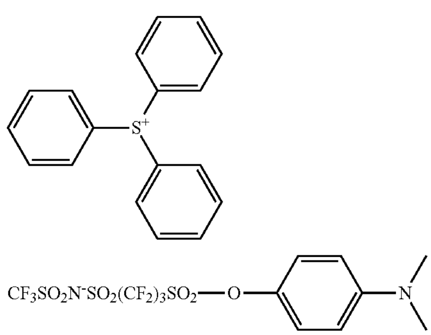
(PA-73)
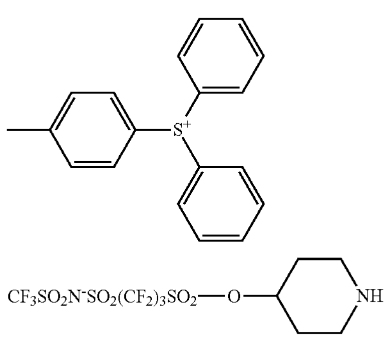
-continued
(PA-74)
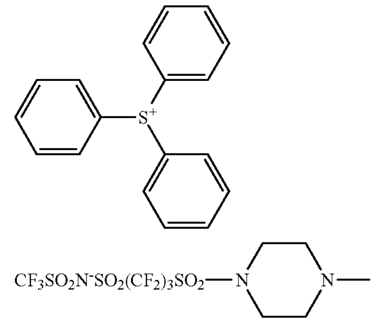
(PA-75)
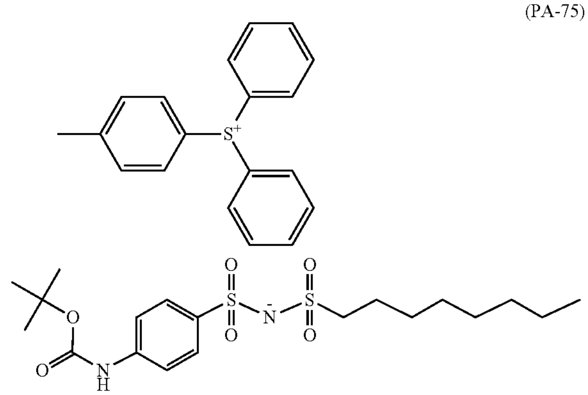
(PA-76)
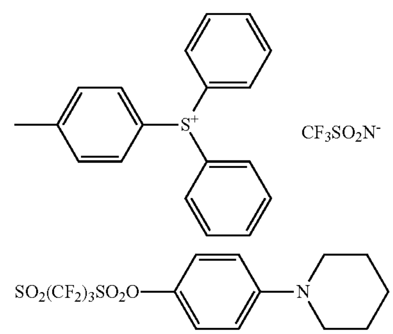
(PA-77)
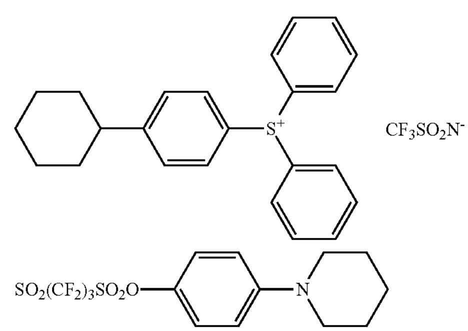
(PA-78)
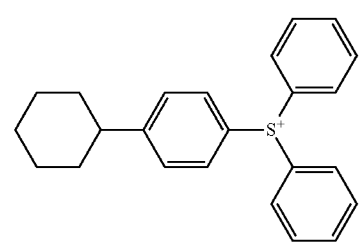

-continued
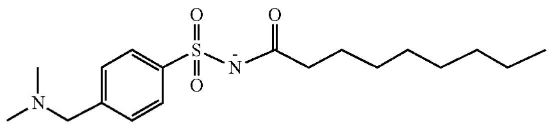
(PA-79)
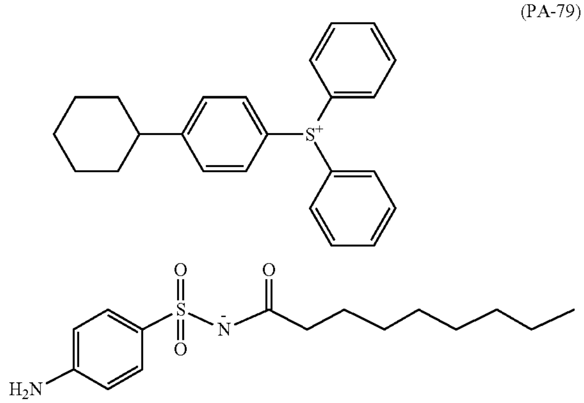
(PA-80)
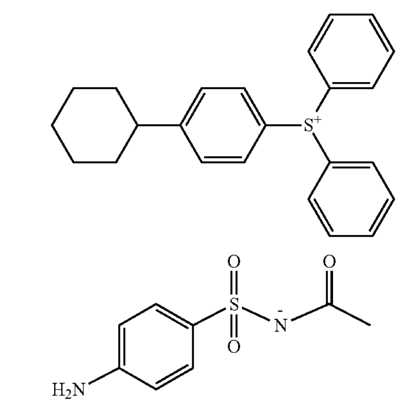
(PA-81)
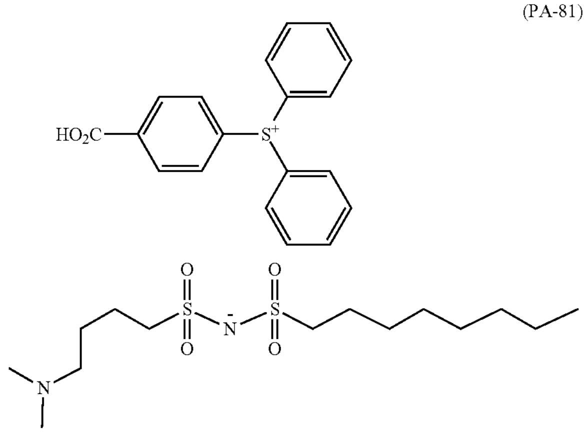
(PA-82)
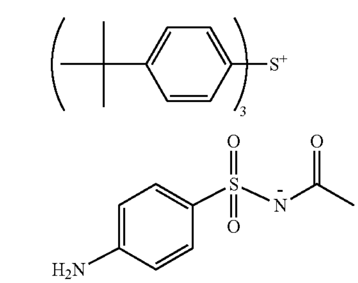
-continued
(PA-83)
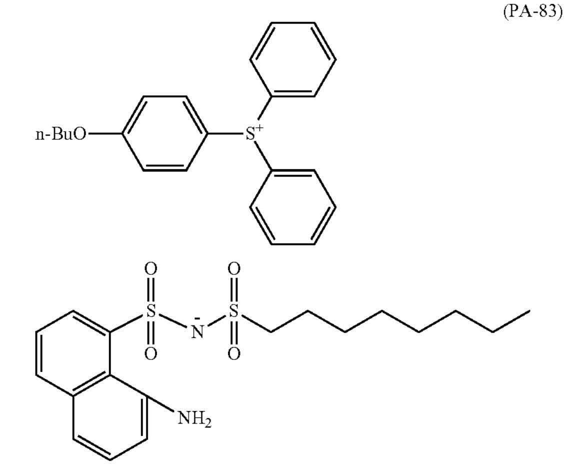
(PA-84)
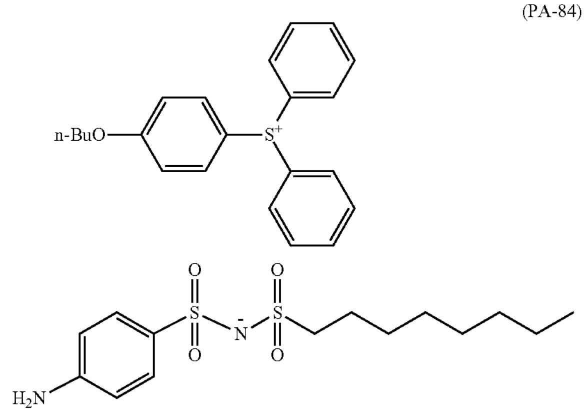
(PA-85)
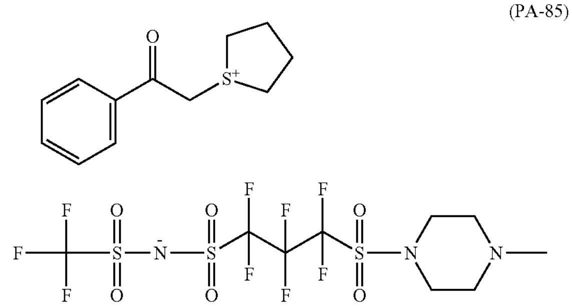
(PA-86)
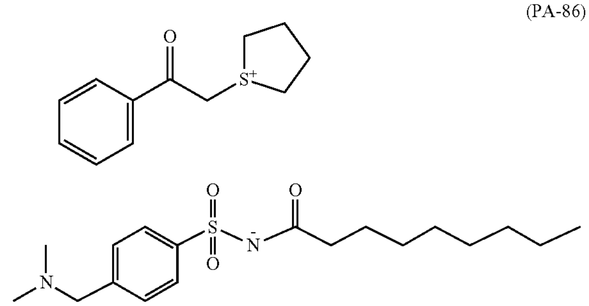
(PA-87)
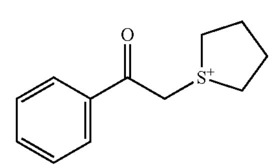

-continued
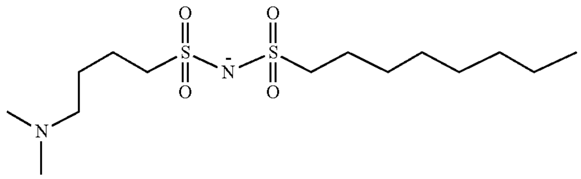
(PA-88)
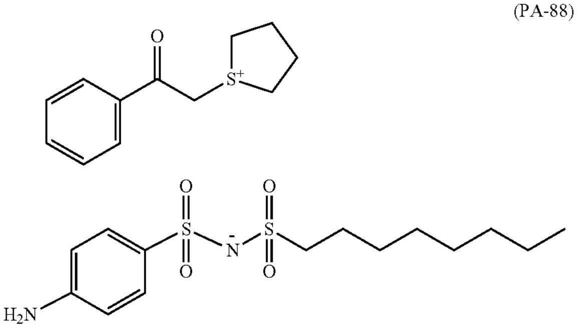
(PA-89)
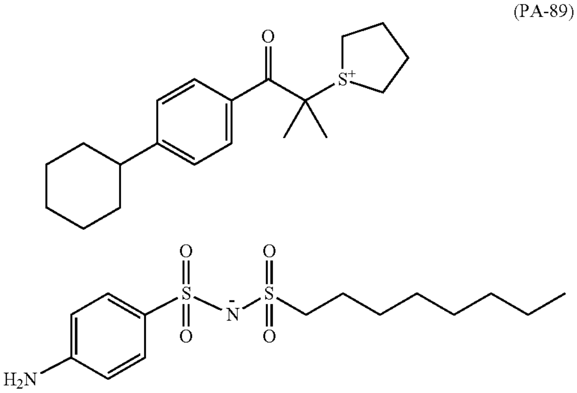
(PA-90)
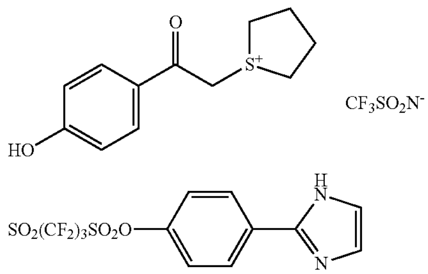
(PA-91)
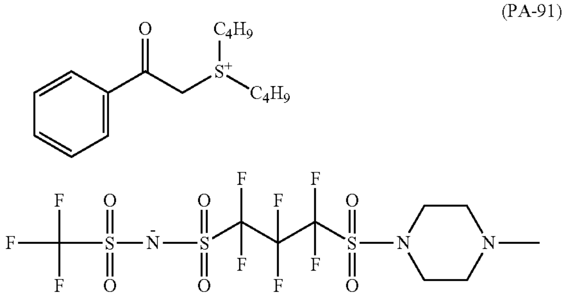
(PA-92)
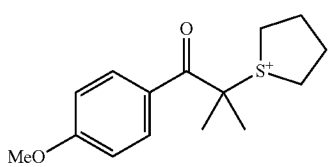
-continued
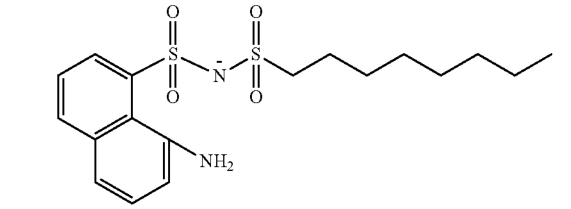
(PA-93)
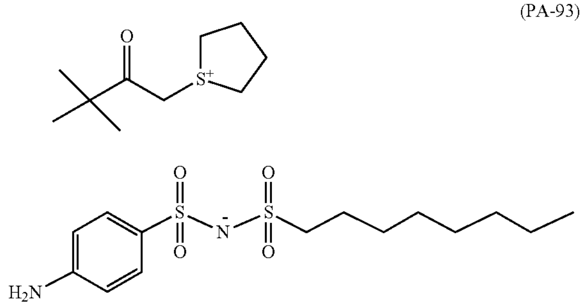
(PA-94)
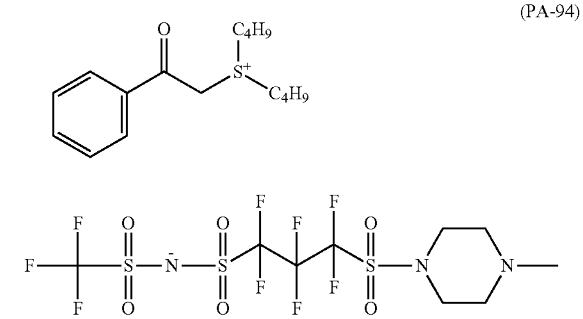
(PA-95)
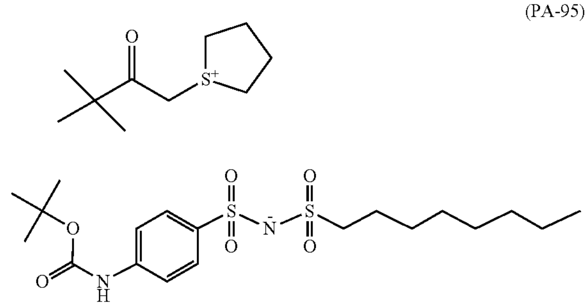
(PA-96)
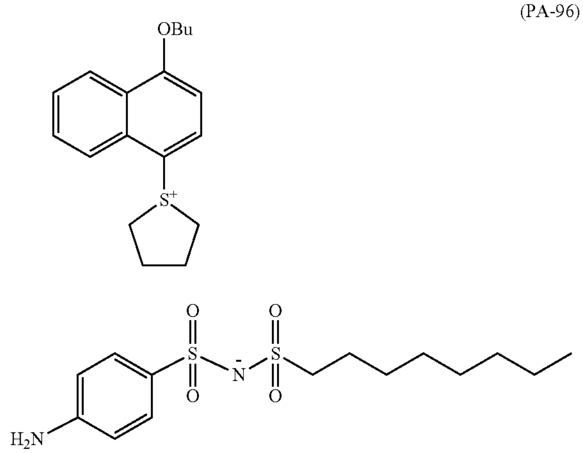

-continued (PA-97)

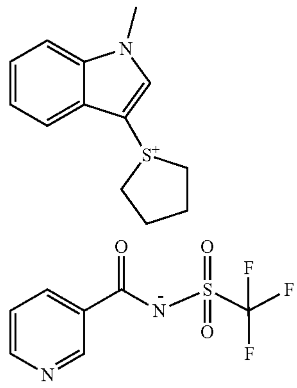

(PA-98)

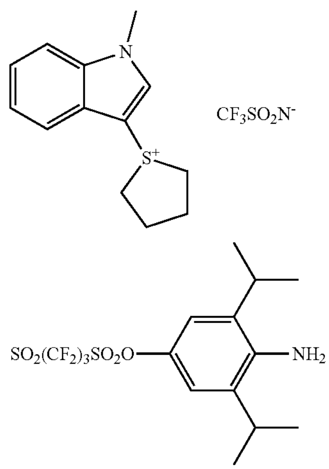

(PA-99)

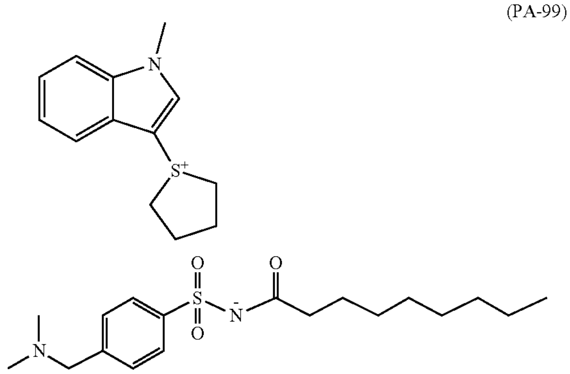

(PA-100)

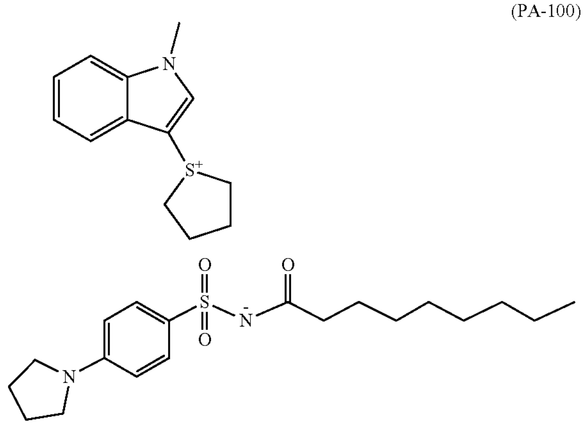

-continued (PA-101)

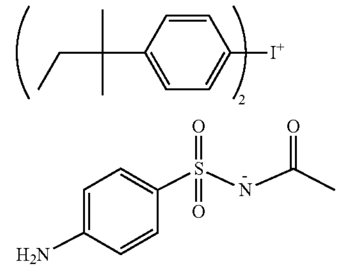

(PA-102)

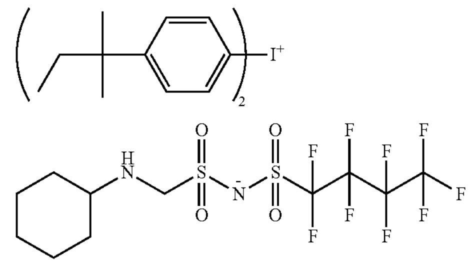

In the present invention, a compound (PA) other than the compound capable of generating a compound represented by formula (PA-1) can be also appropriately selected. For example, a compound that is an ionic compound and has a proton acceptor site in the cation moiety may be used. More specifically, examples of such a compound include a compound represented by the following formula (7):

$$(R)_m A^+ (R_N)_n \quad X^- \tag{7}$$

In the formula, A represents a sulfur atom or an iodine atom.

m represents 1 or 2, and n represents 1 or 2, provided that when A is a sulfur atom, m+n=3 and when A is an iodine atom, m+n=2.

R represents an aryl group.

$R_N$ represents an aryl group substituted with a proton acceptor functional group.

$X^-$ represents a counter anion.

Specific examples of $X^-$ are the same as those of $X^-$ in formula (ZI).

Specific preferred examples of the aryl group of R and $R_N$ include a phenyl group.

Specific examples of the proton acceptor functional group contained in $R_N$ are the same as those of the proton acceptor functional group described above in formula (PA-1).

In the composition of the present invention, the blending ratio of the compound (PA) in the entire composition is preferably from 0.1 to 10 mass %, more preferably from 1 to 8 mass %, based on the total solid content.

(6) Guanidine Compound

The composition of the present invention may further contain a guanidine compound having a structure represented by the following formula:

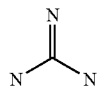

The guanidine compound exhibits strong basicity because thanks to three nitrogens, dispersion of positive electric charges of a conjugate acid is stabilized.

As for the basicity of the guanidine compound (A) for use in the present invention, the pKa of the conjugate acid is preferably 6.0 or more, more preferably from 7.0 to 20.0 in view of high neutralization reactivity with an acid and excellent roughness characteristics, and still more preferably from 8.0 to 16.0.

Such strong basicity makes it possible to suppress diffusion of an acid and contribute to formation of an excellent pattern profile.

The "pKa" as used herein is pKa in an aqueous solution and described, for example, in *Kaaaku Binran* (*Chemical Handbook*) (*II*) (4th revised edition, compiled by The Chemical Society of Japan, Maruzen (1993)), and as this value is lower, the acid strength is higher. Specifically, the acid dissociation constant at 25° C. is measured using an aqueous infinite dilution solution, whereby pKa in an aqueous solution can be actually measured. Alternatively, a value based on Hammett's substituent constants and data base containing values known in publications can be determined by computation using the following software package 1. The pKa values referred to in the description of the present invention all are a value determined by computation using this software package.

Software Package 1: Advanced Chemistry Development (ACD/Labs) Software V8.14 for Solaris (1994-2007 ACD/Labs)

In the present invention, the log P is a logarithmic value of the n-octanol/water partition coefficient (P) and is an effective parameter capable of characterizing the hydrophilicity/hydrophobicity for compounds over a wide range. The partition coefficient is generally determined by computation but not from experiments and in the present invention, a value computed using CS ChemDraw Ultra Ver. 8.0 software package (Crippen's fragmentation method) is employed.

The log P of the guanidine compound (A) is preferably 10 or less. With this value or less, the compound can be uniformly incorporated in the resist film.

The log P of the guanidine compound (A) for use in the present invention is preferably from 2 to 10, more preferably from 3 to 8, still more preferably 4 to 8.

The guanidine compound (A) for use in the present invention preferably contains no nitrogen atom except for in the guanidine structure.

Specific examples of the guanidine compound are illustrated below, but the present invention is not limited thereto.

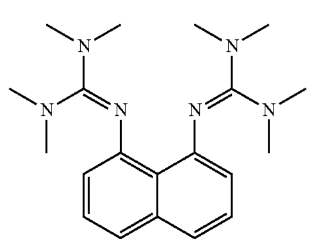

Log P: 4.29

-continued

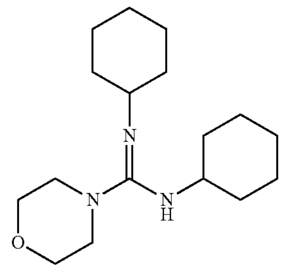

Log P: 3.32

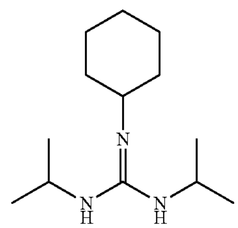

Log P: 3.1

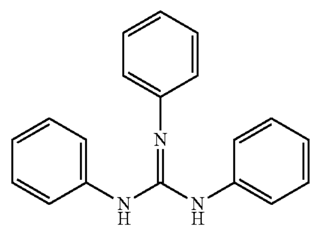

Log P: 5.24

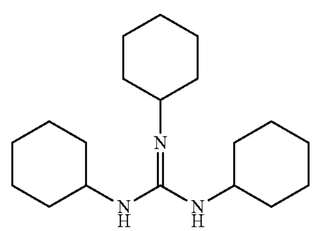

Log P: 4.89

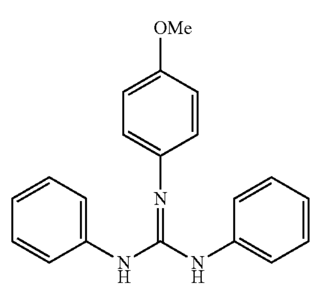

Log P: 5.11

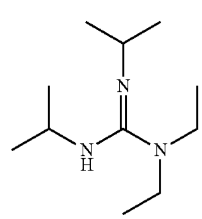

Log P: 2.61

-continued

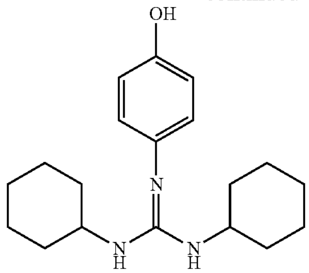

Log P: 4.61

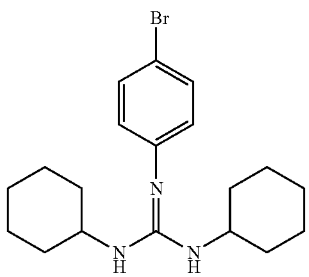

Log P: 5.83

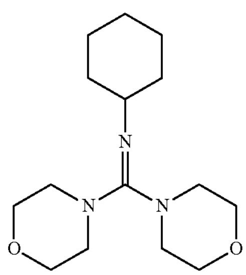

Log P: 1.75

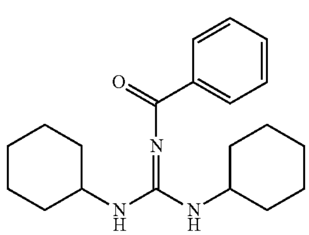

Log P: 4.95

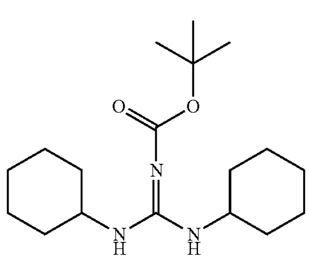

Log P: 4.51

-continued

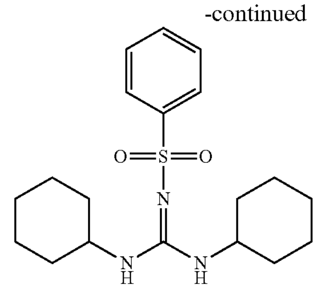

Log P: 4.55

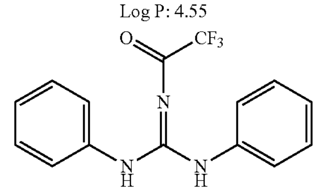

Log P: 4.43

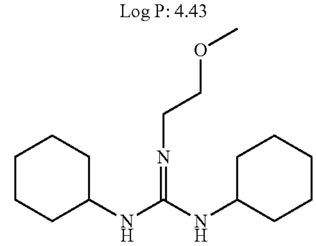

Log P: 3.18

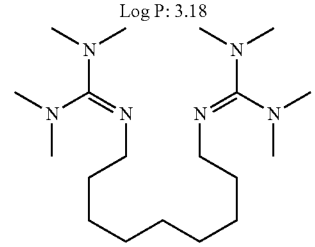

Log P: 4.4

(7) Low Molecular Compound Having a Nitrogen Atom and Having a Group Capable of Leaving by the Action of an Acid The composition of the present invention may contain a low molecular compound having a nitrogen atom and having a group capable of leaving by the action of an acid (hereinafter, sometimes referred to as "low molecular compound (D)" or "compound (D)"). The low molecular compound (D) preferably exhibits basicity after the group capable of leaving by the action of an acid is eliminated.

The group capable of leaving by the action of an acid is not particularly limited but is preferably an acetal group, a carbonate group, a carbamate group, a tertiary ester group, a tertiary hydroxyl group or a hemiaminal ether group, more preferably a carbamate group or a hemiaminal ether group.

The molecular weight of the (D) low molecular compound having a group capable of leaving by the action of an acid is preferably from 100 to 1,000, more preferably from 100 to 700, still more preferably from 100 to 500.

The compound (D) is preferably an amine derivative having on the nitrogen atom a group capable of leaving by the action of an acid.

The compound (D) may have a protective group-containing carbamate group on the nitrogen atom. The protective group constituting the carbamate group can be represented by the following formula (d-1):

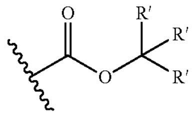

(d-1)

In formula (d-1), each R' independently represents a hydrogen atom, a linear or branched alkyl group, a cycloalkyl group, an aryl group, an aralkyl group or an alkoxyalkyl group. R' may combine with each other to form a ring.

R' is preferably a linear or branched alkyl group, a cycloalkyl group or an aryl group, more preferably a linear or branched alkyl group or a cycloalkyl group.

Specific structures of the protective group are illustrated below.

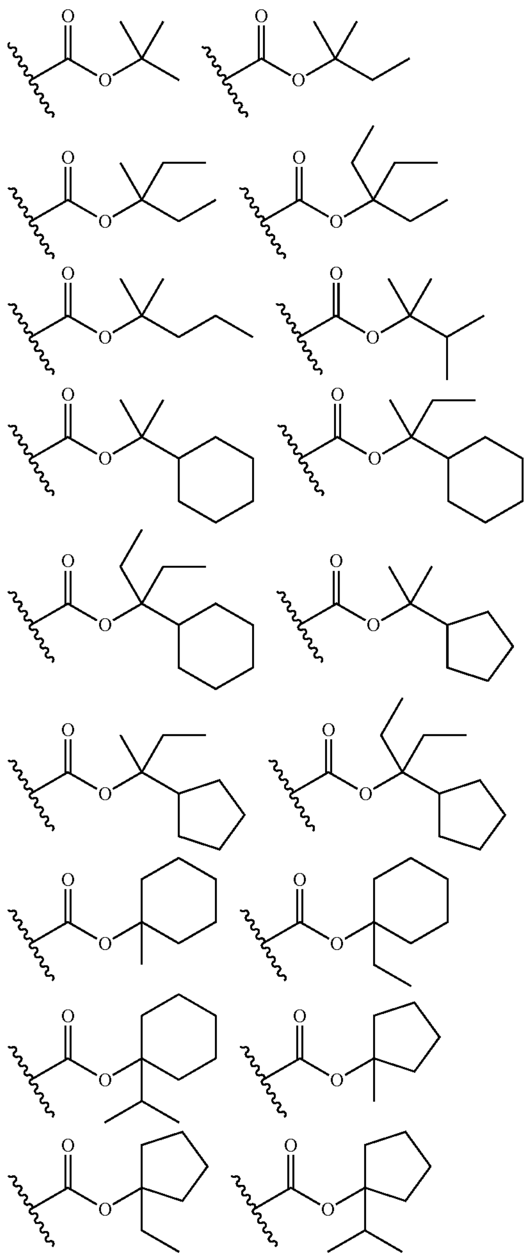

-continued

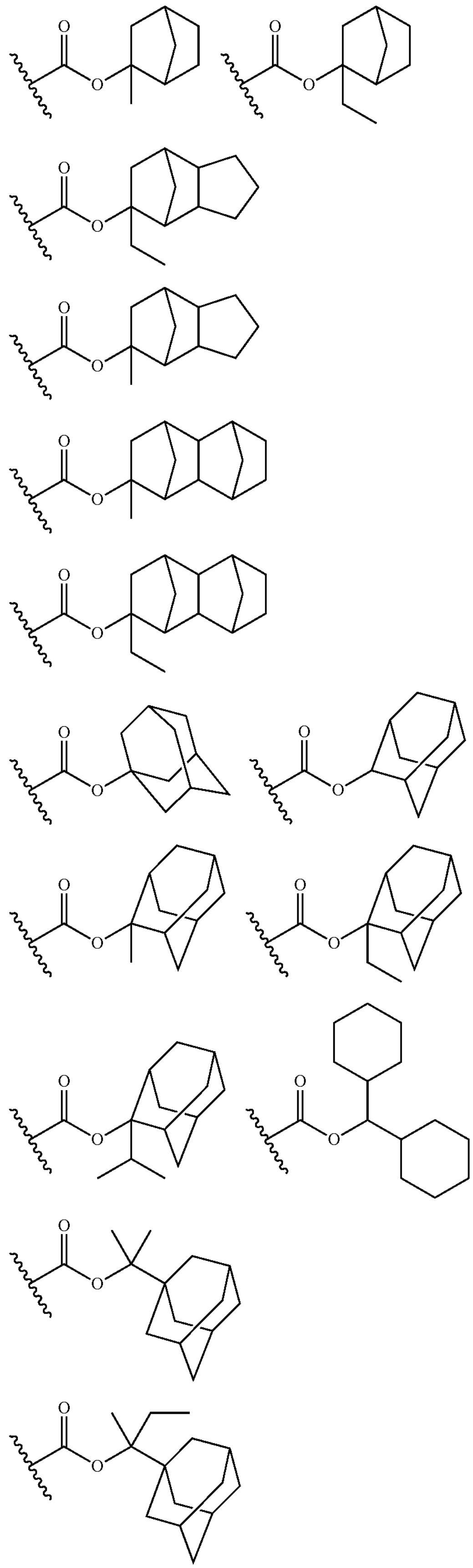

-continued

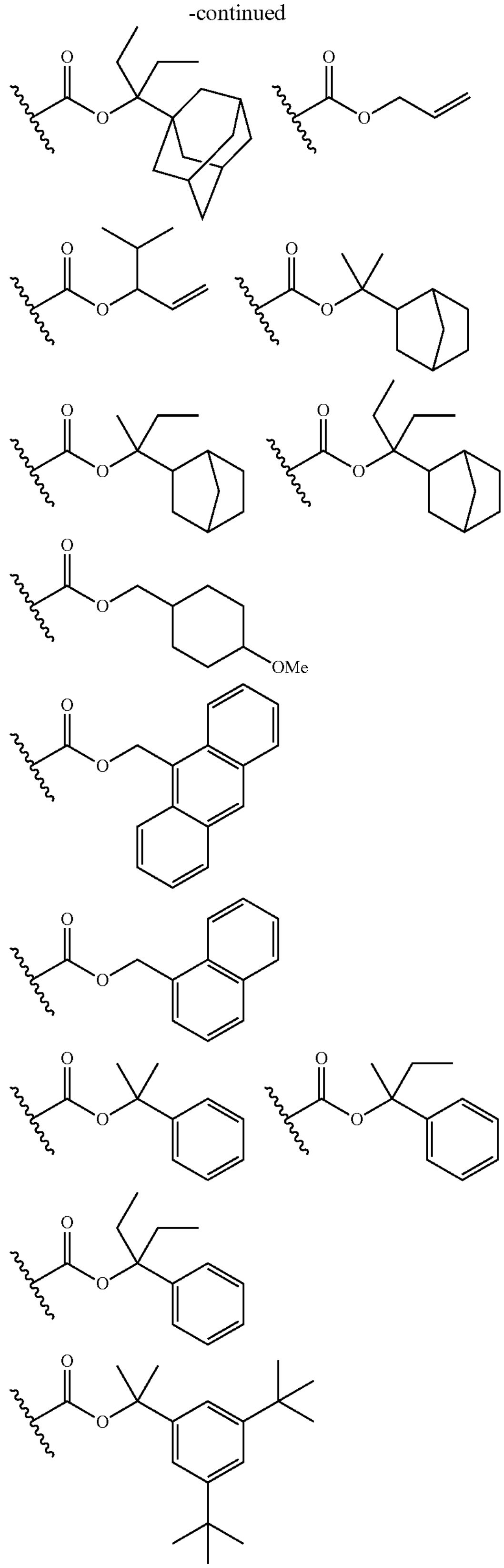

The compound (D) may be also composed by arbitrarily combining the basic compound and the structure represented by formula (d-1).

The compound (D) is more preferably a compound having a structure represented by the following formula (A).

Incidentally, the compound (D) may be a compound corresponding to the above-described basic compound as long as it is a low molecular compound having a group capable of leaving by the action of an acid.

(A)

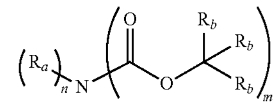

In formula (A), Ra represents a hydrogen atom, an alkyl group, a cycloalkyl group, an aryl group or an aralkyl group. Also, when n=2, two Ra may be the same or different, and two Ra may combine with each other to form a divalent heterocyclic hydrocarbon group (preferably having a carbon number of 20 or less) or a derivative thereof.

Each Rb independently represents a hydrogen atom, an alkyl group, a cycloalkyl group, an aryl group, an aralkyl group or an alkoxyalkyl group, provided that in —C(Rb)(Rb)(Rb), when one or more Rb are a hydrogen atom, at least one of the remaining Rb is a cyclopropyl group, a 1-alkoxyalkyl group or an aryl group.

At least two Rb may combine to form an alicyclic hydrocarbon group, an aromatic hydrocarbon group, a heterocyclic hydrocarbon group, or a derivative thereof.

n represents an integer of 0 to 2, m represents an integer of 1 to 3, and n+m=3.

In formula (A), the alkyl group, cycloalkyl group, aryl group and aralkyl group of Ra and Rb may be substituted with a functional group such as hydroxyl group, cyano group, amino group, pyrrolidino group, piperidino group, morpholino group and oxo group, an alkoxy group, or a halogen atom. The same applies to the alkoxyalkyl group of Rb.

Examples of the alkyl group, cycloalkyl group, aryl group and aralkyl group (these alkyl, cycloalkyl, aryl and aralkyl groups may be substituted with the above-described functional group, an alkoxy group or a halogen atom) of Ra and/or Rb include:

- a group derived from a linear or branched alkane such as methane, ethane, propane, butane, pentane, hexane, heptane, octane, nonane, decane, undecane and dodecane, or a group where the group derived from an alkane is substituted with one or more kinds of or one or more groups of cycloalkyl groups such as cyclobutyl group, cyclopentyl group and cyclohexyl group;
- a group derived from a cycloalkane such as cyclobutane, cyclopentane, cyclohexane, cycloheptane, cyclooctane, norbornane, adamantane and noradamantane, or a group where the group derived from a cycloalkane is substituted with one or more kinds of or one or more groups of linear or branched alkyl groups such as methyl group, ethyl group, n-propyl group, i-propyl group, n-butyl group, 2-methylpropyl group, 1-methylpropyl group and tert-butyl group;
- a group derived from an aromatic compound such as benzene, naphthalene and anthracene, or a group where the group derived from an aromatic compound is substituted with one or more kinds of or one or more groups of linear or branched alkyl groups such as methyl group, ethyl group, n-propyl group, i-propyl group, n-butyl group, 2-methylpropyl group, 1-methylpropyl group and tert-butyl group;

a group derived from a heterocyclic compound such as pyrrolidine, piperidine, morpholine, tetrahydrofuran (THF), tetrahydropyran, indole, indoline, quinoline, perhydroquinoline, indazole and benzimidazole, or a group where the group derived from a heterocyclic compound is substituted with one or more kinds of or one or more groups of linear or branched alkyl groups or aromatic compound-derived groups; a group where the group derived from a linear or branched alkane or the group derived from a cycloalkane is substituted with one or more kinds of or one or more groups of aromatic compound-derived groups such as phenyl group, naphthyl group and anthracenyl group; and a group where the substituent above is substituted with a functional group such as hydroxyl group, cyano group, amino group, pyrrolidino group, piperidino group, morpholino group and oxo group.

Examples of the divalent heterocyclic hydrocarbon group (preferably having a carbon number of 1 to 20) formed by combining Ra with each other or a derivative thereof include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline and 1,5,9-triazacyclododecane, and a group where the group derived from a heterocyclic compound is substituted with one or more kinds of or one or more groups of linear or branched alkane-derived groups, cycloalkane-derived groups, aromatic compound-derived groups, heterocyclic compound-derived groups, and functional groups such as hydroxyl group, cyano group, amino group, pyrrolidino group, piperidino group, morpholino group and oxo group.

Specific examples of the compound (D) particularly preferred in the present invention are illustrated below, but the present invention is not limited thereto.

(D-1)

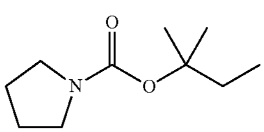

(D-2)

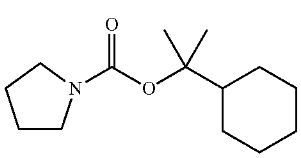

(D-3)

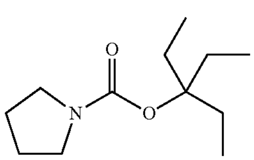

(D-4)

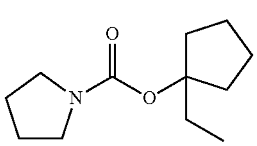

-continued (D-5)

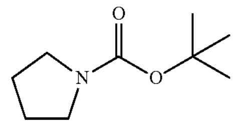

(D-6)

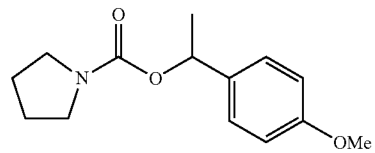

(D-7)

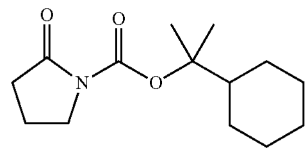

(D-8)

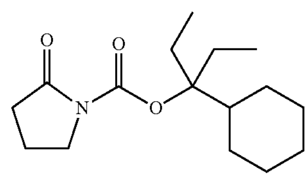

(D-9)

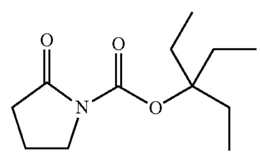

(D-10)

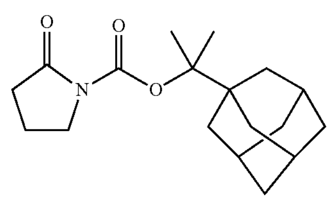

(D-11)

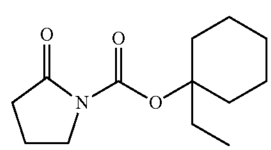

(D-12)

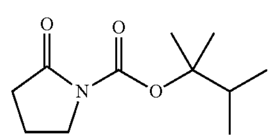

(D-13)

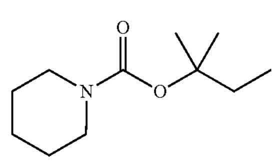

(D-14)

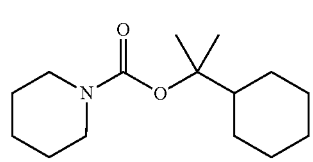

-continued
(D-15)
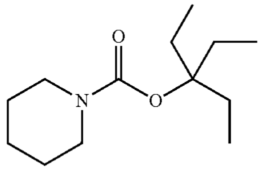
(D-16)
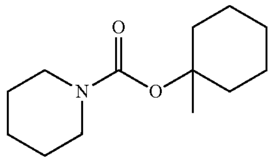
(D-17)
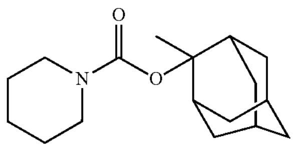
(D-18)
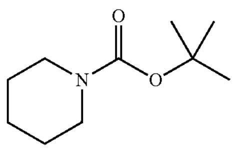
(D-19)
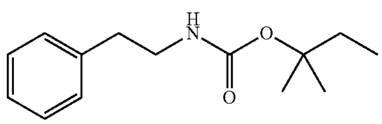
(D-20)
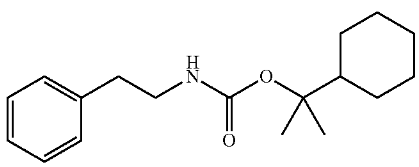
(D-21)
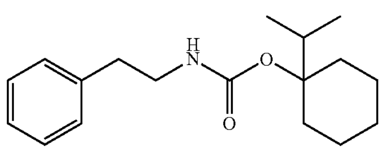
(D-22)
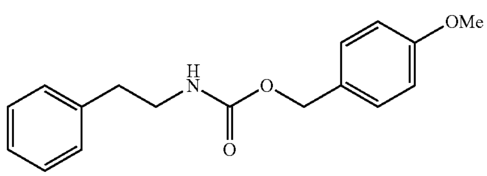
(D-23)
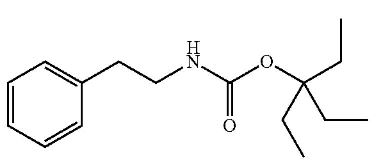
-continued
(D-24)
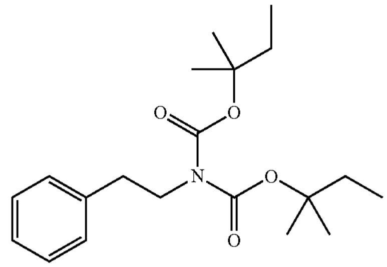
(D-25)
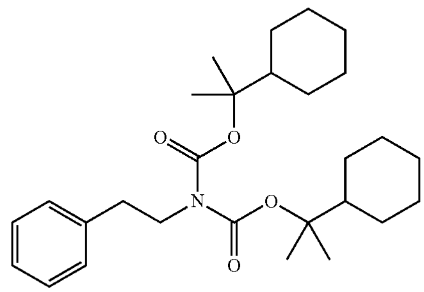
(D-26)
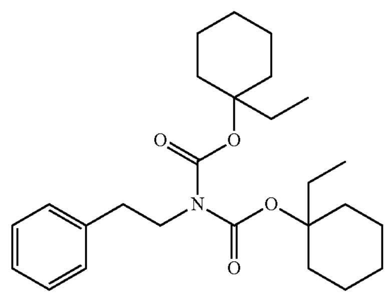
(D-27)
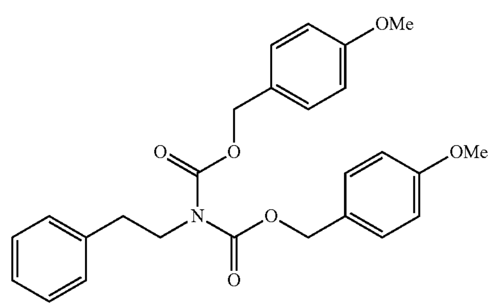
(D-28)
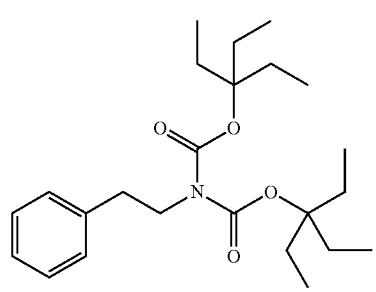

-continued
(D-29)
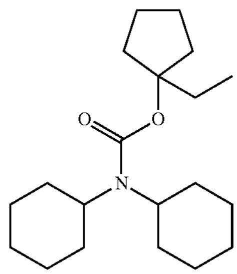
(D-30)
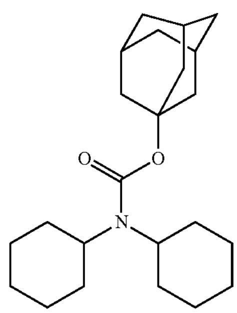
(D-31)
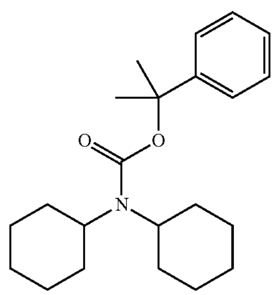
(D-32)
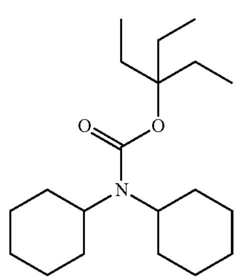
(D-33)
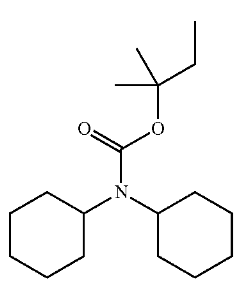
-continued
(D-34)
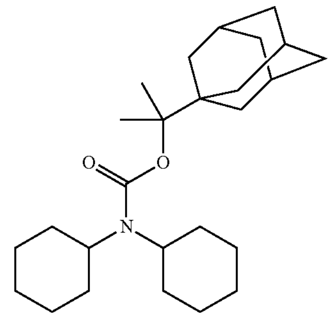
(D-35)
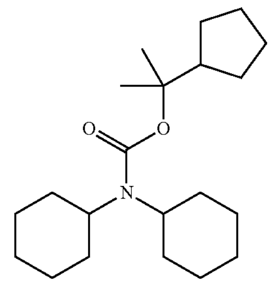
(D-36)
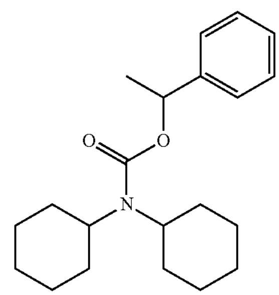
(D-37)
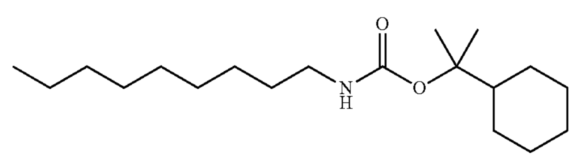
(D-38)
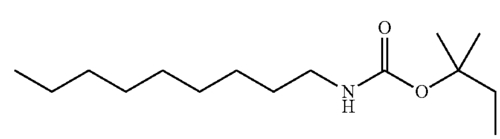
(D-39)
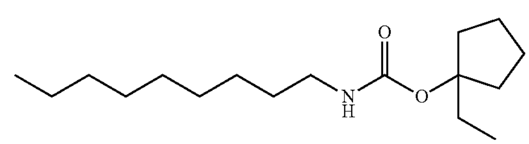
(D-40)
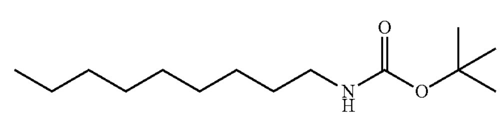

-continued
(D-41)
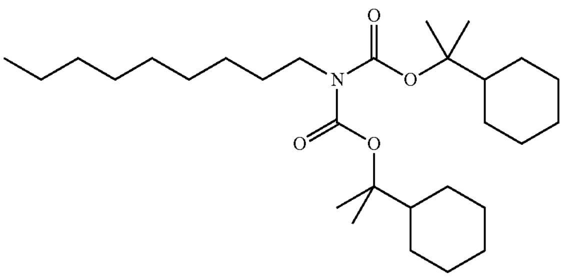
(D-42)
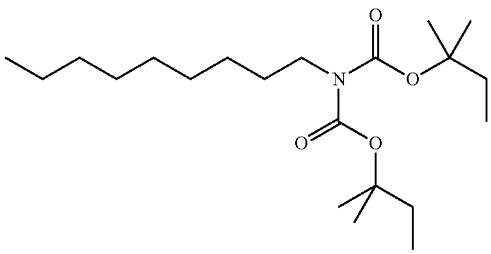
(D-43)
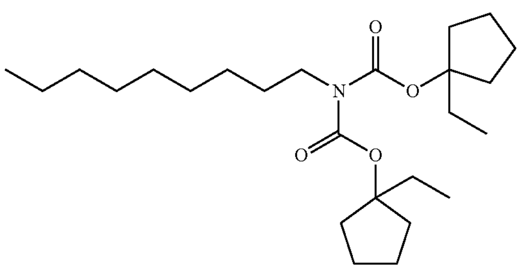
(D-44)
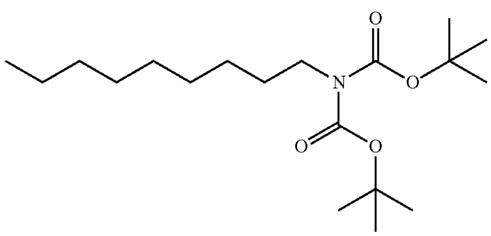
(D-45)
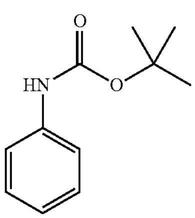
(D-46)
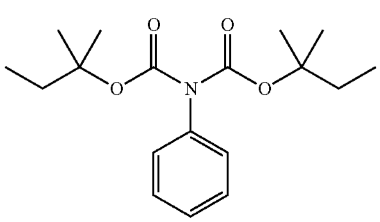
-continued
(D-47)
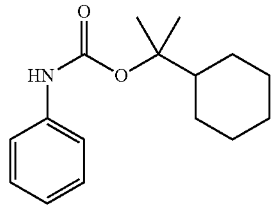
(D-48)
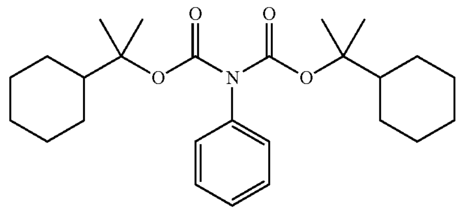
(D-49)
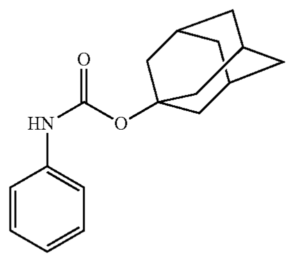
(D-50)
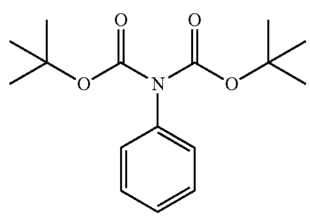
(D-51)
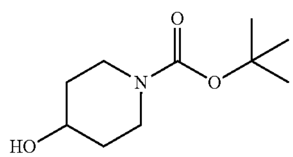
(D-52)
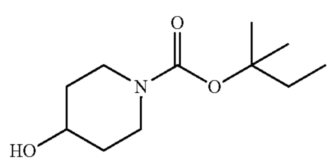
(D-53)
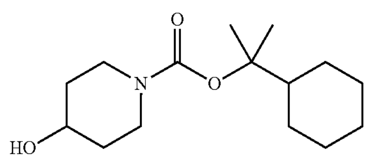
(D-54)
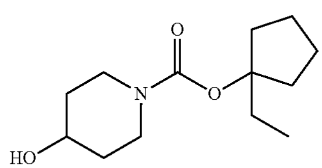

-continued (D-55)

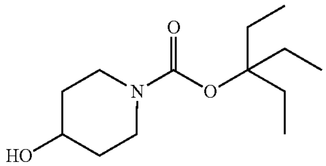

(D-56)

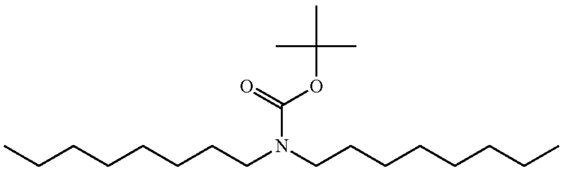

(D-57)

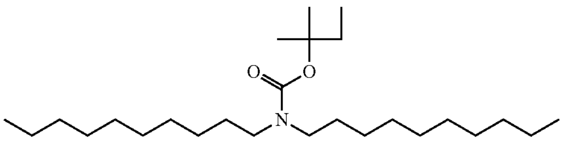

(D-58)

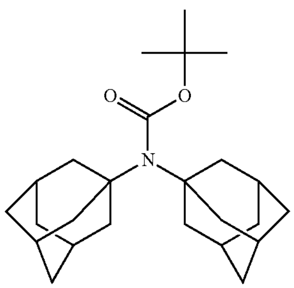

(D-59)

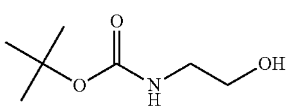

(D-60)

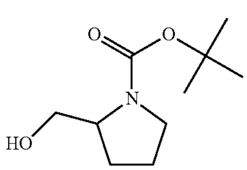

(D-61)

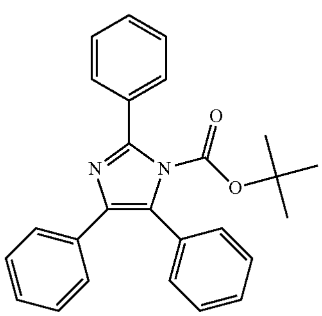

-continued (D-62)

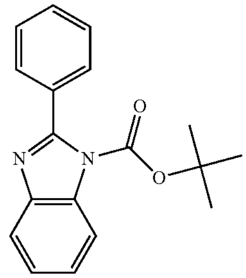

(D-63)

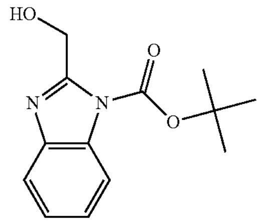

(D-64)

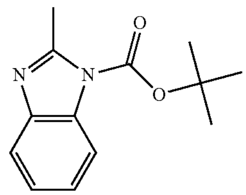

(D-65)

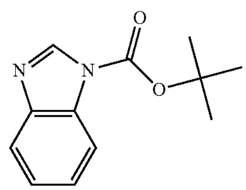

The compound represented by formula (A) can be synthesized by referring to, for example, JP-A-2007-298569 and JP-A-2009-199021.

In the present invention, as for the low molecular weight compound (D), one compound may be used alone, or two or more compounds may be mixed and used.

The composition of the present invention may or may not contain the low molecular compound (D), but in the case of containing the compound (D), the content thereof is usually from 0.001 to 20 mass %, preferably from 0.001 to 10 mass %, more preferably from 0.01 to 5 mass %, based on the total solid content of the composition combined with the basic compound.

In the case where the composition of the present invention contains an acid generator, the ratio between the acid generator and the compound (D) used in the composition is preferably acid generator/[compound (D)+basic compound] (by mol)=from 2.5 to 300. That is, the molar ratio is preferably 2.5 or more in view of sensitivity and resolution and is preferably 300 or less from the standpoint of suppressing the reduction in resolution due to thickening of the resist pattern over time after exposure until heat treatment. The acid generator/[compound (D)+basic compound] (by mol) is more preferably from 5.0 to 200, still more preferably from 7.0 to 150.

Other examples of the basic compound which can be used in the composition of the present invention include compounds synthesized in Examples of JP-A-2002-363146 and compounds described in paragraph 0108 of JP-A-2007-298569.

A photosensitive basic compound may be also used as the basic compound. Examples of the photosensitive basic compound which can be used include compounds described in JP-T-2003-524799 (the term "JP-T" as used herein means a "published Japanese translation of a PCT patent application") and *J. Photopolym. Sci. & Tech.*, Vol. 8, pp. 543-553 (1995).

The molecular weight of the basic compound is usually from 100 to 1,500, preferably from 150 to 1,300, more preferably from 200 to 1,000.

One kind of these basic compounds may be used alone, or two or more kinds thereof may be used in combination.

In the case where the composition of the present invention contains a basic compound, the content thereof is preferably from 0.01 to 8.0 mass %, more preferably from 0.1 to 5.0 mass %, still more preferably from 0.2 to 4.0 mass %, based on the total solid content of the composition.

The molar ratio of the basic compound to the photoacid generator is preferably from 0.01 to 10, more preferably from 0.05 to 5, still more preferably from 0.1 to 3. If the molar ratio is excessively large, the sensitivity and/or resolution may be reduced, whereas if the molar ratio is excessively small, thinning of the pattern may occur between exposure and heating (post-baking). The molar ratio is more preferably from 0.05 to 5, still more preferably from 0.1 to 3. In this molar ratio, the proportion of the photoacid generator is based on the total amount of the repeating unit (B) of the resin and the photoacid generator that may be further contained in the resin.

[7] Hydrophobic Resin (HR)

The actinic ray-sensitive or radiation-sensitive resin composition of the present invention may contain (HR) a hydrophobic resin separately from the resin (P).

The hydrophobic resin (HR) preferably contains a fluorine atom-containing group, a silicon atom-containing group or a hydrocarbon group having a carbon number of 5 or more so as to be unevenly distributed to the film surface. Such a group may be present in the main chain of the resin or may be substituted on the side chain. Specific examples of the hydrophobic resin (HR) are illustrated below.

(HR-1)

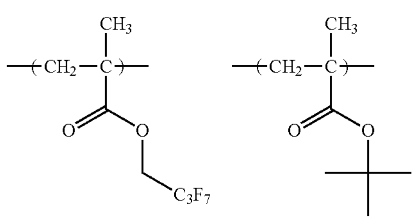

(HR-2)

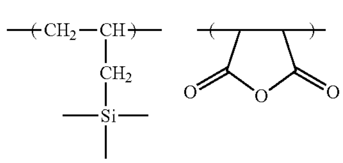

(HR-3)

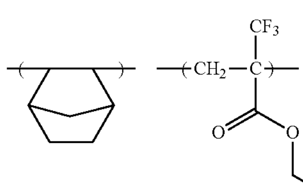

-continued (HR-4)

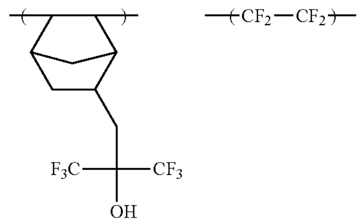

(HR-5)

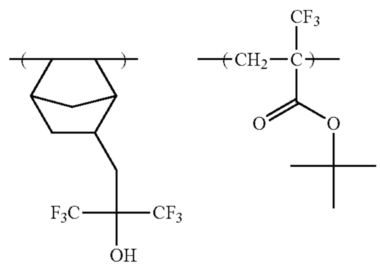

(HR-6)

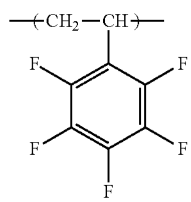

(HR-7)

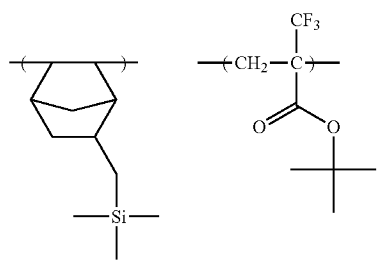

(HR-8)

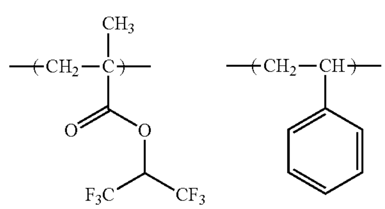

(HR-9)

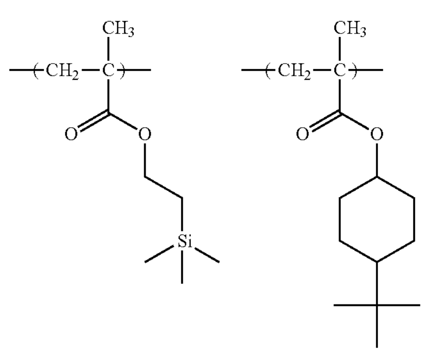

-continued
(HR-10)
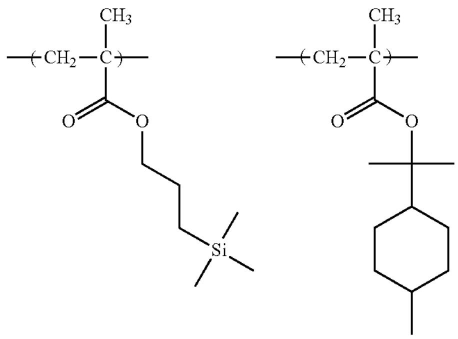
(HR-11)
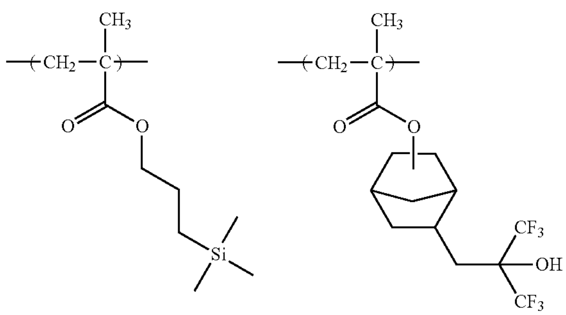
(HR-12)
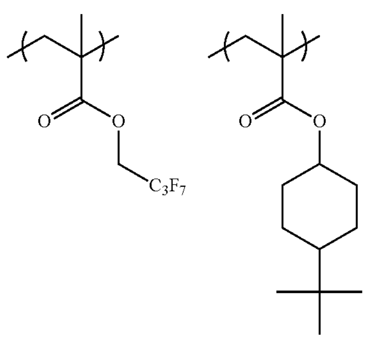
(HR-13)
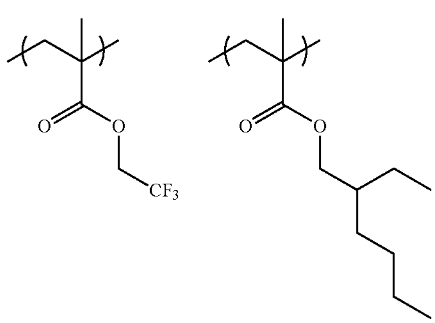
(HR-14)
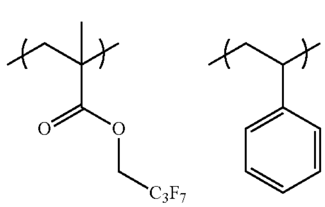
-continued
(HR-15)
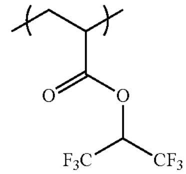
(HR-16)
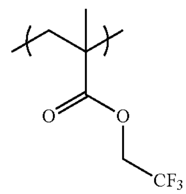
(HR-17)
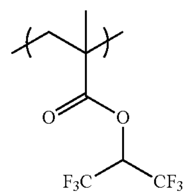
(HR-18)
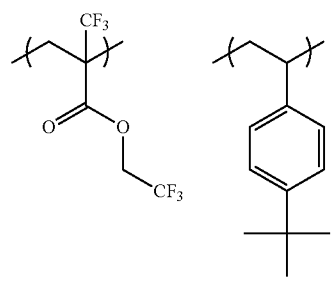
(HR-19)
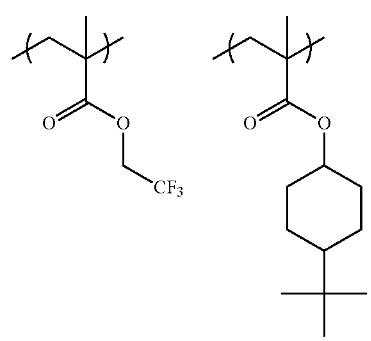
(HR-20)
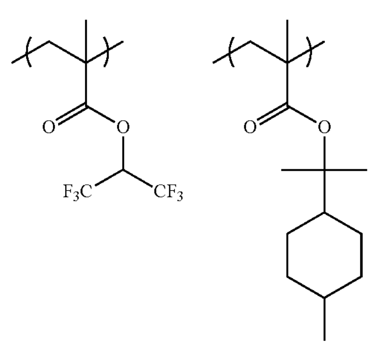

-continued
(HR-21)
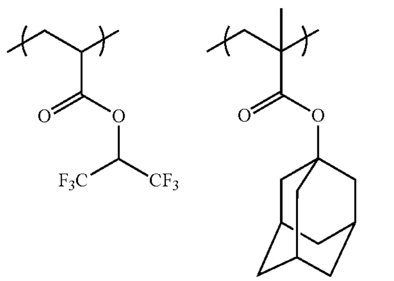
(HR-22)
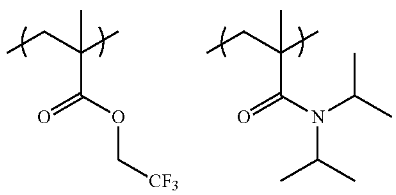
(HR-23)
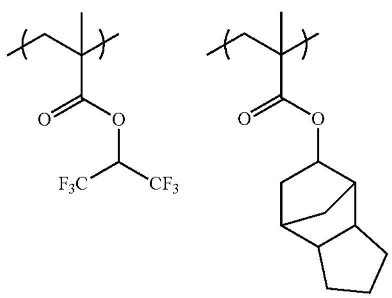
(HR-24)
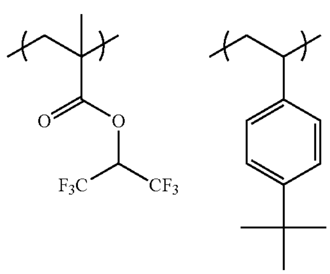
(HR-25)
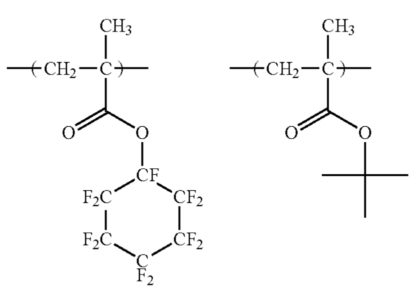
(HR-26)
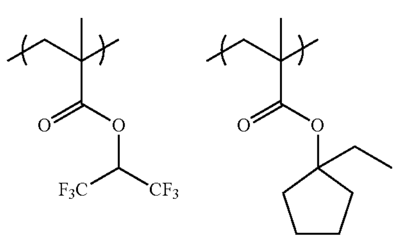
-continued
(HR-27)
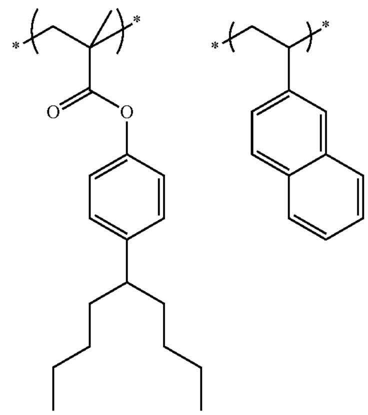
(HR-28)
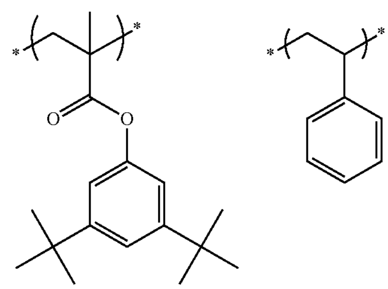
HR-29
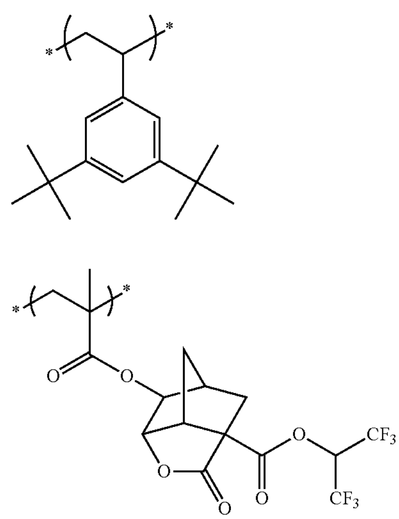
HR-30
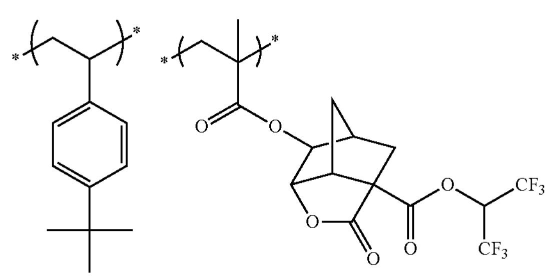

-continued

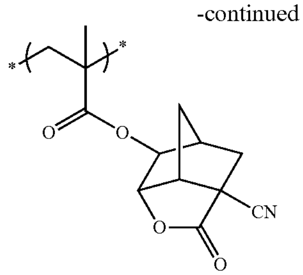

HR-31

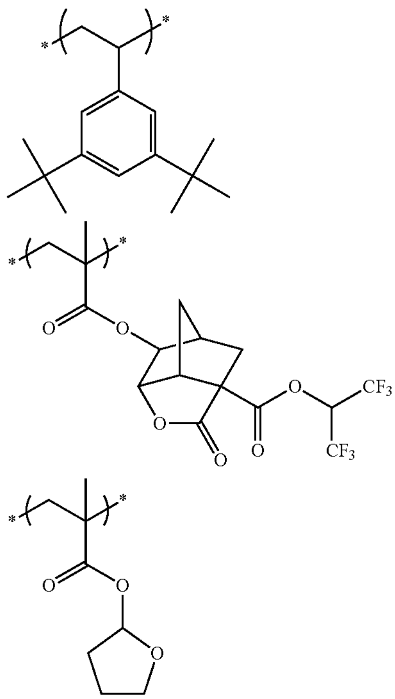

HR-32

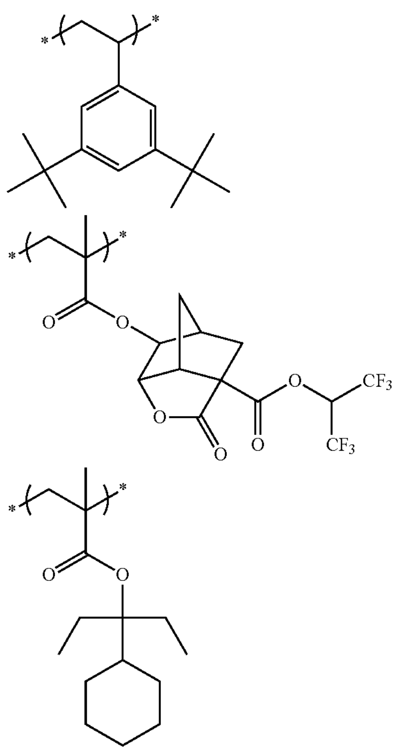

-continued

HR-33

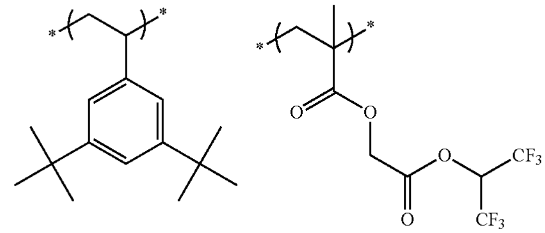

HR-34

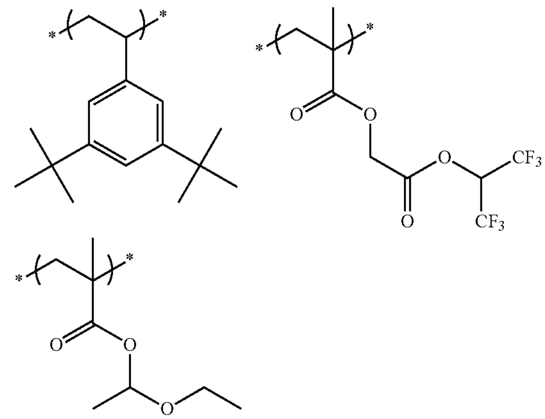

As the hydrophobic resin, in addition, those described in JP-A-2011-248019, JP-A-2010-175859 and JP-A-2012-032544 may be also preferably used.

The weight average molecular weight of the hydrophobic resin (HR) in terms of standard polystyrene is preferably from 1,000 to 100,000, more preferably from 1,000 to 50,000, still more preferably from 2,000 to 20,000.

As for the hydrophobic resin (HR), one kind may be used or a plurality of kinds may be used in combination.

The content of the hydrophobic resin (F) in the composition is preferably from 0.01 to 20 mass %, more preferably from 0.05 to 15 mass %, still more preferably from 0.1 to 10 mass %, based on the total solid content in the composition.

Furthermore, in view of sensitivity, resolution, roughness and the like, the molecular weight distribution (Mw/Mn, sometimes referred to as “polydispersity”) is preferably from 1 to 5, more preferably from 1 to 3, still more preferably from 1 to 2.

[8] Surfactant

The actinic ray-sensitive or radiation-sensitive resin composition of the present invention may further contain a surfactant. Among others, the surfactant is preferably a fluorine-containing and/or silicon-containing surfactant.

Examples of the fluorine-containing and/or silicon-containing surfactant include Megaface F176 and Megaface R08 produced by DIC Corporation; PF656 and PF6320 produced by OMNOVA; Troysol S-366 produced by Troy Chemical; Florad FC430 produced by Sumitomo 3M Inc.; and Polysiloxane Polymer KP-341 produced by Shin-Etsu Chemical Co., Ltd.

A surfactant other than the fluorine-containing and/or silicon-containing surfactant may be also used. Examples of this surfactant include a nonionic surfactant such as polyoxyethylene alkyl ethers and polyoxyethylene alkylaryl ethers.

In addition, known surfactants may be appropriately used. Examples of the surfactant which can be used include surfactants described in paragraph [0273] et seq. of U.S. Patent Application Publication No. 2008/0248425A1.

One kind of a surfactant may be used alone, or two or more kinds of surfactants may be used in combination.

In the case where the composition of the present invention further contains a surfactant, the content of the surfactant is preferably from 0.0001 to 2 mass %, more preferably from 0.001 to 1 mass %, based on the total solid content of the resin composition.

On the other hand, by setting the amount added of the surfactant to 10 ppm or less based on the total amount of the actinic ray-sensitive or radiation-sensitive resin composition (excluding the solvent), the hydrophobic resin is more unevenly distributed to the surface, so that the resist film surface can be made more hydrophobic and the followability of water at the immersion exposure can be enhanced.

[9] Other Additives

The composition of the present invention may appropriately contain, in addition to the components described above, a carboxylic acid, an onium carboxylate, a dissolution inhibiting compound having a molecular weight of 3,000 or less described, for example, in *Proceeding of SPIE*, 2724, 355 (1996), a dye, a plasticizer, a photosensitizer, a light absorber, an antioxidant and the like.

In particular, a carboxylic acid is suitably used for enhancing the performance. The carboxylic acid is preferably an aromatic carboxylic acid such as benzoic acid and naphthoic acid.

The content of the carboxylic acid is preferably from 0.01 to 10 mass %, more preferably from 0.01 to 5 mass %, still more preferably from 0.01 to 3 mass %, based on the total solid content concentration of the composition.

From the standpoint of enhancing the resolution, the actinic ray-sensitive or radiation-sensitive resin composition of the present invention is preferably used in a film thickness of 10 to 250 nm, more preferably from 20 to 200 nm, still more preferably from 30 to 100 nm. Such a film thickness can be achieved by setting the solid content concentration in the composition to an appropriate range, thereby imparting an appropriate viscosity and enhancing the coatability and film-forming property.

The solid content concentration in the actinic ray-sensitive or radiation-sensitive resin composition of the present invention is usually from 1.0 to 10 mass %, preferably from 2.0 to 5.7 mass %, more preferably from 2.0 to 5.3 mass %. By setting the solid content concentration to the range above, the resist solution can be uniformly coated on a substrate and furthermore, a resist pattern improved in the line width roughness can be formed. The reason therefor is not clearly known, but it is considered that probably thanks to a solid content concentration of 10 mass % or less, preferably 5.7 mass % or less, aggregation of materials, particularly, a photoacid generator, in the resist solution is suppressed, as a result, a uniform resist film can be formed.

The solid content concentration is a weight percentage of the weight of resist components excluding the solvent, based on the total weight of the actinic ray-sensitive or radiation-sensitive resin composition.

The actinic ray-sensitive or radiation-sensitive resin composition of the present invention is used by dissolving the components above in a predetermined organic solvent, preferably in the above-described mixed solvent, filtering the solution, and coating the filtrate on a predetermined support (substrate). The filter used for filtration is preferably a polytetrafluoroethylene-, polyethylene- or nylon-made filter having a pore size of 0.1 μm or less, more preferably 0.05 μm or less, still more preferably 0.03 μm or less. In the filtration through a filter, as described, for example, in JP-A-2002-62667, circulating filtration may be performed, or the filtration may be performed by connecting a plurality of kinds of filters in series or in parallel. Also, the composition may be filtered a plurality of times. Furthermore, a deaeration treatment or the like may be applied to the composition before and after filtration through a filter.

[10] Pattern Forming Method

The present invention relates to an actinic ray-sensitive or radiation-sensitive film (hereinafter, sometimes referred to as resist film) formed using the above-described composition of the present invention.

Also, the pattern forming method of the present invention includes at least:

(i) a step of forming a film (resist film) from an actinic ray-sensitive or radiation-sensitive resin composition, (ii) a step of exposing the film, and (iii) a step of performing development by using a developer.

The developer in the step (iii) may be an organic solvent-containing developer or an alkali developer but is preferably an organic solvent-containing developer, because the effects of the present invention are more markedly brought out.

Specifically, the pattern forming method of the present invention preferably includes at least:

(i) a step of forming a film (resist film) from an actinic ray-sensitive or radiation-sensitive resin composition, (ii) a step of exposing the film, and (iii') a step of developing the exposed film by using an organic solvent-containing developer to form a negative pattern.

The exposure in the step (ii) may be immersion exposure.

The pattern forming method of the present invention preferably includes (iv) a heating step after the exposure step (ii).

The pattern forming method of the present invention may further include (v) a step of performing development by using an alkali developer when the developer in the step (iii) is an organic solvent-containing developer, and on the other hand, may further include (v) a step of performing development by using an organic solvent-containing developer when the developer in the step (iii) is an alkali developer.

In the pattern forming method of the present invention, the exposure step (ii) may be performed a plurality of times.

In the pattern forming method of the present invention, the heating step (v) may be performed a plurality of times.

The resist film is formed of the above-described actinic ray-sensitive or radiation-sensitive resin composition of the present invention and, more specifically, is preferably formed on a substrate. In the pattern forming method of the present invention, the step of forming a film on a substrate by using the actinic ray-sensitive or radiation-sensitive resin composition, the step of exposing the film, and the development step can be performed by generally known methods.

For example, the composition is coated on such a substrate as used in the production of a precision integrated circuit device, an imprint mold or the like (e.g., silicon/silicon dioxide-coated substrate, silicon nitride and chromium-deposited quartz substrate) by using a spinner, a coater or the like. The coating is thereafter dried, whereby an actinic ray-sensitive or radiation-sensitive film can be formed.

Before forming the resist film, an antireflection film may be previously provided by coating on the substrate.

The antireflection film used may be either an inorganic film type such as titanium, titanium dioxide, titanium nitride, chromium oxide, carbon and amorphous silicon, or an organic film type composed of a light absorber and a polymer material. A commercially available organic antireflection film such as DUV30 Series and DUV-40 Series produced by Brewer Science, Inc. and AR-2, AR-3 and AR-5 produced by Shipley Co., Ltd. may be also used as the organic antireflection film.

The pattern forming method also preferably includes, after film formation, a pre-baking step (PB) before entering the exposure step.

Furthermore, the pattern forming method also preferably includes a post-exposure baking step (PEB) after the exposure step but before the development step.

As for the heating temperature, both PB and PEB are preferably performed at 70 to 120° C., more preferably at 80 to 110° C.

The heating time is preferably from 30 to 300 seconds, more preferably from 30 to 180 seconds, still more preferably from 30 to 90 seconds.

The heating can be performed using a device attached to an ordinary exposure/developing machine or may be performed using a hot plate or the like.

The reaction in the exposed area is accelerated by the baking and in turn, the sensitivity or pattern profile is improved.

It is also preferred to include a heating step (post baking) after the rinsing step. By the baking, the developer and rinsing solution remaining between patterns as well as in the inside of the pattern are removed.

Examples of the actinic ray or radiation include infrared light, visible light, ultraviolet light, far ultraviolet light, X-ray, and electron beam. An actinic ray or radiation having, for example, a wavelength of 250 nm or less, particularly 220 nm or less, is preferred. Such an actinic ray or radiation includes, for example, KrF excimer laser (248 nm), ArF excimer laser (193 nm), $F_2$ excimer laser (157 nm), X-ray, and electron beam. The actinic ray or radiation is preferably, for example, KrF excimer laser, ArF excimer laser, electron beam, X-ray or EUV light, more preferably electron beam, X-ray or EUV light.

In the present invention, an immersion exposure method can be applied in the step of performing exposure.

The immersion exposure method is a technique to increase the resolution, and this is a technique of performing exposure by filling a space between the projection lens and the sample with a high refractive-index liquid (hereinafter, sometimes referred to as an "immersion liquid").

As for the "effect of immersion", assuming that $\lambda_0$ is the wavelength of exposure light in air, n is the refractive index of the immersion liquid for air, θ is the convergence half-angle of beam and $NA_0=\sin\theta$, the resolution and the depth of focus in immersion can be expressed by the following formulae. Here, $k_1$ and $k_2$ are coefficients related to the process.

$$(\text{Resolution})=k_1\cdot(\lambda_0/n)/NA_0$$

$$(\text{Depth of focus})=\pm k_2\cdot(\lambda_0/n)/NA_0^2$$

That is, the effect of immersion is equal to use of an exposure wavelength of 1/n. In other words, in the case of a projection optical system having the same NA, the depth of focus can be made n times larger by immersion. This is effective for all pattern profiles and furthermore, can be combined with the super-resolution technology under study at present, such as phase-shift method and modified illumination method.

In the case of performing immersion exposure, a step of washing the film surface with an aqueous chemical may be performed (1) before the exposure step after forming the film on a substrate and/or (2) after the step of exposing the film through an immersion liquid but before the step of baking the film.

The immersion liquid is preferably a liquid being transparent to light at the exposure wavelength and having as small a temperature coefficient of refractive index as possible in order to minimize the distortion of an optical image projected on the film. In particular, when the exposure light source is ArF excimer laser (wavelength: 193 nm), water is preferably used in view of easy availability and easy handleability in addition to the above-described aspects.

In the case of using water, an additive (liquid) capable of decreasing the surface tension of water and increasing the interface activity may be added in a small ratio. This additive is preferably an additive that does not dissolve the resist layer on the wafer and at the same time, gives only a negligible effect on the optical coat at the undersurface of the lens element.

Such an additive is preferably, for example, an aliphatic alcohol having a refractive index substantially equal to that of water, and specific examples thereof include methyl alcohol, ethyl alcohol and isopropyl alcohol. By virtue of adding an alcohol having a refractive index substantially equal to that of water, even when the alcohol component in water is evaporated and its content concentration is changed, the change in the refractive index of the liquid as a whole can be advantageously made very small.

On the other hand, if a substance opaque to light at 193 nm or an impurity greatly differing in the refractive index from water migrates into the water, this gives rise to distortion of an optical image projected on the resist. Therefore, the water used is preferably distilled water. Furthermore, pure water after filtration through an ion exchange filter or the like may be also used.

The electrical resistance of water used as the immersion liquid is preferably 18.3 MΩcm or more, and TOC (total organic carbon) is preferably 20 ppb or less. The water is preferably subjected to a deaeration treatment.

Also, the lithography performance can be enhanced by raising the refractive index of the immersion liquid. From such a standpoint, an additive for raising the refractive index may be added to water, or heavy water ($D_2O$) may be used in place of water.

In the immersion exposure step, the immersion liquid must move on a wafer following the movement of an exposure head that is scanning the wafer at a high speed and forming an exposure pattern. Therefore, the contact angle of the immersion liquid for the resist film in a dynamic state is important, and the resist is required to have a performance of allowing the immersion liquid to follow the high-speed scanning of an exposure head with no remaining of a liquid droplet.

In order to prevent the film from directly contacting with the immersion liquid, a film (hereinafter, sometimes referred to as a "topcoat") sparingly soluble in the immersion liquid may be provided between the film formed using the composition of the present invention and the immersion liquid. The functions required of the topcoat are suitability for coating as a resist overlayer, transparency to radiation, particularly, radiation having a wavelength of 193 nm, and sparing solubility in immersion liquid. The topcoat is preferably unmixable with the resist and capable of being uniformly coated as an overlayer of the resist.

In view of transparency to light at 193 nm, the topcoat is preferably an aromatic-free polymer.

Specific examples thereof include a hydrocarbon polymer, an acrylic acid ester polymer, a polymethacrylic acid, a polyacrylic acid, a polyvinyl ether, a silicon-containing polymer, and a fluorine-containing polymer. If an impurity dissolves out into the immersion liquid from the topcoat, the optical lens is contaminated. For this reason, residual monomer components of the polymer are preferably little contained in the topcoat.

On removing the topcoat, a developer may be used, or a release agent may be separately used. The release agent is preferably a solvent less likely to permeate the film. From the standpoint that the removing step can be performed simultaneously with the film development step, the topcoat is preferably removable with an alkali developer and in view of removal with an alkali developer, the topcoat is preferably acidic, but considering non-intermixing with the film, the topcoat may be neutral or alkaline.

The difference in the refractive index between the topcoat and the immersion liquid is preferably null or small. In this case, the resolution can be enhanced. In the case where the exposure light source is ArF excimer laser (wavelength: 193 nm), water is preferably used as the immersion liquid and therefore, the topcoat for ArF immersion exposure preferably has a refractive index close to the refractive index (1.44) of water. Also, in view of transparency and refractive index, the topcoat is preferably a thin film.

The topcoat is preferably unmixable with the film and further unmixable also with the immersion liquid. From this standpoint, when the immersion liquid is water, the solvent used for the topcoat is preferably a medium that is sparingly soluble in the solvent used for the composition of the present invention and is water-insoluble. Furthermore, when the immersion liquid is an organic solvent, the topcoat may be either water-soluble or water-insoluble.

On the other hand, when performing EUV exposure or EB exposure, for the purpose of outgas inhibition or blob defect suppression or for preventing, for example, worsening of the collapse performance due to a reverse taper profile or worsening of LWR due to surface roughening, a topcoat layer may be formed as an overlayer of the resist film formed of the actinic ray-sensitive or radiation-sensitive resin composition of the present invention. The topcoat composition used for formation of the topcoat layer is described below.

In the topcoat composition for use in the present invention, the solvent is preferably water or an organic solvent, more preferably water or an alcohol-based solvent.

In the case where the solvent is an organic solvent, a solvent incapable of dissolving the resist film is preferred. As the solvent which can be used, an alcohol-based solvent, a fluorine-based solvent or a hydrocarbon-based solvent is preferably used, and it is more preferred to use a fluorine-free alcohol-based solvent. The alcohol-based solvent is, in view of coatability, preferably a primary alcohol, more preferably a primary alcohol having a carbon number of 4 to 8. As the primary alcohol having a carbon number of 4 to 8, a linear, branched or cyclic alcohol may be used, but a linear or branched alcohol is preferred. Specific examples thereof include 1-butanol, 1-hexanol, 1-pentanol, and 3-methyl-1-butanol.

In the case where the solvent of the topcoat composition for use in the present invention is water, an alcohol-based solvent or the like, the composition preferably contains a water-soluble resin. It is considered that the uniformity of solubility in the developer can be more enhanced by containing a water-soluble resin. Preferred examples of the water-soluble resin include polyacrylic acid, polymethacrylic acid, polyhydroxystyrene, polyvinylpyrrolidone, polyvinyl alcohol, polyvinyl ether, polyvinyl acetal, polyacrylimide, polyethylene glycol, polyethylene oxide, polyethyleneimine, polyester polyol, polyether polyol, and polysaccharides. Among these, polyacrylic acid, polymethacrylic acid, polyhydroxystyrene, polyvinylpyrrolidone and polyvinyl alcohol are preferred. Incidentally, the water-soluble resin is not limited only to a homopolymer and may be a copolymer, for example, may be a copolymer having a monomer corresponding to the repeating unit of the homopolymer described above and another monomer unit. Specifically, an acrylic acid-methacrylic acid copolymer, an acrylic acid-hydroxystyrene copolymer, and the like may be also used in the present invention.

As the resin for the topcoat composition, a resin having an acidic group described in JP-A-2009-134177 and JP-A-2009-91798 may be also preferably used.

The weight average molecular weight of the water-soluble resin is not particularly limited but is preferably from 2,000 to 1,000,000, more preferably from 5,000 to 500,000, still more preferably from 10,000 to 100,000. The weight average molecular weight of the resin as used herein indicates a molecular weight in terms of polystyrene measured by GPC (carrier: THF or N-methyl-2-pyrrolidone (NMP)).

The pH of the topcoat composition is not particularly limited but is preferably from 0 to 10, more preferably from 0 to 8, still more preferably from 1 to 7.

In the case where the solvent of the topcoat composition is an organic solvent, the topcoat composition may contain a hydrophobic resin such as the hydrophobic resin (HR) described above in the paragraph of an actinic ray-sensitive or radiation-sensitive resin composition. As the hydrophobic resin, it is also preferred to use a hydrophobic resin described in JP-A-2008-209889.

The concentration of the resin in the topcoat composition is preferably from 0.1 to 10 mass %, more preferably from 0.2 to 5 mass %, still more preferably from 0.3 to 3 mass %.

The topcoat material may contain a component other than the resin, but the proportion of the resin in the solid content of the topcoat composition is preferably form 80 to 100 mass %, more preferably from 90 to 100 mass %, still more preferably from 95 to 100 mass %.

The solid content concentration of the topcoat composition for use in the present invention is preferably from 0.1 to 10 mass %, more preferably from 0.2 to 6 mass %, still more preferably from 0.3 to 5 mass %. By adjusting the solid content concentration to fall in the range above, the topcoat composition can be uniformly coated on the resist film.

Examples of the component other than the resin, which can be added to the topcoat material, include a surfactant, a photoacid generator, and a basic compound. Specific examples of the photoacid generator and basic compound include the same compounds as those of the above-described compound capable of generating an acid upon irradiation with an actinic ray or radiation and the basic compound.

In the case of using a surfactant, the amount of the surfactant used is preferably from 0.0001 to 2 mass %, more preferably from 0.001 to 1 mass %, based on the total amount of the topcoat composition.

Addition of a surfactant to the topcoat composition makes it possible to enhance the coatability when coating the topcoat composition. The surfactant includes nonionic, anionic, cationic and amphoteric surfactants.

Examples of the nonionic surfactant which can be used include Plufarac Series produced by BASF; ELEBASE Series, Finesurf Series, and Blaunon Series produced by Aoki Oil Industrial Co., Ltd.; Adeka Pluronic P-103 produced by Asahi Denka Co., Ltd.; Emulgen Series, Amiet Series, Aminon PK-02S, Emanon CH-25, and Rheodol Series produced by Kao Corporation; Surflon S-141 produced by AGC Seimi Chemical Co., Ltd.; Noigen Series produced by Daiichi Kogyo Seiyaku Co., Ltd.; Newcalgen Series produced by Takemoto Oil & Fat Co., Ltd.; DYNOL 604, EnviroGem AD01, Olfine EXP Series, and Surfynol Series produced by Nisshin Chemical Industry Co., Ltd.; and Ftergent 300 produced by Ryoko Chemical Co., Ltd.

Examples of the anionic surfactant which can be used include Emal 20T and Poiz 532A produced by Kao Corporation; Phosphanol ML-200 produced by Toho Chemical Industry Co., Ltd.; EMULSOGEN Series produced by Clariant Japan K.K.; Surflon S-111N and Surflon S-211 produced by AGC Seimi Chemical Co., Ltd.; Plysurf Series produced by Dai-ichi Kogyo Seiyaku Co., Ltd.; Pionin Series produced by Takemoto Oil & Fat Co., Ltd.; Olfine PD-201 and Olfine PD-202 produced by Nisshin Chemical Industry Co., Ltd.; AKYPO RLM45 and ECT-3 produced by Nihon Surfactant Kogyo K.K.; and Lipon produced by Lion Corporation.

Examples of the cationic surfactant which can be used include Acetamin 24 and Acetamin 86 produced by Kao Corporation.

Examples of the amphoteric surfactant which can be used include Surflon S-131 (produced by AGC Seimi Chemical Co., Ltd.); and Enagicol C-40H and Lipomin LA (both produced by Kao Corporation).

Also, these surfactants may be mixed and used.

In the pattern forming method of the present invention, a resist film can be formed on a substrate by using the above-described actinic ray-sensitive or radiation-sensitive resin composition, and a topcoat layer can be formed on the resist film by using the topcoat composition. The film thickness of the topcoat layer is preferably from 10 to 200 nm, more preferably from 20 to 100 nm, still more preferably from 40 to 80 nm.

The method for coating the actinic ray-sensitive or radiation-sensitive resin composition on a substrate is preferably spin coating, and the rotation speed thereof is preferably from 1,000 to 3,000 rpm.

For example, the actinic ray-sensitive or radiation-sensitive resin composition is coated on such a substrate as used in the production of a precision integrated circuit device (e.g., silicon/silicon dioxide-coated substrate) by an appropriate coating method such as spinner and coater and then dried to form a resist film. Incidentally, a known antireflection film may be previously provided by coating. Also, the resist film is preferably dried before forming a topcoat layer.

On the resist film obtained, the topcoat composition is coated by the same method as the resist film forming method and dried, whereby a topcoat layer can be formed.

The resist film having thereon a topcoat layer is irradiated with an electron beam (EB), an X-ray or EUV light usually through a mask, then preferably baked (heated), and further subjected to development, whereby a good pattern can be obtained.

In the present invention, the substrate on which the film is formed is not particularly limited, and a substrate generally used in the process of producing a semiconductor such as IC or producing a liquid crystal device or a circuit board such as thermal head or in the lithography of other photo-fabrication processes, for example, an inorganic substrate such as silicon, SiN, $SiO_2$ and SiN, or a coating-type inorganic substrate such as SOG, can be used. If desired, an organic antireflection film may be formed between the film and the substrate.

In the case where the pattern forming method of the present invention includes a step of performing development by using an alkali developer, the alkali developer which can be used includes, for example, an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

This alkaline aqueous solution may be also used after adding thereto alcohols and a surfactant each in an appropriate amount.

The alkali concentration of the alkali developer is usually from 0.1 to 20 mass %.

The pH of the alkali developer is usually from 10.0 to 15.0.

In particular, an aqueous solution of 2.38 mass % tetramethylammonium hydroxide is preferred.

As for the rinsing solution in the rinsing treatment performed after the alkali development, pure water is used, and the pure water may be also used after adding thereto a surfactant in an appropriate amount.

After the development or rinsing, a treatment of removing the developer or rinsing solution adhering on the pattern by a supercritical fluid may be performed.

In the case where the pattern forming method of the present invention includes a step of performing development by using an organic solvent-containing developer, as for the developer used in the step (hereinafter, sometimes referred to as an "organic developer"), a polar solvent such as ketone-based solvent, ester-based solvent, alcohol-based solvent, amide-based solvent and ether-based solvent, or a hydrocarbon-based solvent can be used.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, and propyl lactate.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; and a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol.

Examples of the ether-based solvent include, in addition to the glycol ether-based solvents above, dioxane and tetrahydrofuran.

Examples of the amide-based solvent which can be used include N-methyl-2-pyrrolidone, N,N-dimethylacetamide, N,N-dimethylformamide, hexamethylphosphoric triamide, and 1,3-dimethyl-2-imidazolidinone.

Examples of the hydrocarbon-based solvent include an aromatic hydrocarbon-based solvent such as toluene and xylene, and an aliphatic hydrocarbon-based solvent such as pentane, hexane, octane and decane.

A plurality of these solvents may be mixed, or the solvent may be used by mixing it with a solvent other than those described above or with water. However, in order to sufficiently bring out the effects of the present invention, the percentage water content in the entire developer is preferably less than 10 mass %, and it is more preferred to contain substantially no water.

That is, the amount of the organic solvent used in the organic developer is preferably from 90 to 100 mass %, more preferably from 95 to 100 mass %, based on the total amount of the developer.

In particular, the organic developer is preferably a developer containing at least one kind of an organic solvent selected from the group consisting of a ketone-based solvent, an ester-based solvent, an alcohol-based solvent, an amide-based solvent and an ether-based solvent.

The vapor pressure at 20° C. of the organic developer is preferably 5 kPa or less, more preferably 3 kPa or less, still more preferably 2 kPa or less. By setting the vapor pressure of the organic developer to 5 kPa or less, evaporation of the developer on a substrate or in a development cup is suppressed and the temperature uniformity in the wafer plane is enhanced, as a result, the dimensional uniformity in the wafer plane is improved.

Specific examples of the solvent having a vapor pressure of 5 kPa or less include a ketone-based solvent such as 1-octanone, 2-octanone, 1-nonanone, 2-nonanone, 2-heptanone (methyl amyl ketone), 4-heptanone, 2-hexanone, diisobutyl ketone, cyclohexanone, methylcyclohexanone, phenylacetone and methyl isobutyl ketone; an ester-based solvent such as butyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate and propyl lactate; an alcohol-based solvent such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an ether-based solvent such as tetrahydrofuran; an amide-based solvent such as N-methyl-2-pyrrolidone, N,N-dimethylacetamide and N,N-dimethylformamide; an aromatic hydrocarbon-based solvent such as toluene and xylene; and an aliphatic hydrocarbon-based solvent such as octane and decane.

Specific examples of the solvent having a vapor pressure of 2 kPa or less that is a particularly preferred range include a ketone-based solvent such as 1-octanone, 2-octanone, 1-nonanone, 2-nonanone, 4-heptanone, 2-hexanone, diisobutyl ketone, cyclohexanone, methylcyclohexanone and phenylacetone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate and propyl lactate; an alcohol-based solvent such as n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an amide-based solvent such as N-methyl-2-pyrrolidone, N,N-dimethylacetamide and N,N-dimethylformamide; an aromatic hydrocarbon-based solvent such as xylene; and an aliphatic hydrocarbon-based solvent such as octane and decane.

In the organic developer, a surfactant can be added in an appropriate amount, if desired.

The surfactant is not particularly limited but, for example, ionic or nonionic fluorine-containing and/or silicon-containing surfactants can be used. Examples of the fluorine-containing and/or silicon-containing surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,294,511 and 5,824,451. A nonionic surfactant is preferred. The nonionic surfactant is not particularly limited, but use of a fluorine-containing surfactant or a silicon-containing surfactant is more preferred.

The amount of the surfactant used is usually from 0.001 to 5 mass %, preferably from 0.005 to 2 mass %, more preferably from 0.01 to 0.5 mass %, based on the total amount of the developer.

Also, the organic developer may contain an appropriate amount of a basic compound, if desired. Examples of the basic compound include those described above in the paragraph of [6] Basic Compound.

As regards the developing method, for example, a method of dipping the substrate in a bath filled with the developer for a fixed time (dipping method), a method of raising the developer on the substrate surface by the effect of a surface tension and keeping it still for a fixed time, thereby performing the development (puddling method), a method of spraying the developer on the substrate surface (spraying method), and a method of continuously ejecting the developer on the substrate spinning at a constant speed while scanning a developer ejecting nozzle at a constant rate (dynamic dispense method) may be applied.

In the case where the above-described various developing methods include a step of ejecting the developer toward the resist film from a development nozzle of a developing apparatus, the ejection pressure of the developer ejected (the flow velocity per unit area of the developer ejected) is preferably 2 $mL/sec/mm^2$ or less, more preferably 1.5 $mL/sec/mm^2$ or less, still more preferably 1 $mL/sec/mm^2$ or less. The flow velocity has no particular lower limit but in view of throughput, is preferably 0.2 $mL/sec/mm^2$ or more.

By setting the ejection pressure of the ejected developer to the range above, pattern defects attributable to the resist scum after development can be greatly reduced.

Details of this mechanism are not clearly known, but it is considered that thanks to the ejection pressure in the above-described range, the pressure imposed on the resist film by the developer becomes small and the resist film or resist pattern is kept from inadvertent chipping or collapse.

Here, the ejection pressure ($mL/sec/mm^2$) of the developer is a value at the outlet of a development nozzle in a developing apparatus.

Examples of the method for adjusting the ejection pressure of the developer include a method of adjusting the ejection pressure by a pump or the like, and a method of supplying the developer from a pressurized tank and adjusting the pressure to change the ejection pressure.

After the step of performing development by using an organic solvent-containing developer, a step of stopping the development by replacing the solvent with another solvent may be practiced.

The pattern forming method may include a step of rinsing the film with a rinsing solution after the step of performing development by using an organic solvent-containing developer, but in view of, for example, throughput (productivity) and the amount of rinsing solution used, it is preferred not to include a step of rinsing the film with a rinsing solution.

The rinsing solution used in the rinsing step after the step of performing development by using an organic solvent-containing developer is not particularly limited as long as it does not dissolve the resist pattern, and a solution containing a general organic solvent may be used. As the rinsing solution, a rinsing solution containing at least one kind of an organic solvent selected from the group consisting of a hydrocarbon-based solvent, a ketone-based solvent, an ester-based solvent, an alcohol-based solvent, an amide-based solvent and an ether-based solvent is preferably used.

Specific examples of the hydrocarbon-based solvent, ketone-based solvent, ester-based solvent, alcohol-based solvent, amide-based solvent and ether-based solvent are the same as those described above for the organic solvent-containing developer.

After the step of performing development by using an organic solvent-containing developer, more preferably, a step of rinsing the film by using a rinsing solution containing at least one kind of an organic solvent selected from the group consisting of a ketone-based solvent, an ester-based solvent, an alcohol-based solvent and an amide-based solvent is preformed; still more preferably, a step of rinsing the film by using a rinsing solution containing an alcohol-based solvent or an ester-based solvent is performed; yet still more preferably, a step of rinsing the film by using a rinsing solution containing a monohydric alcohol is performed; and most preferably, a step of rinsing the film by using a rinsing solution containing a monohydric alcohol having a carbon number of 5 or more is performed.

The monohydric alcohol used in the rinsing step includes a linear, branched or cyclic monohydric alcohol, and specific examples of the monohydric alcohol which can be used include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol and 4-octanol. As for the particularly preferred monohydric alcohol having a carbon number of 5 or more, 1-hexanol, 2-hexanol, 4-methyl-2-pentanol, 1-pentanol, 3-methyl-1-butanol and the like can be used.

A plurality of these components may be mixed, or the solvent may be used by mixing it with an organic solvent other than those described above.

The percentage water content in the rinsing solution is preferably 10 mass % or less, more preferably 5 mass % or less, still more preferably 3 mass % or less. By setting the percentage water content to 10 mass % or less, good development characteristics can be obtained.

The vapor pressure at 20° C. of the rinsing solution used after the step of performing development by using an organic solvent-containing developer is preferably from 0.05 to 5 kPa, more preferably from 0.1 to 5 kPa, and most preferably from 0.12 to 3 kPa. By setting the vapor pressure of the rinsing solution to the range from 0.05 to 5 kPa, the temperature uniformity in the wafer plane is enhanced and moreover, swelling due to permeation of the rinsing solution is suppressed, as a result, the dimensional uniformity in the wafer plane is improved.

The rinsing solution may be also used after adding thereto a surfactant in an appropriate amount.

In the rinsing step, the wafer after development using an organic solvent-containing developer is rinsed using the above-described organic solvent-containing rinsing solution. The method for rinsing treatment is not particularly limited, but examples of the method which can be applied include a method of continuously ejecting the rinsing solution on the substrate spinning at a constant speed (spin coating method), a method of dipping the substrate in a bath filled with the rinsing solution for a fixed time (dipping method), and a method of spraying the rinsing solution on the substrate surface (spraying method). Above all, it is preferred to perform the rinsing treatment by the spin coating method and after the rinsing, remove the rinsing solution from the substrate surface by spinning the substrate at a rotation speed of 2,000 to 4,000 rpm. It is also preferred to include a heating step (Post Bake) after the rinsing step. By the baking, the developer and rinsing solution remaining between patterns as well as in the inside of the pattern are removed. The heating step after the rinsing step is performed at usually from 40 to 160° C., preferably from 70 to 95° C., for usually from 10 seconds to 3 minutes, preferably from 30 to 90 seconds.

In the pattern forming method of the present invention, a step of performing development by using an organic solvent-containing developer (organic solvent development step) and a step of performing development by using an aqueous alkali solution (alkali development step) may be used in combination. Thanks to this combination, a finer pattern can be formed.

In the present invention, the portion of low exposure intensity is removed in the organic solvent development step, and by further performing the alkali development step, the portion of high exposure intensity is also removed. By virtue of the multiple development process of performing development a plurality of times in this way, a pattern can be formed by keeping only the region of intermediate exposure intensity from being dissolved, so that a finer pattern than usual can be formed (the same mechanism as in [0077] of JP-A-2008-292975).

In the pattern forming method of the present invention, the order of the alkali development step and the organic solvent development step is not particularly limited, but the alkali development is preferably performed before the organic solvent development step.

Also, an imprint mold may be produced using the composition of the present invention. For details, refer to, for example, Japanese Patent 4,109,085, JP-A-2008-162101, and "Yoshihiko Hirai (compiler), *Nanoimprint no Kiso to Gijutsu Kaihatsu•Oyo Tenkai-Nanoimprint no Kiban Gijutsu to Saishin no Gijutsu Tenkai* (*Basic and Technology Expansion•Application Development of Nanoimprint-Substrate Technology of Nanoimprint and Latest Technology Expansion*), Frontier Shuppan".

The present invention also relates to a method for manufacturing an electronic device, comprising the above-described pattern forming method of the present invention, and an electronic device manufactured by this manufacturing method.

The electronic device of the present invention is suitably mounted on electric electronic equipment (such as home electronics, OA•media equipment, optics and communication equipment).

EXAMPLES

Reference Synthesis Example 1

Synthesis of M-1-1

(Synthesis of Chloroether Compound)

In a 300 mL-volume eggplant-type flask equipped with a Dean-Stark tube, 10.51 g of isovaleraldehyde, 12.35 g of ethanol, 1.41 g of camphorsulfonic acid and 100 mL of heptane were added, and refluxing was performed for 8 hours. After returning the temperature to room temperature, 3.1 g of triethylamine was added and stirred, and the organic layer was washed with saturated sodium bicarbonate water twice and with distilled water once. By removing heptane and unreacted ethanol under the conditions of reduced pressure and heating, Acetal Compound 1 shown below was obtained.

Subsequently, 11.47 g of acetyl chloride was added to the entire amount of Acetal Compound 1 obtained, and the mixture was stirred in a water bath at 45° C. for 4 hours. After returning the temperature to room temperature, unreacted acetyl chloride was removed under the reduced pressure condition, whereby Compound C1-1 shown below was obtained as a chloroether compound.

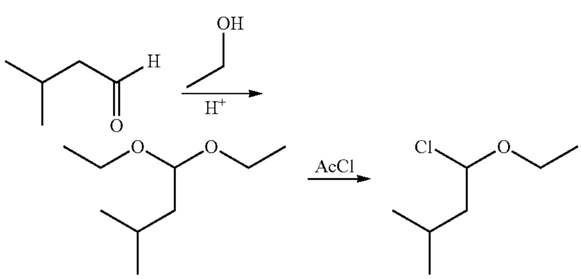

Acetal Compound 1 Cl-1

(Synthesis of M-I-1)

An eggplant-type flask was charged with 36 g of methacrylic acid, 46 g of triethylamine, 36 g of magnesium sulfate and 200 g of THF, and the contents were stirred at 0° C. for 10 minutes. Thereto, 57 g of C1-1 was added dropwise over 30 minutes. After returning the temperature to room temperature, 300 mL of ethyl acetate was added, and the organic layer was washed with saturated brine twice and with distilled water twice. After drying over magnesium sulfate, ethyl acetate was removed by distillation under reduced pressure to obtain 65 g of M-I-1.

Synthesis Example 1

Synthesis of Resin P-1

In a nitrogen stream, 23 g of cyclohexanone was charged into a three-neck flask (Solvent 1) and heated at 85° C. Subsequently, 14 g of M-1-1 and 6.7 g of M-II-1 were dissolved in 60 g of cyclohexanone and furthermore, 0.92 g of initiator V-601 (produced by Wako Pure Chemical Industries, Ltd.) was dissolved therein. The obtained solution was added dropwise to (Solvent 1) over 4 hours. After the completion of dropwise addition, the reaction was further allowed to proceed at 85° C. for 2 hours. The reaction solution was allowed to cool and then added dropwise to 1,200 mL of hexane, and the precipitated powder was collected by filtration and dried to obtain 17 g of Resin P-1.

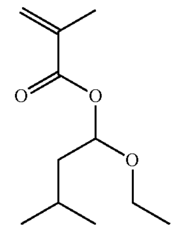

M-I-1

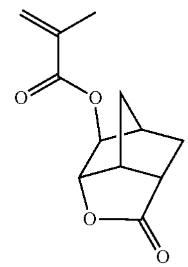

M-II-1

With respect to the obtained Resin P-1, the compositional ratio (molar ratio) of Resin P-1 was calculated by $^{13}$C-NMR measurement. Also, the weight average molecular weight (Mw: in terms of polystyrene), number average molecular weight (Mn: in terms of polystyrene) and polydispersity (Mw/Mn, hereinafter sometimes referred to as "PDI") of Resin P-1 were calculated by GPC (solvent: N-methylpyrrolidone (NMP)) measurement. These results are shown in the chemical formulae later.

Synthesis Example 2

Synthesis of Resin P-19

(Synthesis of M-III-1)

After dissolving 100.00 parts by mass of p-acetoxystyrene in 400 parts by mass of ethyl acetate, the solution was cooled to 0° C., and 47.60 parts by mass of sodium methoxide (28 mass % methanol solution) was added dropwise thereto over 30 minutes, followed by stirring at room temperature for 5 hours. After adding ethyl acetate, the organic layer was washed with distilled water three times and then dried over anhydrous sodium sulfate, and the solvent was removed by distillation to obtain 131.70 parts by mass of p-hydroxystyrene (54 mass % ethyl acetate solution).

After dissolving 18.52 parts by mass of p-hydroxystyrene (54 mass % ethyl acetate solution) in 56.00 parts by mass of ethyl acetate, 31.58 parts by mass of 1,1,2,2,3,3-hexafluoropropane-1,3-disulfonyl difluoride was added thereto, and the mixture was cooled to 0° C. A solution obtained by dissolving 12.63 parts by mass of triethylamine in 25.00 parts by mass of ethyl acetate was added dropwise thereto over 30 minutes and while keeping the temperature at 0° C., the mixture was stirred for 4 hours. After adding ethyl acetate, the organic layer was washed with saturated brine three times and then dried over anhydrous sodium sulfate, and the solvent was removed by distillation to obtain 32.90 parts by mass of Compound A.

After dissolving 35.00 g of Compound A in 315 parts by mass of methanol, the resulting solution was cooled to 0° C., and 245 parts by mass of an aqueous 1 N sodium hydroxide solution was added thereto, followed by stirring at room temperature for 2 hours. The solvent was removed by distillation. After adding ethyl acetate, the organic layer was washed with saturated brine three times and then dried over anhydrous sodium sulfate, and the solvent was removed by distillation to obtain 34.46 parts by mass of Compound B.

After dissolving 28.25 parts by mass of Compound B in 254.25 parts by mass of methanol, 23.34 parts by mass of triphenylsulfonium bromide was added thereto, followed by stirring at room temperature for 3 hours. The solvent was removed by distillation and after adding distilled water, the mixture was extracted with chloroform three times. The obtained organic layer was washed with distilled water three times, and the solvent was removed by distillation to obtain 42.07 parts by mass of the target Compound (M-III-1).

M-III-1

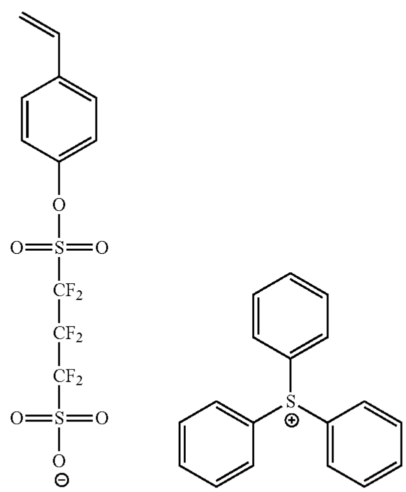

(Synthesis of Resin P-19)

In a nitrogen stream, 31 g of PGMEA was charged into a three-neck flask (Solvent 1) and heated at 85° C. Subsequently, 14 g of M-1-1, 4.4 g of M-11-1 and 9.1 g of M-III-1 were dissolved in 80 g of PGMEA and furthermore, 0.92 g of initiator V-601 (produced by Wako Pure Chemical Industries, Ltd.) was dissolved therein. The resulting solution was added dropwise to (Solvent 1) over 4 hours. After the completion of dropwise addition, the reaction was further allowed to proceed at 85° C. for 2 hours. The reaction solution was allowed to cool and then added dropwise to a solution obtained by mixing 1,700 mL of hexane and 400 mL of ethyl acetate, and the precipitated powder was collected by filtration and dried to obtain 17 g of Resin P-19.

With respect to the obtained Resin P-19, the compositional ratio (molar ratio) of Resin P-19 was calculated by $^{13}$C-NMR measurement. Also, the weight average molecular weight (Mw: in terms of polystyrene), number average molecular weight (Mn: in terms of polystyrene) and polydispersity (Mw/Mn, hereinafter sometimes referred to as "PDI") of Resin P-19 were calculated by GPC (solvent: NMP) measurement. These results are shown in the chemical formulae later.

SYNTHESIS EXAMPLES

Synthesis of Resins (P-2) to (P-18) and (P-20) to (P-46)

Resins (P-2) to (P18) and (P-20) to (P-46) were synthesized by the same method as in Synthesis Examples 1 and 2 except for appropriately changing the polymerizable compound (monomer) used.

Figure 2:
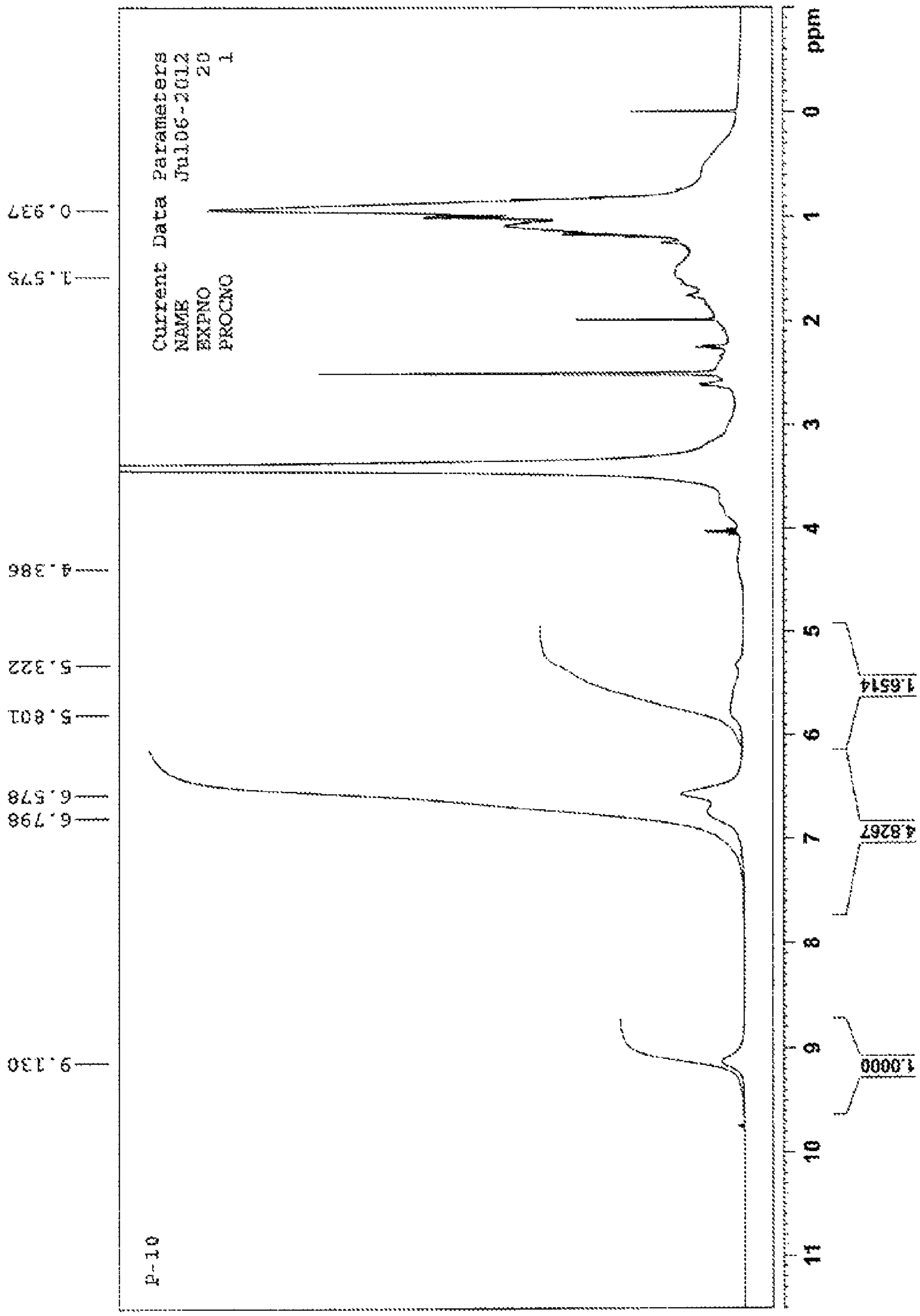
FIG. 2 is a graph showing the $^1$H-NMR spectrum of Resin (P-10).
Figure 3:
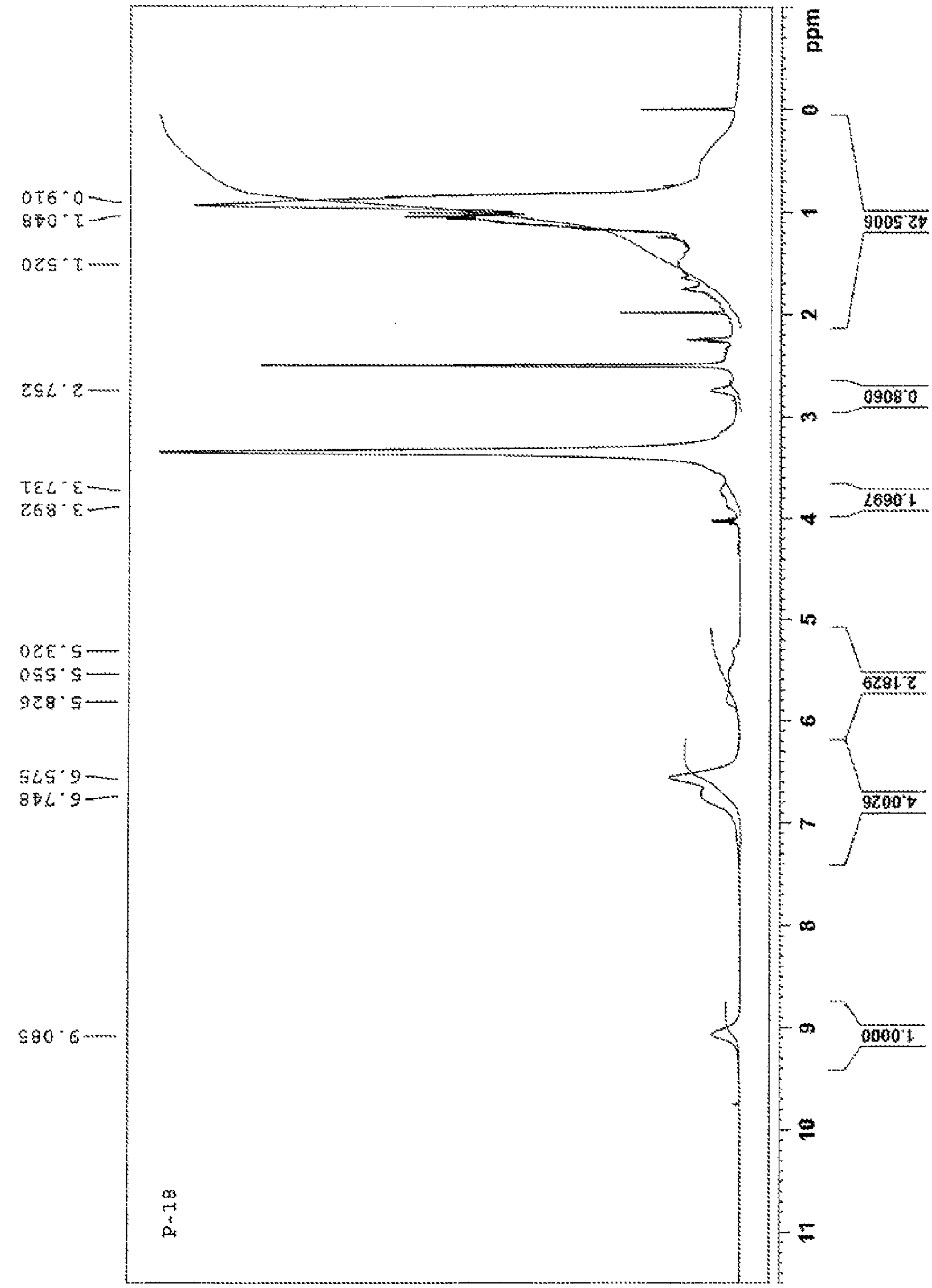
FIG. 3 is a graph showing the $^1$H-NMR spectrum of Resin (P-18).

Among these, FIGS. 1 to 3 shows, as the identification data, the $^1$H-NMR spectra of Resins (P-3), (P-10) and (P-18) synthesized.

The polymer structure, weight average molecular weight (Mw) and polydispersity (Mw/Mn) (PDI) of each of Resins (P-1) to (P-46) are shown below. Also, the compositional ratio of respective repeating units in the polymer structure is shown by molar ratio.

P-1

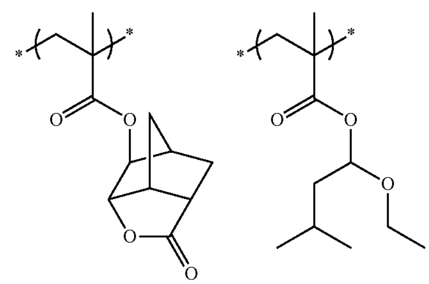

Compositional ratio 30/70
Mw 9200
PDI 1.55

P-2

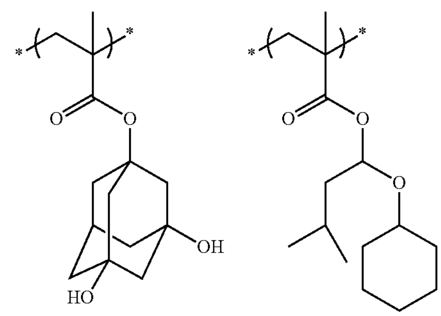

Compositional ratio 15/85
Mw 9900
PDI 1.55

P-3

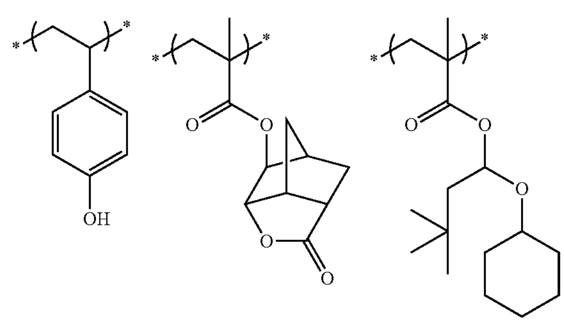

Compositional ratio 30/10/60
Mw 11000
PDI 1.59

-continued
P-4
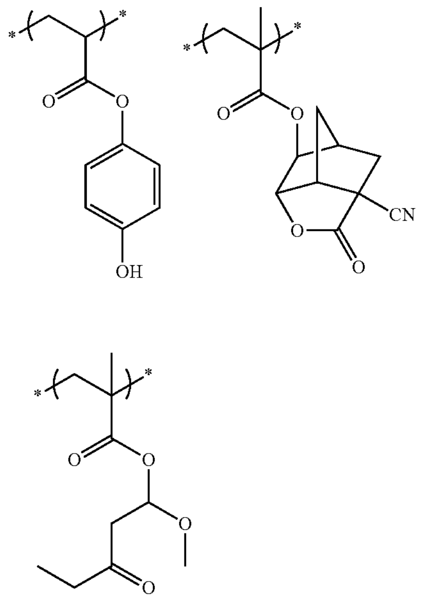
Compositional ratio 35/5/60
Mw 8200
PDI 1.43
P-5
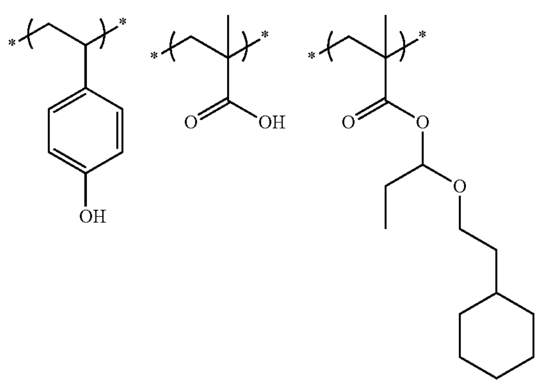
Compositional ratio 30/5/65
Mw 8500
PDI 1.50
P-6
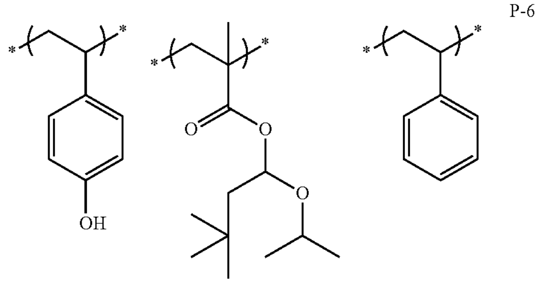
Compositional ratio 28/62/10
Mw 7200
PDI 1.70
-continued
P-7
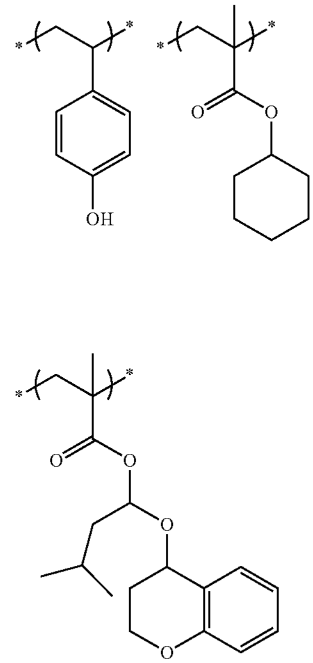
Compositional ratio 20/70/10
Mw 9600
PDI 1.53
P-8
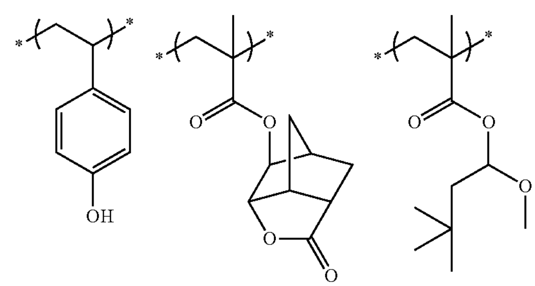
Compositional ratio 24/8/68
Mw 15600
PDI 1.56
P-9
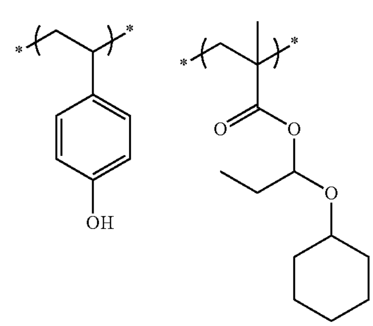

-continued
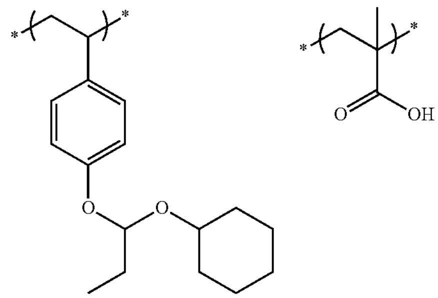
Compositional ratio 20/63/12/5
Mw 11100
PDI 1.70
P-10
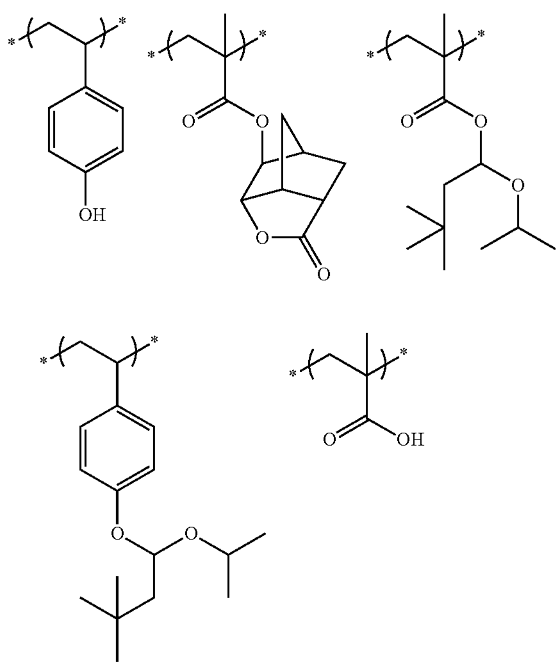
Compositional ratio 30/10/50/5/5
Mw 7900
PDI 1.42
P-11
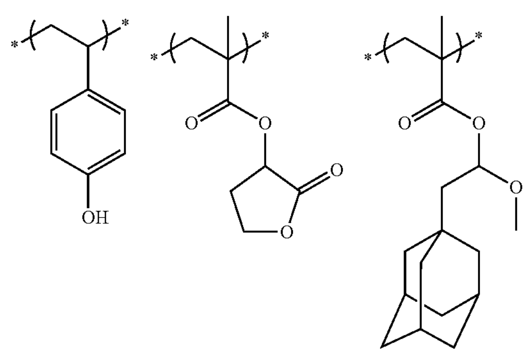
Compositional Ratio 30/10/60
Mw 6200
PDI 1.55
-continued
P-12
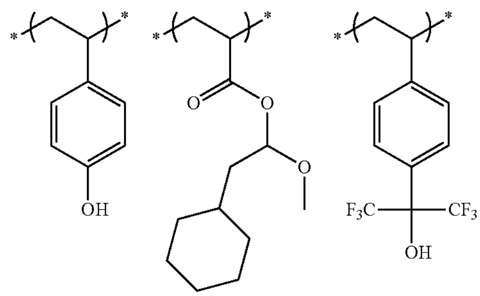
Compositional Ratio 20/50/30
Mw 10200
PDI 1.88
P-13
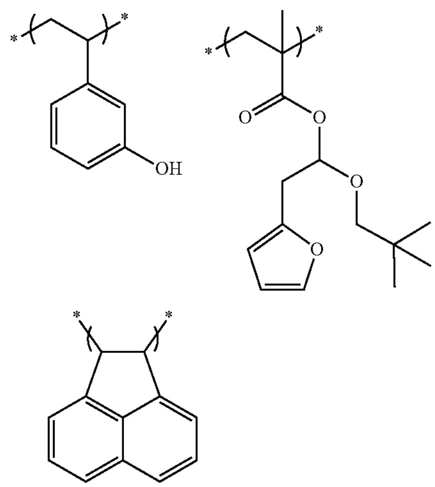
Compositional Ratio 20/70/10
Mw 8400
PDI 1.39
P-14
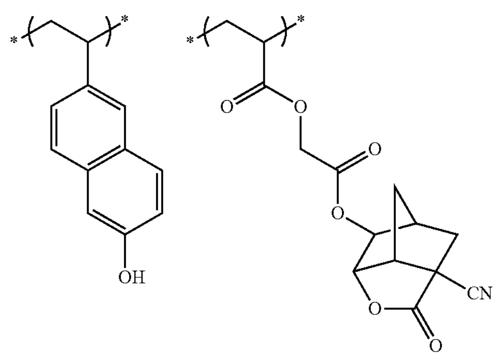
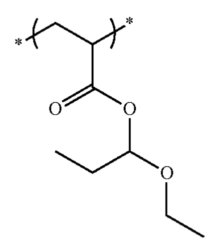
Compositional Ratio 40/5/55
Mw 11300
PDI 1.70

P-15
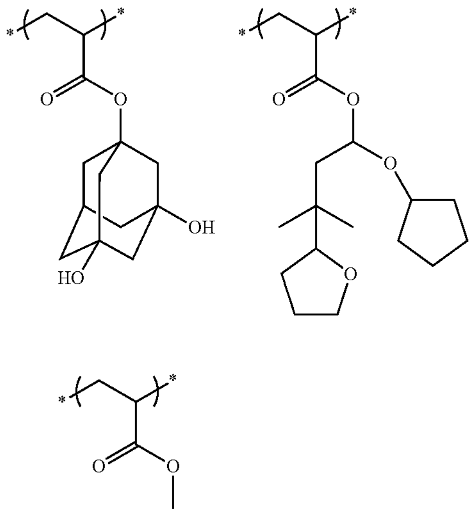
Compositional Ratio 15/70/15
Mw 16500
PDI 1.66
P-16
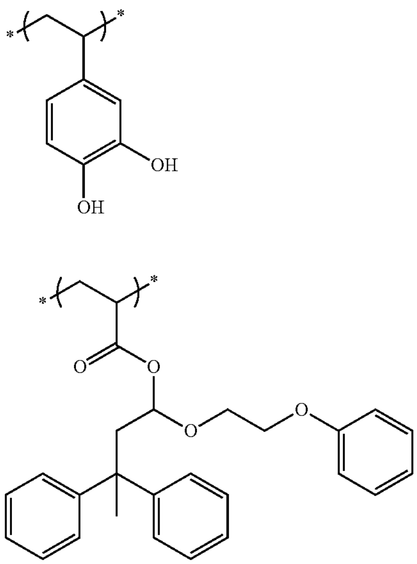
Compositional Ratio 30/70
Mw 25000
PDI 1.89
P-17
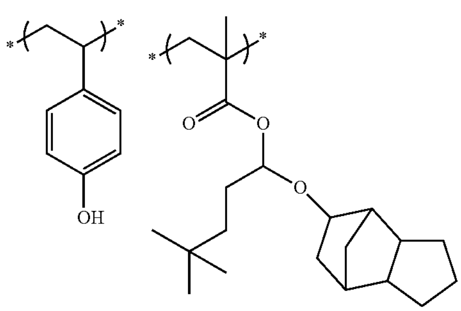
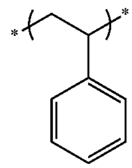
Compositional Ratio 32/59/9
Mw 16000
PDI 2.00
P-18
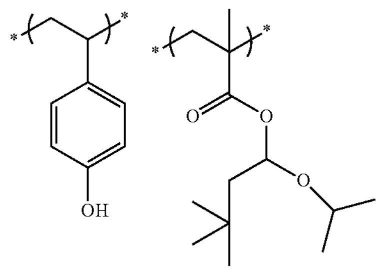
Compositional Ratio 31/69
Mw 16000
PDI 1.65
P-19
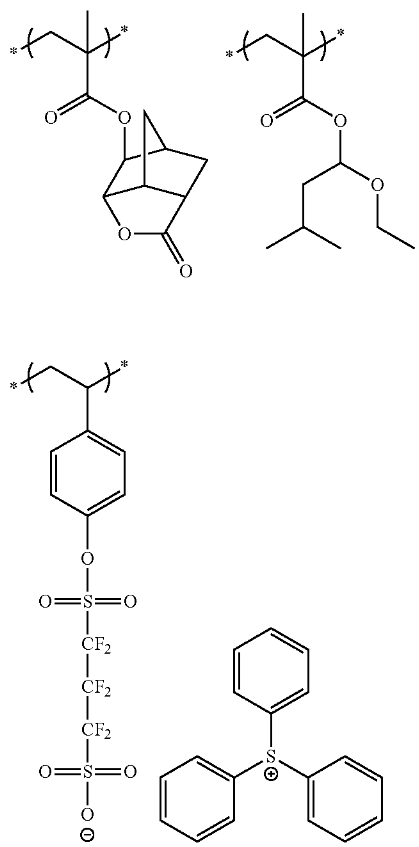
Compositional Ratio 20/70/10
Mw 15600
PDI 1.66

-continued
P-20
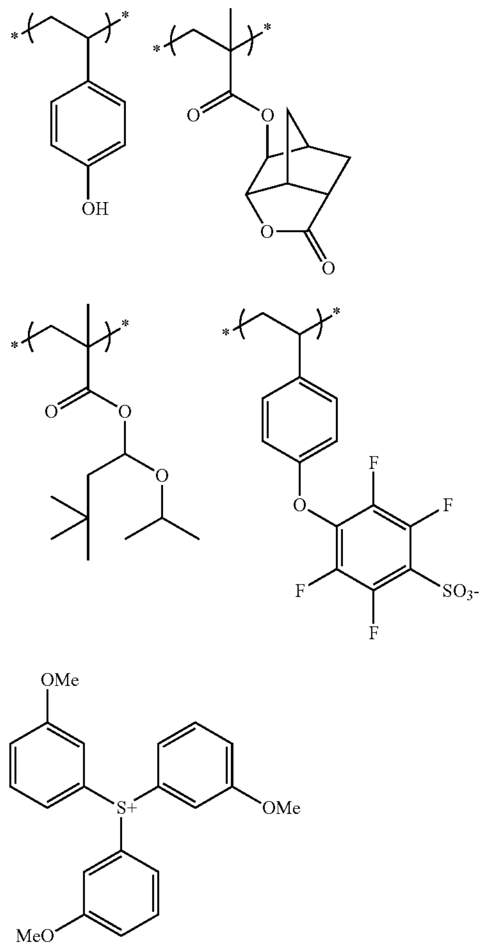
Compositional Ratio 25/5/50/20
Mw 12800
PDI 1.60
P-21
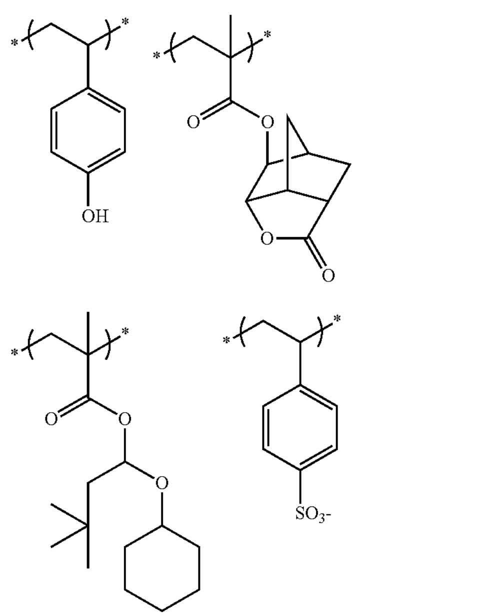
-continued
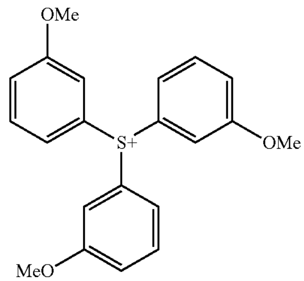
Compositional Ratio 30/10/50/10
Mw 13000
PDI 1.48
P-22
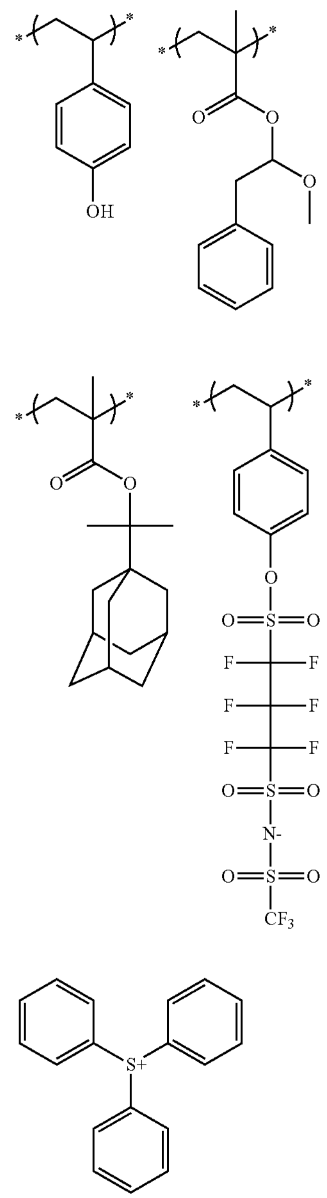
Compositional Ratio 25/60/8/7
Mw 13800
PDI 1.62

-continued
P-23
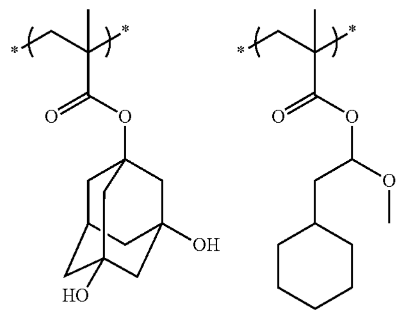
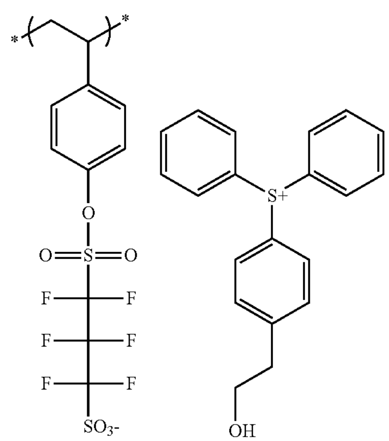
Compositional Ratio 8/65/27
Mw 13000
PDI 1.98
P-24
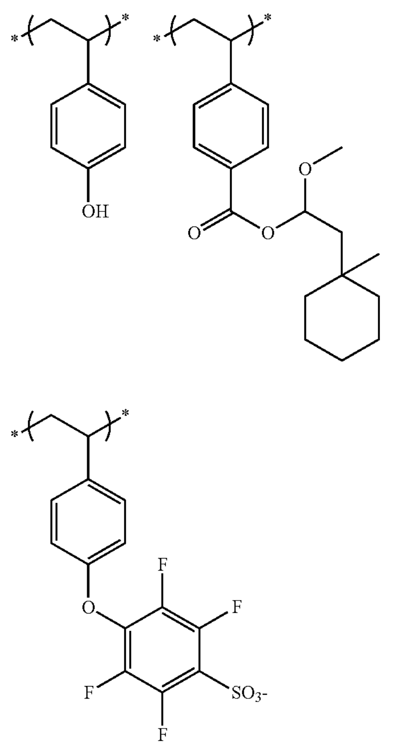
-continued
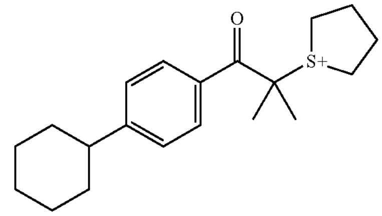
Compositional Ratio 22/69/9
Mw 11000
PDI 1.88
P-25
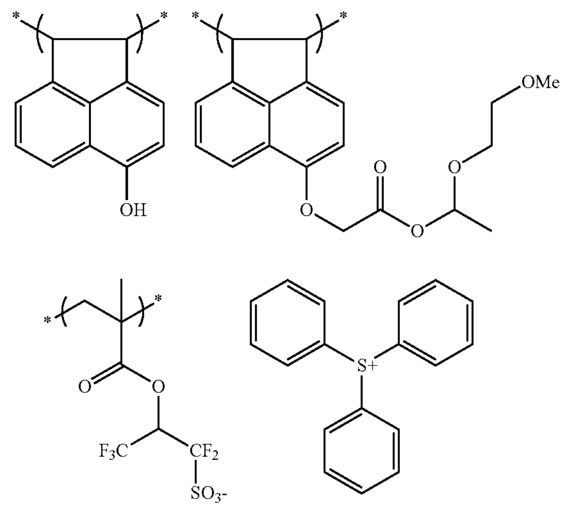
Compositional Ratio 30/55/15
Mw 13800
PDI 1.69
P-26
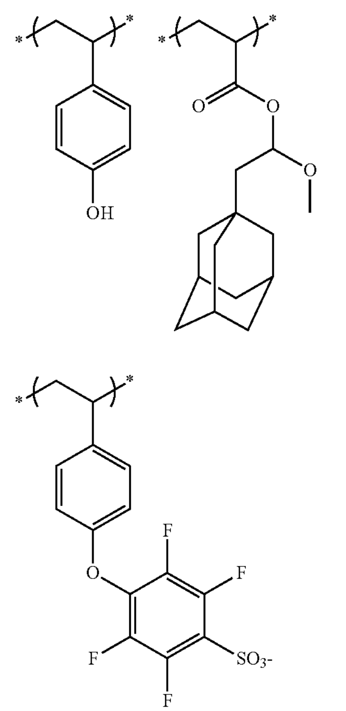

-continued
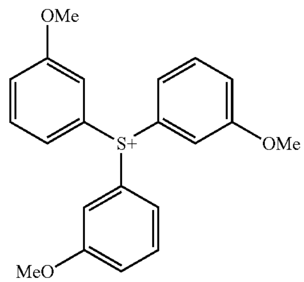
Compositional Ratio 30/55/15
Mw 14000
PDI 1.60
P-27
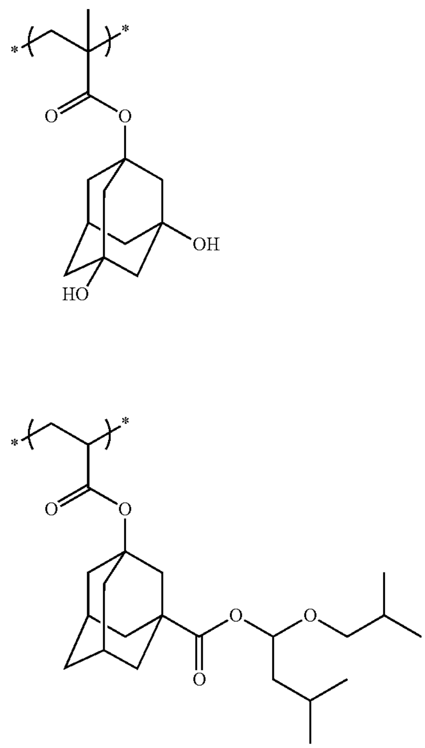
Compositional ratio 20/80
Mw 20000
PDI 1.66
P-28
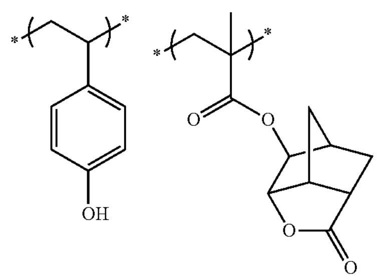
-continued
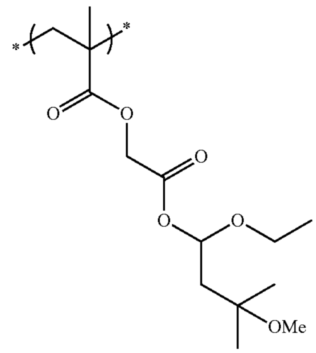
Compositional ratio 25/15/60
Mw 15600
PDI 1.66
P-29
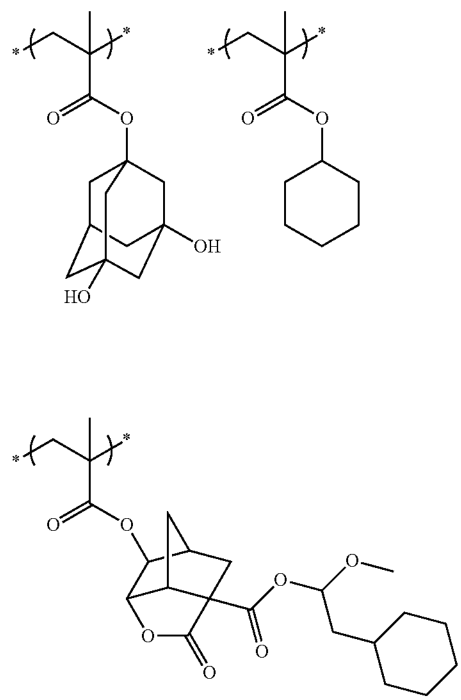
Compositional ratio 25/10/65
Mw 21000
PDI 1.29
P-30
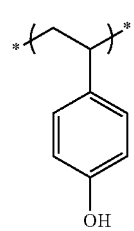

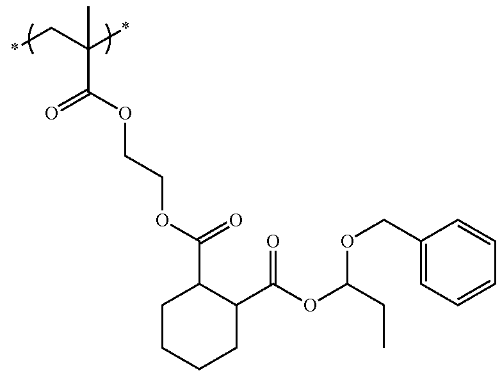
Compositional ratio 30/70
Mw 20000
PDI 1.73
P-31
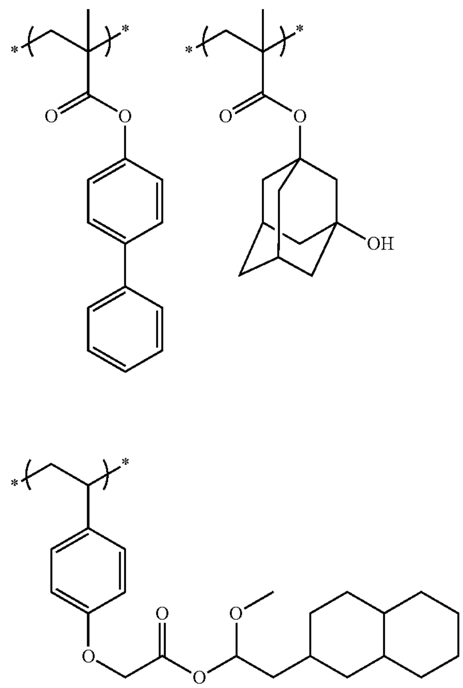
Compositional ratio 10/25/65
Mw 10000
PDI 1.80
P-32
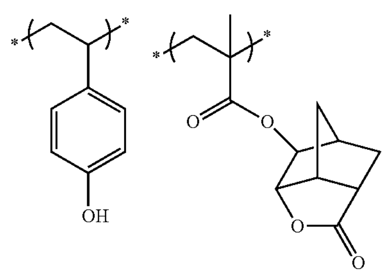
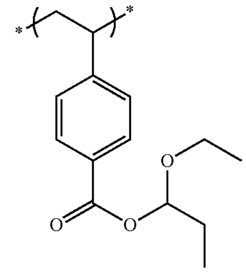
Compositional ratio 30/10/60
Mw 8000
PDI 1.50
P-33
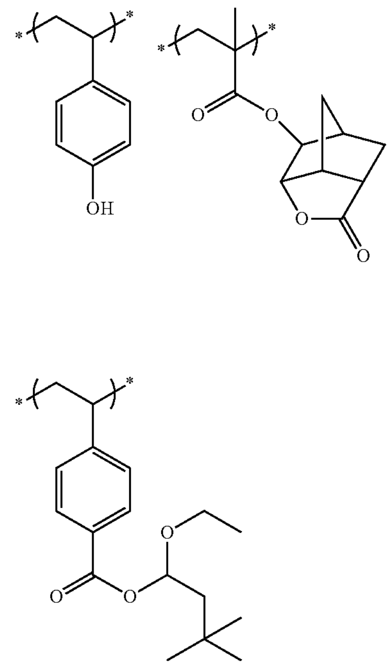
Compositional ratio 22/20/58
Mw 7900
PDI 1.66
P-34
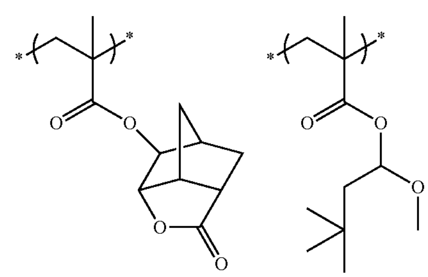
Compositional ratio 25/75
Mw 16000
PDI 1.65

P-35
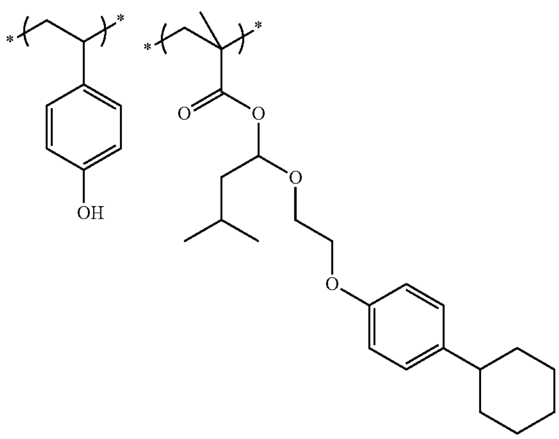
Compositional ratio 85/15
Mw 8200
PDI 1.60
P-36
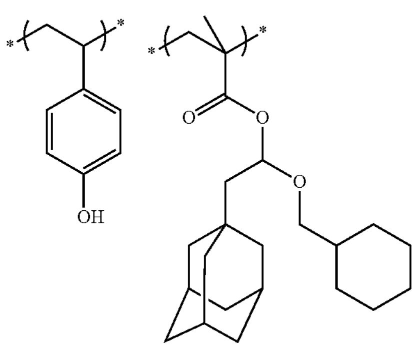
Compositional ratio 75/25
Mw 10000
PDI 1.65
P-37
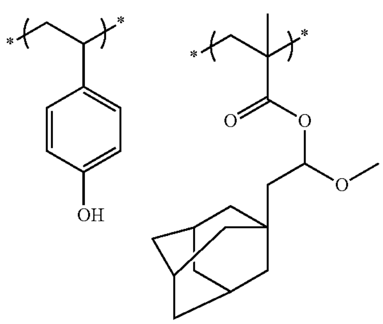
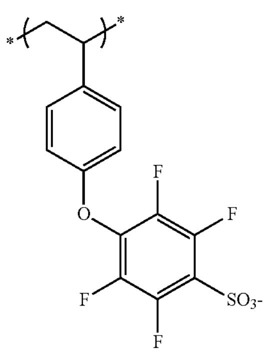
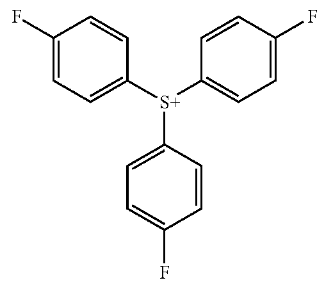
Compositional Ratio 31/64/5
Mw 11200
PDI 1.65
P-38
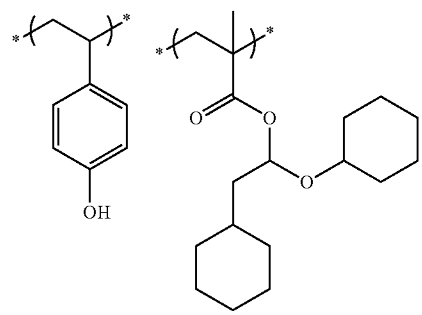
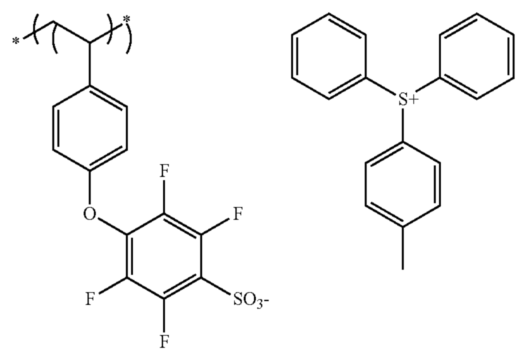
Compositional Ratio 15/75/10
Mw 14300
PDI 1.42
P-39
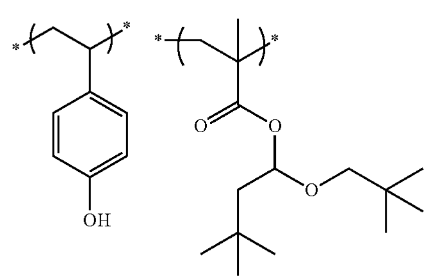

-continued
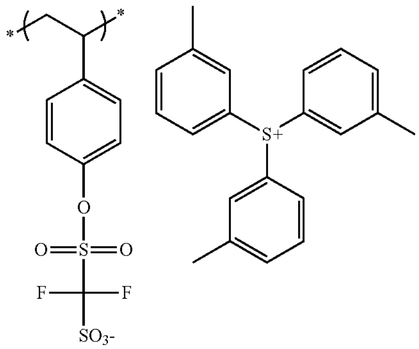
Compositional Ratio 20/73/7
Mw 12500
PDI 1.73
P-40
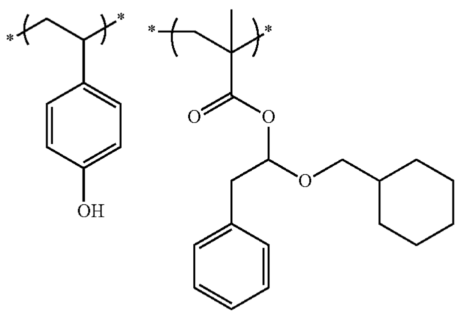
Compositional Ratio 10/79/11
Mw 9800
PDI 1.50
P-41
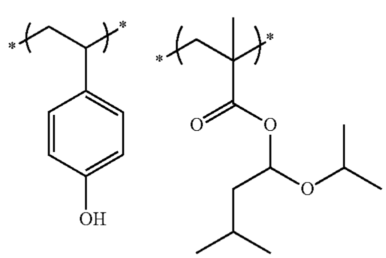
-continued
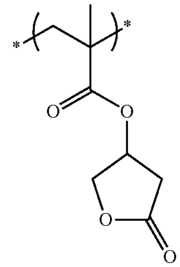
Compositional Ratio 40/48/12
Mw 8800
PDI 1.21
P-42
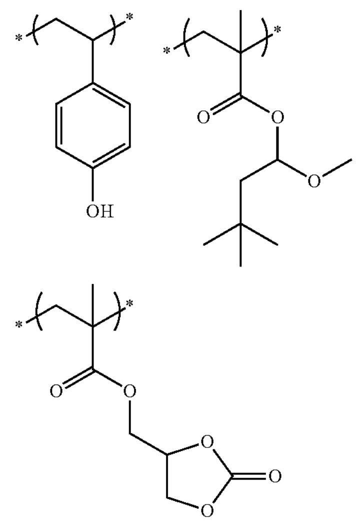
Compositional Ratio 20/73/7
Mw 14200
PDI 1.53
P-43
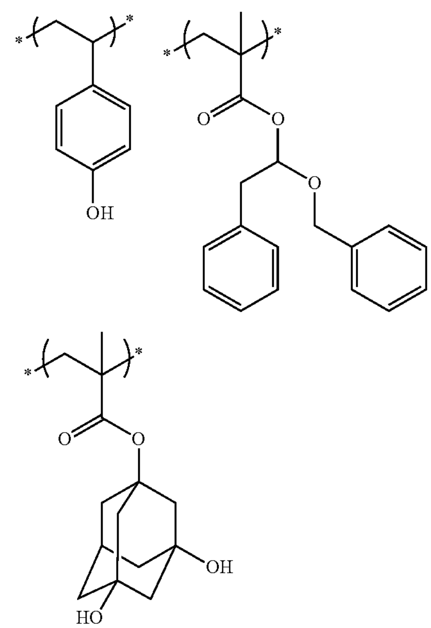
Compositional Ratio 25/61/14
Mw 12500
PDI 1.73

-continued

P-44

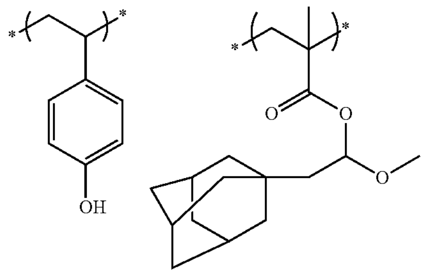

Compositional Ratio 35/65
Mw 7800
PDI 1.34

P-45

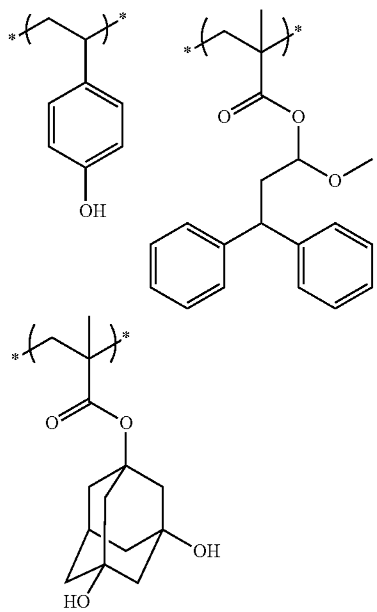

Compositional Ratio 20/73/7
Mw 10200
PDI 1.56

P-46

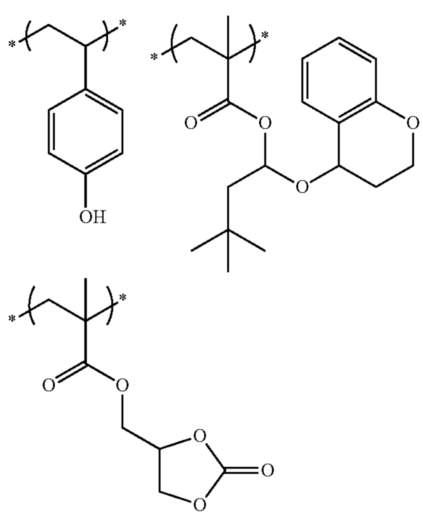

Compositional Ratio 41/51/8
Mw 9600
PDI 1.37

Resins (Q-1) to (Q-5) shown below were used as the combined acid-decomposable resin, and Resins (R-1) to (R-8) were used for Comparative Example. In addition, Resin (HR-24) was used as the hydrophobic resin (HR). The polymer structure, weight average molecular weight (Mw) and polydispersity (Mw/Mn) (PDI) of each of Resins (Q-1) to (Q-5), Resins (R-1) to (R-8) and Resin (HR-24) are shown below. Also, the compositional ratio of respective repeating units in the polymer structure is shown by molar ratio.

Q-1

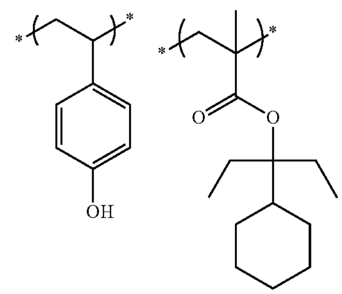

Compositional ratio 30/70
Mw 7900
PDI 1.66

Q-2

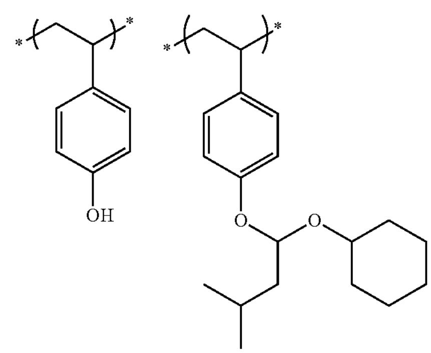

Compositional ratio 60/40
Mw 7900
PDI 1.22

Q-3

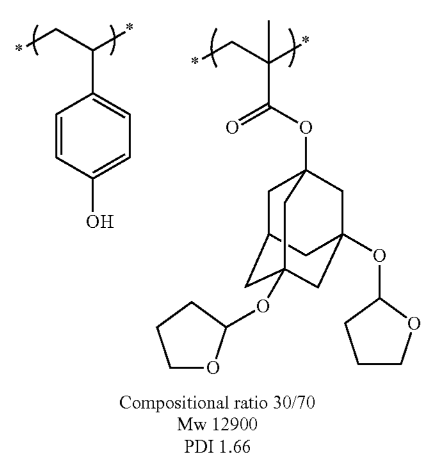

Compositional ratio 30/70
Mw 12900
PDI 1.66

-continued
Q-4
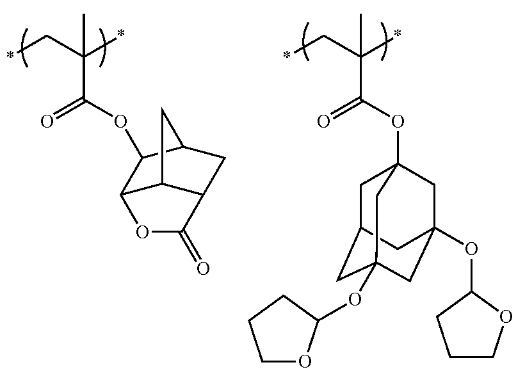
Compositional ratio 30/70
Mw 16300
PDI 1.89
Q-5
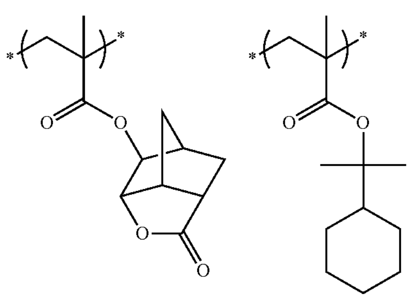
Compositional ratio 30/70
Mw 12600
PDI 1.59
R-1
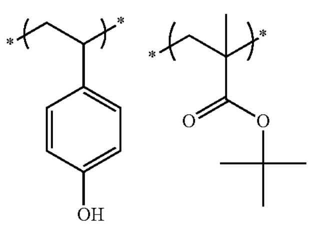
Compositional ratio 30/70
Mw 10000
PDI 1.60
R-2
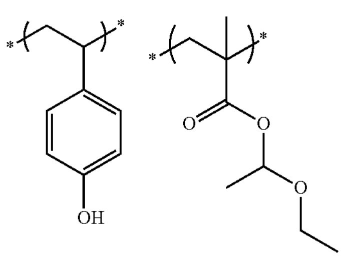
Compositional ratio 35/65
Mw 9200
PDI 1.55
-continued
R-3
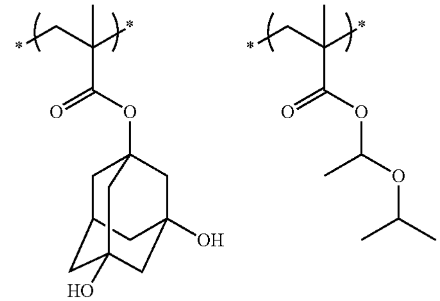
Compositional ratio 20/80
Mw 8900
PDI 1.50
R-4
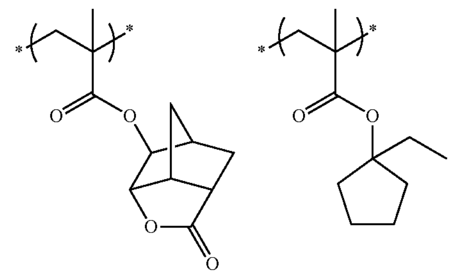
Compositional ratio 40/60
Mw 11000
PDI 1.62
R-5
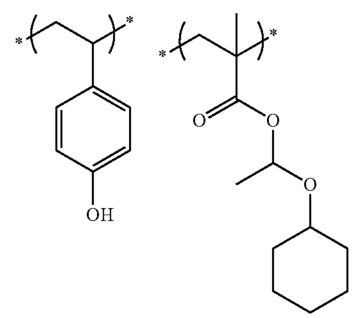
Compositional ratio 60/40
Mw 6500
PDI 1.49
R-6
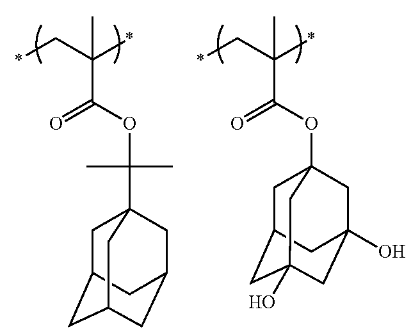

-continued
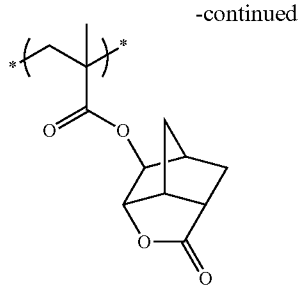
Compositional ratio 50/10/40
Mw 8800
PDI 1.90
R-7
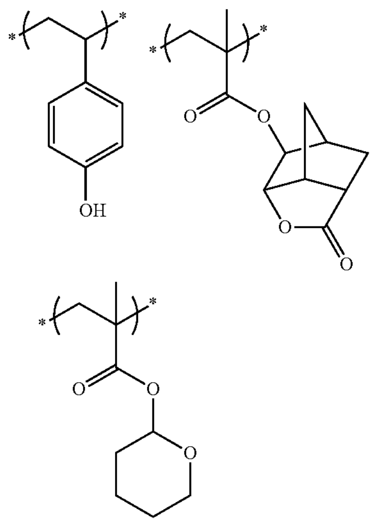
Compositional ratio 20/20/60
Mw 14600
PDI 1.63
R-8
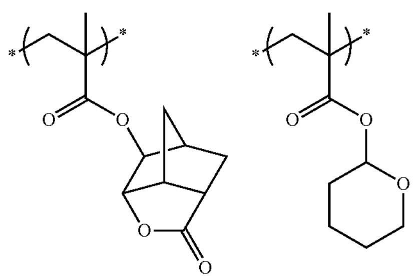
Compositional ratio 42/58
Mw 9600
PDI 1.36
HR-24
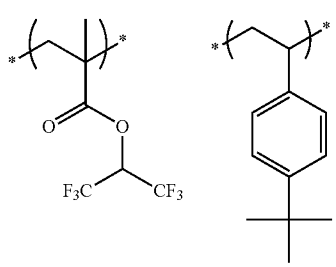
Compositional ratio 72/28
Mw 7800
PDI 1.42
[Photoacid Generator]
As the photoacid generator, the compounds represented by the following formulae were used.
PAG-1
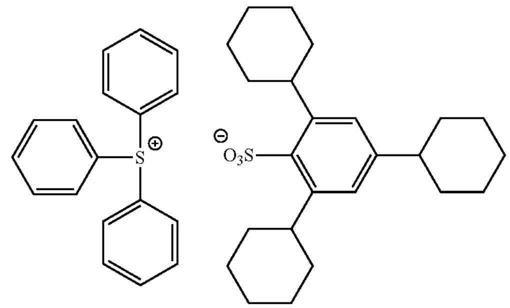
PAG-2
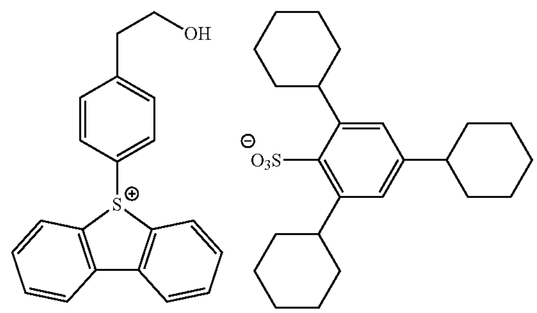
PAG-3
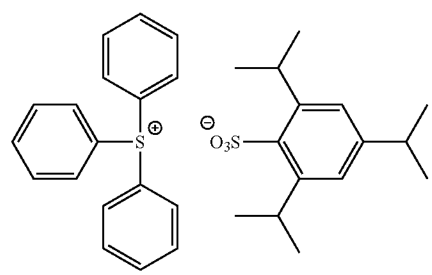
PAG-4
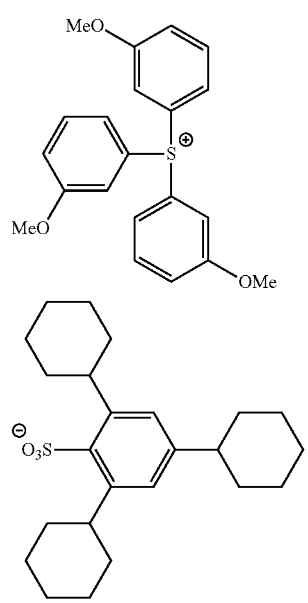

-continued
PAG-5
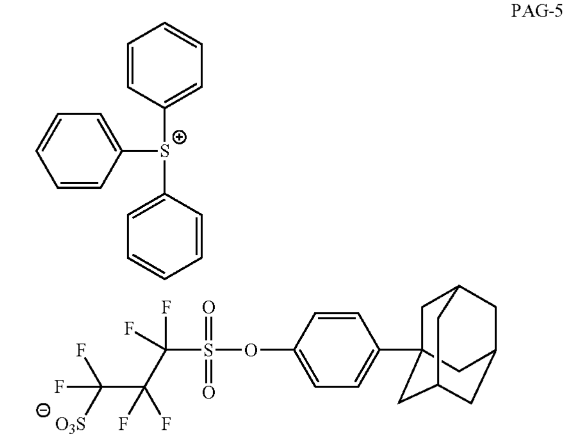
PAG-6
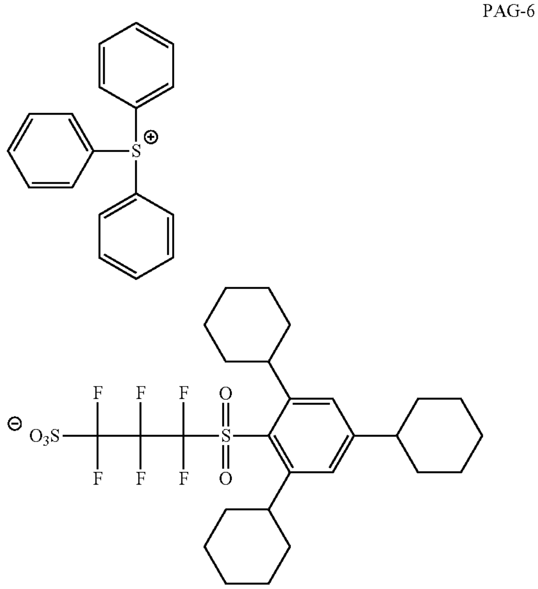
PAG-7
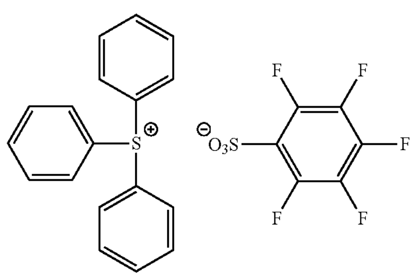
PAG-8
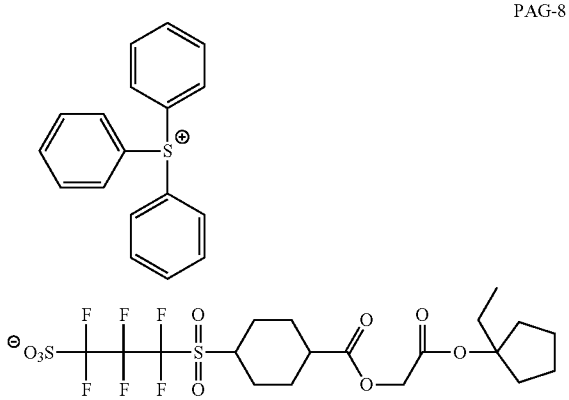
-continued
PAG-9
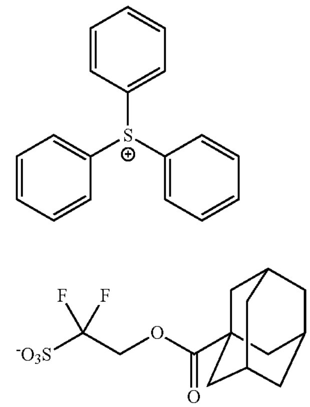
PAG-10
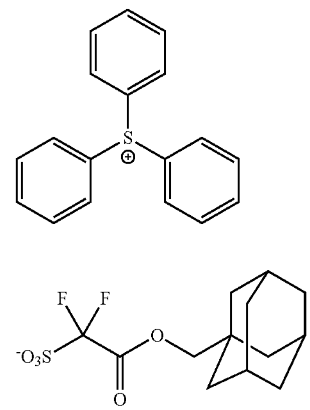
PAG-11
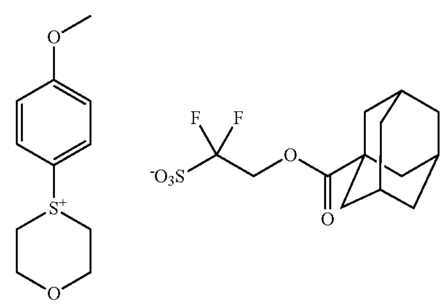
PAG-12
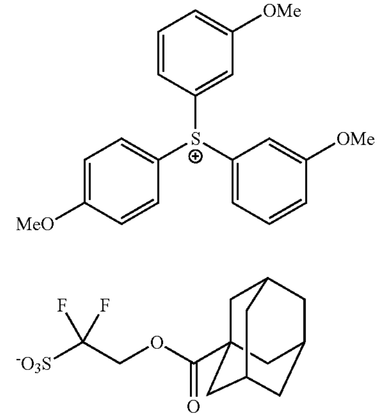

-continued
PAG-13
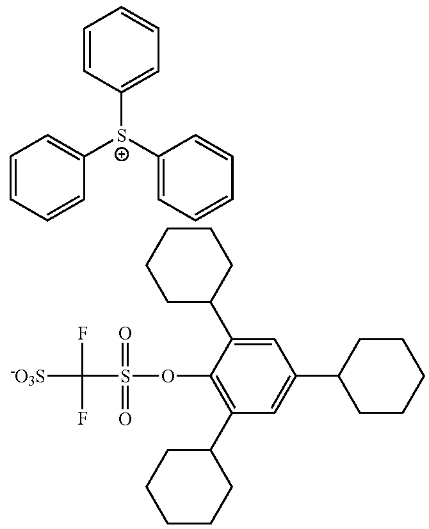
PAG-14
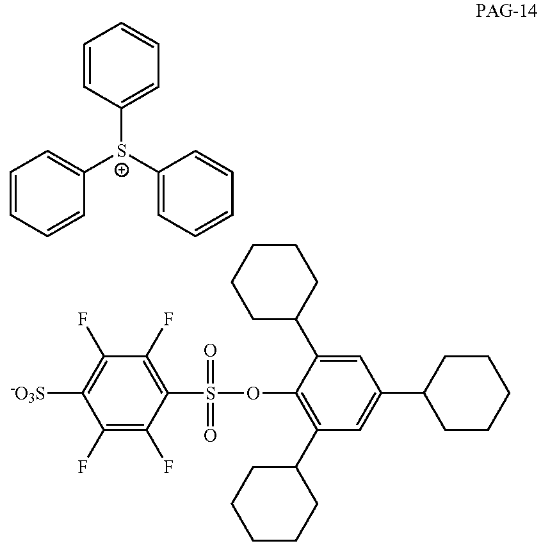
PAG-15
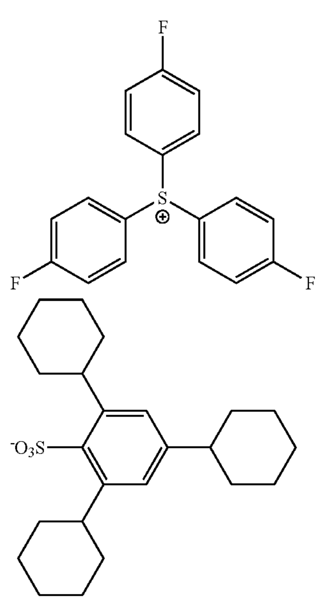
[Basic Compound]
As the basic compound, any one of the following compounds (N-1) to (N-11) was used.
N-1
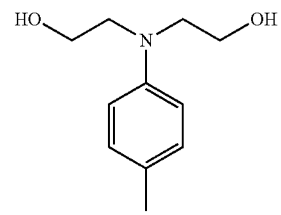
N-2
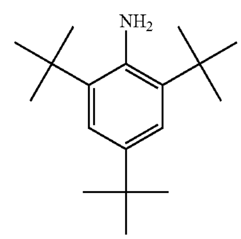
N-3
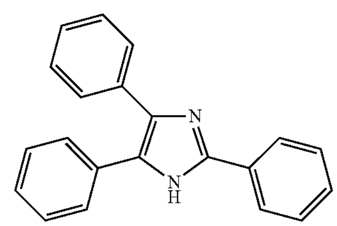
N-4
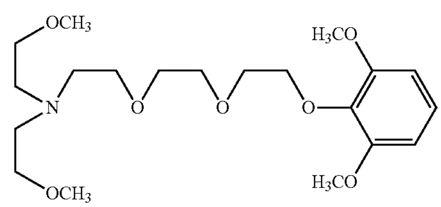
N-5
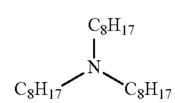
N-6
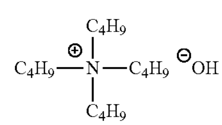
N-7
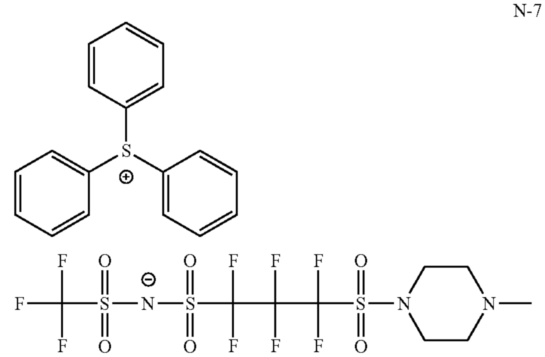

-continued

N-8

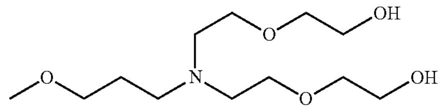

N-9

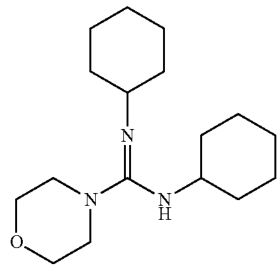

N-10

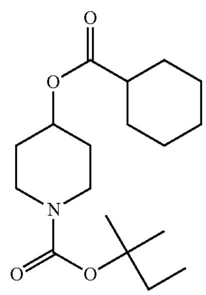

N-11

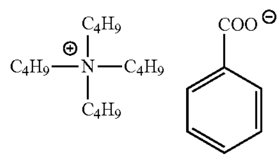

Compound (N-7) comes under the compound (PA) and was synthesized based on the description in paragraph [0354] of JP-A-2006-330098.

[Surfactant and Solvent]

As the surfactant, the following W-1 to W-3 were used.

W-1: Megaface R08 (produced by DIC Corporation, containing fluorine and silicon)

W-2: Polysiloxane Polymer KP-341 (produced by Shin-Etsu Chemical Co., Ltd.; silicon-containing)

W-3: Troysol S-366 (produced by Troy Chemical; fluorine-containing)

As the solvent, the following S1 to S4 were appropriately mixed and used.

S1: Propylene glycol monomethyl ether acetate (PGMEA; b.p.=146° C.)

S2: Propylene glycol monomethyl ether (PGME; b.p.=120° C.)

S3: Methyl lactate (b.p.=145° C.)

S4: Cyclohexanone (b.p.=157° C.)

<Developer>

As the developer, the followings were used.

SG-1: 2-Nonanone

SG-2: Methyl amyl ketone

SG-3: Butyl acetate

<Rinsing Solution>

As the rinsing solution, the followings were used.

SR-1: 4-Methyl-2-pentanol

SR-2: 1-Hexanol

SR-3: Methyl isobutyl carbinol

Examples 1-1 to 1-47 and Comparative Examples 1-1 and 1-2

Electron Beam (EB) Exposure (1) Preparation and Coating of Coating Solution of Actinic Ray-Sensitive or Radiation-Sensitive Resin Composition A coating solution composition having a solid content concentration of 2.5 mass % according to the formulation shown in the Table below was microfiltered through a membrane filter having a pore size of 0.1 μm to obtain an actinic ray-sensitive or radiation-sensitive resin composition (resist composition) solution.

This actinic ray-sensitive or radiation-sensitive resin composition solution was coated on a 6-inch Si wafer previously subjected to a hexamethyldisilazane (HMDS) treatment, by using a spin coater, Mark 8, manufactured by Tokyo Electron Ltd. and dried on a hot plate at 100° C. for 60 seconds to obtain a resist film having a thickness of 50 nm.

(2) EB Exposure and Development

The resist film-coated wafer obtained in (1) above was patternwise irradiated by using an electron beam lithography apparatus (HL750, manufactured by Hitachi, Ltd., accelerating voltage: 50 KeV). At this time, the lithography was performed to form a 1:1 line-and-space pattern. After the electron beam lithography, the wafer was heated on a hot plate at 110° C. for 60 seconds, then developed by puddling the organic developer shown in the Table below for 30 seconds, rinsed by using the rinsing solution shown in the Table below, spun at a rotation speed of 4,000 rpm for 30 seconds and heated at 90° C. for 60 seconds to obtain a 1:1 line-and-space pattern having a line width of 100 nm.

(3) Evaluation of Resist Pattern

Using a scanning electron microscope (S-9220, manufacture by Hitachi Ltd.), the obtained resist pattern was evaluated for sensitivity, resolution and isolated space resolution by the following methods. The results obtained are shown in the Table below.

(3-1) Sensitivity

The irradiation energy below which a 1:1 line-and-space pattern having a line width of 100 nm cannot be resolved was taken as the sensitivity (Eop). A smaller value indicates higher performance.

(3-2) Resolution

The minimum line width below which the line-and-space (1:1) pattern at the Eop above cannot be separated was taken as the resolution. A smaller value indicates higher performance.

(3-3) Isolated Space Resolution (EB)

The limiting resolution (the minimum space width below which a line and a space cannot be separated and resolved) of an isolated pattern (line:space=100:1) at the irradiation dose giving the sensitivity above was determined. This value was taken as "isolated space resolution (nm)".

TABLE 1

| | Acid-Decomposable Resin (mass %) | Photoacid Generator (mass %) | Basic Compound (mass %) | Solvent (mass ratio) | Surfactant (mass %) | Developer | Rinsing Solution | Resolution (nm) | Sensitivity (μC/cm²) | Isolated Space Resolution (nm) |
|---|---|---|---|---|---|---|---|---|---|---|
| Example 1-1 | P-1<br>77.99 | PAG-4<br>20 | N-1<br>2 | S1/S2<br>80/20 | W-3<br>0.01 | SG-3 | SR-3 | 50 | 19.6 | 75.0 |
| Example 1-2 | P-2<br>75.99 | PAG-12<br>20 | N-1<br>4 | S1/S2<br>80/20 | W-3<br>0.01 | SG-3 | SR-1 | 50 | 19.6 | 87.5 |
| Example 1-3 | P-3<br>77.99 | PAG-1<br>20 | N-1<br>2 | S1/S2<br>80/20 | W-3<br>0.01 | SG-3 | — | 37.5 | 16.9 | 62.5 |
| Example 1-4 | P-3<br>77.99 | PAG-1<br>20 | N-1<br>2 | S1/S2<br>80/20 | W-3<br>0.01 | SG-2 | — | 37.5 | 19.2 | 50.0 |
| Example 1-5 | P-3<br>77.99 | PAG-12<br>20 | N-1<br>2 | S1/S2<br>80/20 | W-3<br>0.01 | SG-3 | — | 37.5 | 17.9 | 37.5 |
| Example 1-6 | P-4<br>77.99 | PAG-9<br>20 | N-1<br>2 | S1/S2<br>80/20 | W-3<br>0.01 | SG-3 | — | 50 | 19.6 | 75.0 |
| Example 1-7 | P-5<br>87.99 | PAG-1<br>10 | N-9<br>2 | S1/S2<br>80/20 | W-3<br>0.01 | SG-3 | — | 62.5 | 24.2 | 87.5 |
| Example 1-8 | P-6<br>77.99 | PAG-9<br>20 | N-1<br>2 | S1/S2<br>80/20 | W-3<br>0.01 | SG-3 | — | 37.5 | 15.5 | 62.5 |
| Example 1-9 | P-7<br>77.99 | PAG-4<br>20 | N-8<br>2 | S1/S2<br>80/20 | W-3<br>0.01 | SG-3 | — | 50 | 24.5 | 75.0 |
| Example 1-10 | P-8<br>77.99 | PAG-6<br>20 | N-3<br>2 | S1/S2<br>80/20 | W-2<br>0.01 | SG-3 | — | 37.5 | 25.1 | 62.5 |
| Example 1-11 | P-8<br>77.99 | PAG-9<br>20 | N-1<br>2 | S1/S2<br>80/20 | W-3<br>0.01 | SG-3 | — | 37.5 | 17.9 | 62.5 |
| Example 1-12 | P-8<br>77.99 | PAG-9<br>20 | N-1<br>2 | S1/S2<br>80/20 | W-3<br>0.01 | SG-1 | — | 37.5 | 18.5 | 75.0 |
| Example 1-13 | P-9<br>77.99 | PAG-7<br>20 | N-6<br>2 | S1/S2<br>80/20 | W-3<br>0.01 | SG-3 | — | 62.5 | 20 | 100 |
| Example 1-14 | P-10<br>77.99 | PAG-12<br>20 | N-3<br>2 | S1/S2<br>80/20 | W-2<br>0.01 | SG-3 | — | 37.5 | 18.2 | 62.5 |
| Example 1-15 | P-11<br>77.99 | PAG-12<br>20 | N-8<br>2 | S1/S2<br>80/20 | W-3<br>0.01 | SG-3 | — | 37.5 | 18.2 | 62.5 |
| Example 1-16 | P-12<br>78.99 | PAG-1<br>20 | N-3<br>1 | S1/S2<br>80/20 | W-2<br>0.01 | SG-3 | — | 50 | 20 | 50.0 |
| Example 1-17 | P-13<br>77.99 | PAG-6<br>20 | N-3<br>2 | S1/S2<br>80/20 | W-3<br>0.01 | SG-3 | — | 37.5 | 17.8 | 62.5 |
| Example 1-18 | P-14<br>77.99 | PAG-3<br>20 | N-3<br>2 | S1/S2<br>80/20 | W-3<br>0.01 | SG-3 | — | 62.5 | 24.6 | 62.5 |
| Example 1-19 | P-15<br>77.99 | PAG-6<br>20 | N-3<br>2 | S1/S2<br>80/20 | W-3<br>0.01 | SG-3 | SR-3 | 37.5 | 17.5 | 75.0 |
| Example 1-20 | P-16<br>75.99 | PAG-4<br>20 | N-10<br>4 | S1/S2<br>80/20 | W-3<br>0.01 | SG-3 | — | 37.5 | 17.5 | 62.5 |
| Example 1-21 | P-17<br>77.99 | PAG-2<br>20 | N-4<br>2 | S1/S2<br>80/20 | W-3<br>0.01 | SG-3 | — | 75 | 18.5 | 112.5 |
| Example 1-22 | P-18<br>77.99 | PAG-4<br>20 | N-3<br>2 | S1/S2<br>80/20 | W-2<br>0.01 | SG-3 | — | 37.5 | 17.9 | 62.5 |
| Example 1-23 | P-18<br>77.99 | PAG-9<br>20 | N-3<br>2 | S1/S2<br>80/20 | W-2<br>0.01 | SG-3 | — | 37.5 | 20.3 | 75.0 |
| Example 1-24 | P-18<br>77.99 | PAG-12<br>20 | N-3<br>2 | S1/S2<br>80/20 | W-2<br>0.01 | SG-3 | — | 37.5 | 18.4 | 50.0 |
| Example 1-25 | P-19<br>97.99 | — | N-6<br>2 | S1/S2<br>50/50 | W-3<br>0.01 | SG-3 | SR-3 | 50 | 20.1 | 87.5 |
| Example 1-26 | P-20<br>97.99 | — | N-3<br>2 | S1/S2<br>80/20 | W-3<br>0.01 | SG-3 | — | 37.5 | 18.1 | 62.5 |
| Example 1-27 | P-20<br>97.99 | — | N-3<br>2 | S1/S2<br>80/20 | W-3<br>0.01 | SG-2 | — | 37.5 | 20.6 | 75.0 |
| Example 1-28 | P-21<br>97.99 | — | N-2<br>2 | S1/S2<br>80/20 | W-3<br>0.01 | SG-3 | — | 37.5 | 18.4 | 75.0 |
| Example 1-29 | P-21<br>98.99 | — | N-2<br>1 | S1/S2<br>80/20 | W-3<br>0.01 | SG-1 | — | 37.5 | 21.3 | 62.5 |
| Example 1-30 | P-22<br>97.99 | — | N-6<br>2 | S1/S2<br>80/20 | W-3<br>0.01 | SG-3 | — | 50 | 20 | 87.5 |
| Example 1-31 | P-23<br>97.99 | — | N-3<br>2 | S1/S2<br>80/20 | W-3<br>0.01 | SG-3 | — | 50 | 20.3 | 75.0 |
| Example 1-32 | P-24<br>97.99 | — | N-6<br>2 | S1/S2<br>50/50 | W-3<br>0.01 | SG-3 | — | 37.5 | 17.8 | 62.5 |
| Example 1-33 | P-25<br>97.99 | — | N-3<br>2 | S1/S2<br>80/20 | W-3<br>0.01 | SG-3 | — | 62.5 | 21.9 | 100 |
| Example 1-34 | P-26<br>97.99 | — | N-8<br>2 | S1/S2<br>80/20 | W-3<br>0.01 | SG-3 | — | 37.5 | 18.1 | 62.5 |
| Example 1-35 | P-26<br>97.99 | — | N-8<br>2 | S1/S2<br>80/20 | W-3<br>0.01 | SG-3 | — | 37.5 | 18.5 | 62.5 |
| Example 1-36 | P-27<br>77.99 | PAG-10<br>20 | N-4<br>2 | S1/S2<br>80/20 | W-3<br>0.01 | SG-3 | SR-3 | 62.5 | 21.3 | 87.5 |
| Example 1-37 | P-28<br>77.99 | PAG-4<br>20 | N-6<br>2 | S1/S2<br>80/20 | W-3<br>0.01 | SG-3 | — | 50 | 17.9 | 75.0 |

TABLE 1-continued

| | Acid-Decomposable Resin (mass %) | Photoacid Generator (mass %) | Basic Compound (mass %) | Solvent (mass ratio) | Surfactant (mass %) | Developer | Rinsing Solution | Resolution (nm) | Sensitivity ($\mu C/cm^2$) | Isolated Space Resolution (nm) |
|---|---|---|---|---|---|---|---|---|---|---|
| Example 1-38 | P-29<br>77.99 | PAG-1<br>20 | N-6<br>2 | S1/S2<br>80/20 | W-3<br>0.01 | SG-3 | — | 62.5 | 18.4 | 87.5 |
| Example 1-39 | P-30<br>77.99 | PAG-1<br>20 | N-6<br>2 | S1/S2<br>50/50 | W-3<br>0.01 | SG-3 | — | 75 | 23.5 | 112.5 |
| Example 1-40 | P-31<br>77.99 | PAG-6<br>20 | N-6<br>2 | S1/S2<br>50/50 | W-3<br>0.01 | SG-3 | — | 62.5 | 20.2 | 75.0 |
| Example 1-41 | P-32<br>77.99 | PAG-11<br>20 | N-6<br>2 | S1/S2<br>50/50 | W-3<br>0.01 | SG-3 | — | 75 | 21.3 | 112.5 |
| Example 1-42 | P-33<br>77.99 | PAG-10<br>20 | N-3<br>2 | S1/S2<br>80/20 | W-3<br>0.01 | SG-3 | — | 50 | 20.3 | 75.0 |
| Example 1-43 | P-34<br>77.99 | PAG-9<br>20 | N-6<br>2 | S1/S2<br>50/50 | W-3<br>0.01 | SG-3 | — | 37.5 | 18.1 | 62.5 |
| Example 1-44 | P-34/Q-3<br>57.99/20 | PAG-9<br>20 | N-6<br>2 | S1/S2<br>50/50 | W-3<br>0.01 | SG-3 | — | 75 | 22.3 | 87.5 |
| Example 1-45 | P-34<br>77.99 | PAG-6/<br>PAG-9<br>10/10 | N-6<br>2 | S1/S2<br>50/50 | W-3<br>0.01 | SG-3 | — | 62.5 | 18.2 | 62.5 |
| Example 1-46 | P-34<br>78 | PAG-9<br>20 | N-6<br>2 | S1/S2<br>50/50 | None | SG-3 | — | 75 | 19.9 | 75 |
| Example 1-47 | P-35<br>77.99 | PAG-1<br>20 | N-6<br>2 | S1/S2<br>50/50 | W-3<br>0.01 | SG-3 | — | 62.5 | 17 | 75 |
| Comparative Example 1-1 | R-1<br>77.99 | PAG-4<br>20 | N-6<br>2 | S1/S2<br>80/20 | W-3<br>0.01 | SG-3 | — | 100 | 40.4 | not resolved |
| Comparative Example 1-2 | R-2<br>77.99 | PAG-4<br>20 | N-6<br>2 | S1/S2<br>80/20 | W-3<br>0.01 | SG-3 | — | 100 | 41.1 | not resolved |

As apparent from the results shown in the Table above, in Comparative Examples 1-1 and 1-2 where the acid-decomposable resin does not contain a repeating unit represented by formula (1), the resolution and sensitivity were poor and an isolated space could not be resolved.

On the other hand, in all of Examples 1- to 1-47 using the resin (P) containing a repeating unit represented by formula (1), the resolution and sensitivity were excellent and the resolution in an isolated space was also excellent.

Examples 2-1 to 2-59 and Comparative Examples 2-1 and 2-2

Extreme Ultraviolet Ray (EUV) Exposure (1) Preparation and Coating of Coating Solution of Actinic Ray-Sensitive or Radiation-Sensitive Resin Composition A coating solution composition having a solid content concentration of 1.5 mass % according to the formulation shown in the Table below was microfiltered through a membrane filter having a pore size of 0.05 μm to obtain an actinic ray-sensitive or radiation-sensitive resin composition (resist composition) solution.

This actinic ray-sensitive or radiation-sensitive resin composition solution was coated on a 6-inch Si wafer previously subjected to a hexamethyldisilazane (HMDS) treatment, by using a spin coater, Mark 8, manufactured by Tokyo Electron Ltd. and dried on a hot plate at 100° C. for 60 seconds to obtain a resist film having a thickness of 50 nm.

(2) EUV Exposure and Development

The resist film-coated wafer obtained in (1) above was patternwise exposed through an exposure mask (line/space=1/1) by using an EUV exposure apparatus (Micro Exposure Tool, manufactured by Exitech, NA: 0.3, Quadrupole, outer sigma: 0.68, inner sigma: 0.36). After the irradiation, the wafer was heated on a hot plate at 110° C. for 60 seconds, then developed by puddling the organic developer shown in the Table below for 30 seconds, rinsed by using the rinsing solution shown in the Table below, spun at a rotation speed of 4,000 rpm for 30 seconds and baked at 90° C. for 60 seconds to obtain a 1:1 line-and-space pattern having a line width of 50 nm.

(3) Evaluation of Resist Pattern

Using a scanning electron microscope (S-9380II, manufacture by Hitachi Ltd.), the obtained resist pattern was evaluated for sensitivity, resolution and isolated space resolution by the following methods. The results obtained are shown in the Table below.

(3-1) Sensitivity

The irradiation energy below which a 1:1 line-and-space pattern having a line width of 50 nm cannot be resolved was taken as the sensitivity (Eop). A smaller value indicates higher performance.

(3-2) Resolution

The minimum line width below which the line-and-space (1:1) pattern at the Eop above cannot be separated was taken as the resolution. A smaller value indicates higher performance.

(3-3) Isolated Space Resolution (EUV)

The limiting resolution (the minimum space width below which a line and a space cannot be separated and resolved) of an isolated pattern (line:space=5:1) at the irradiation dose giving the sensitivity above was determined. This value was taken as "isolated space resolution (nm)".

TABLE 2

| | Acid-Decomposable Resin (mass %) | Photoacid Generator (mass %) | Basic Compound (mass %) | Solvent (mass ratio) | Surfactant (mass %) | Developer | Rinsing Solution | Resolution (nm) | Sensitivity (mJ/cm$^2$) | Isolated Space Resolution (nm) |
|---|---|---|---|---|---|---|---|---|---|---|
| Example 2-1 | P-1<br>62.95 | PAG-4<br>35 | N-1<br>2 | S1/S2<br>80/20 | W-3<br>0.05 | SG-3 | SR-3 | 28 | 13.1 | 28 |
| Example 2-2 | P-2<br>60.95 | PAG-12<br>35 | N-1<br>4 | S1/S2<br>80/20 | W-3<br>0.05 | SG-3 | SR-1 | 24 | 13.1 | 28 |
| Example 2-3 | P-3<br>62.95 | PAG-1<br>35 | N-1<br>2 | S1/S2<br>80/20 | W-3<br>0.05 | SG-3 | — | 24 | 10.4 | 26 |
| Example 2-4 | P-3<br>62.95 | PAG-1<br>35 | N-1<br>2 | S1/S2<br>80/20 | W-3<br>0.05 | SG-2 | — | 24 | 12.7 | 28 |
| Example 2-5 | P-3<br>62.95 | PAG-12<br>35 | N-1<br>2 | S1/S2<br>80/20 | W-3<br>0.05 | SG-3 | — | 22 | 11.4 | 24 |
| Example 2-6 | P-4<br>62.95 | PAG-9<br>35 | N-1<br>2 | S1/S2<br>80/20 | W-3<br>0.05 | SG-3 | — | 28 | 13.1 | 28 |
| Example 2-7 | P-5<br>77.95 | PAG-1<br>20 | N-9<br>2 | S1/S2<br>80/20 | W-3<br>0.05 | SG-3 | — | 28 | 17.7 | 32 |
| Example 2-8 | P-6<br>62.95 | PAG-9<br>35 | N-1<br>2 | S1/S2<br>80/20 | W-3<br>0.05 | SG-3 | — | 24 | 9.0 | 26 |
| Example 2-9 | P-7<br>62.95 | PAG-4<br>35 | N-8<br>2 | S1/S2<br>80/20 | W-3<br>0.05 | SG-3 | — | 26 | 18.0 | 28 |
| Example 2-10 | P-8<br>62.95 | PAG-6<br>35 | N-3<br>2 | S1/S2<br>80/20 | W-2<br>0.05 | SG-3 | — | 22 | 18.6 | 26 |
| Example 2-11 | P-8<br>62.95 | PAG-9<br>35 | N-1<br>2 | S1/S2<br>80/20 | W-3<br>0.05 | SG-3 | — | 22 | 11.4 | 24 |
| Example 2-12 | P-6<br>62.95 | PAG-9<br>35 | N-1<br>2 | S1/S2<br>80/20 | W-3<br>0.05 | SG-1 | — | 22 | 12.0 | 26 |
| Example 2-13 | P-9<br>62.95 | PAG-7<br>35 | N-6<br>2 | S1/S2<br>80/20 | W-3<br>0.05 | SG-3 | — | 26 | 13.5 | 32 |
| Example 2-14 | P-10<br>62.95 | PAG-12<br>35 | N-3<br>2 | S1/S2<br>80/20 | W-2<br>0.05 | SG-3 | — | 22 | 11.7 | 24 |
| Example 2-15 | P-11<br>62.95 | PAG-12<br>35 | N-8<br>2 | S1/S2<br>80/20 | W-3<br>0.05 | SG-3 | — | 22 | 11.7 | 24 |
| Example 2-16 | P-12<br>63.95 | PAG-1<br>35 | N-3<br>1 | S1/S2<br>80/20 | W-2<br>0.05 | SG-3 | — | 26 | 7.5 | 28 |
| Example 2-17 | P-13<br>62.95 | PAG-6<br>35 | N-3<br>2 | S1/S2<br>80/20 | W-3<br>0.05 | SG-3 | — | 24 | 11.3 | 26 |
| Example 2-18 | P-14<br>62.95 | PAG-3<br>35 | N-3<br>2 | S1/S2<br>80/20 | W-3<br>0.05 | SG-3 | — | 26 | 18.1 | 32 |
| Example 2-19 | P-15<br>62.95 | PAG-6<br>35 | N-3<br>2 | S1/S2<br>80/20 | W-3<br>0.05 | SG-3 | SR-3 | 22 | 11.0 | 24 |
| Example 2-20 | P-16<br>60.95 | PAG-4<br>35 | N-10<br>4 | S1/S2<br>80/20 | W-3<br>0.05 | SG-3 | — | 22 | 11.0 | 26 |
| Example 2-21 | P-17<br>62.95 | PAG-2<br>35 | N-4<br>2 | S1/S2<br>80/20 | W-3<br>0.05 | SG-3 | — | 30 | 12.0 | 36 |
| Example 2-22 | P-18<br>62.95 | PAG-4<br>35 | N-3<br>2 | S1/S2<br>80/20 | W-3<br>0.05 | SG-3 | — | 22 | 11.4 | 26 |
| Example 2-23 | P-18<br>62.95 | PAG-9<br>35 | N-3<br>2 | S1/S2<br>80/20 | W-2<br>0.05 | SG-3 | — | 24 | 13.8 | 26 |
| Example 2-24 | P-18<br>62.95 | PAG-12<br>35 | N-3<br>2 | S1/S2<br>80/20 | W-2<br>0.05 | SG-3 | — | 24 | 11.9 | 26 |
| Example 2-25 | P-19<br>97.95 | — | N-6<br>2 | S1/S2<br>50/50 | W-3<br>0.05 | SG-2 | SR-3 | 26 | 13.6 | 30 |
| Example 2-26 | P-20<br>97.95 | — | N-3<br>2 | S1/S2<br>80/20 | W-3<br>0.05 | SG-3 | — | 22 | 11.6 | 26 |
| Example 2-27 | P-20<br>97.95 | — | N-3<br>2 | S1/S2<br>80/20 | W-3<br>0.05 | SG-1 | — | 22 | 12.7 | 28 |
| Example 2-28 | P-21<br>97.95 | — | N-2<br>2 | S1/S2<br>80/20 | W-3<br>0.05 | SG-3 | — | 24 | 11.9 | 26 |
| Example 2-29 | P-21<br>97.95 | — | N-2<br>2 | S1/S2<br>80/20 | W-3<br>0.05 | SG-2 | — | 24 | 12.1 | 28 |
| Example 2-30 | P-22<br>97.95 | — | N-6<br>2 | S1/S2<br>80/20 | W-3<br>0.05 | SG -3 | — | 28 | 13.5 | 30 |
| Example 2-31 | P-23<br>97.95 | — | N-3<br>2 | S1/S2<br>80/20 | W-3<br>0.05 | SG-3 | — | 28 | 13.8 | 30 |
| Example 2-32 | P-24<br>97.95 | — | N-6<br>2 | S1/S2<br>50/50 | W-3<br>0.05 | SG-3 | — | 22 | 11.3 | 26 |
| Example 2-33 | P-25<br>97.95 | — | N-3<br>2 | S1/S2<br>80/20 | W-3<br>0.05 | SG-3 | — | 26 | 15.4 | 34 |
| Example 2-34 | P-26<br>97.95 | — | N-8<br>2 | S1/S2<br>80/20 | W-3<br>0.05 | SG-3 | — | 22 | 11.6 | 24 |
| Example 2-35 | P-26<br>97.95 | — | N-8<br>2 | S1/S2<br>80/20 | W-3<br>0.05 | SG-2 | — | 24 | 12.0 | 26 |
| Example 2-36 | P-27<br>62.95 | PAG-10<br>35 | N-4<br>2 | S1/S2<br>80/20 | W-3<br>0.05 | SG-3 | SR-3 | 28 | 14.8 | 34 |
| Example 2-37 | P-28<br>62.95 | PAG-4<br>35 | N-6<br>2 | S1/S2<br>80/20 | W-3<br>0.05 | SG-3 | — | 28 | 11.4 | 30 |

TABLE 2-continued

| | Acid-Decomposable Resin (mass %) | Photoacid Generator (mass %) | Basic Compound (mass %) | Solvent (mass ratio) | Surfactant (mass %) | Developer | Rinsing Solution | Resolution (nm) | Sensitivity (mJ/cm$^2$) | Isolated Space Resolution (nm) |
|---|---|---|---|---|---|---|---|---|---|---|
| Example 2-38 | P-29 62.95 | PAG-1 35 | N-6 2 | S1/S2 80/20 | W-3 0.05 | SG-3 | — | 28 | 11.9 | 34 |
| Example 2-39 | P-30 62.95 | PAG-1 35 | N-6 2 | S1/S2 50/50 | W-3 0.05 | SG-3 | — | 30 | 17.0 | 36 |
| Example 2-40 | P-31 62.95 | PAG-6 35 | N-6 9 | S1/S2 50/50 | W-3 0.05 | SG-3 | — | 28 | 13.7 | 34 |
| Example 2-41 | P-32 62.95 | PAG-11 35 | N-6 2 | S1/S2 50/50 | W-3 0.05 | SG-3 | — | 30 | 14.8 | 36 |
| Example 2-42 | P-33 62.95 | PAG-10 35 | N-3 2 | S1/S2 80/20 | W-3 0.05 | SG-3 | — | 28 | 13.8 | 30 |
| Example 2-43 | P-34 62.95 | PAG-9 35 | N-6 2 | S1/S2 50/50 | W-3 0.05 | SG-3 | — | 24 | 11.6 | 26 |
| Example 2-44 | P-34/Q-3 42.95/20.00 | PAG-12 35 | N-3 2 | S1/S2 80/20 | W-3 0.05 | SG-3 | — | 26 | 12 | 30 |
| Example 2-45 | P-34 62.95 | PAG-1/PAG-12 20/15 | N-3 2 | S1/S2 80/20 | W-3 0.05 | SG-3 | — | 24 | 10.6 | 32 |
| Example 2-46 | P-34 63 | PAG-12 35 | N-3 2 | S1/S2 80/20 | None | SG-3 | — | 24 | 12 | 24 |
| Example 2-47 | P-36 62.95 | PAG-1 35 | N-3 2 | S1/S2 80/20 | W-3 0.05 | SG-3 | — | 30 | 13.8 | 36 |
| Example 2-48 | P-37/HR-24 59.95/3.00 | PAG-1 35 | N-8 2 | S1/S4 80/20 | W-3 0.05 | SG-3 | — | 30 | 17.6 | 34 |
| Example 2-49 | P-37 98.00 | — | N-2 2 | S1/S2 80/20 | — | SG-3 | SR-1 | 22 | 16.5 | 28 |
| Example 2-50 | P-38 98.00 | — | N-2 2 | S1/S2 80/20 | — | SG-3 | — | 26 | 15.3 | 26 |
| Example 2-51 | P-39 98.00 | — | N-2 2 | S1/S2 80/20 | — | SG-3 | — | 26 | 15.8 | 28 |
| Example 2-52 | P-40 98.00 | — | N-2 2 | S1/S2 80/20 | — | SG-3 | — | 28 | 16.0 | 28 |
| Example 2-53 | P-40 98.00 | — | N-2 2 | S1/S2 80/20 | — | SG-3 | SR-3 | 24 | 15.9 | 24 |
| Example 2-54 | P-41 62.95 | PAG-15 35 | N-11 2 | S1/S2/S4 70/20/10 | W-3 0.05 | SG-3 | — | 26 | 16.2 | 32 |
| Example 2-55 | P-42 63.00 | PAG-15 35 | N-11 2 | S1/S2/S4 70/20/10 | — | SG-3 | — | 26 | 17 | 30 |
| Example 2-56 | P-43 63.00 | PAG-14 35 | N-3 2 | S1/S2/S4 70/20/10 | — | SG-3 | — | 24 | 10.5 | 30 |
| Example 2-57 | P-44 63.00 | PAG-14 35 | N-3 2 | S1/S2 80/20 | — | SG-3 | — | 26 | 16.9 | 30 |
| Example 2-58 | P-45 63.00 | PAG-13 35 | N-2 2 | S1/S2 80/20 | — | SG-3 | — | 28 | 16.8 | 28 |
| Example 2-59 | P-46 63.00 | PAG-13 35 | N-2 2 | S1/S2 80/20 | — | SG-3 | — | 28 | 10.8 | 24 |
| Comparative Example 2-1 | R-1 62.95 | PAG-4 35 | N-6 2 | S1/S2 80/20 | W-3 0.05 | SG-3 | — | 50 | 33.9 | 48 |
| Comparative Example 2-2 | R-2 62.95 | PAG-4 35 | N-6 2 | S1/S2 80/20 | W-3 0.05 | SG-3 | — | 50 | 34.6 | 50 |

As apparent from the results shown in the Table above, in Comparative Examples 2-1 and 2-2 where the acid-decomposable resin does not contain a repeating unit represented by formula (1), the resolution, sensitivity and resolution in an isolated space were poor.

On the other hand, in all of Examples 2-1 to 2-59 using the resin (P) containing a repeating unit represented by formula (1), the resolution, sensitivity and resolution in an isolated space were excellent.

Examples 3-1 to 3-14 and Comparative Examples 3-1 and 3-2

ArF Exposure (1) Preparation of Coating Solution of Actinic Ray-Sensitive or Radiation-Sensitive Resin Composition A coating solution composition having a solid content concentration of 3.8 mass % according to the formulation shown in the Table below was microfiltered through a membrane filter having a pore size of 0.03 μm to prepare an actinic ray-sensitive or radiation-sensitive resin composition (resist composition) solution.

(2) Exposure Conditions: ArF Dry Exposure

An organic antireflection film, ARC29A (produced by Nissan Chemical Industries, Ltd.), was coated on a 12-inch silicon wafer and baked at 205° C. for 60 seconds to form an antireflection film having a thickness of 75 nm, and the actinic ray-sensitive or radiation-sensitive resin composition prepared above was coated thereon and baked at 130° C. for 60 seconds to form a resist film having a thickness of 120 nm. This resist film was exposed through a mask by using an ArF excimer laser scanner (PAS5500/1100, manufactured by ASML, NA: 0.75, Dipole, σo/σi=0.89/0.65). Thereafter, the wafer was heated at 100° C. for 60 seconds, developed with the organic solvent developer shown in the Table below for 30 seconds, rinsed with the rinsing solution shown in the Table below for 30 seconds while spinning the wafer at a rotation speed of 1,000 rpm, and spin-dried to obtain a 1:1 line-and-space resist pattern having a line width of 50 nm.

(3) Evaluation of Resist Pattern

Using a scanning electron microscope (S-9380II, manufacture by Hitachi Ltd.), the obtained resist pattern was evaluated for sensitivity, resolution and isolated space resolution by the following methods. The results obtained are shown in the Table below.

(3-1) Sensitivity

The irradiation energy below which a 1:1 line-and-space pattern having a line width of 50 nm cannot be resolved was taken as the sensitivity (Eop). A smaller value indicates higher performance.

(3-2) Resolution

The minimum line width below which the line-and-space (1:1) pattern at the Eop above cannot be separated was taken as the resolution. A smaller value indicates higher performance.

(3-3) Isolated Space Resolution (ArF)

The limiting resolution (the minimum space width below which a line and a space cannot be separated and resolved) of an isolated pattern (line:space=10:1) at the irradiation dose giving the sensitivity above was determined. This value was taken as "isolated space resolution (nm)".

Examples 4-1 to 4-31 and Comparative Examples 4-1 to 4-3

Electron Beam (EB) Exposure (1) Preparation and Coating of Coating Solution of Actinic Ray-Sensitive or Radiation-Sensitive Resin Composition The components shown in the Table below were dissolved in the solvent to prepare a solution having a solid content concentration of 4 mass %, and this solution was filtered through a polytetrafluoroethylene filter having a pore size of 0.10 μm to prepare an actinic ray-sensitive or radiation-sensitive resin composition (resist composition). The actinic ray-sensitive or radiation-sensitive resin composition was evaluated by the following methods, and the results obtained are shown in the Table below.

As for each component in the Table below, the ratio when using a plurality of kinds is a ratio by mass.

(2) EB Exposure and Development

The actinic ray-sensitive or radiation-sensitive resin composition prepared was uniformly coated on a hexamethyldisilazane-treated silicon substrate by using a spin coater and

TABLE 3

| | Acid-Decomposable Resin (mass %) | Photoacid Generator (mass %) | Basic Compound (mass %) | Solvent (mass ratio) | Surfactant (mass %) | Developer | Rinsing Solution | Resolution (nm) | Sensitivity (mJ/cm$^2$) | Isolated Space Resolution (nm) |
|---|---|---|---|---|---|---|---|---|---|---|
| Example 3-1 | P-1<br>79.95 | PAG-4<br>15 | N-1<br>5 | S1/S2<br>80/20 | W-3<br>0.05 | SG-3 | SR-3 | 38 | 13.8 | 46 |
| Example 3-2 | P-2<br>79.95 | PAG-12<br>15 | N-1<br>5 | S1/S2<br>80/20 | W-3<br>0.05 | SG-3 | SR-3 | 40 | 12.6 | 44 |
| Example 3-3 | P-15<br>79.95 | PAG-6<br>15 | N-3<br>5 | S1/S2<br>80/20 | W-3<br>0.05 | SG-3 | SR-3 | 34 | 13.2 | 40 |
| Example 3-4 | P-19<br>94.95 | — | N-6<br>5 | S1/S2<br>50/50 | W-3<br>0.05 | SG-3 | SR-3 | 38 | 13.1 | 44 |
| Example 3-5 | P-27<br>79.95 | PAG-10<br>15 | N-4<br>5 | S3/S4<br>80/20 | W-3<br>0.05 | SG-3 | SR-3 | 38 | 14.3 | 46 |
| Example 3-6 | P-29<br>79.95 | PAG-1<br>15 | N-6<br>5 | S3/S4<br>80/20 | W-3<br>0.05 | SG-3 | SR-3 | 36 | 13.2 | 48 |
| Example 3-7 | P-34<br>79.95 | PAG-12<br>15 | N-6<br>5 | S1/S2<br>50/50 | W-3<br>0.05 | SG-3 | SR-3 | 34 | 8.3 | 40 |
| Example 3-8 | P-34<br>79.95 | PAG-9<br>15 | N-6<br>5 | S1/S2<br>50/50 | W-3<br>0.05 | SG-3 | SR-2 | 34 | 11.2 | 46 |
| Example 3-9 | P-34<br>79.95 | PAG-12<br>15 | N-6<br>5 | S1/S2<br>50/50 | W-3<br>0.05 | SG-2 | SR-3 | 36 | 13.6 | 40 |
| Example 3-10 | P-34<br>79.95 | PAG-1<br>15 | N-6<br>5 | S1/S2<br>50/50 | W-3<br>0.05 | SG-3 | SR-3 | 32 | 12.0 | 42 |
| Example 3-11 | P-34<br>79.95 | PAG-4<br>15 | N-6<br>5 | S1/S2<br>50/50 | W-3<br>0.05 | SG-3 | SR-3 | 32 | 11.9 | 40 |
| Example 3-12 | P-34/Q-4<br>59.95/20.00 | PAG-4<br>15 | N-6<br>5 | S1/S2<br>50/50 | W-3<br>0.05 | SG-3 | SR-3 | 34 | 14.3 | 40 |
| Example 3-13 | P-34<br>79.95 | PAG-6/PAG9<br>10/5 | N-6<br>5 | S1/S2<br>50/50 | W-3<br>0.05 | SG-3 | SR-3 | 30 | 13.6 | 38 |
| Example 3-14 | P-34<br>80 | PAG-4<br>15 | N-6<br>5 | S1/S2<br>50/50 | None | SG-3 | SR-3 | 36 | 12.9 | 48 |
| Comparative Example 3-1 | R-3<br>79.95 | PAG-4<br>15 | N-6<br>5 | S1/S2<br>80/20 | W-3<br>0.05 | SG-3 | — | 50 | 33.4 | not resolved |
| Comparauve Example 3-2 | R-4<br>79.95 | PAG-4<br>15 | N-6<br>5 | S1/S2<br>80/20 | W-3<br>0.05 | SG-3 | — | 50 | 34.1 | not resolved |

As apparent from the results shown in the Table above, in Comparative Examples 3-1 and 3-2 where the acid-decomposable resin does not contain a repeating unit represented by formula (1), the resolution and sensitivity were poor and an isolated space could not be resolved.

On the other hand, in all of Examples 3-1 to 3-14 using the resin (P) containing a repeating unit represented by formula (1), the resolution and sensitivity were excellent and resolution in an isolated space was also excellent.

dried by heating on a hot plate at 120° C. for 90 seconds to form an actinic ray-sensitive or radiation-sensitive film (resist film) having a thickness of 100 nm. This actinic ray-sensitive or radiation-sensitive film was irradiated with an electron beam by using an electron beam irradiation apparatus (HL750, manufactured by Hitachi Ltd., accelerating voltage: 50 KeV) and immediately after irradiation, heated on a hot plate at 110° C. for 90 seconds. Furthermore, the resist film was developed at 23° C. for 60 seconds by using an aqueous tetramethylammonium hydroxide solution at a concentration of 2.38 mass %, rinsed with pure water for 30 seconds and then spin-dried to obtain a resist pattern.

(3) Evaluation of Resist Pattern

Using a scanning electron microscope (S-9220, manufacture by Hitachi Ltd.), the obtained resist pattern was evaluated for sensitivity, resolution and isolated space resolution by the following methods. The results obtained are shown in the Table below.

(3-1) Sensitivity

The minimum irradiation energy below which a line-and-space pattern (line:space 1:1) having a line width of 100 nm cannot be resolved was taken as the sensitivity. A smaller value indicates higher sensitivity.

(3-2) Resolution

The limiting resolution (the minimum line width below which a line and a space cannot be separated and resolved) at the irradiation dose giving the sensitivity above was taken as the resolution. A smaller value indicates higher performance.

(3-3) Isolated Space Resolution (EB)

The limiting resolution (the minimum space width below which a line and a space cannot be separated and resolved) of an isolated pattern (line:space=100:1) at the irradiation dose giving the sensitivity above was determined. This value was taken as "isolated space resolution (nm)".

TABLE 4

| | Acid-Decomposable Resin (mass %) | Photoacid Generator (mass %) | Basic Compound (mass %) | Solvent (mass ratio) | Surfactant (mass %) | Resolution (nm) | Sensitivity ($\mu C/cm^2$) | Isolated Space Resolution (nm) |
|---|---|---|---|---|---|---|---|---|
| Example 4-1 | P-3<br>77.99 | PAG-1<br>20 | N-1<br>2 | S1/S2<br>80/20 | W-3<br>0.01 | 62.5 | 17.9 | 75 |
| Example 4-2 | P-3<br>77.99 | PAG-1<br>20 | N-1<br>2 | S1/S2<br>80/20 | W-3<br>0.01 | 62.5 | 20.2 | 75 |
| Example 4-3 | P-3<br>77.99 | PAG-12<br>20 | N-1<br>2 | S1/S2<br>80/20 | W-3<br>0.01 | 62.5 | 18.9 | 62.5 |
| Example 4-4 | P-5<br>87.99 | PAG-1<br>10 | N-9<br>2 | S1/S2<br>80/20 | W-3<br>0.01 | 87.5 | 25.2 | 87.5 |
| Example 4-5 | P-6<br>77.99 | PAG-9<br>20 | N-1<br>2 | S1/S2<br>80/20 | W-3<br>0.01 | 62.5 | 16.5 | 75 |
| Example 4-6 | P-7<br>75.99 | PAG-4<br>20 | N-8<br>4 | S1/S2<br>80/20 | W-3<br>0.01 | 75 | 25.5 | 87.5 |
| Example 4-7 | P-8<br>75.99 | PAG-6<br>20 | N-3<br>4 | S1/S2<br>80/20 | W-2<br>0.01 | 62.5 | 26.1 | 62.5 |
| Example 4-8 | P-8<br>77.99 | PAG-9<br>20 | N-1<br>2 | S1/S2<br>80/20 | W-3<br>0.01 | 62.5 | 18.9 | 75 |
| Example 4-9 | P-8<br>77.99 | PAG-9<br>20 | N-1<br>2 | S1/S2<br>80/20 | W-3<br>0.01 | 62.5 | 19.5 | 75 |
| Example 4-10 | P-9<br>77.99 | PAG-7<br>20 | N-6<br>2 | S1/S2<br>80/20 | W-3<br>0.01 | 87.5 | 21 | 100 |
| Example 4-11 | P-10<br>77.99 | PAG-12<br>20 | N-3<br>2 | S1/S2<br>80/20 | W-2<br>0.01 | 62.5 | 19.2 | 75 |
| Example 4-12 | P-11<br>77.99 | PAG-12<br>20 | N-8<br>2 | S1/S2<br>80/20 | W-3<br>0.01 | 62.5 | 19.2 | 62.5 |
| Example 4-13 | P-12<br>78.99 | PAG-1<br>20 | N-3<br>1 | S1/S2<br>80/20 | W-2<br>0.01 | 75 | 21 | 87.5 |
| Example 4-14 | P-14<br>77.99 | PAG-3<br>20 | N-3<br>2 | S1/S2<br>80/20 | W-3<br>0.01 | 87.5 | 25.6 | 100 |
| Example 4-15 | P-15<br>77.99 | PAG-6<br>20 | N-3<br>2 | S1/S2<br>80/20 | W-3<br>0.01 | 62.5 | 18.5 | 75 |
| Example 4-16 | P-18<br>77.99 | PAG-4<br>20 | N-3<br>2 | S1/S2<br>80/20 | W-2<br>0.01 | 62.5 | 18.9 | 62.5 |
| Example 4-17 | P-18<br>77.99 | PAG-9<br>20 | N-3<br>2 | S1/S2<br>80/20 | W-2<br>0.01 | 62.5 | 21.3 | 75 |
| Example 4-18 | P-18<br>77.99 | PAG-12<br>20 | N-3<br>2 | S1/S2<br>80/20 | W-2<br>0.01 | 62.5 | 19.4 | 62.5 |
| Example 4-19 | P-19<br>97.99 | — | N-6<br>2 | S1/S2<br>50/50 | W-3<br>0.01 | 75 | 21.1 | 87.5 |
| Example 4-20 | P-20<br>97.99 | — | N-3<br>2 | S1/S2<br>80/20 | W-3<br>0.01 | 62.5 | 19.1 | 62.5 |
| Example 4-21 | P-20<br>97.99 | — | N-3<br>2 | S1/S2<br>80/20 | W-3<br>0.01 | 62.5 | 21.6 | 75 |
| Example 4-22 | P-21<br>97.99 | — | N-2<br>2 | S1/S2<br>80/20 | W-3<br>0.01 | 62.5 | 19.4 | 75 |
| Example 4-23 | P-21<br>98.99 | — | N-2<br>1 | S1/S2<br>80/20 | W-3<br>0.01 | 62.5 | 22.3 | 62.5 |
| Example 4-24 | P-23<br>97.99 | — | N-2<br>2 | S1/S2<br>80/20 | W-3<br>0.01 | 75 | 21.3 | 75 |
| Example 4-25 | P-26<br>97.99 | — | N-8<br>2 | S1/S2<br>80/20 | W-3<br>0.01 | 62.5 | 19.1 | 62.5 |
| Example 4-26 | P-26<br>97.99 | — | N-8<br>2 | S1/S2<br>80/20 | W-3<br>0.01 | 62.5 | 19.5 | 62.5 |
| Example 4-27 | P-34<br>77.99 | PAG-9<br>20 | N-6<br>2 | S1/S2<br>50/50 | W-3<br>0.01 | 62.5 | 19.1 | 62.5 |
| Example 4-28 | P-34/Q-2<br>57.99/20 | PAG-9<br>20 | N-6<br>2 | S1/S2<br>50/50 | W-3<br>0.01 | 75 | 20.3 | 87.5 |
| Example 4-29 | P-34<br>77.99 | PAG-6/PAG-9<br>10/10 | N-6<br>2 | S1/S2<br>50/50 | W-3<br>0.01 | 62.5 | 19.1 | 62.5 |

TABLE 4-continued

| | Acid-Decomposable Resin (mass %) | Photoacid Generator (mass %) | Basic Compound (mass %) | Solvent (mass ratio) | Surfactant (mass %) | Resolution (nm) | Sensitivity ($\mu C/cm^2$) | Isolated Space Resolution (nm) |
|---|---|---|---|---|---|---|---|---|
| Example 4-30 | P-34<br>78 | PAG-9<br>20 | N-6<br>2 | S1/S2<br>50/50 | None | 75 | 20.5 | 75 |
| Example 4-31 | P-35<br>77.99 | PAG-1<br>20 | N-6<br>2 | S1/S2<br>50/50 | W-3<br>0.01 | 62.5 | 19.6 | 75 |
| Comparative Example 4-1 | R-1<br>77.99 | PAG-4<br>20 | N-6<br>2 | S1/S2<br>80/20 | W-3<br>0.01 | 100 | 41.4 | not resolved |
| Comparative Example 4-2 | R-5<br>77.99 | PAG-4<br>20 | N-6<br>2 | S1/S2<br>80/20 | W-3<br>0.01 | 100 | 42.1 | not resolved |
| Comparative Example 4-3 | R-7<br>77.99 | PAG-4<br>20 | N-6<br>2 | S1/S2<br>80/20 | W-3<br>0.01 | 100 | 51.3 | not resolved |

As apparent from the results shown in the Table above, in Comparative Examples 4-1 to 4-3 where the acid-decomposable resin does not contain a repeating unit represented by formula (1), the resolution and sensitivity were poor and an isolated space could not be resolved.

On the other hand, in all of Examples 4-1 to 4-31 using the resin (P) containing a repeating unit represented by formula (1), the resolution and sensitivity were excellent and the resolution in an isolated space was also excellent.

Examples 5-1 to 5-31 and Comparative Examples 5-1 to 5-3

EUV (Extreme Ultraviolet Ray) Exposure (1) Preparation and Coating of Coating Solution of Actinic Ray-Sensitive or Radiation-Sensitive Resin Composition The components shown in the Table below were dissolved in the solvent to prepare a solution having a solid content concentration of 4 mass %, and this solution was filtered through a polytetrafluoroethylene filter having a pore size of 0.10 μm to prepare an actinic ray-sensitive or radiation-sensitive resin composition (resist composition). The actinic ray-sensitive or radiation-sensitive resin composition was evaluated by the following methods, and the results obtained are shown in the Table below.

As for each component in the Table below, the ratio when using a plurality of kinds is a ratio by mass.

(2) EUV Exposure and Development

The actinic ray-sensitive or radiation-sensitive resin composition prepared was uniformly coated on a hexamethyldisilazane-treated silicon substrate by using a spin coater and dried by heating on a hot plate at 120° C. for 90 seconds to form an actinic ray-sensitive or radiation-sensitive film (resist film) having a thickness of 100 nm. The wafer coated with this resist film was patternwise exposed using an EUV exposure apparatus (Micro Exposure Tool, manufactured by Exitech, NA: 0.3, Quadrupole, outer sigma: 0.68, inner sigma: 0.36) through an exposure mask (line/space=1/1) and immediately after exposure, heated on a hot plate at 110° C. for 90 seconds. Furthermore, the film was developed at 23° C. for 60 seconds by using an aqueous tetramethylammonium hydroxide solution at a concentration of 2.38 mass %, rinsed with pure water for 30 seconds, and then spin-dried to obtain a resist pattern.

(3) Evaluation of Resist Pattern

Using a scanning electron microscope (S-9220, manufacture by Hitachi Ltd.), the obtained resist pattern was evaluated for sensitivity, resolution and isolated space resolution by the following methods. The results obtained are shown in the Table below.

(3-1) Sensitivity

The minimum irradiation energy below which a line-and-space pattern (line:space=1:1) having a line width of 50 nm cannot be resolved was taken as the sensitivity. A smaller value indicates higher sensitivity.

(3-2) Resolution

The limiting resolution (the minimum line width below which a line and a space cannot be separated and resolved) at the irradiation dose giving the sensitivity above was taken as the resolution. A smaller value indicates higher performance.

(3-3) Isolated Space Resolution (EUV)

The limiting resolution (the minimum space width below which a line and a space cannot be separated and resolved) of an isolated pattern (line:space=5:1) at the irradiation dose giving the sensitivity above was determined. This value was taken as "isolated space resolution (nm)".

TABLE 5

| | Acid-Decomposable Resin (mass %) | Photoacid Generator (mass %) | Basic Compound (mass %) | Solvent (mass ratio) | Surfactant (mass %) | Resolution (nm) | Sensitivity ($mJ/cm^2$) | Isolated Space Resolution (nm) |
|---|---|---|---|---|---|---|---|---|
| Example 5-1 | P-3<br>62.95 | PAG-4<br>35 | N-8<br>2 | S1/S2<br>80/20 | W-3<br>0.05 | 26 | 19.1 | 34 |
| Example 5-2 | P-3<br>62.95 | PAG-12<br>35 | N-8<br>2 | S1/S2<br>80/20 | W-3<br>0.05 | 28 | 15.5 | 36 |
| Example 5-3 | P-3<br>62.95 | PAG-1<br>35 | N-6<br>2 | S1/S2<br>50/50 | W-3<br>0.05 | 26 | 14.8 | 34 |
| Example 5-4 | P-5<br>62.95 | PAG-6<br>33 | N-6<br>2 | S1/S2<br>50/50 | W-3<br>0.05 | 32 | 17.2 | 40 |
| Example 5-5 | P-6<br>62.95 | PAG-12<br>35 | N-1<br>2 | S1/S2<br>80/20 | W-3<br>0.05 | 26 | 14.9 | 34 |
| Example 5-6 | P-7<br>62.95 | PAG-9<br>35 | N-1<br>2 | S1/S2<br>80/20 | W-3<br>0.05 | 32 | 16.6 | 40 |

TABLE 5-continued

| | Acid-Decomposable Resin (mass %) | Photoacid Generator (mass %) | Basic Compound (mass %) | Solvent (mass ratio) | Surfactant (mass %) | Resolution (nm) | Sensitivity (mJ/cm$^2$) | Isolated Space Resolution (nm) |
|---|---|---|---|---|---|---|---|---|
| Example 5-7 | P-8<br>62.95 | PAG-6<br>35 | N-3<br>2 | S1/S2<br>80/20 | W-2<br>0.05 | 26 | 22.1 | 34 |
| Example 5-8 | P-8<br>62.95 | PAG-9<br>35 | N-1<br>2 | S1/S2<br>80/20 | W-3<br>0.05 | 28 | 12.5 | 36 |
| Example 5-9 | P-S<br>62.95 | PAG-12<br>35 | N-3<br>2 | S1/S2<br>80/20 | W-2<br>0.05 | 26 | 15.2 | 34 |
| Example 5-10 | P-9<br>77.95 | PAG-1<br>20 | N-9<br>2 | S1/S2<br>80/20 | W-3<br>0.05 | 32 | 21.2 | 40 |
| Example 5-11 | P-10<br>62.95 | PAG-9<br>35 | N-1<br>2 | S1/S2<br>80/20 | W-3<br>0.05 | 26 | 14.9 | 34 |
| Example 5-12 | P-11<br>62.95 | PAG-9<br>35 | N-1<br>2 | S1/S2<br>80/20 | W-3<br>0.05 | 26 | 15.5 | 34 |
| Example 5-13 | P-12<br>62.95 | PAG-4<br>35 | N-8<br>2 | S1/S2<br>80/20 | W-3<br>0.05 | 30 | 21.5 | 38 |
| Example 5-14 | P-14<br>62.95 | PAG-7<br>35 | N-6<br>2 | S1/S2<br>80/20 | W-3<br>0.05 | 30 | 17 | 38 |
| Example 5-15 | P-15<br>62.95 | PAG-12<br>35 | N-8<br>2 | S1/S2<br>80/20 | W-3<br>0.05 | 26 | 15.2 | 34 |
| Example 5-16 | P-18<br>62.95 | PAG-1<br>35 | N-3<br>2 | S1/S2<br>80/20 | W-3<br>0.05 | 26 | 14.5 | 34 |
| Example 5-17 | P-18<br>62.95 | PAG-6<br>35 | N-3<br>2 | S1/S2<br>80/20 | W-3<br>0.05 | 28 | 14.8 | 36 |
| Example 5-18 | P-18<br>62.95 | PAG-6<br>35 | N-3<br>2 | S1/S2<br>80/20 | W-2<br>0.05 | 28 | 15.4 | 36 |
| Example 5-19 | P-19<br>98.95 | — | N-3<br>1 | S1/S2<br>80/20 | W-2<br>0.05 | 30 | 17 | 38 |
| Example 5-20 | P-20<br>95.95 | — | N-10<br>4 | S1/S2<br>80/20 | W-3<br>0.05 | 26 | 14.5 | 34 |
| Example 5-21 | P-20<br>97.95 | — | N-4<br>2 | S1/S2<br>80/20 | W-3<br>0.05 | 34 | 15.5 | 42 |
| Example 5-22 | P-21<br>97.95 | — | N-3<br>2 | S1/S2<br>80/20 | W-2<br>0.05 | 26 | 14.9 | 34 |
| Example 5-23 | P-21<br>97.95 | — | N-3<br>2 | S1/S2<br>80/20 | W-2<br>0.05 | 28 | 17.3 | 36 |
| Example 5-24 | P-23<br>97.95 | — | N-6<br>2 | S1/S2<br>50/50 | W-3<br>0.05 | 30 | 17.1 | 38 |
| Example 5-25 | P-26<br>95.95 | — | N-4<br>3 | S1/S3<br>80/20 | W-3<br>1.05 | 28 | 17.3 | 36 |
| Example 5-26 | P-26<br>97.95 | — | N-3<br>2 | S1/S2<br>80/20 | W-3<br>0.05 | 26 | 15.1 | 34 |
| Example 5-27 | P-34<br>62.95 | PAG-12<br>35 | N-3<br>2 | S1/S2<br>80/20 | W-3<br>0.05 | 26 | 16.2 | 34 |
| Example 5-28 | P-34/Q-2<br>42.95/20.00 | PAG-12<br>35 | N-3<br>2 | S1/S2<br>80/20 | W-3<br>0.05 | 26 | 17.5 | 38 |
| Example 5-29 | P-34<br>62.95 | PAG-1/PAG-12<br>20/15 | N-3<br>2 | S1/S2<br>80/20 | W-3<br>0.05 | 26 | 15.1 | 34 |
| Example 5-30 | P-34<br>63 | PAG-12<br>35 | N-3<br>2 | S1/S2<br>80/20 | None | 28 | 17.5 | 38 |
| Example 5-31 | P-36<br>62.95 | PAG-1<br>35 | N-3<br>2 | S1/S2<br>80/20 | W-3<br>0.05 | 30 | 17.6 | 42 |
| Comparative Example 5-1 | R-1<br>62.95 | PAG-4<br>35 | N-6<br>2 | S1/S2<br>80/20 | W-3<br>0.05 | 50 | 26.6 | not resolved |
| Comparative Example 5-2 | R-5<br>62.95 | PAG-4<br>35 | N-6<br>2 | S1/S2<br>80/20 | W-3<br>0.05 | 50 | 27.5 | not resolved |
| Comparative Example 5-3 | R-7<br>62.95 | PAG-4<br>35 | N-6<br>2 | S1/S2<br>80/20 | W-3<br>0.05 | 50 | 47.2 | not resolved |

As apparent from the results shown in the Table above, in Comparative Examples 5-1 to 5-3 where the acid-decomposable resin does not contain a repeating unit represented by formula (1), the resolution and sensitivity were poor and an isolated space could not be resolved.

On the other hand, in all of Examples 5-1 to 5-31 using the resin (P) containing a repeating unit represented by formula (1), the resolution and sensitivity were excellent and the resolution in an isolated space was also excellent.

Examples 6-1 to 6-14 and Comparative Examples 6-1 to 6-3

ArF Exposure (1) Preparation of Coating Solution of Actinic Ray-Sensitive or Radiation-Sensitive Resin Composition A coating solution composition having a solid content concentration of 3.8 mass % according to the formulation shown in the Table below was microfiltered through a membrane filter having a pore size of 0.03 μm to prepare an actinic ray-sensitive or radiation-sensitive resin composition (resist composition) solution.

(2) Exposure Conditions: ArF Dry Exposure

An organic antireflection film, ARC29A (produced by Nissan Chemical Industries, Ltd.), was coated on a 12-inch silicon wafer and baked at 205° C. for 60 seconds to form an antireflection film having a thickness of 75 nm, and the actinic ray-sensitive or radiation-sensitive resin composition prepared above was coated thereon and baked at 130° C. for 60 seconds to form a resist film having a thickness of 120 nm. This resist film was exposed through a mask by using an ArF excimer laser scanner (PAS5500/1100, manufactured by ASML, NA: 0.75, Dipole, σo/σi=0.89/0.65). Thereafter, the wafer was heated at 100° C. for 60 seconds, developed with an aqueous tetramethylammonium hydroxide solution (2.38 mass %) for 30 seconds, rinsed with pure water, and then spin-dried to obtain a resist pattern.

(3) Evaluation of Resist Pattern

Using a scanning electron microscope (S-9220, manufacture by Hitachi Ltd.), the obtained resist pattern was evaluated for sensitivity, resolution and isolated line resolution by the following methods. The results obtained are shown in the Table below.

(3-1) Sensitivity

The irradiation energy below which a 1:1 line-and-space pattern having a line width of 50 nm cannot be resolved was taken as the sensitivity (Eop). A smaller value indicates higher performance.

(3-2) Resolution

The minimum line width below which the line-and-space (1:1) pattern at the Eop above cannot be separated was taken as the resolution. A smaller value indicates higher performance.

(3-3) Isolated Space Resolution (ArF)

The limiting resolution (the minimum space width below which a line and a space cannot be separated and resolved) of an isolated pattern (line:space=10:1) at the irradiation dose giving the sensitivity above was determined. This value was taken as "isolated space resolution (nm)".

TABLE 6

| | Acid-Decomposable Resin (mass %) | Photoacid Generator (mass %) | Basic Compound (mass %) | Solvent (mass ratio) | Surfactant (mass %) | Resolution (nm) | Sensitivity (mJ/cm$^2$) | Isolated Space Resolution (nm) |
|---|---|---|---|---|---|---|---|---|
| Example 6-1 | P-1<br>79.95 | PAG-4<br>15 | N-1<br>5 | S1/S2<br>80/20 | W-3<br>0.05 | 40 | 15.8 | 48 |
| Example 6-2 | P-2<br>79.95 | PAG-12<br>15 | N-1<br>5 | S1/S2<br>80/20 | W-3<br>0.05 | 40 | 14.6 | 44 |
| Example 6-3 | P-15<br>79.95 | PAG-6<br>15 | N-3<br>5 | S1/S2<br>80/20 | W-3<br>0.05 | 36 | 15.2 | 36 |
| Example 6-4 | P-19<br>94.95 | — | N-6<br>5 | S1/S2<br>50/50 | W-3<br>0.05 | 38 | 15.1 | 44 |
| Example 6-5 | P-27<br>79.95 | PAG-10<br>15 | N-4<br>5 | S3/S4<br>80/20 | W-3<br>0.05 | 38 | 16.3 | 46 |
| Example 6-6 | P-29<br>79.95 | PAG-1<br>15 | N-6<br>5 | S3/S4<br>80/20 | W-1<br>0.05 | 36 | 15.2 | 48 |
| Example 6-7 | P-34<br>79.95 | PAG-12<br>15 | N-6<br>5 | S1/S2<br>50/50 | W-3<br>0.05 | 36 | 10.3 | 36 |
| Example 6-8 | P-34<br>79.95 | PAG-9<br>15 | N-6<br>5 | S1/S2<br>50/50 | W-3<br>0.05 | 34 | 13.2 | 46 |
| Example 6-9 | P-34<br>79.95 | PAG-12<br>15 | N-6<br>5 | S1/S2<br>50/50 | W-3<br>0.05 | 36 | 15.6 | 40 |
| Example 6-10 | P-34<br>79.95 | PAG-1<br>15 | N-6<br>5 | S1/S2<br>50/50 | W-3<br>0.05 | 32 | 14.0 | 42 |
| Example 6-11 | P-34<br>79.95 | PAG-4<br>15 | N-6<br>5 | S1/S2<br>50/50 | W-3<br>0.05 | 32 | 13.9 | 40 |
| Example 6-12 | P-34/Q-5<br>59.95/20.00 | PAG-4<br>15 | N-6<br>5 | S1/S2<br>50/50 | W-3<br>0.05 | 36 | 15.6 | 40 |
| Example 6-13 | P-34<br>79.95 | PAG-6/PAG-9<br>10/5 | N-6<br>5 | S1/S2<br>50/50 | W-3<br>0.05 | 32 | 14.2 | 38 |
| Example 6-14 | P-34<br>80 | PAG-4<br>15 | N-6<br>5 | S1/S2<br>50/50 | None | 38 | 16.0 | 48 |
| Comparative Example 6-1 | R-3<br>79.95 | PAG-4<br>15 | N-6<br>5 | S1/S2<br>80/20 | W-3<br>0.05 | 50 | 37.2 | not resolved |
| Comparative Example 6-2 | R-4<br>79.95 | PAG-4<br>15 | N-6<br>5 | S1/S2<br>80/20 | W-3<br>0.05 | 50 | 36.1 | not resolved |
| Comparative Example 6-3 | R-8<br>79.95 | PAG-5<br>15 | N-6<br>5 | S1/S3<br>80/20 | W-3<br>0.05 | 50 | 42.3 | not resolved |

As apparent from the results shown in the Table above, in Comparative Examples 6-1 to 6-3 where the acid-decomposable resin does not contain a repeating unit represented by formula (1), the resolution and sensitivity were poor and an isolated space could not be resolved.

On the other hand, in all of Examples 6-1 to 6-14 using the resin (P) containing a repeating unit represented by formula (1), the resolution and sensitivity were excellent and resolution in an isolated space was also excellent.

INDUSTRIAL APPLICABILITY

According to the present invention, an actinic ray-sensitive or radiation-sensitive resin composition ensuring that a fine pattern with a narrow space width (for example, a space width of the order of several tens of nm) can be formed at high resolution and high sensitivity and particularly in the formation of a fine pattern with a narrow space width, a pattern difficult to form by alkali development (for example, an isolated space pattern) can be formed at high resolution by organic solvent development, a resist film using the same, a pattern forming method, a manufacturing method of an electronic device, an electronic device, and a resin can be provided.

This application is based on a Japanese patent application filed on Jul. 27, 2012 (Japanese Patent Application No. 2012-167818), and Japanese patent application filed on Mar. 15, 2013 (Japanese Patent Application No. 2013-054399), and the contents thereof are incorporated herein by reference.

The invention claimed is:

1. An actinic ray-sensitive or radiation-sensitive resin composition comprising:

a compound capable of generating an acid upon irradiation with an actinic ray or radiation;

a solvent; and (P) a resin having (a) a repeating unit represented by the following formula (1):

(1)

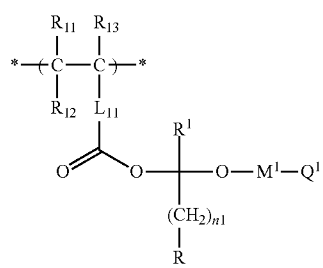

wherein each of $R_{11}$, $R_{12}$ and $R_{13}$ independently represents a hydrogen atom, an alkyl group, a cycloalkyl group, a halogen atom, a cyano group or an alkoxycarbonyl group, $R_{12}$ may combine with $L_{11}$ to form a ring, and in this case, $R_{12}$ represents a single bond or an alkylene group;

$R^1$ represents a hydrogen atom or an alkyl group;

$L_{11}$ represents a single bond or a divalent linking group, and in the case of forming a ring with $R_{12}$, $L_{11}$ represents a trivalent linking group;

R represents an alkyl group, a cycloalkyl group, an aryl group, an aralkyl group, an alkoxy group, an acyl group or a heterocyclic group;

n1 represents an integer of 1 or more;

$M^1$ represents a single bond or a divalent linking group;

$Q^1$ represents an alkyl group, a cycloalkyl group, an aryl group or a heterocyclic group;

when $M^1$ is a divalent linking group, $Q^1$ may combine with $M^1$ through a single bond or another linking group to form a ring; and the case where R combines with $Q^1$ or $M^1$ to form a ring is excluded.

2. The actinic ray-sensitive or radiation-sensitive resin composition as claimed in claim 1, wherein $R^1$ is a hydrogen atom.

3. The actinic ray-sensitive or radiation-sensitive resin composition as claimed in claim 1, wherein $L_{11}$ is a single bond, a group represented by —COO-$L_1$- or a group represented by -$L_2$-O—$CH_2$— (wherein $L_1$ represents an alkylene group having a carbon number of 1 to 9, which may contain a heteroatom or a carbonyl bond, and $L_2$ represents an arylene group having a carbon number of 1 to 10.

4. The actinic ray-sensitive or radiation-sensitive resin composition as claimed in claim 3, wherein $L_{11}$ is a single bond.

5. The actinic ray-sensitive or radiation-sensitive resin composition as claimed in claim 1, wherein R in formula (1) is a group represented by —$C(R^{21})(R^{22})(R^{23})$ wherein each of $R^{21}$ to $R^{23}$ independently represents a hydrogen atom, an alkyl group, a cycloalkyl group, an aryl group, an aralkyl group or a heterocyclic group, and each of at least two members of $R^{21}$ to $R^{23}$ independently represents an alkyl group, a cycloalkyl group, an aryl group, an aralkyl group or a heterocyclic group, and at least two members of $R^{21}$ to $R^{23}$ may combine with each other to form a ring, with the provided excluding the case where at least one of $R^{21}$ to $R^{23}$ combines with $M^1$ or $Q^1$ to form a ring.

6. The actinic ray-sensitive or radiation-sensitive resin composition as claimed in claim 5, wherein in formula (1), each of $R^{21}$ to $R^{23}$ is independently an alkyl group.

7. The actinic ray-sensitive or radiation-sensitive resin composition as claimed in claim 1, wherein n1 in formula (1) is 1.

8. The actinic ray-sensitive or radiation-sensitive resin composition as claimed in claim 1, wherein the resin (P) is a resin further containing a repeating unit represented by the following formula (5) or (6):

(5)

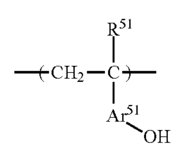

(6)

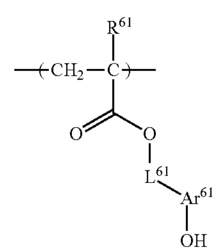

wherein each of $R^{51}$ and $R^{61}$ independently represents a hydrogen atom or a methyl group, each of $Ar^{51}$ and $Ar^{61}$ independently represents an arylene group, and $L^{61}$ represents a single bond or an alkylene group.

9. The actinic ray-sensitive or radiation-sensitive resin composition as claimed in claim 1, wherein the resin (P) is a resin further containing a repeating unit represented by the following formula (4):

(4)

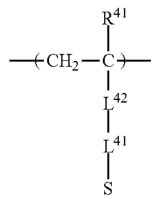

wherein $R^{41}$ represents a hydrogen atom or a methyl group, $L^{41}$ represents a single bond or a divalent linking group, $L^{42}$ represents a divalent linking group, and S represents a structural moiety capable of decomposing upon irradiation with an actinic ray or radiation to generate an acid on the side chain.

10. The actinic ray-sensitive or radiation-sensitive resin composition as claimed in claim 1, wherein R formula (1) is an alkyl group having a carbon number of 5 or more.

11. The actinic ray-sensitive or radiation-sensitive resin composition as claimed in claim 1, wherein $Q^1$ in formula (1) is an aryl group.

12. The actinic ray-sensitive or radiation-sensitive resin composition as claimed in claim 1, wherein $Q^1$ in formula (1) is an alkyl group having a carbon number of 6 or more.

13. A resist film formed using the actinic ray-sensitive or radiation-sensitive resin composition claimed in claim 1.

14. A pattern forming method comprising (i) a step of forming a film by using the actinic ray-sensitive or radiation-sensitive resin composition claimed in claim 1, (ii) a step of exposing the film, and (iii) a step of developing the exposed film by using a developer to form a pattern.

15. The pattern forming method as claimed in claim 14, wherein the developer contains an organic solvent.

16. A method for manufacturing an electronic device, comprising (i) a step of forming a film on an inorganic substrate or a coating-type inorganic substrate suitable for use in a process of producing a semiconductor, a liquid crystal device or a circuit board by using the actinic ray-sensitive or radiation-sensitive resin composition claimed in claim 1, (ii) a step of pattern-wise exposing the film, and (iii) a step of developing the exposed film by using a developer to form a pattern on the inorganic substrate or coating-type inorganic substrate.

17. A resin comprising a repeating unit having a phenolic hydroxyl group represented by the following formula and a repeating unit represented by the following formula (1-2):

(1-2)

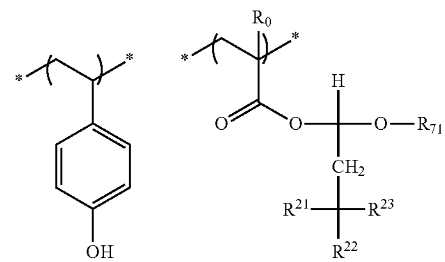

wherein in formula (1-2), $R_0$ represents a hydrogen atom or a methyl group;

each of $R^{21}$ to $R^{23}$ independently represents a hydrogen atom, an alkyl group, a cycloalkyl group, an aryl group, an aralkyl group or a heterocyclic group, and each of at least two members of $R^{21}$ to $R^{23}$ independently represents an alkyl group, a cycloalkyl group, an aryl group, an aralkyl group or a heterocyclic group;

at least two of $R^{21}$ to $R^{23}$ may combine with each other to form a ring, with the proviso excluding the case where at least one of $R^{21}$ to $R^{23}$ combines with $R_{71}$ to form a ring; and $R_{71}$ represents an unsubstituted alkyl group, a cycloalkyl group-substituted alkyl group, a cycloalkyl group, an aralkyl group, an aryloxyalkyl group or a heterocyclic group.

18. The actinic ray-sensitive or radiation-sensitive resin composition as claimed in claim 17, wherein the total number of the carbon numbers of $R^{21}$ to $R^{23}$ in formula (1-2) is 4 or more.

19. The actinic ray-sensitive or radiation-sensitive resin composition as claimed in claim 17, wherein $R_{71}$ in formula (1-2) is an alkyl group having a carbon number of 6 or more.

* * * * *